(12) United States Patent
Khadiwala et al.

(10) Patent No.: US 10,346,250 B2
(45) Date of Patent: *Jul. 9, 2019

(54) CONFIGURING STORAGE RESOURCES OF A DISPERSED STORAGE NETWORK

(71) Applicant: International Business Machines Corporation, Armonk, NY (US)

(72) Inventors: Ravi Khadiwala, Bartlett, IL (US); Wesley Leggette, Chicago, IL (US); Andrew Baptist, Mt. Pleasant, WI (US); Greg Dhuse, Chicago, IL (US); Ilya Volvovski, Chicago, IL (US); Jason K. Resch, Chicago, IL (US); Manish Motwani, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 163 days.

This patent is subject to a terminal disclaimer.

(21) Appl. No.: 15/350,672

(22) Filed: Nov. 14, 2016

(65) Prior Publication Data

US 2017/0063402 A1    Mar. 2, 2017

Related U.S. Application Data

(63) Continuation of application No. 14/527,139, filed on Oct. 29, 2014, now Pat. No. 9,594,639.

(Continued)

(51) Int. Cl.
*G06F 11/00* (2006.01)
*G06F 11/14* (2006.01)
(Continued)

(52) U.S. Cl.
CPC .......... *G06F 11/1435* (2013.01); *G06F 3/064* (2013.01); *G06F 3/067* (2013.01);
(Continued)

(58) Field of Classification Search
CPC .................................................. G06F 11/1435
(Continued)

(56) References Cited

U.S. PATENT DOCUMENTS 4,092,732 A    5/1978  Ouchi
5,454,101 A    9/1995  Mackay et al.
(Continued)

OTHER PUBLICATIONS

Shamir; How to Share a Secret; Communications of the ACM; vol. 22, No. 11; Nov. 1979; pp. 612-613.

(Continued)

*Primary Examiner* — Dieu Minh T Le
(74) *Attorney, Agent, or Firm* — Garlick & Markison; Timothy W. Markison; Timothy D. Taylor

(57) ABSTRACT

A method includes determining an acceptable site failure number for storing a set of encoded data slices based on available sites and storage units within the available sites. The method further includes determining dispersed storage error encoding parameters based on the acceptable site failure number, wherein the parameters includes a decode threshold number and a total width number. The method further includes encoding, in accordance with the parameters, a data segment of data to produce the set of encoded data slices. The method further includes generating a slice mapping based on the acceptable site failure number, the available sites, and the storage units within the available storage units within the available sites. The method further includes sending, based on the slice mapping, the set of encoded data slices to at least some of the storage units within at least some of the available sites for storage therein.

15 Claims, 69 Drawing Sheets

Related U.S. Application Data

(60) Provisional application No. 61/924,196, filed on Jan. 6, 2014.

(51) Int. Cl.
| | | |
|---|---|---|
| *G06F 11/10* | (2006.01) | |
| *H04L 29/08* | (2006.01) | |
| *G06F 17/30* | (2006.01) | |
| *G06F 3/06* | (2006.01) | |
| *H03M 13/35* | (2006.01) | |

(52) U.S. Cl.
CPC ........ *G06F 3/0619* (2013.01); *G06F 11/1076* (2013.01); *G06F 17/30* (2013.01); *H03M 13/353* (2013.01); *H04L 67/1097* (2013.01); *G06F 2211/1028* (2013.01)

(58) Field of Classification Search
USPC .... 714/6.11, 6.12, 6.13, 6.2, 6.21, 6.23, 4.1, 714/4.11, 4.3, 4.12
See application file for complete search history.

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,035,914 | B1 | 4/2006 | Payne et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de La Torre et al. |
| 9,594,639 | B2* | 3/2017 | Khadiwala .......... G06F 11/1435 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0028673 | A1 | 2/2003 | Lin et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1* | 4/2009 | Gladwin .......... G06F 17/30067 |
| 2009/0094318 | A1 | 4/2009 | Gladwin et al. |
| 2010/0023524 | A1 | 1/2010 | Gladwin et al. |
| 2014/0298134 | A1* | 10/2014 | Grube .................. G06F 9/4401 |
| | | | 714/763 |
| 2014/0351674 | A1* | 11/2014 | Grube ................ G06F 11/1076 |
| | | | 714/764 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

(56) References Cited

OTHER PUBLICATIONS

Sermersheim; Lightweight Directory Access Protocol (LDAP): The Protocol; IETF Network Working Group; RFC 1511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

| DST allocation info 242 | data partition info 320: data ID; No. of partitions; Addr. info for each partition; format conversion indication | | | | | | |
|---|---|---|---|---|---|---|---|
| | task execution info 322 | | | | intermediate result info 324 | | |
| task 326 | task ordering 328 | data partition 330 | set of DT EX mods 332 | Name 334 | interm. result processing 336 | scratch pad storage 338 | intermediate result storage 340 |
| 1_1 | none | 2_1 - 2_z | 1_1, 2_1, 3_1, 4_1, & 5_1 | R1-1 | DST unit 1 | DST unit 1 | DST units 1-5 |
| 1_2 | none | 2_1 - 2_4 | 1_1, 2_1, 3_1, 4_1, & 5_1 | R1-2 | DST unit 1 | DST unit 1 | DST units 1-5 |
| 1_3 | none | 2_1 - 2_4 2_5 - 2_z | 1_1, 2_1, 3_1, 4_1, & 5_1 1_2, 2_2, 3_2, 4_2, & 5_2 | R1-3 | DST unit 2 | DST unit 2 | DST units 2-6 |
| 1_4 | after 1_3 | R1-3_1 - R1-3_4 R1-3_5 - R1-3_z | 1_1, 2_1, 3_1, 4_1, & 5_1 1_2, 2_2, 6_1, 7_1, & 7_2 | R1_4 | DST unit 3 | DST unit 3 | DST units 3-7 |
| 1_5 | after 1_4 | R1-4_1 - R1-4_z & 2_1 - 2_z | 1_1, 2_1, 3_1, 4_1, & 5_1 | R1-5 | DST unit 1 | DST unit 1 | DST units 1-5 |
| 1_6 | after 1_1 & 1_5 | R1-1_1 - R1-1_z & R1-5_1 - R1-5_z | 1_2, 2_1, 3_1, 4_1, & 5_1 | R1-6 | DST unit 2 | DST unit 2 | DST units 2-6 |
| 1_7 | after 1_2 & 1_5 | R1-2_1 - R1-2_z & R1-5_1 - R1-5_z | 1_2, 2_2, 3_2, 4_2, & 5_2 | R1-7 | DST unit 3 | DST unit 3 | DST units 3-7 |
| 2 | none | 2_1 - 2_z | 3_1, 4_1, 5_1, 6_1, & 7_1 | R2 | DST unit 7 | DST unit 7 | DST units 7, 1-4 |
| 3_1 | none (same as 1_3) | use R1_3 | | R1-1 | | | |
| 3_2 | after 3_1 | R1-3_1 - R1-3_z | 1_2, 2_2, 3_2, 4_2, & 5_2 | R3-2 | DST unit 5 | DST unit 5 | DST units 5,6, 1-3 |

FIG. 32

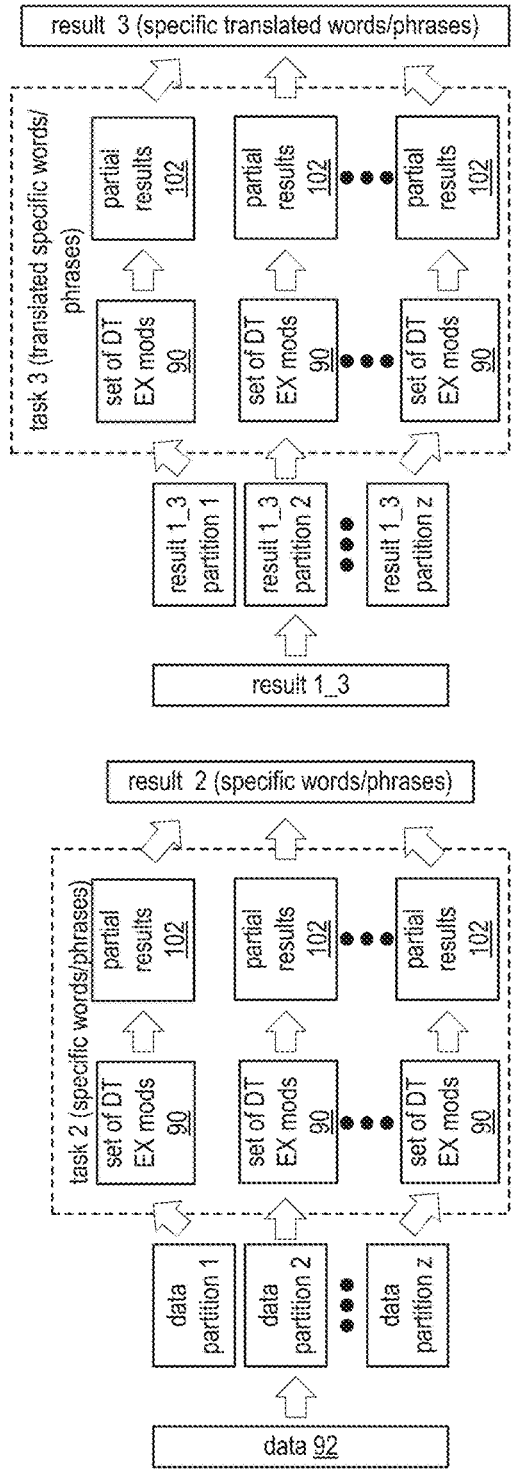
FIG. 38
FIG. 37
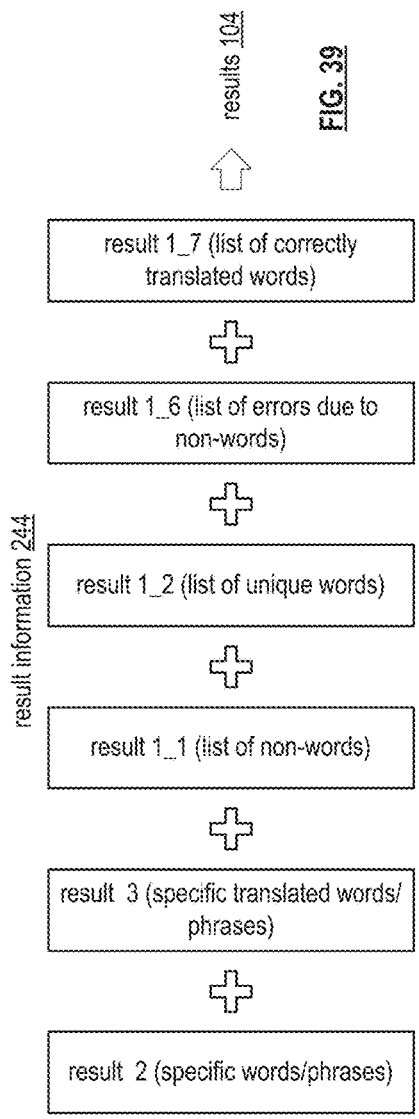
FIG. 39

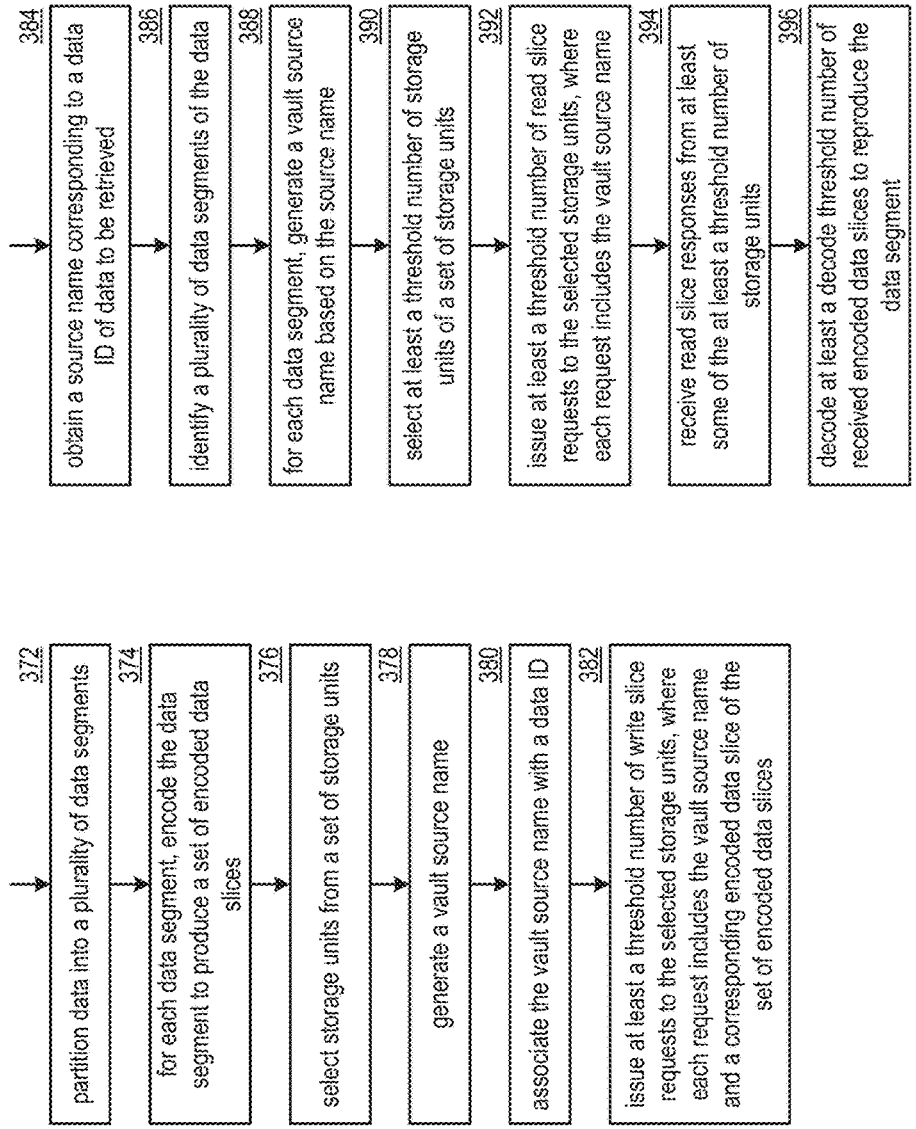

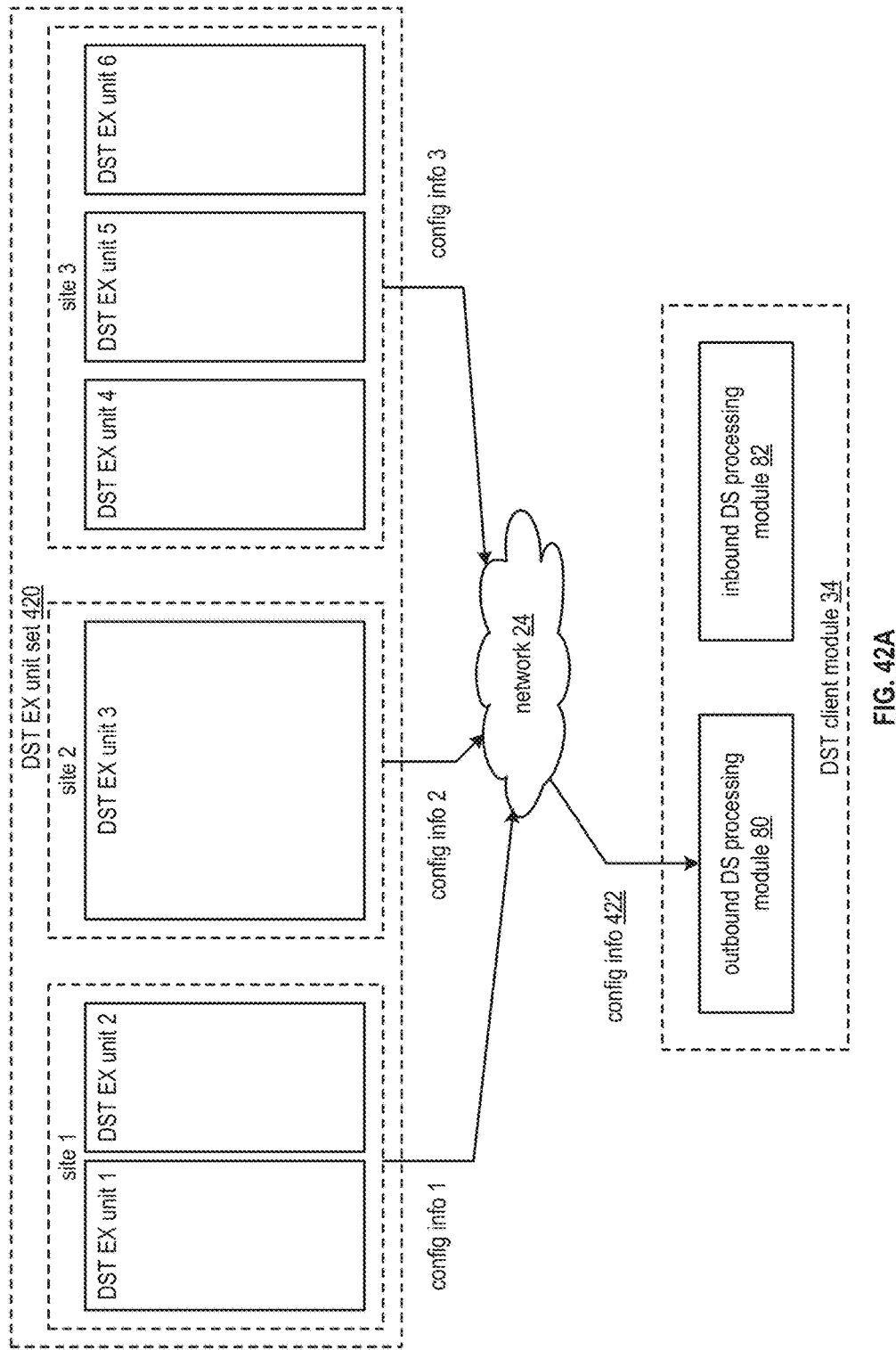

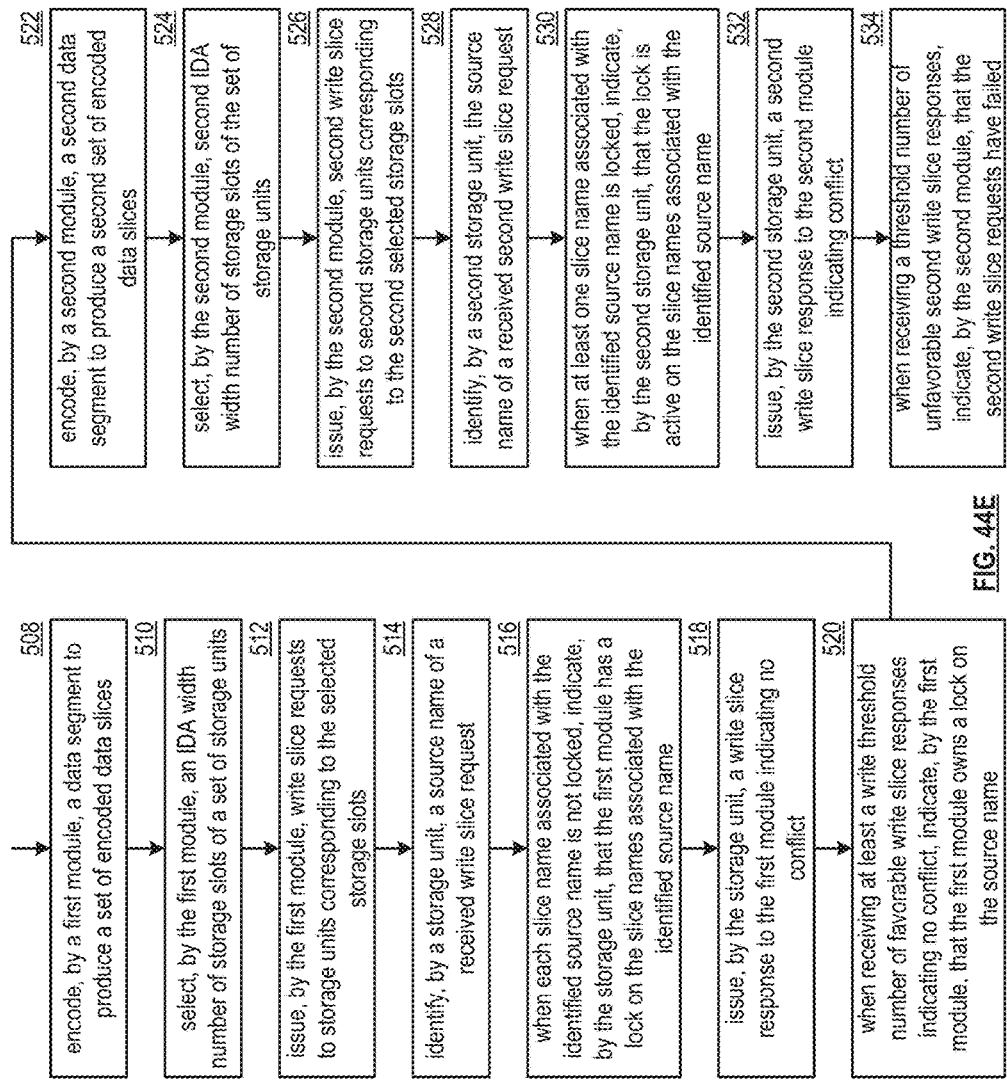

CONFIGURING STORAGE RESOURCES OF A DISPERSED STORAGE NETWORK

CROSS REFERENCE TO RELATED PATENTS

The present U.S. Utility Patent Application claims priority pursuant to 35 U.S.C. § 120 as a continuation of U.S. Utility application Ser. No. 14/527,139, entitled "CONFIGURING STORAGE RESOURCES OF A DISPERSED STORAGE NETWORK", filed Oct. 29, 2014, which claims priority pursuant to 35 U.S.C. § 119(e) to U.S. Provisional Application No. 61/924,196, entitled "CONFIGURING STORAGE SLOTS IN A DISPERSED STORAGE NETWORK", filed Jan. 6, 2014, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

Technical Field of the Invention

This invention relates generally to computer networks and more particularly to dispersed storage of data and distributed task processing of data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc., on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 32 is a diagram of an example of DST allocation information for the example of FIG. 30 in accordance with the present invention;

FIGS. 33-38 are schematic block diagrams of the DSTN module performing the example of FIG. 30 in accordance with the present invention;

FIG. 39 is a diagram of an example of combining result information into final results for the example of FIG. 30 in accordance with the present invention;

FIG. 40C is a flowchart illustrating an example of storing data in accordance with the present invention;

FIG. 40D is a flowchart illustrating an example of retrieving data in accordance with the present invention;

Figure 42B:
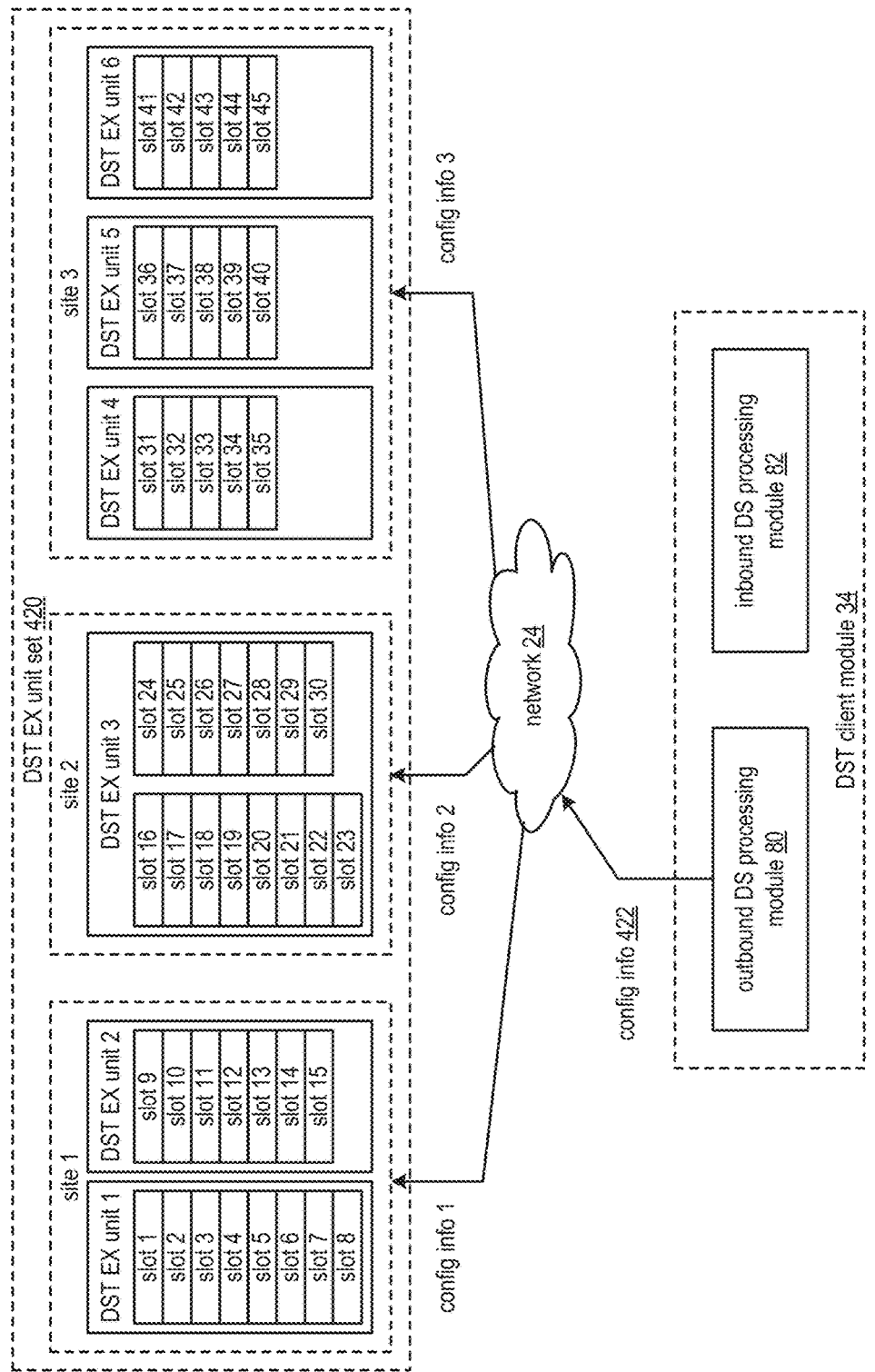
Figure 42C:
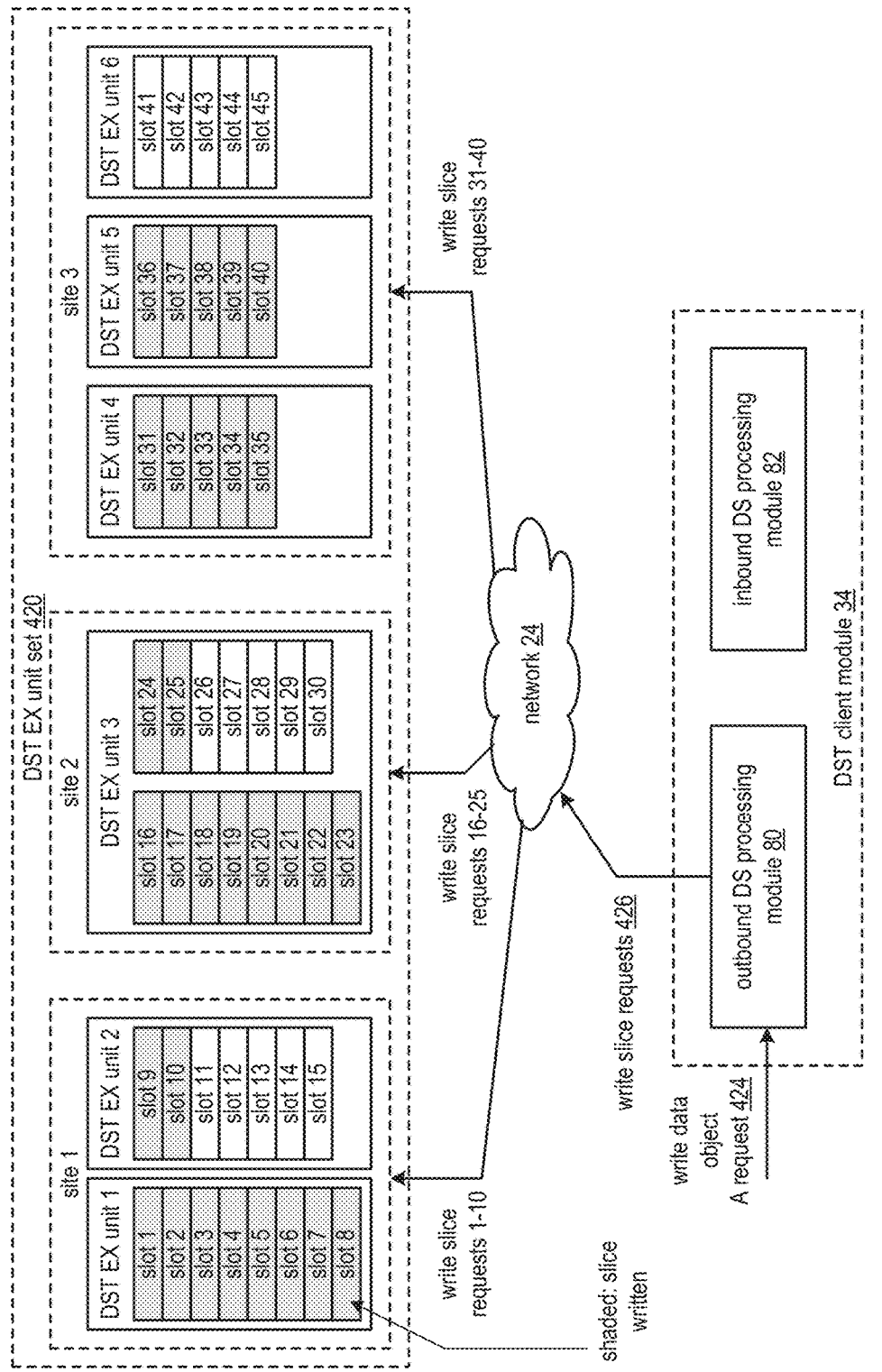
Figure 42D:
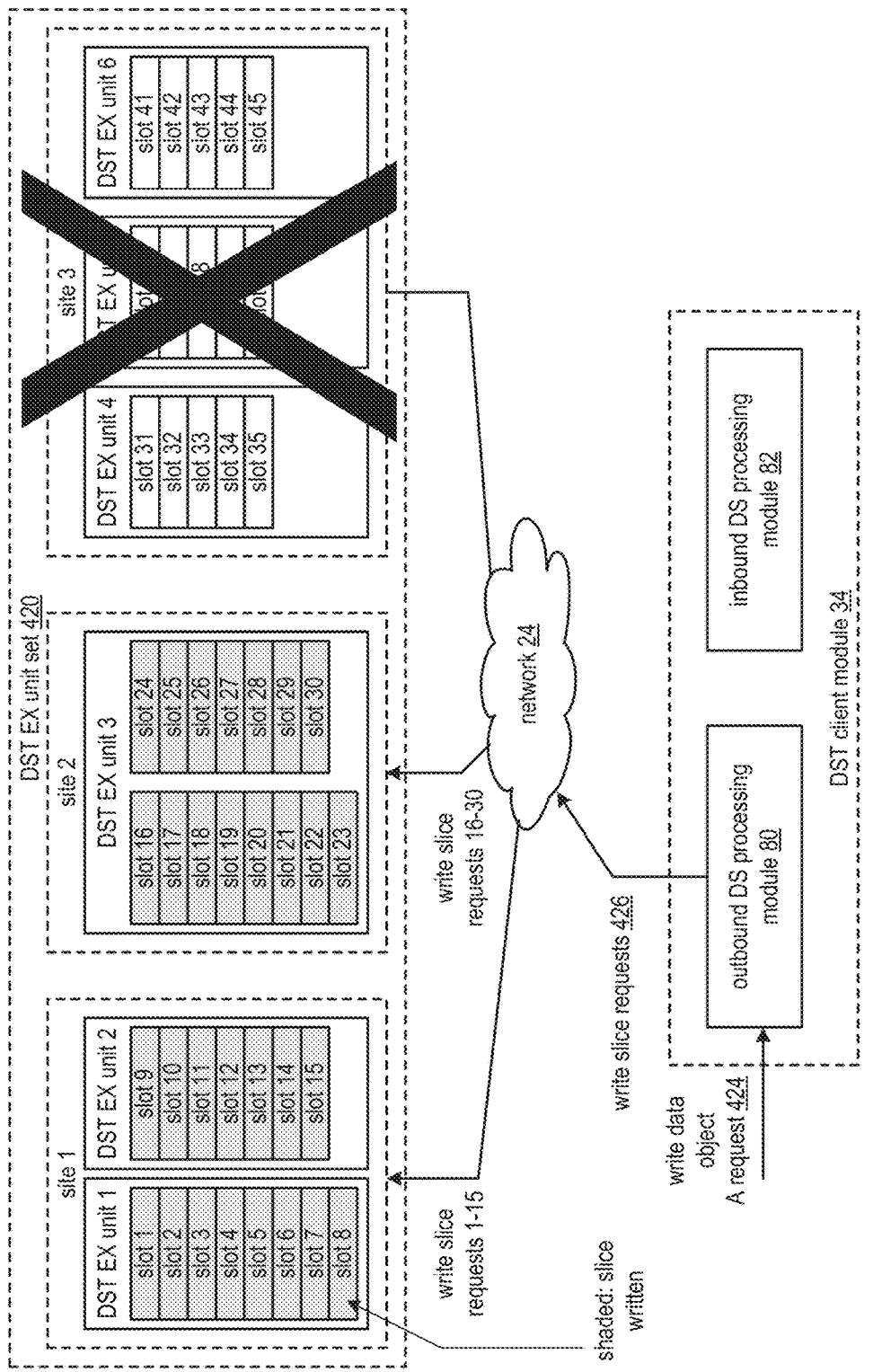
Figure 42E:
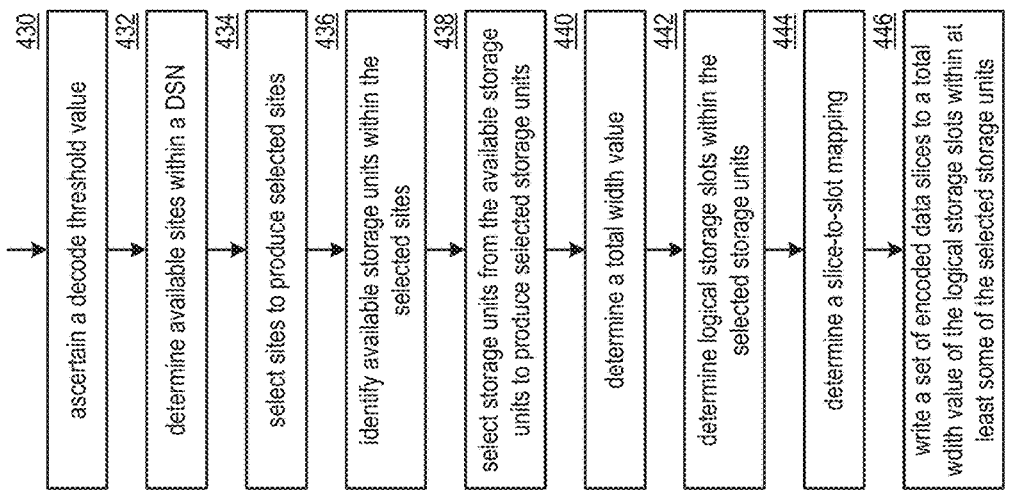
Figure 43A:
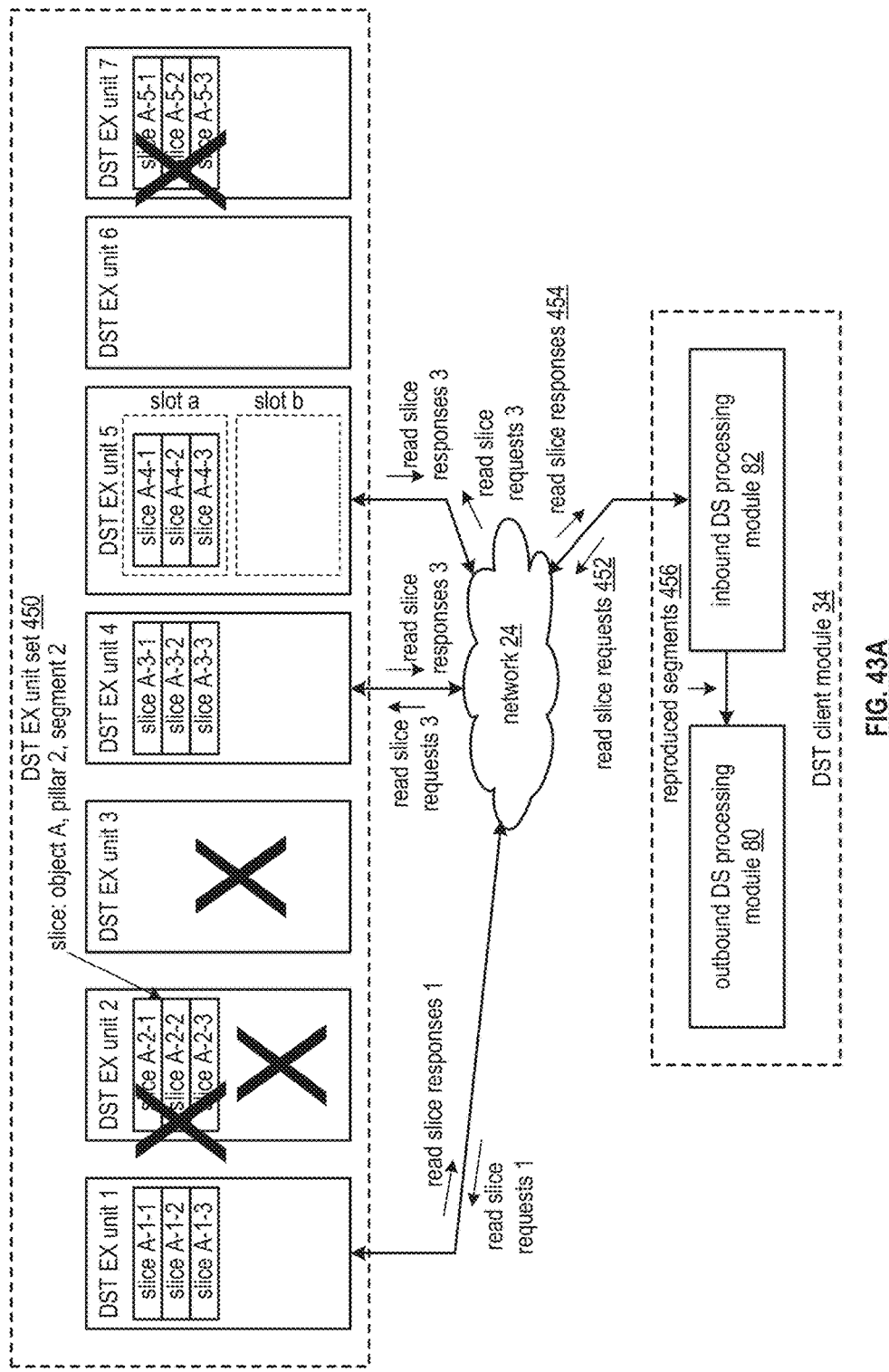
Figure 43B:
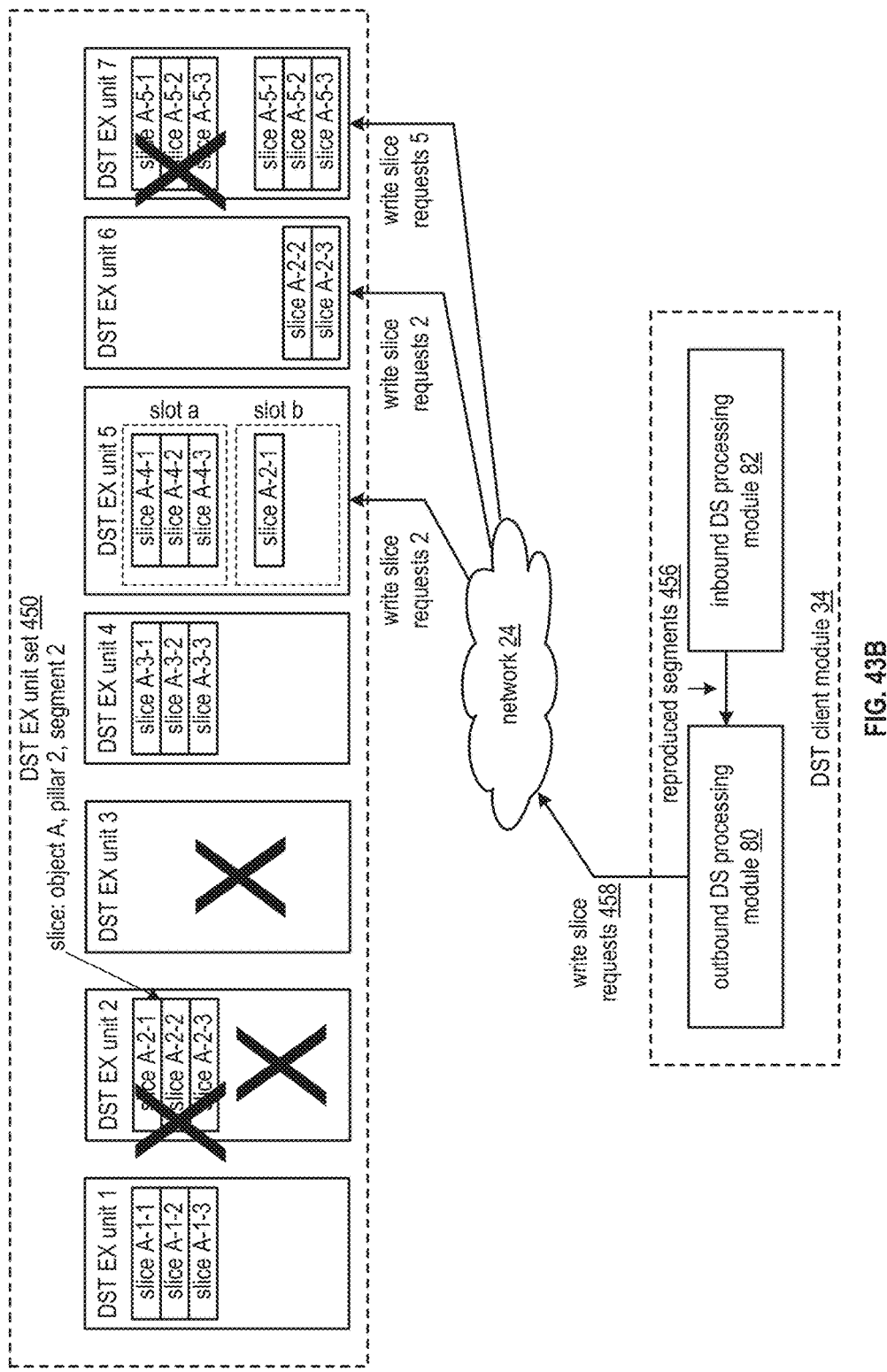
Figure 43C:
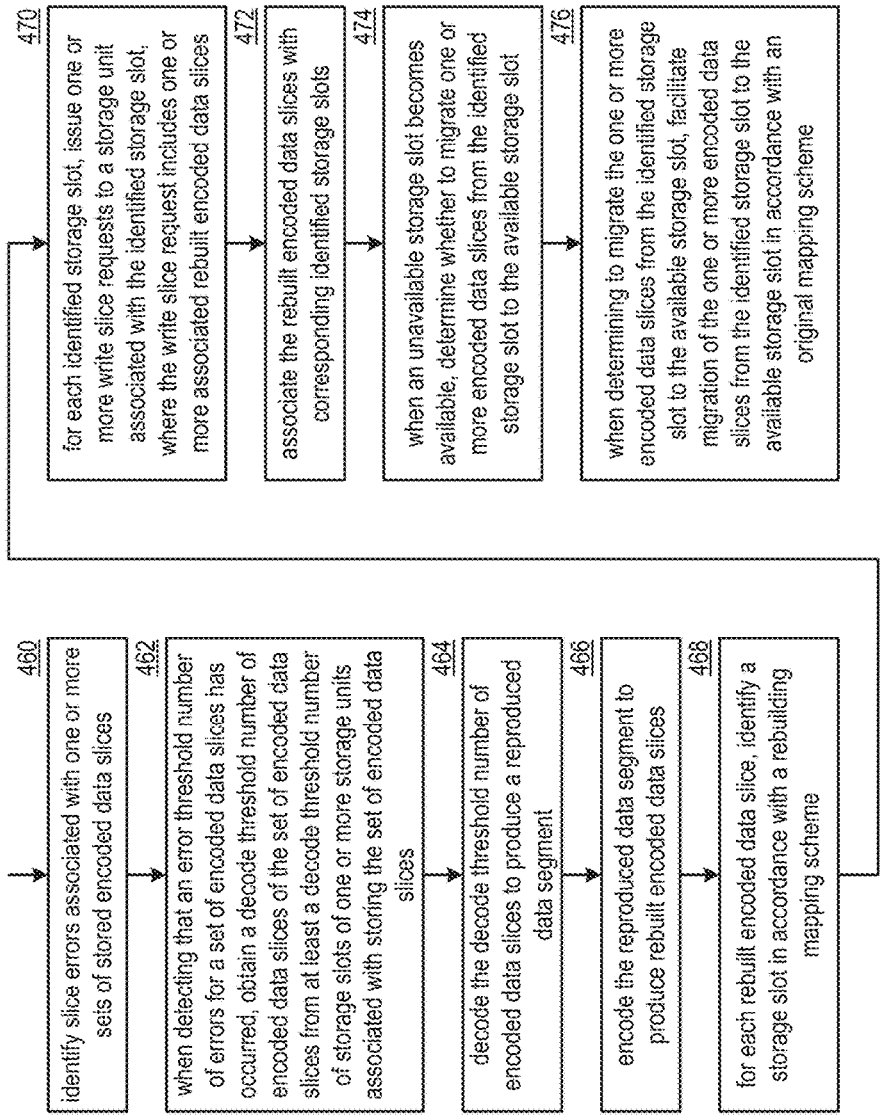
Figure 44A:
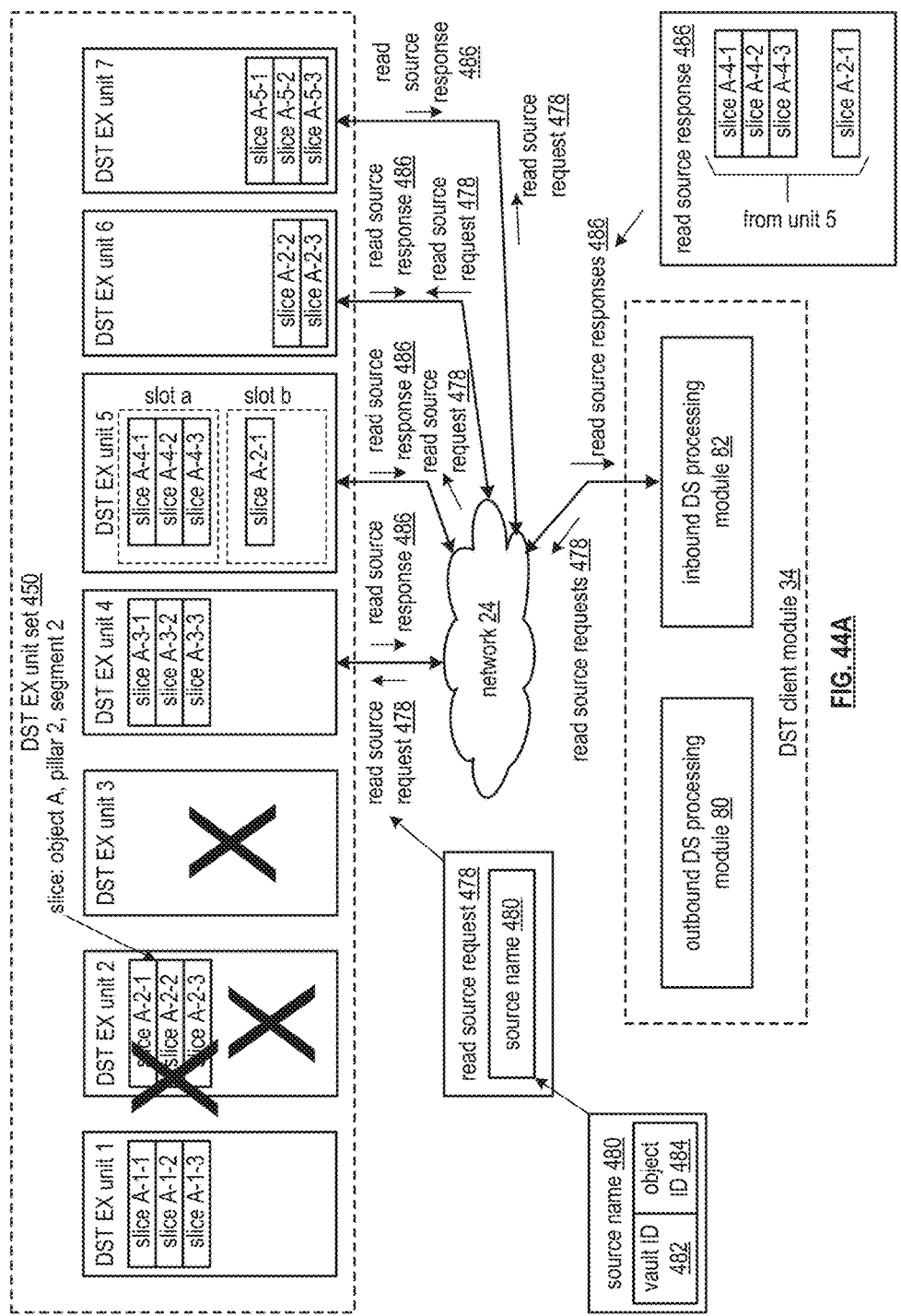
Figure 44B:
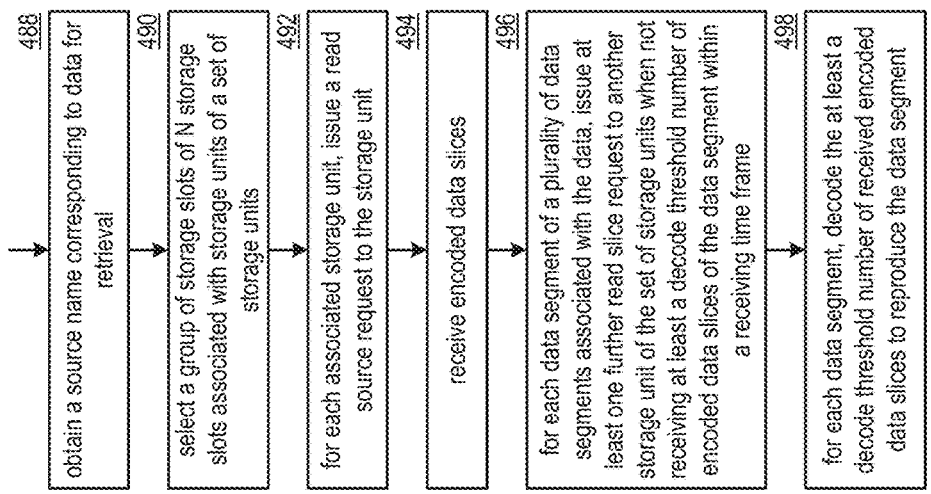
Figure 44C:
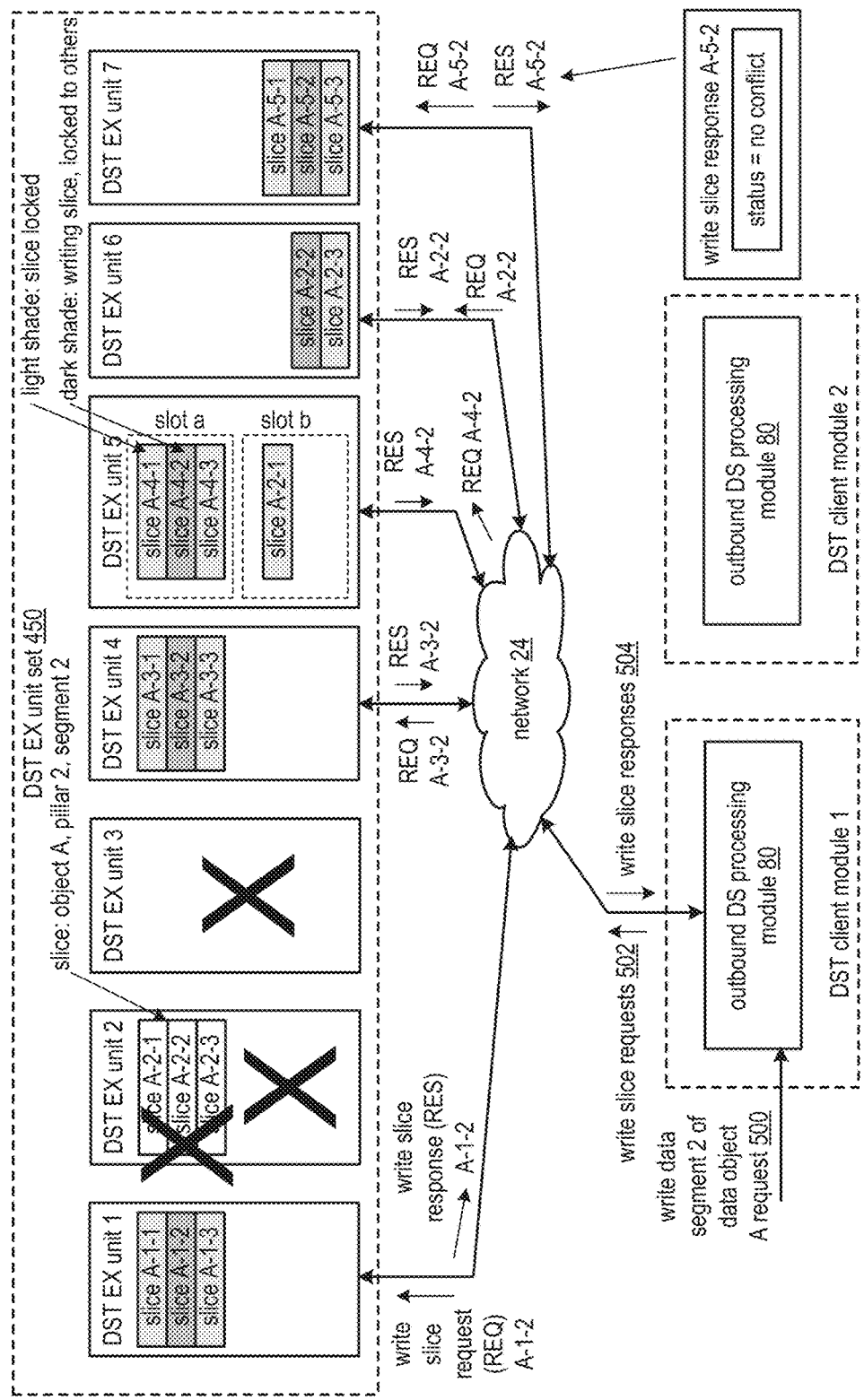
Figure 44D:
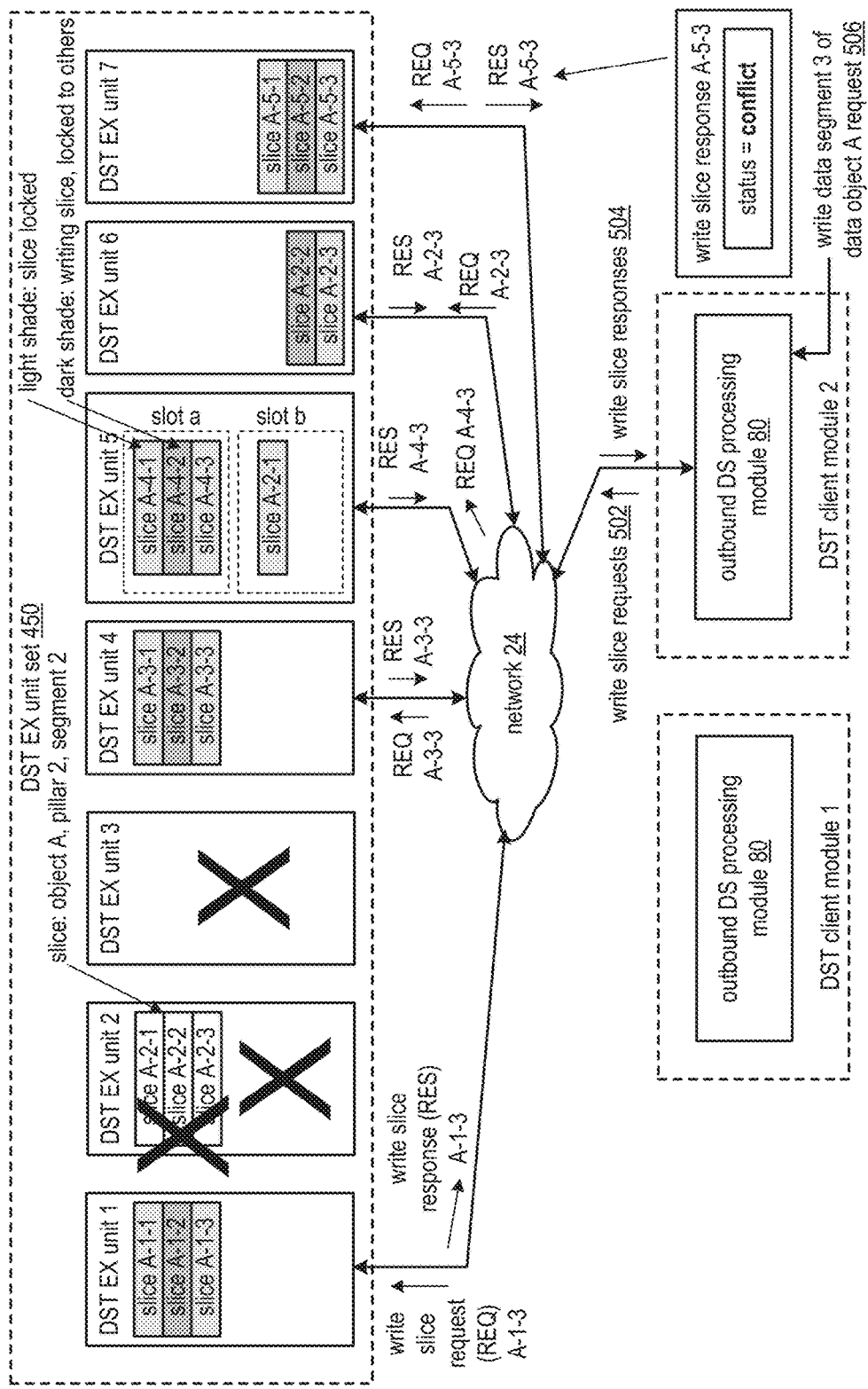
Figure 45A:
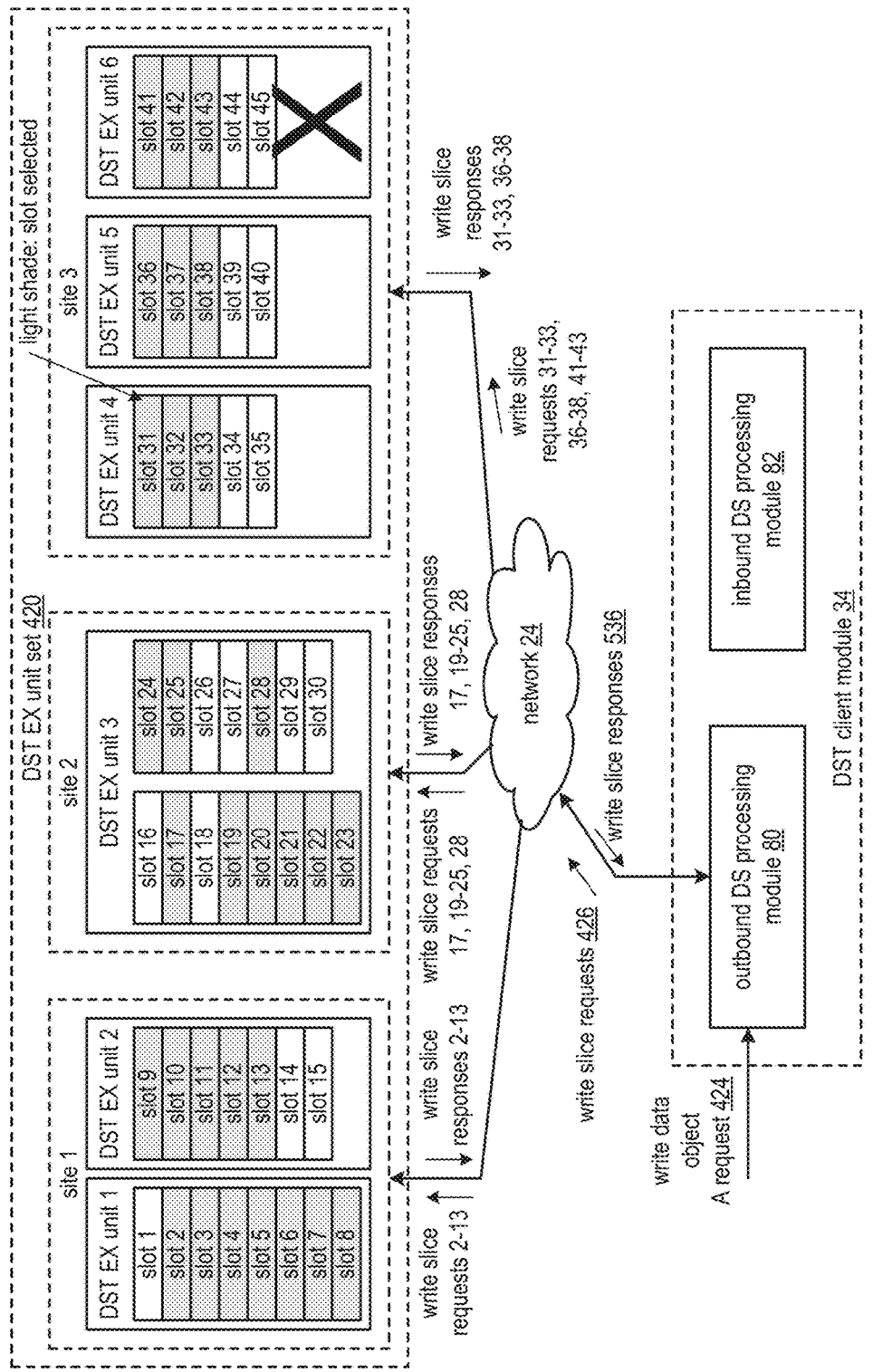
Figure 45B:
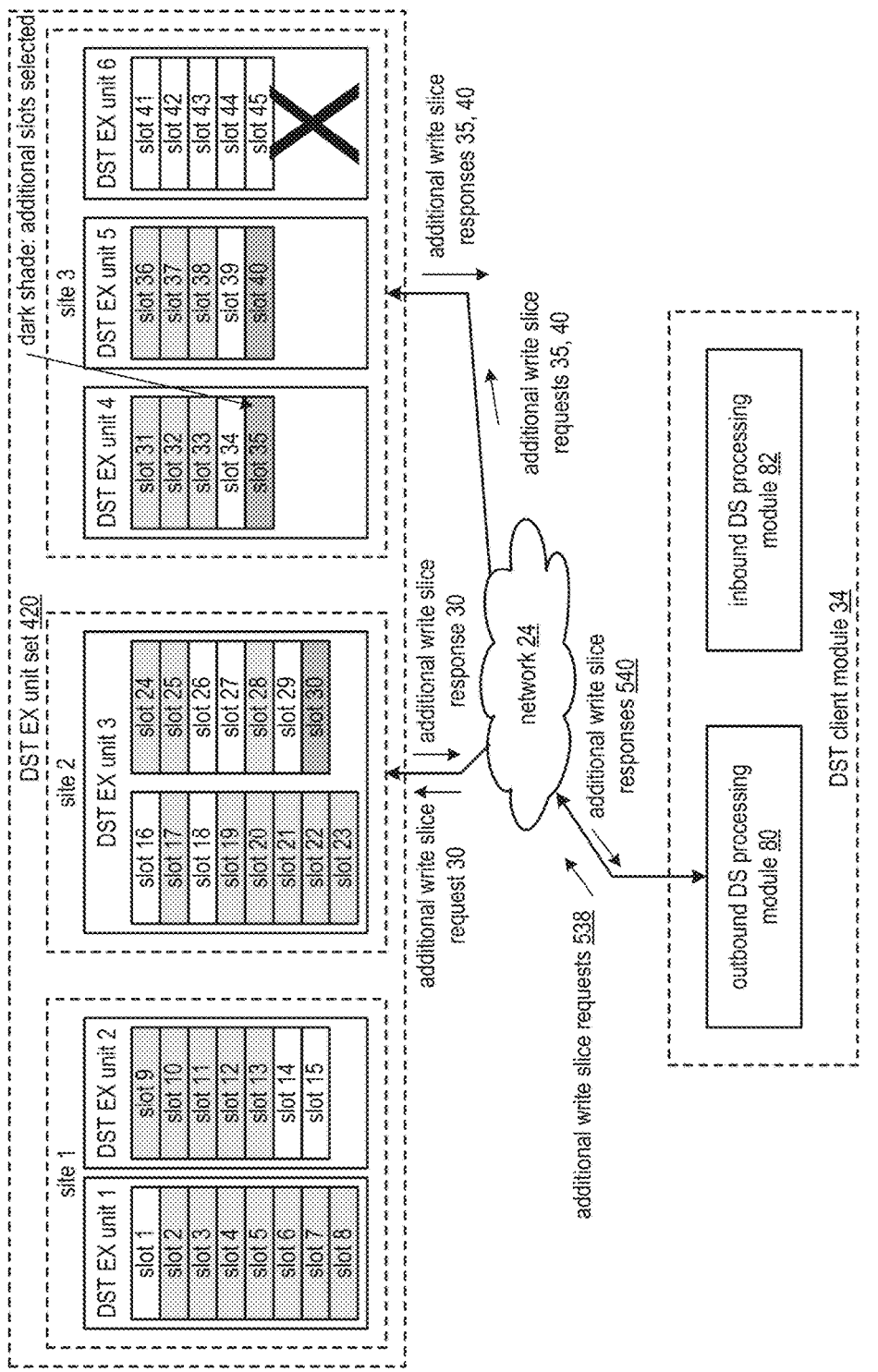
Figure 45C:
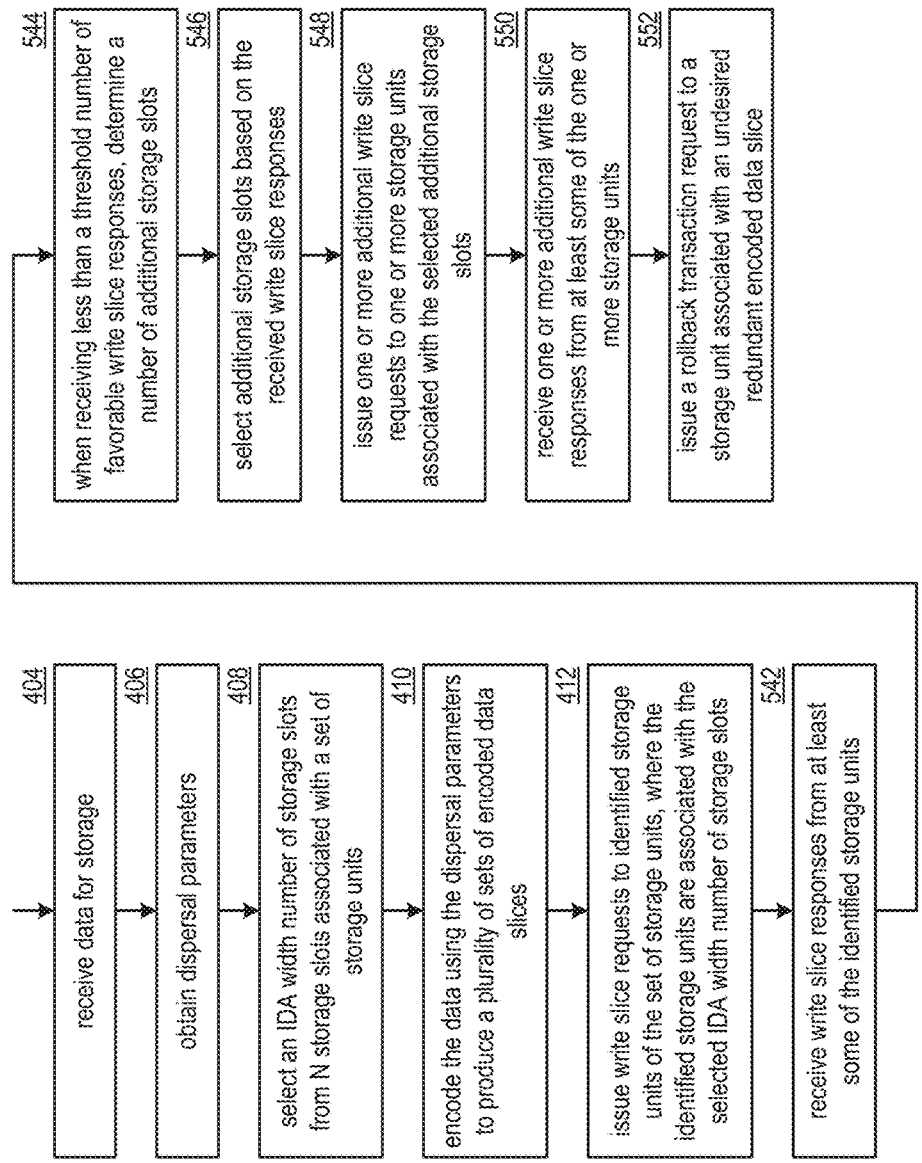
Figure 46A:
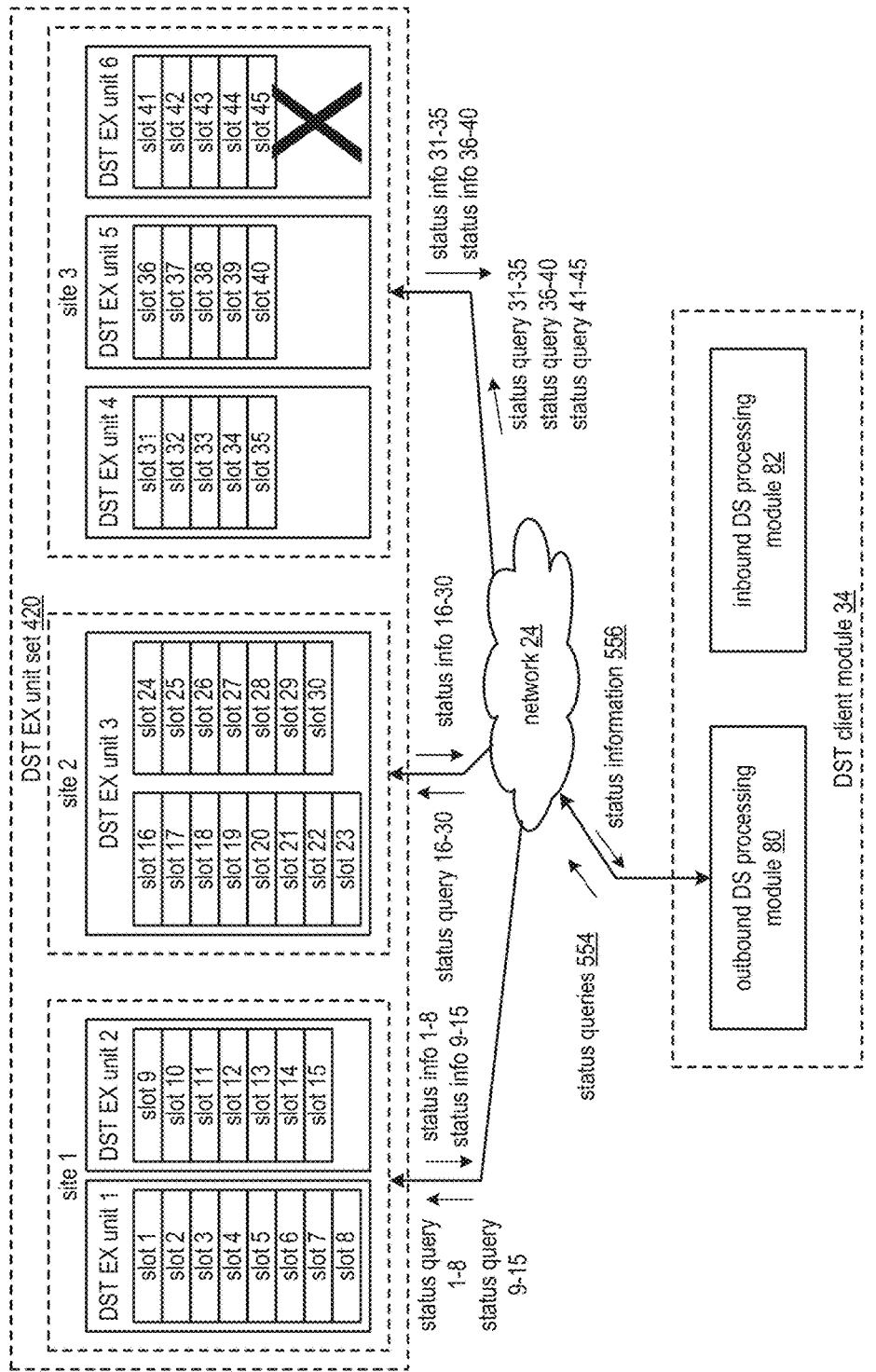
Figure 46B:
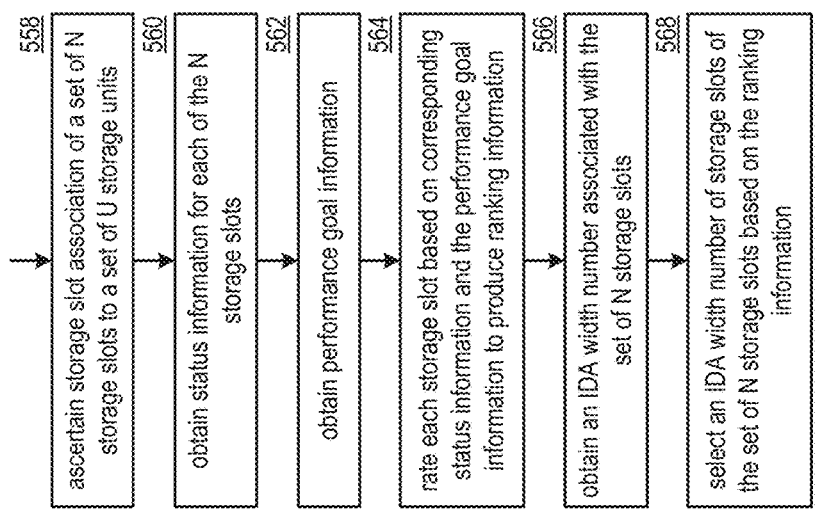
Figure 47A:
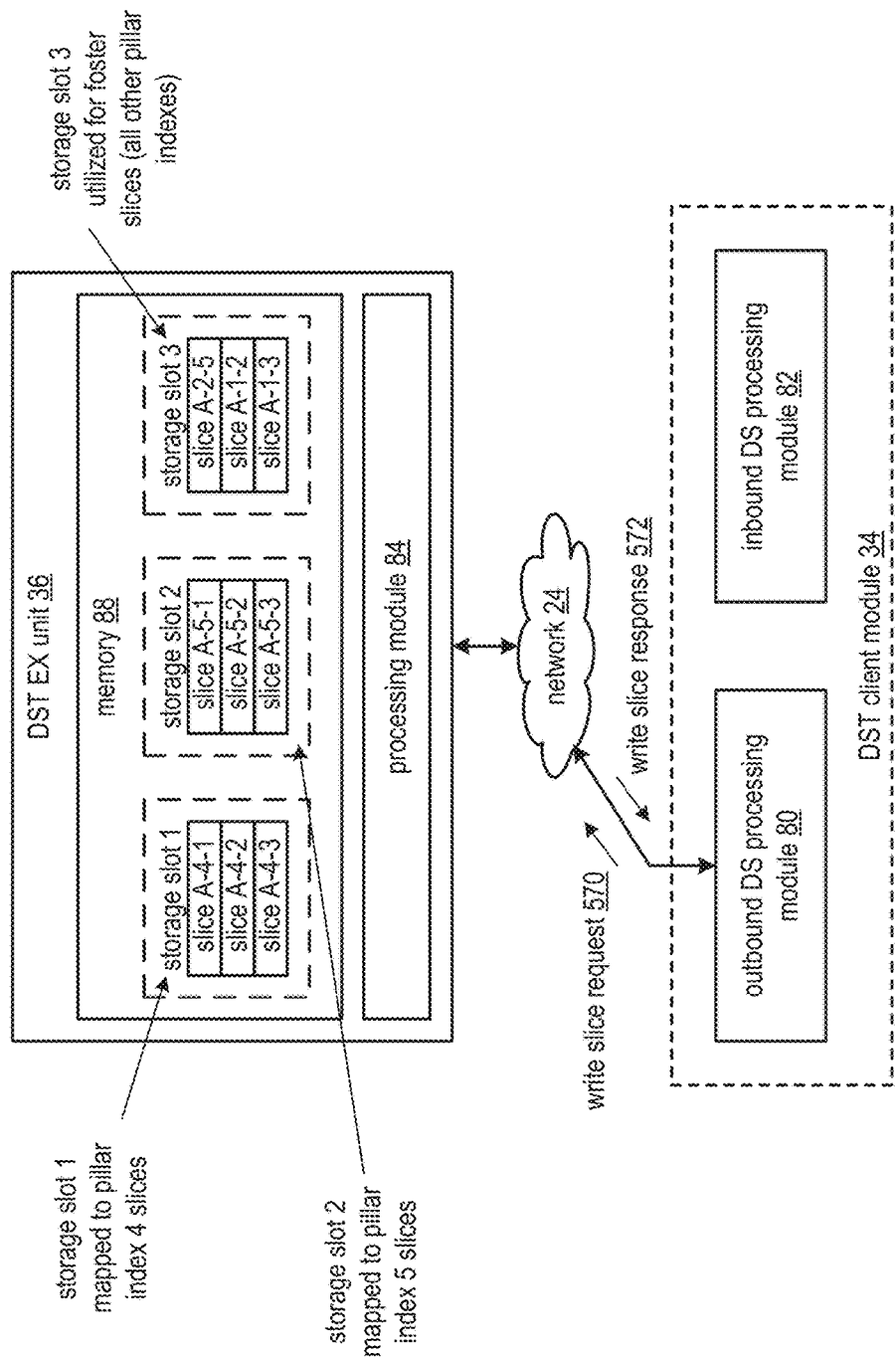
Figure 47B:
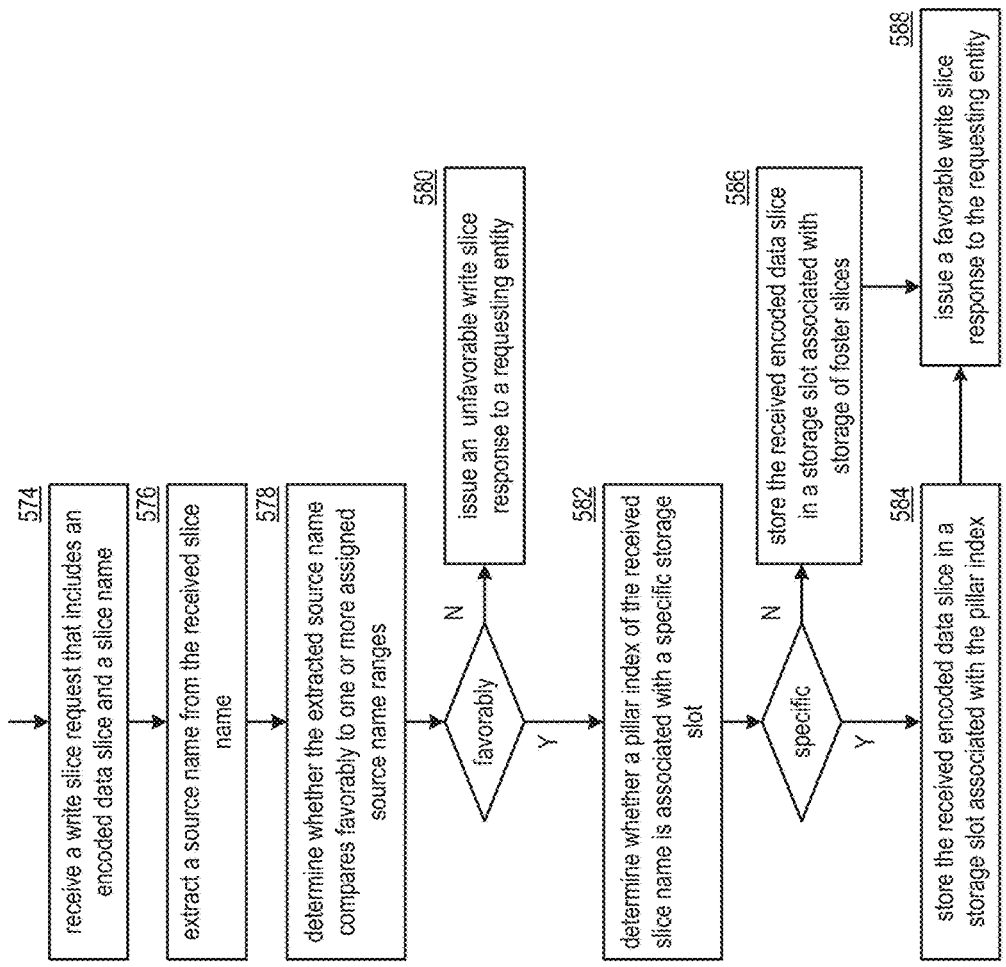
Figure 48A:
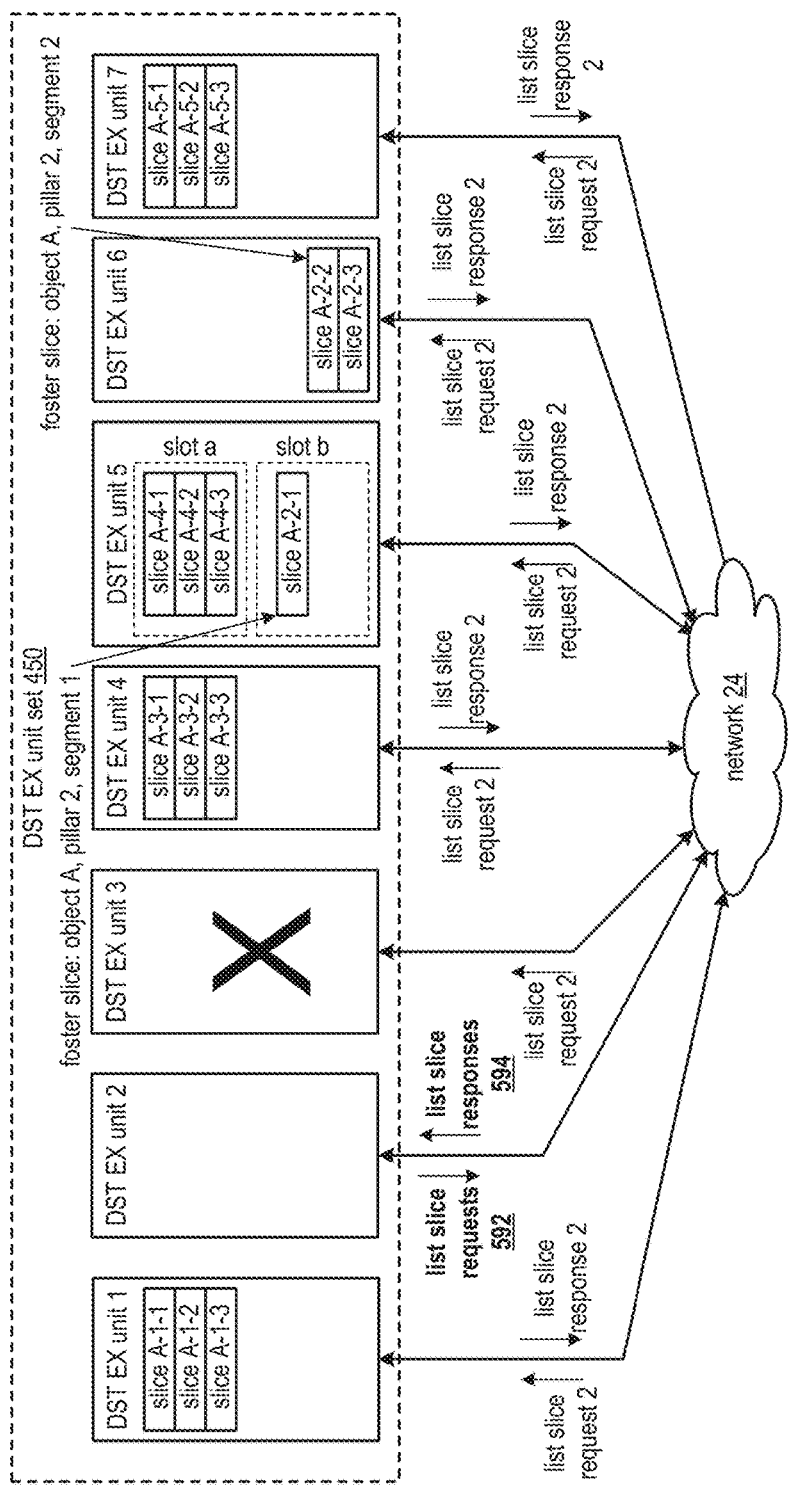
Figure 48B:
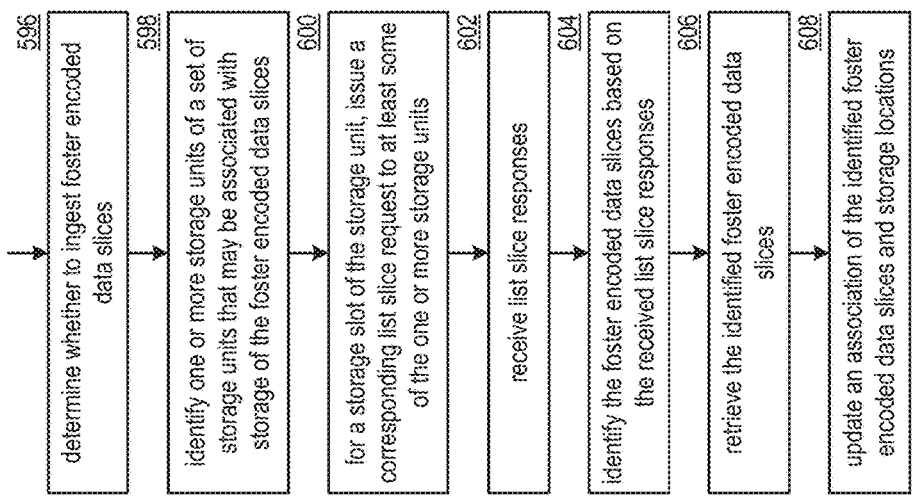
Figure 48C:
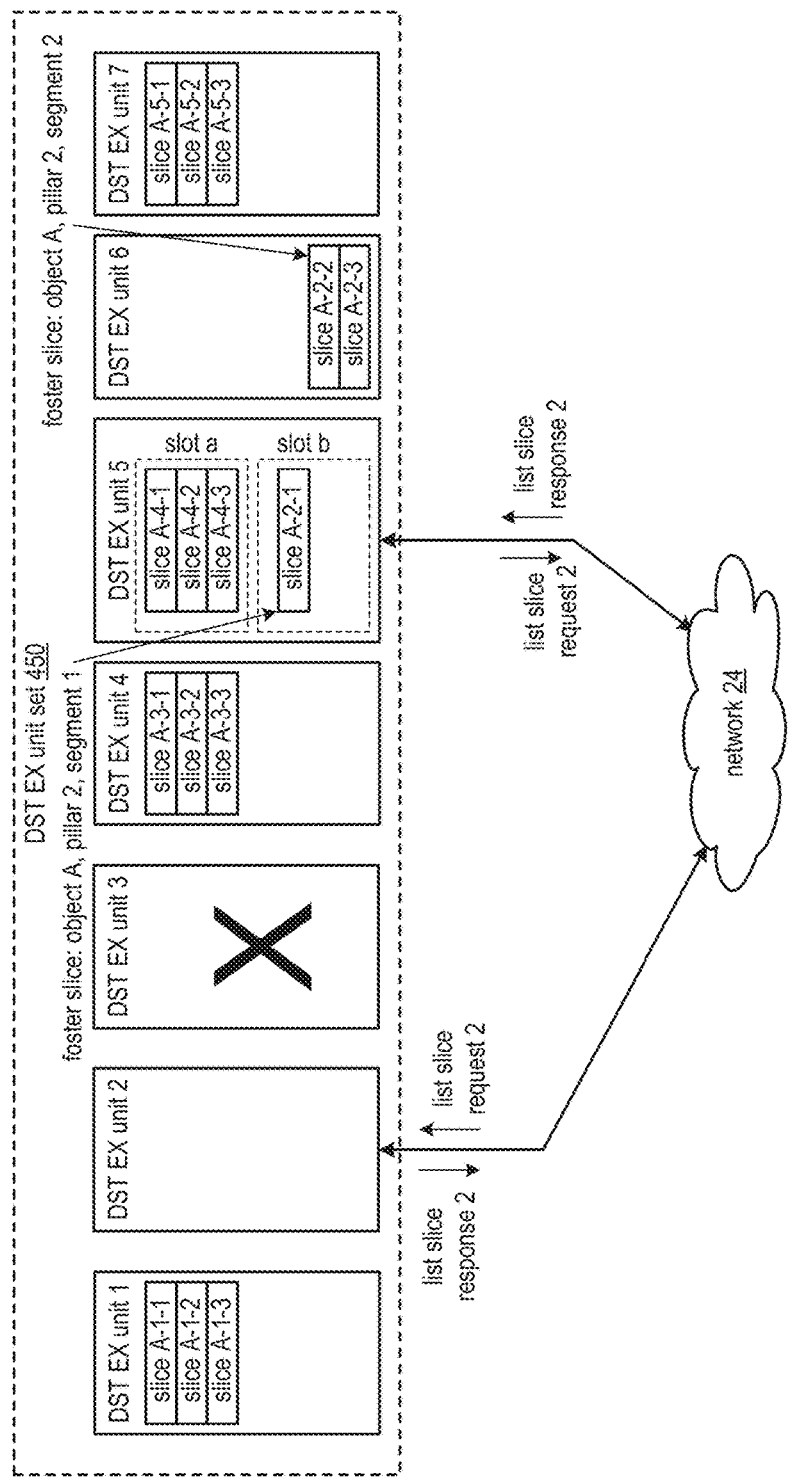
Figure 48D:
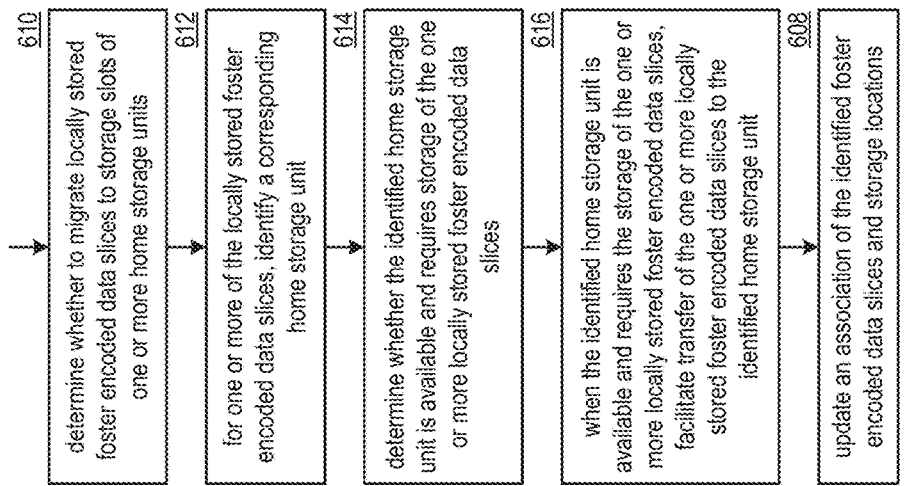
Figure 49A:
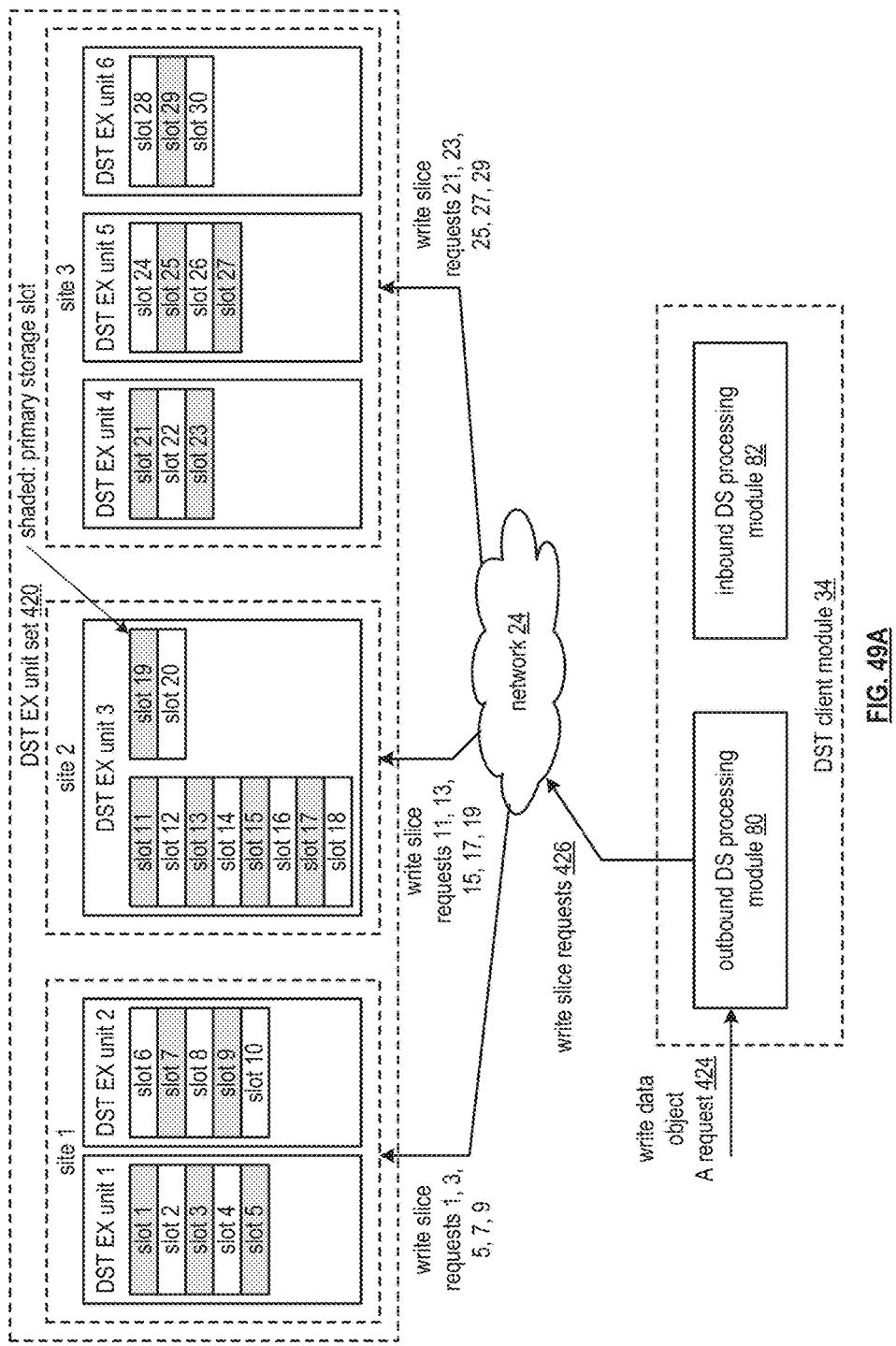
Figure 49B:
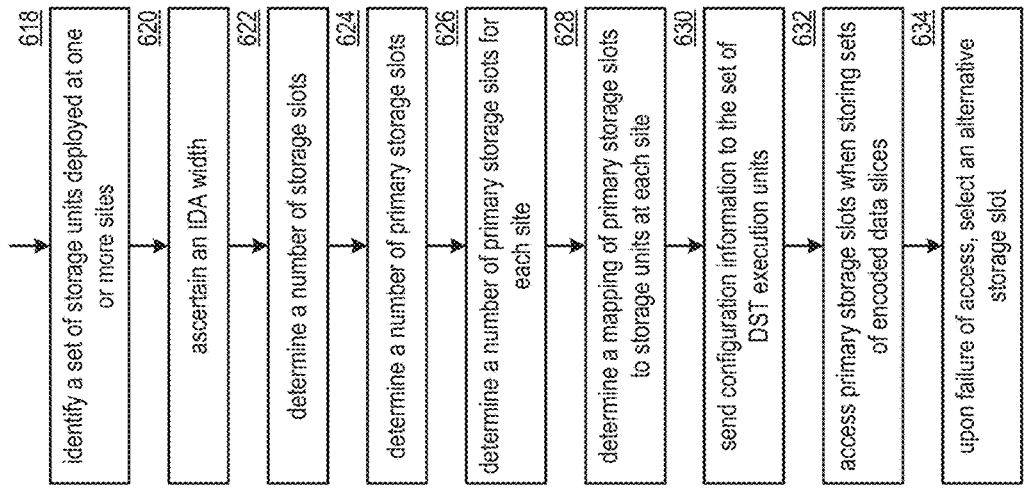
Figure 50A:
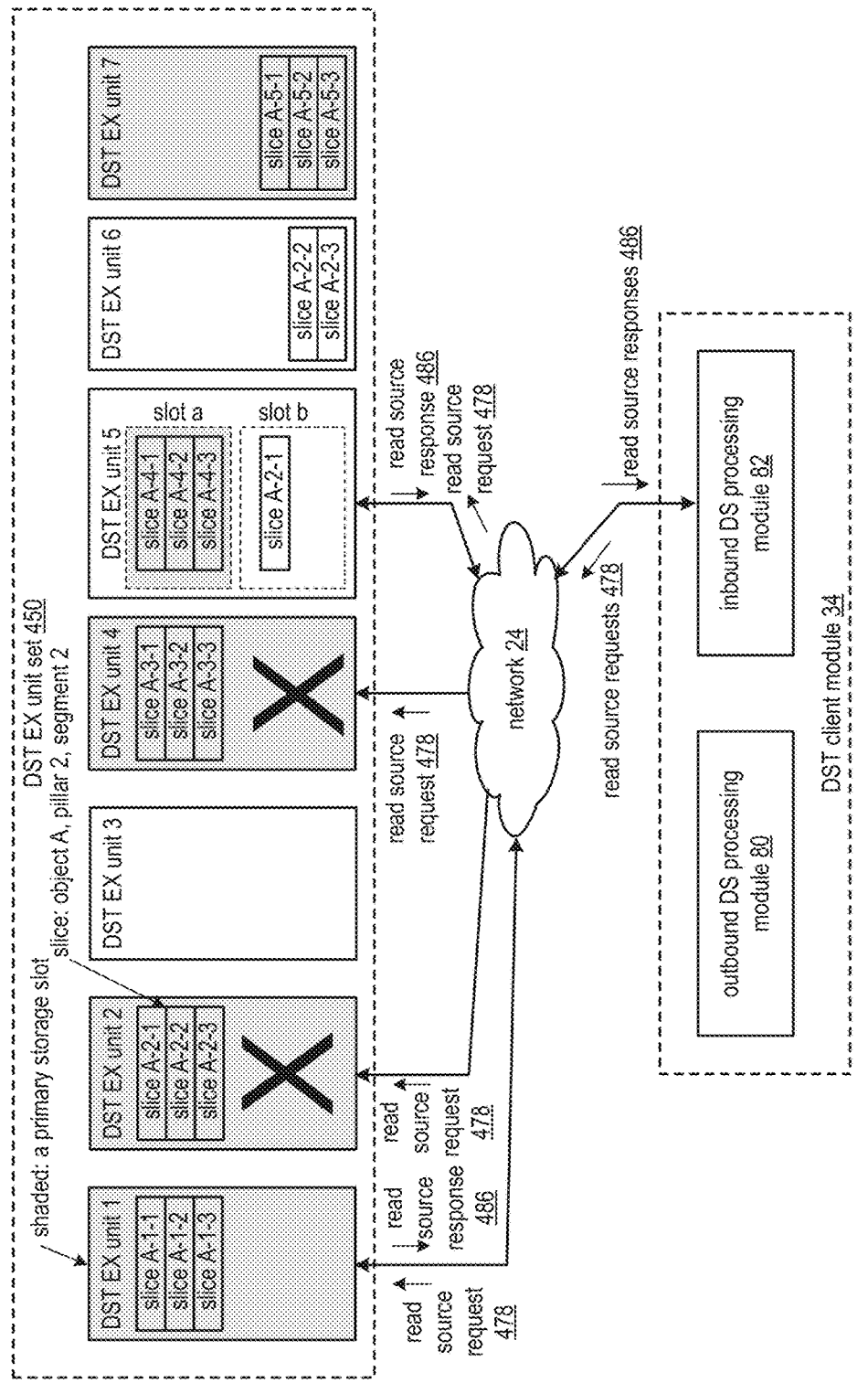
Figure 50B:
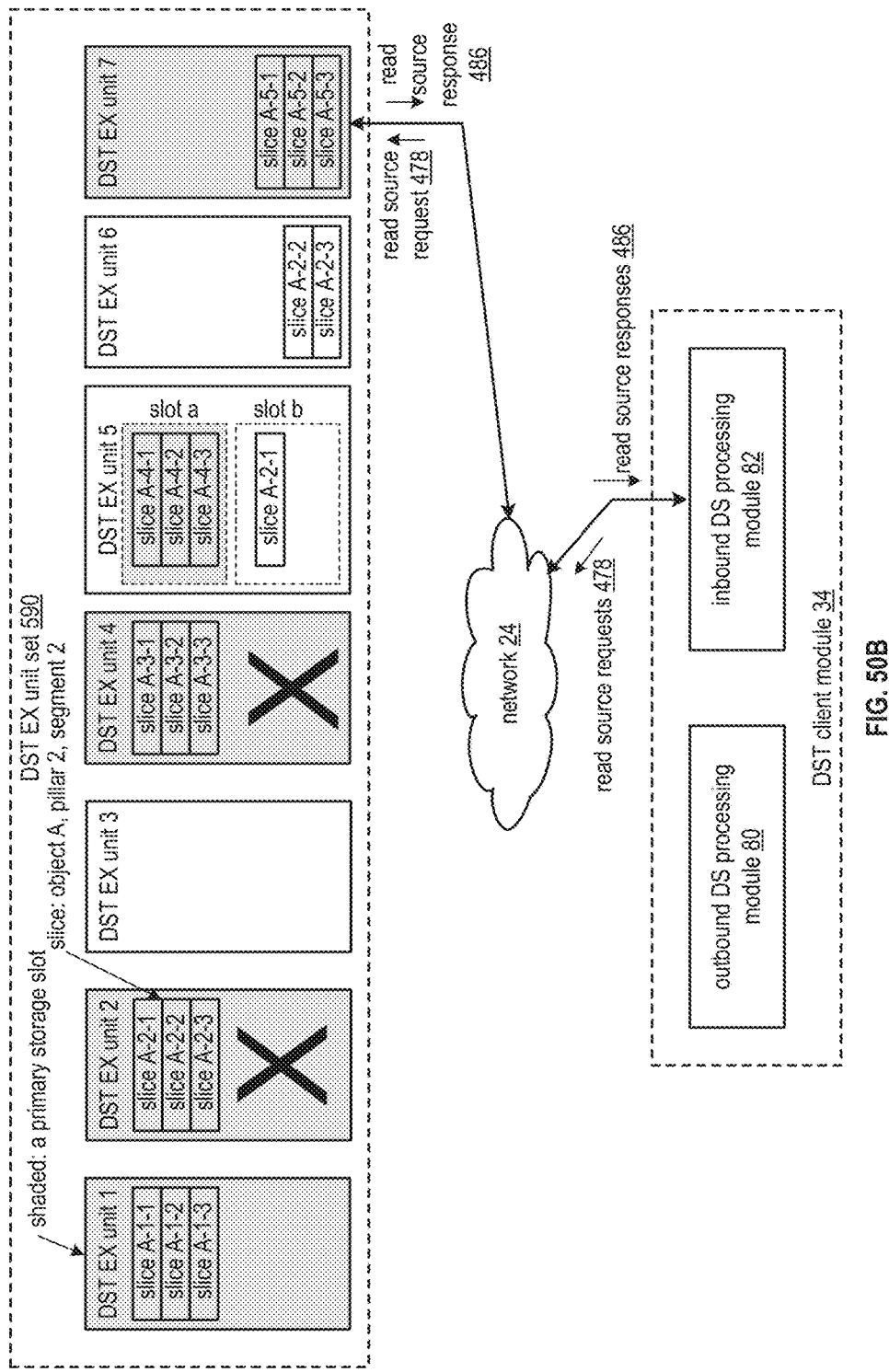
Figure 50C:
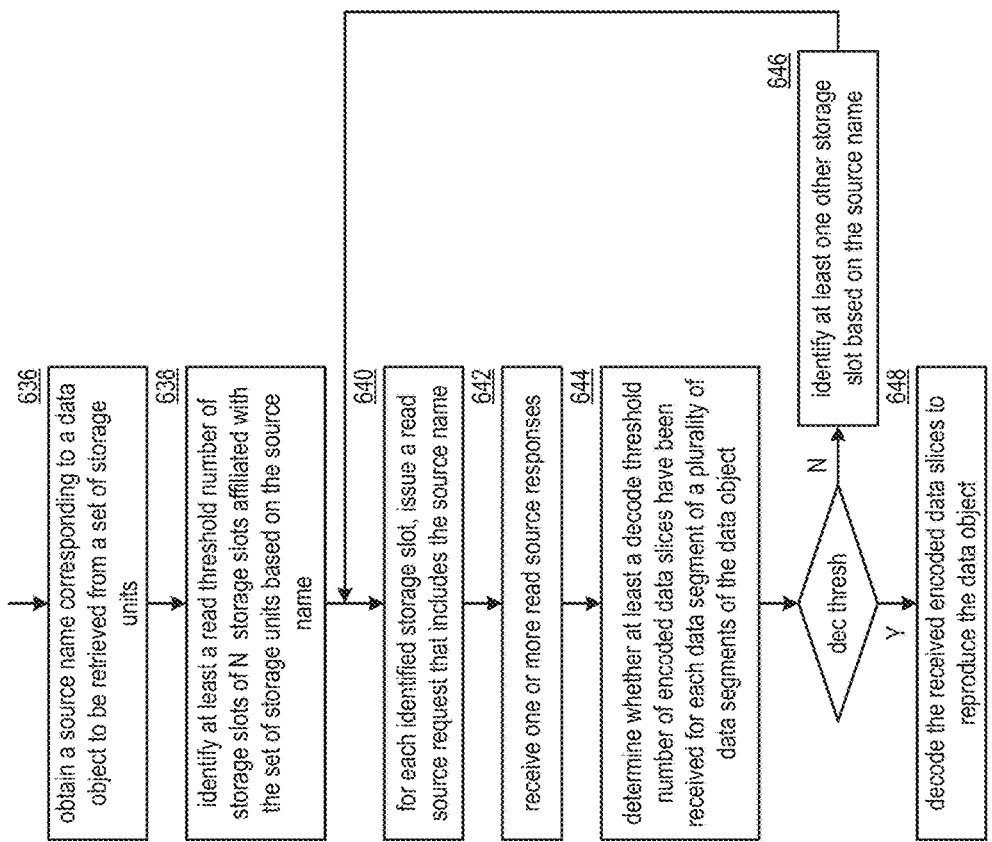

FIGS. 42A-D are schematic block diagrams of an embodiment of another dispersed storage network (DSN) in accordance with the present invention;

FIG. 42E is a flowchart illustrating an example of configuring a set of storage units in accordance with the present invention;

FIGS. 43A and 43B are schematic block diagrams of another embodiment of a dispersed storage network (DSN) in accordance with the present invention;

FIG. 43C is a flowchart illustrating an example of rebuilding an encoded data slices in accordance with the present invention;

FIG. 44A is a schematic block diagram of another embodiment of a dispersed storage network (DSN) in accordance with the present invention;

FIG. 44B is a flowchart illustrating another example of retrieving data in accordance with the present invention;

FIGS. 44C and 44D are schematic block diagrams of another embodiment of a dispersed storage network (DSN) in accordance with the present invention;

FIG. 44E is a flowchart illustrating an example of storing encoded data slices in accordance with the present invention;

FIGS. 45A and 45B are schematic block diagrams illustrating another example of a dispersed storage network (DSN) in accordance with the present invention;

FIG. 45C is a flowchart illustrating another example of storing encoded data slices in accordance with the present invention;

FIG. 46A is a schematic block diagram of another embodiment of a dispersed storage network (DSN) in accordance with the present invention;

FIG. 46B is a flowchart illustrating an example of selecting storage slots in accordance with the present invention;

FIG. 47A is a schematic block diagram of another embodiment of a distributed storage and task (DST) execution unit in accordance with the present invention;

FIG. 47B is a flowchart illustrating another example of storing encoded data slices in accordance with the present invention;

FIGS. 48A and 48C are schematic block diagrams of another embodiment of a dispersed storage network (DSN) in accordance with the present invention;

FIG. 48B is a flowchart illustrating an example of migrating encoded data slices in accordance with the present invention;

FIG. 48D is a flowchart illustrating another example of migrating encoded data slices in accordance with the present invention;

FIG. 49A is a schematic block diagram of another embodiment of a dispersed storage network (DSN) in accordance with the present invention;

FIG. 49B is a flowchart illustrating another example of configuring a set of storage units in accordance with the present invention;

FIGS. 50A and 50B are schematic block diagrams of another embodiment of a dispersed storage network (DSN) in accordance with the present invention; and FIG. 50C is a flowchart illustrating another example of selecting storage slots in accordance with the present invention.

DETAILED DESCRIPTION OF THE INVENTION

Figure 1:
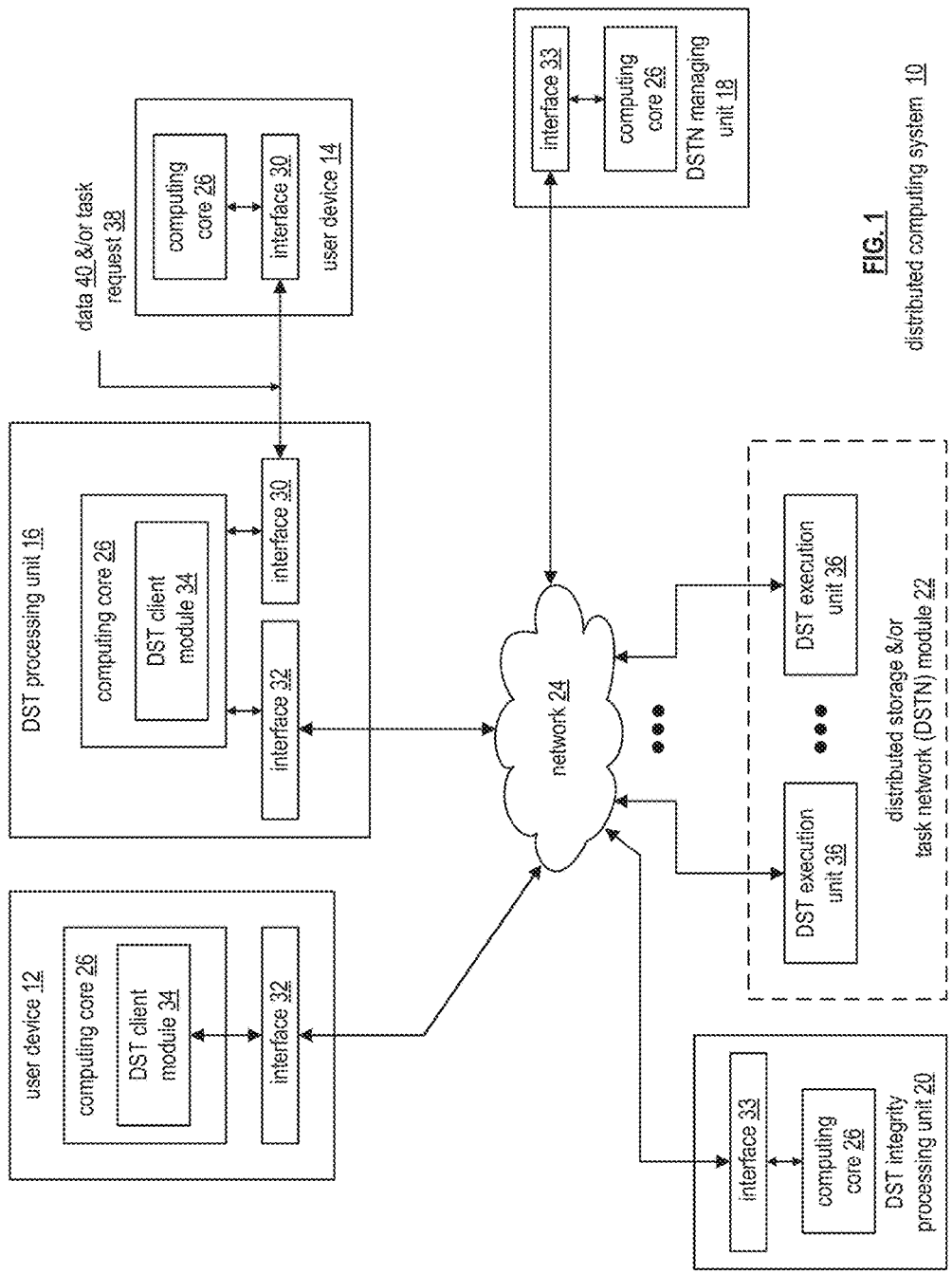
FIG. 1 is a schematic block diagram of an embodiment of a distributed computing system in accordance with the present invention.

FIG. 1 is a schematic block diagram of an embodiment of a distributed computing system 10 that includes a user device 12 and/or a user device 14, a distributed storage and/or task (DST) processing unit 16, a distributed storage and/or task network (DSTN) managing unit 18, a DST integrity processing unit 20, and a distributed storage and/or task network (DSTN) module 22. The components of the distributed computing system 10 are coupled via a network 24, which may include one or more wireless and/or wire lined communication systems; one or more private intranet systems and/or public internet systems; and/or one or more local area networks (LAN) and/or wide area networks (WAN).

The DSTN module 22 includes a plurality of distributed storage and/or task (DST) execution units 36 that may be located at geographically different sites (e.g., one in Chicago, one in Milwaukee, etc.). Each of the DST execution units is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc.

Each of the user devices 12-14, the DST processing unit 16, the DSTN managing unit 18, and the DST integrity processing unit 20 include a computing core 26 and may be a portable computing device and/or a fixed computing device. A portable computing device may be a social networking device, a gaming device, a cell phone, a smart phone, a personal digital assistant, a digital music player, a digital video player, a laptop computer, a handheld computer, a tablet, a video game controller, and/or any other portable device that includes a computing core. A fixed computing device may be a personal computer (PC), a computer server, a cable set-top box, a satellite receiver, a television set, a printer, a fax machine, home entertainment equipment, a video game console, and/or any type of home or office computing equipment. User device 12 and DST processing unit 16 are configured to include a DST client module 34.

With respect to interfaces, each interface 30, 32, and 33 includes software and/or hardware to support one or more communication links via the network 24 indirectly and/or directly. For example, interface 30 supports a communication link (e.g., wired, wireless, direct, via a LAN, via the network 24, etc.) between user device 14 and the DST processing unit 16. As another example, interface 32 supports communication links (e.g., a wired connection, a wireless connection, a LAN connection, and/or any other type of connection to/from the network 24) between user device 12 and the DSTN module 22 and between the DST processing unit 16 and the DSTN module 22. As yet another example, interface 33 supports a communication link for each of the DSTN managing unit 18 and DST integrity processing unit 20 to the network 24.

The distributed computing system 10 is operable to support dispersed storage (DS) error encoded data storage and retrieval, to support distributed task processing on received data, and/or to support distributed task processing on stored data. In general and with respect to DS error encoded data storage and retrieval, the distributed computing system 10 supports three primary operations: storage management, data storage and retrieval (an example of which will be discussed with reference to FIGS. 20-26), and data storage integrity verification. In accordance with these three primary functions, data can be encoded, distributedly stored in physically different locations, and subsequently retrieved in a reliable and secure manner. Such a system is tolerant of a significant number of failures (e.g., up to a failure level, which may be greater than or equal to a pillar width minus a decode threshold minus one) that may result from individual storage device failures and/or network equipment failures without loss of data and without the need for a redundant or backup copy. Further, the system allows the data to be stored for an indefinite period of time without data loss and does so in a secure manner (e.g., the system is very resistant to attempts at hacking the data).

The second primary function (i.e., distributed data storage and retrieval) begins and ends with a user device 12-14. For instance, if a second type of user device 14 has data 40 to store in the DSTN module 22, it sends the data 40 to the DST processing unit 16 via its interface 30. The interface 30 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). In addition, the interface 30 may attach a user identification code (ID) to the data 40.

To support storage management, the DSTN managing unit 18 performs DS management services. One such DS management service includes the DSTN managing unit 18 establishing distributed data storage parameters (e.g., vault creation, distributed storage parameters, security parameters, billing information, user profile information, etc.) for a user device 12-14 individually or as part of a group of user devices. For example, the DSTN managing unit 18 coordinates creation of a vault (e.g., a virtual memory block) within memory of the DSTN module 22 for a user device, a group of devices, or for public access and establishes per vault dispersed storage (DS) error encoding parameters for a vault. The DSTN managing unit 18 may facilitate storage of DS error encoding parameters for each vault of a plurality of vaults by updating registry information for the distributed computing system 10. The facilitating includes storing updated registry information in one or more of the DSTN module 22, the user device 12, the DST processing unit 16, and the DST integrity processing unit 20.

The DS error encoding parameters (e.g., or dispersed storage error coding parameters) include data segmenting information (e.g., how many segments data (e.g., a file, a group of files, a data block, etc.) is divided into), segment security information (e.g., per segment encryption, compression, integrity checksum, etc.), error coding information (e.g., pillar width, decode threshold, read threshold, write threshold, etc.), slicing information (e.g., the number of encoded data slices that will be created for each data segment); and slice security information (e.g., per encoded data slice encryption, compression, integrity checksum, etc.).

The DSTN managing unit 18 creates and stores user profile information (e.g., an access control list (ACL)) in local memory and/or within memory of the DSTN module 22. The user profile information includes authentication information, permissions, and/or the security parameters. The security parameters may include encryption/decryption scheme, one or more encryption keys, key generation scheme, and/or data encoding/decoding scheme.

The DSTN managing unit 18 creates billing information for a particular user, a user group, a vault access, public vault access, etc. For instance, the DSTN managing unit 18 tracks the number of times a user accesses a private vault and/or public vaults, which can be used to generate a per-access billing information. In another instance, the DSTN managing unit 18 tracks the amount of data stored and/or retrieved by a user device and/or a user group, which can be used to generate a per-data-amount billing information.

Another DS management service includes the DSTN managing unit 18 performing network operations, network administration, and/or network maintenance. Network operations includes authenticating user data allocation requests (e.g., read and/or write requests), managing creation of vaults, establishing authentication credentials for user devices, adding/deleting components (e.g., user devices, DST execution units, and/or DST processing units)

from the distributed computing system 10, and/or establishing authentication credentials for DST execution units 36. Network administration includes monitoring devices and/or units for failures, maintaining vault information, determining device and/or unit activation status, determining device and/or unit loading, and/or determining any other system level operation that affects the performance level of the system 10. Network maintenance includes facilitating replacing, upgrading, repairing, and/or expanding a device and/or unit of the system 10.

To support data storage integrity verification within the distributed computing system 10, the DST integrity processing unit 20 performs rebuilding of 'bad' or missing encoded data slices. At a high level, the DST integrity processing unit 20 performs rebuilding by periodically attempting to retrieve/list encoded data slices, and/or slice names of the encoded data slices, from the DSTN module 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in memory of the DSTN module 22. Note that the DST integrity processing unit 20 may be a separate unit as shown, it may be included in the DSTN module 22, it may be included in the DST processing unit 16, and/or distributed among the DST execution units 36.

To support distributed task processing on received data, the distributed computing system 10 has two primary operations: DST (distributed storage and/or task processing) management and DST execution on received data (an example of which will be discussed with reference to FIGS. 3-19). With respect to the storage portion of the DST management, the DSTN managing unit 18 functions as previously described. With respect to the tasking processing of the DST management, the DSTN managing unit 18 performs distributed task processing (DTP) management services. One such DTP management service includes the DSTN managing unit 18 establishing DTP parameters (e.g., user-vault affiliation information, billing information, user-task information, etc.) for a user device 12-14 individually or as part of a group of user devices.

Another DTP management service includes the DSTN managing unit 18 performing DTP network operations, network administration (which is essentially the same as described above), and/or network maintenance (which is essentially the same as described above). Network operations include, but are not limited to, authenticating user task processing requests (e.g., valid request, valid user, etc.), authenticating results and/or partial results, establishing DTP authentication credentials for user devices, adding/deleting components (e.g., user devices, DST execution units, and/or DST processing units) from the distributed computing system, and/or establishing DTP authentication credentials for DST execution units.

To support distributed task processing on stored data, the distributed computing system 10 has two primary operations: DST (distributed storage and/or task) management and DST execution on stored data. With respect to the DST execution on stored data, if the second type of user device 14 has a task request 38 for execution by the DSTN module 22, it sends the task request 38 to the DST processing unit 16 via its interface 30. An example of DST execution on stored data will be discussed in greater detail with reference to FIGS. 27-39. With respect to the DST management, it is substantially similar to the DST management to support distributed task processing on received data.

Figure 2:
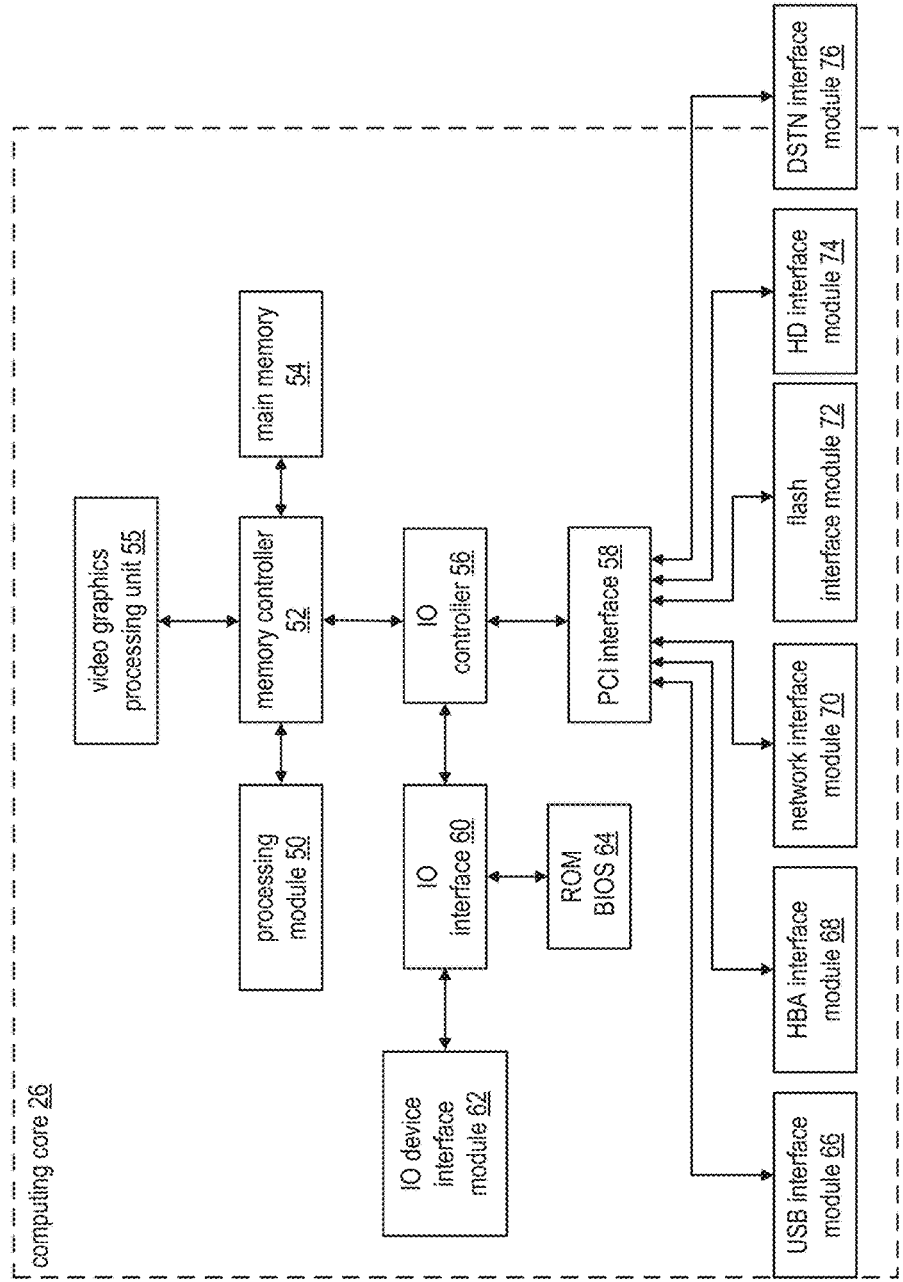
FIG. 2 is a schematic block diagram of an embodiment of a computing core in accordance with the present invention.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSTN interface module 76.

The DSTN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSTN interface module 76 and/or the network interface module 70 may function as the interface 30 of the user device 14 of FIG. 1. Further note that the IO device interface module 62 and/or the memory interface modules may be collectively or individually referred to as IO ports.

Figure 3:
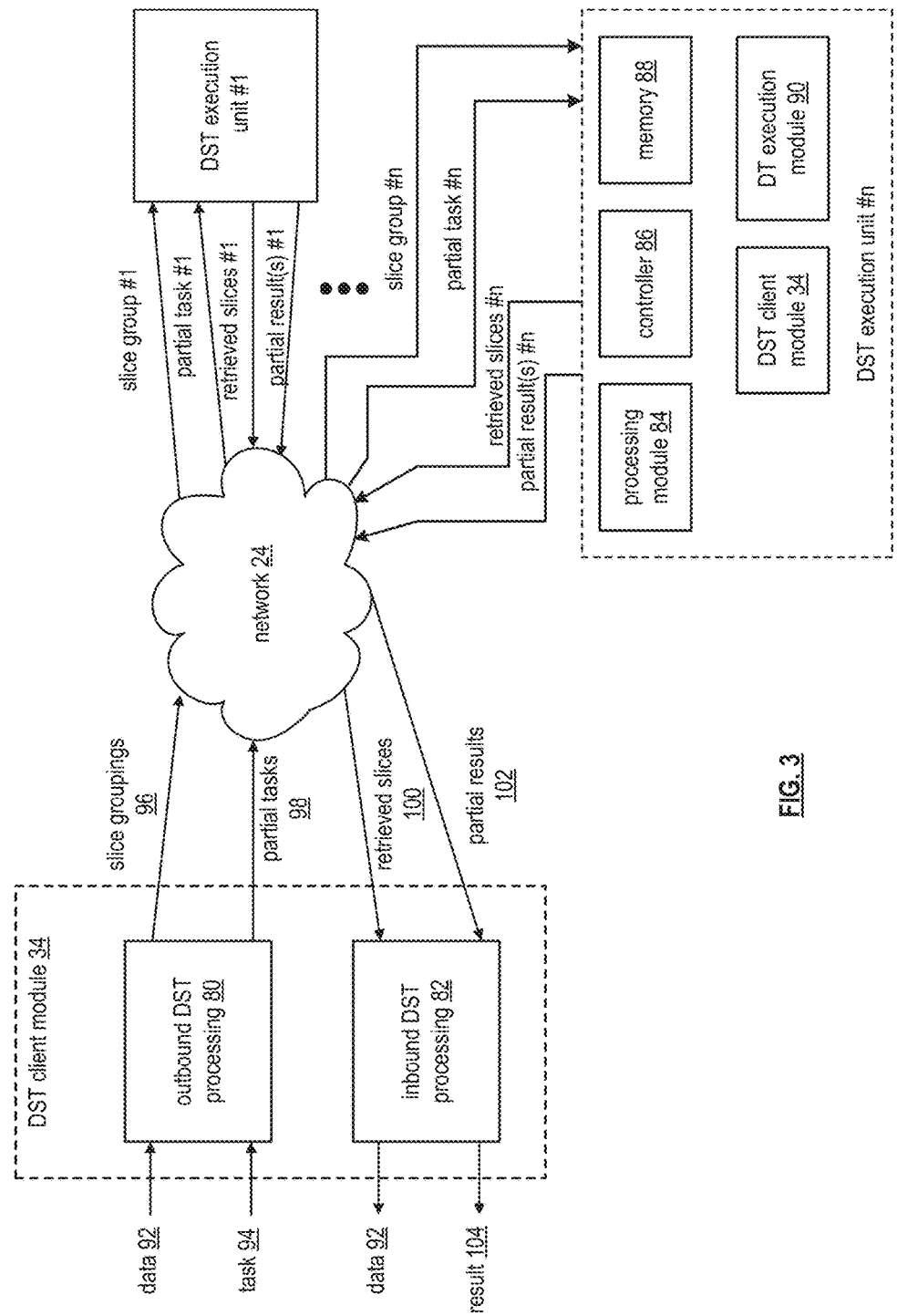
FIG. 3 is a diagram of an example of a distributed storage and task processing in accordance with the present invention.

FIG. 3 is a diagram of an example of the distributed computing system performing a distributed storage and task processing operation. The distributed computing system includes a DST (distributed storage and/or task) client module 34 (which may be in user device 14 and/or in DST processing unit 16 of FIG. 1), a network 24, a plurality of DST execution units 1-n that includes two or more DST execution units 36 of FIG. 1 (which form at least a portion of DSTN module 22 of FIG. 1), a DST managing module (not shown), and a DST integrity verification module (not shown). The DST client module 34 includes an outbound DST processing section 80 and an inbound DST processing section 82. Each of the DST execution units 1-n includes a controller 86, a processing module 84, memory 88, a DT (distributed task) execution module 90, and a DST client module 34.

In an example of operation, the DST client module 34 receives data 92 and one or more tasks 94 to be performed upon the data 92. The data 92 may be of any size and of any content, where, due to the size (e.g., greater than a few Terabytes), the content (e.g., secure data, etc.), and/or task(s) (e.g., MIPS intensive), distributed processing of the task(s) on the data is desired. For example, the data 92 may be one or more digital books, a copy of a company's emails, a large-scale Internet search, a video security file, one or more entertainment video files (e.g., television programs, movies, etc.), data files, and/or any other large amount of data (e.g., greater than a few Terabytes).

Within the DST client module 34, the outbound DST processing section 80 receives the data 92 and the task(s) 94. The outbound DST processing section 80 processes the data 92 to produce slice groupings 96. As an example of such processing, the outbound DST processing section 80 partitions the data 92 into a plurality of data partitions. For each data partition, the outbound DST processing section 80 dispersed storage (DS) error encodes the data partition to produce encoded data slices and groups the encoded data slices into a slice grouping 96. In addition, the outbound DST processing section 80 partitions the task 94 into partial tasks 98, where the number of partial tasks 98 may correspond to the number of slice groupings 96.

The outbound DST processing section 80 then sends, via the network 24, the slice groupings 96 and the partial tasks 98 to the DST execution units 1-n of the DSTN module 22 of FIG. 1. For example, the outbound DST processing section 80 sends slice group 1 and partial task 1 to DST execution unit 1. As another example, the outbound DST processing section 80 sends slice group #n and partial task #n to DST execution unit #n.

Each DST execution unit performs its partial task 98 upon its slice group 96 to produce partial results 102. For example, DST execution unit #1 performs partial task #1 on slice group #1 to produce a partial result #1, for results. As a more specific example, slice group #1 corresponds to a data partition of a series of digital books and the partial task #1 corresponds to searching for specific phrases, recording where the phrase is found, and establishing a phrase count. In this more specific example, the partial result #1 includes information as to where the phrase was found and includes the phrase count.

Upon completion of generating their respective partial results 102, the DST execution units send, via the network 24, their partial results 102 to the inbound DST processing section 82 of the DST client module 34. The inbound DST processing section 82 processes the received partial results 102 to produce a result 104. Continuing with the specific example of the preceding paragraph, the inbound DST processing section 82 combines the phrase count from each of the DST execution units 36 to produce a total phrase count. In addition, the inbound DST processing section 82 combines the 'where the phrase was found' information from each of the DST execution units 36 within their respective data partitions to produce 'where the phrase was found' information for the series of digital books.

In another example of operation, the DST client module 34 requests retrieval of stored data within the memory of the DST execution units 36 (e.g., memory of the DSTN module). In this example, the task 94 is retrieve data stored in the memory of the DSTN module. Accordingly, the outbound DST processing section 80 converts the task 94 into a plurality of partial tasks 98 and sends the partial tasks 98 to the respective DST execution units 1-n.

In response to the partial task 98 of retrieving stored data, a DST execution unit 36 identifies the corresponding encoded data slices 100 and retrieves them. For example, DST execution unit #1 receives partial task #1 and retrieves, in response thereto, retrieved slices #1. The DST execution units 36 send their respective retrieved slices 100 to the inbound DST processing section 82 via the network 24.

The inbound DST processing section 82 converts the retrieved slices 100 into data 92. For example, the inbound DST processing section 82 de-groups the retrieved slices 100 to produce encoded slices per data partition. The inbound DST processing section 82 then DS error decodes the encoded slices per data partition to produce data partitions. The inbound DST processing section 82 de-partitions the data partitions to recapture the data 92.

Figure 4:
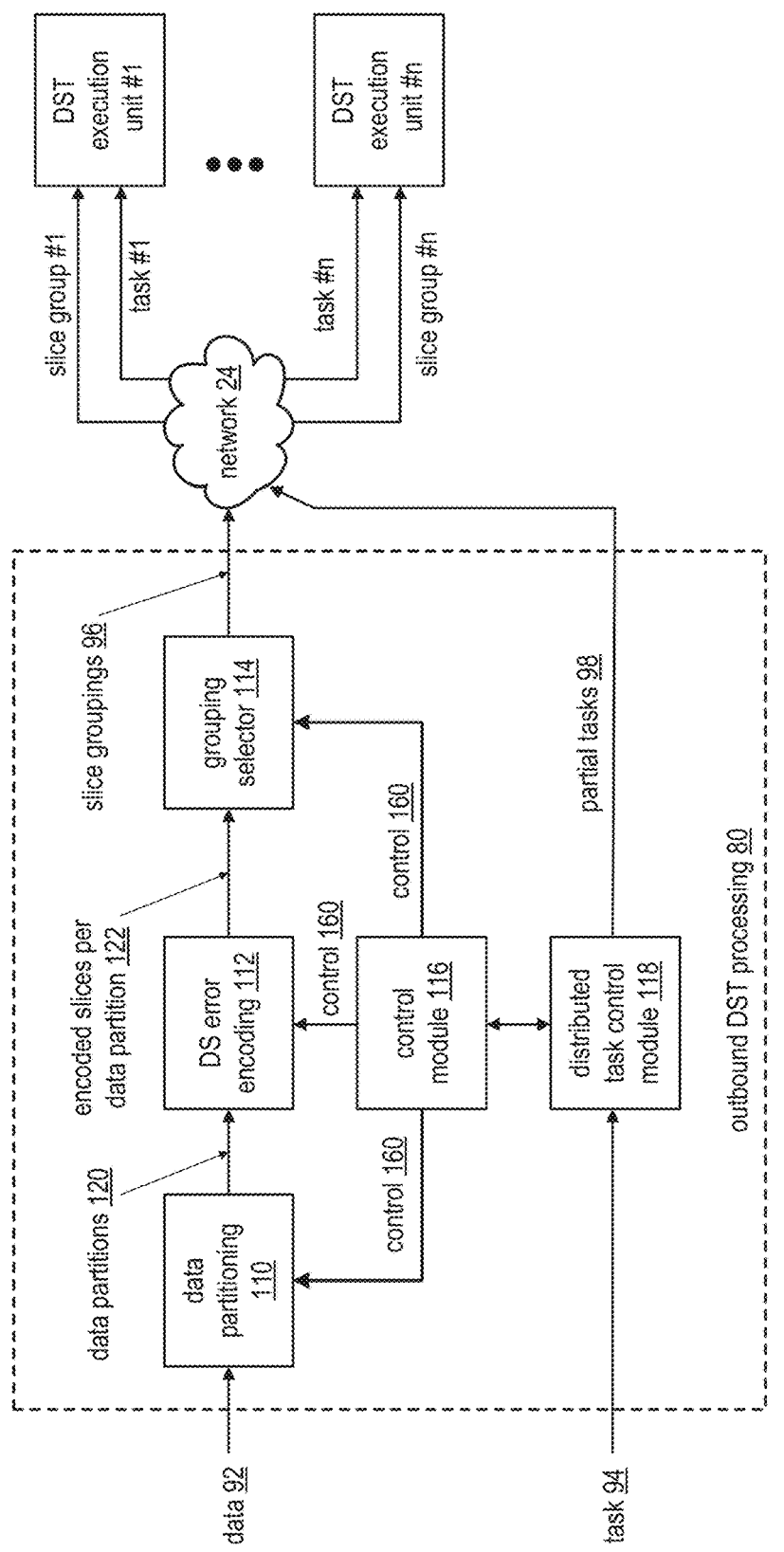
FIG. 4 is a schematic block diagram of an embodiment of an outbound distributed storage and/or task (DST) processing in accordance with the present invention.

FIG. 4 is a schematic block diagram of an embodiment of an outbound distributed storage and/or task (DST) processing section 80 of a DST client module 34 FIG. 1 coupled to a DSTN module 22 of a FIG. 1 (e.g., a plurality of n DST execution units 36) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 partitions data 92 into a plurality of data partitions 120. The number of partitions and the size of the partitions may be selected by the control module 116 via control 160 based on the data 92 (e.g., its size, its content, etc.), a corresponding task 94 to be performed (e.g., simple, complex, single step, multiple steps, etc.), DS encoding parameters (e.g., pillar width, decode threshold, write threshold, segment security parameters, slice security parameters, etc.), capabilities of the DST execution units 36 (e.g., processing resources, availability of processing recourses, etc.), and/or as may be inputted by a user, system administrator, or other operator (human or automated). For example, the data partitioning module 110 partitions the data 92 (e.g., 100 Terabytes) into 100,000 data segments, each being 1 Gigabyte in size. Alternatively, the data partitioning module 110 partitions the data 92 into a plurality of data segments, where some of data segments are of a different size, are of the same size, or a combination thereof.

The DS error encoding module 112 receives the data partitions 120 in a serial manner, a parallel manner, and/or a combination thereof. For each data partition 120, the DS error encoding module 112 DS error encodes the data partition 120 in accordance with control information 160 from the control module 116 to produce encoded data slices 122. The DS error encoding includes segmenting the data partition into data segments, segment security processing (e.g., encryption, compression, watermarking, integrity check (e.g., CRC), etc.), error encoding, slicing, and/or per slice security processing (e.g., encryption, compression, watermarking, integrity check (e.g., CRC), etc.). The control information 160 indicates which steps of the DS error encoding are active for a given data partition and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 122 of a data partition into a set of slice groupings 96. The number of slice groupings corresponds to the number of DST execution units 36 identified for a particular task 94. For example, if five DST execution units 36 are identified for the particular task 94, the grouping selector module groups the encoded slices 122 of a data partition into five slice groupings 96. The grouping selector module 114 outputs the slice groupings 96 to the corresponding DST execution units 36 via the network 24.

The distributed task control module 118 receives the task 94 and converts the task 94 into a set of partial tasks 98. For example, the distributed task control module 118 receives a task to find where in the data (e.g., a series of books) a phrase occurs and a total count of the phrase usage in the data. In this example, the distributed task control module 118 replicates the task 94 for each DST execution unit 36 to produce the partial tasks 98. In another example, the distributed task control module 118 receives a task to find where in the data a first phrase occurs, where in the data a second phrase occurs, and a total count for each phrase usage in the data. In this example, the distributed task control module 118 generates a first set of partial tasks 98 for finding and counting the first phrase and a second set of partial tasks for finding and counting the second phrase. The distributed task control module 118 sends respective first and/or second partial tasks 98 to each DST execution unit 36.

Figure 5:
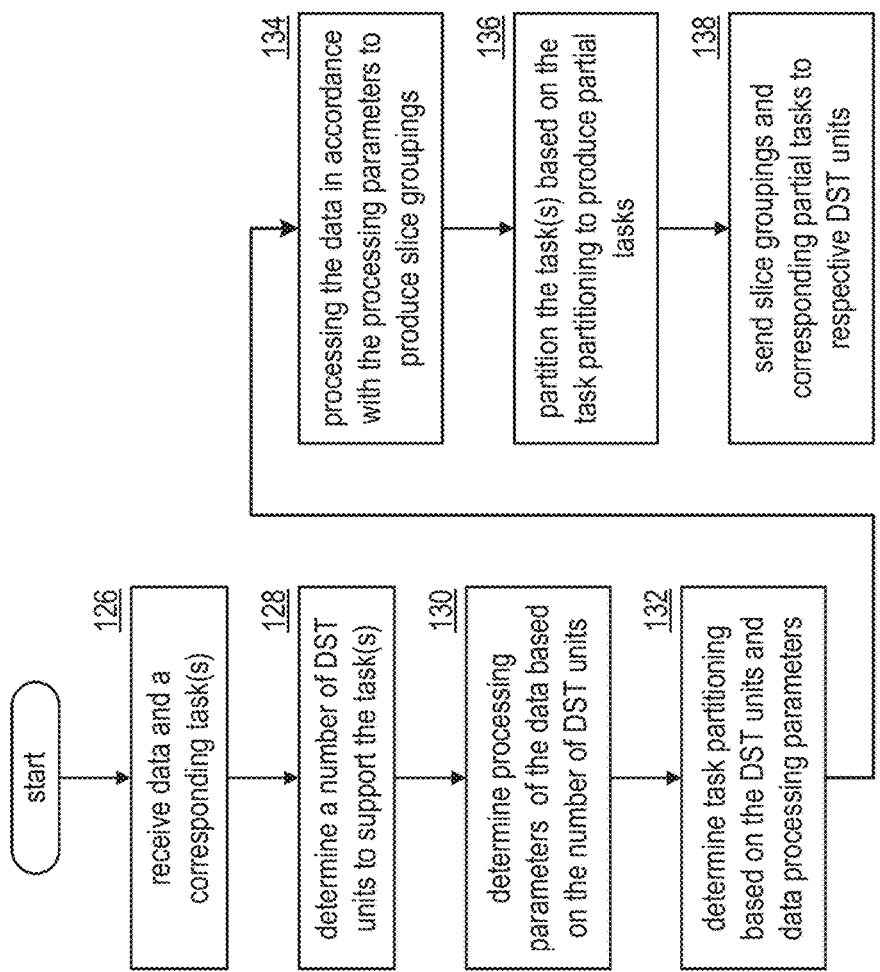
FIG. 5 is a logic diagram of an example of a method for outbound DST processing in accordance with the present invention.

FIG. 5 is a logic diagram of an example of a method for outbound distributed storage and task (DST) processing that begins at step 126 where a DST client module receives data and one or more corresponding tasks. The method continues at step 128 where the DST client module determines a number of DST units to support the task for one or more data partitions. For example, the DST client module may determine the number of DST units to support the task based on the size of the data, the requested task, the content of the data, a predetermined number (e.g., user indicated, system administrator determined, etc.), available DST units, capability of the DST units, and/or any other factor regarding distributed task processing of the data. The DST client module may select the same DST units for each data partition, may select different DST units for the data partitions, or a combination thereof.

The method continues at step 130 where the DST client module determines processing parameters of the data based on the number of DST units selected for distributed task processing. The processing parameters include data partitioning information, DS encoding parameters, and/or slice grouping information. The data partitioning information includes a number of data partitions, size of each data partition, and/or organization of the data partitions (e.g., number of data blocks in a partition, the size of the data blocks, and arrangement of the data blocks). The DS encoding parameters include segmenting information, segment security information, error encoding information (e.g., dispersed storage error encoding function parameters including one or more of pillar width, decode threshold, write threshold, read threshold, generator matrix), slicing information, and/or per slice security information. The slice grouping information includes information regarding how to arrange the encoded data slices into groups for the selected DST units. As a specific example, if the DST client module determines that five DST units are needed to support the task, then it determines that the error encoding parameters include a pillar width of five and a decode threshold of three.

The method continues at step 132 where the DST client module determines task partitioning information (e.g., how to partition the tasks) based on the selected DST units and data processing parameters. The data processing parameters include the processing parameters and DST unit capability information. The DST unit capability information includes the number of DT (distributed task) execution units, execution capabilities of each DT execution unit (e.g., MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.)), and/or any information germane to executing one or more tasks.

The method continues at step 134 where the DST client module processes the data in accordance with the processing parameters to produce slice groupings. The method continues at step 136 where the DST client module partitions the task based on the task partitioning information to produce a set of partial tasks. The method continues at step 138 where the DST client module sends the slice groupings and the corresponding partial tasks to respective DST units.

Figure 6:
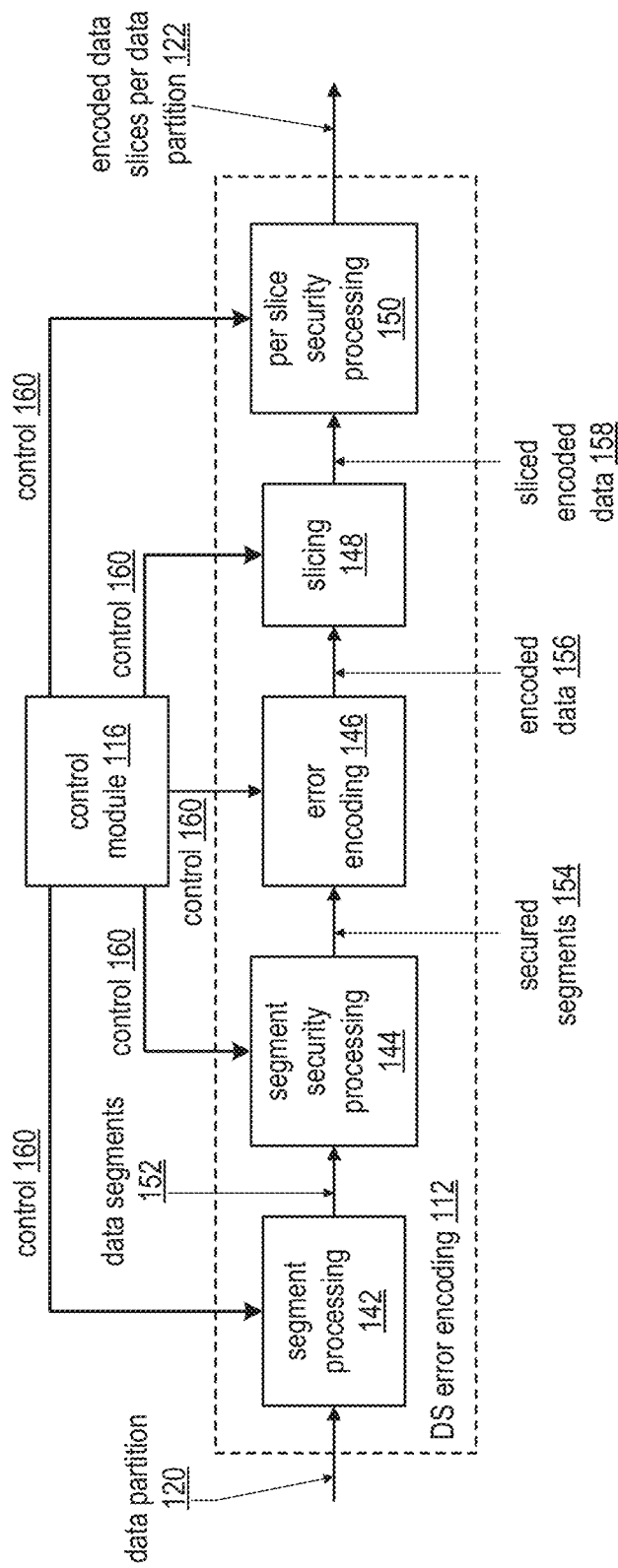
FIG. 6 is a schematic block diagram of an embodiment of a dispersed error encoding in accordance with the present invention.

FIG. 6 is a schematic block diagram of an embodiment of the dispersed storage (DS) error encoding module 112 of an outbound distributed storage and task (DST) processing section. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives a data partition 120 from a data partitioning module and receives segmenting information as the control information 160 from the control module 116. The segmenting information indicates how the segment processing module 142 is to segment the data partition 120. For example, the segmenting information indicates how many rows to segment the data based on a decode threshold of an error encoding scheme, indicates how many columns to segment the data into based on a number and size of data blocks within the data partition 120, and indicates how many columns to include in a data segment 152. The segment processing module 142 segments the data 120 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., cyclic redundancy check (CRC), etc.), and/or any other type of digital security. For example, when the segment security processing module 144 is enabled, it may compress a data segment 152, encrypt the compressed data segment, and generate a CRC value for the encrypted data segment to produce a secure data segment 154. When the segment security processing module 144 is not enabled, it passes the data segments 152 to the error encoding module 146 or is bypassed such that the data segments 152 are provided to the error encoding module 146.

The error encoding module 146 encodes the secure data segments 154 in accordance with error correction encoding parameters received as control information 160 from the control module 116. The error correction encoding parameters (e.g., also referred to as dispersed storage error coding parameters) include identifying an error correction encoding scheme (e.g., forward error correction algorithm, a Reed-Solomon based algorithm, an online coding algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment 154 to produce an encoded data segment 156.

The slicing module 148 slices the encoded data segment 156 in accordance with the pillar width of the error correction encoding parameters received as control information 160. For example, if the pillar width is five, the slicing module 148 slices an encoded data segment 156 into a set of five encoded data slices. As such, for a plurality of encoded data segments 156 for a given data partition, the slicing module outputs a plurality of sets of encoded data slices 158.

The per slice security processing module 150, when enabled by the control module 116, secures each encoded data slice 158 based on slice security information received as control information 160 from the control module 116. The slice security information includes data compression, encryption, watermarking, integrity check (e.g., CRC, etc.), and/or any other type of digital security. For example, when the per slice security processing module 150 is enabled, it compresses an encoded data slice 158, encrypts the compressed encoded data slice, and generates a CRC value for the encrypted encoded data slice to produce a secure encoded data slice 122. When the per slice security processing module 150 is not enabled, it passes the encoded data slices 158 or is bypassed such that the encoded data slices 158 are the output of the DS error encoding module 112. Note that the control module 116 may be omitted and each module stores its own parameters.

Figure 7:
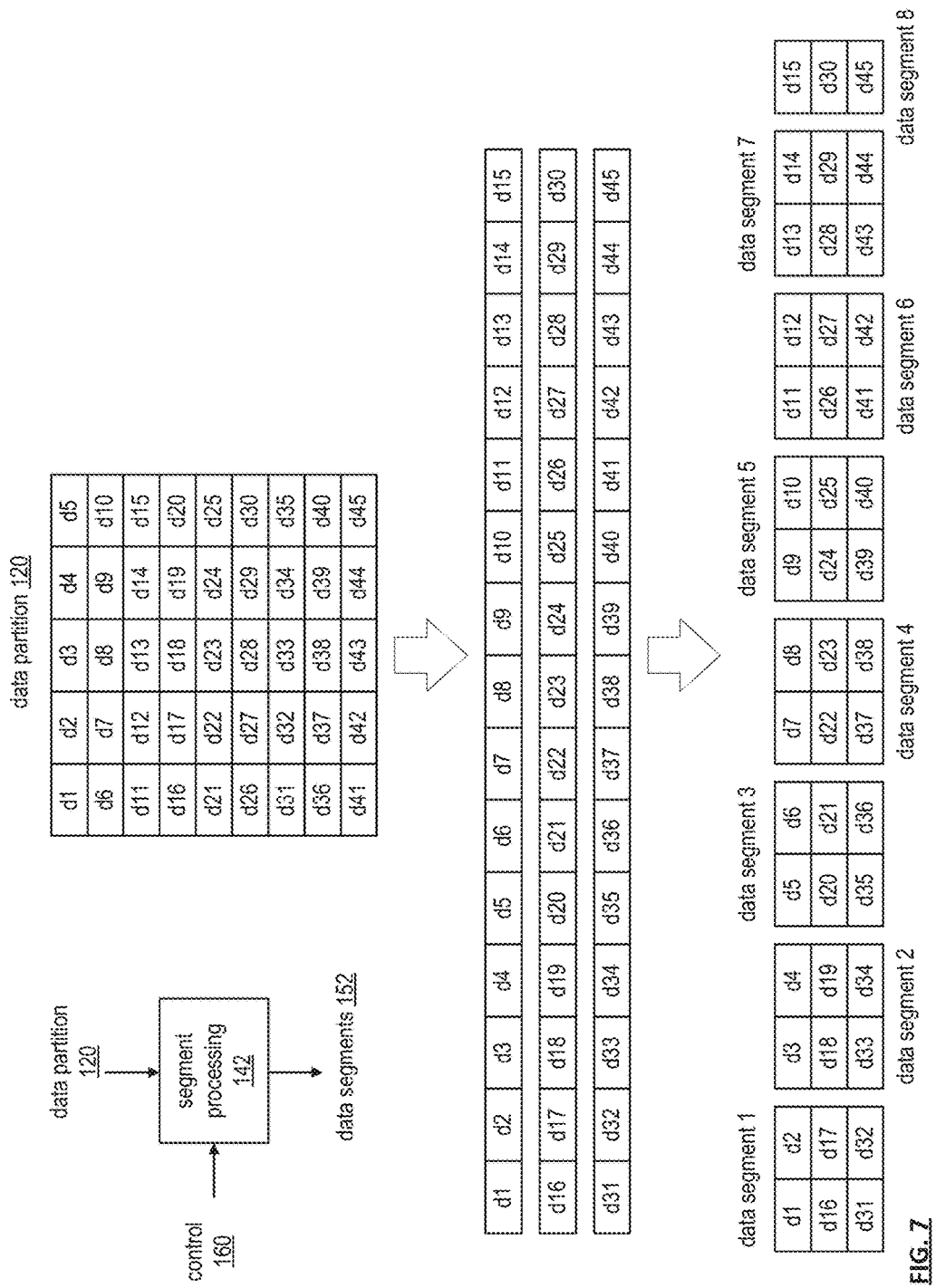
FIG. 7 is a diagram of an example of a segment processing of the dispersed error encoding in accordance with the present invention.

FIG. 7 is a diagram of an example of a segment processing of a dispersed storage (DS) error encoding module. In this example, a segment processing module 142 receives a data partition 120 that includes 45 data blocks (e.g., d1-d45), receives segmenting information (i.e., control information 160) from a control module, and segments the data partition 120 in accordance with the control information 160 to produce data segments 152. Each data block may be of the same size as other data blocks or of a different size. In addition, the size of each data block may be a few bytes to megabytes of data. As previously mentioned, the segmenting information indicates how many rows to segment the data partition into, indicates how many columns to segment the data partition into, and indicates how many columns to include in a data segment.

In this example, the decode threshold of the error encoding scheme is three; as such the number of rows to divide the data partition into is three. The number of columns for each row is set to 15, which is based on the number and size of data blocks. The data blocks of the data partition are arranged in rows and columns in a sequential order (i.e., the first row includes the first 15 data blocks; the second row includes the second 15 data blocks; and the third row includes the last 15 data blocks).

With the data blocks arranged into the desired sequential order, they are divided into data segments based on the segmenting information. In this example, the data partition is divided into 8 data segments; the first 7 include 2 columns of three rows and the last includes 1 column of three rows. Note that the first row of the 8 data segments is in sequential order of the first 15 data blocks; the second row of the 8 data segments in sequential order of the second 15 data blocks; and the third row of the 8 data segments in sequential order of the last 15 data blocks. Note that the number of data blocks, the grouping of the data blocks into segments, and size of the data blocks may vary to accommodate the desired distributed task processing function.

Figure 8:
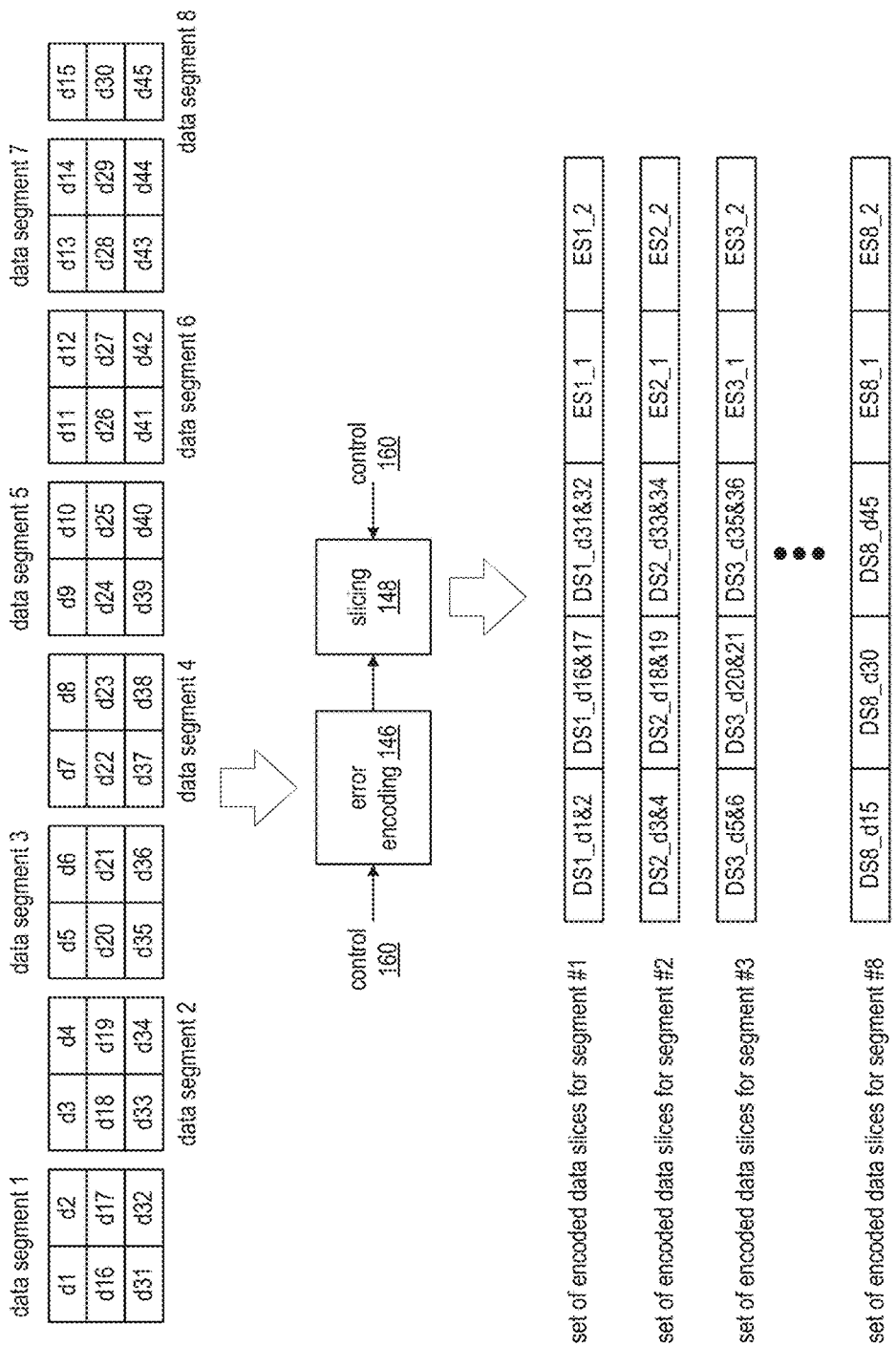
FIG. 8 is a diagram of an example of error encoding and slicing processing of the dispersed error encoding in accordance with the present invention.

FIG. 8 is a diagram of an example of error encoding and slicing processing of the dispersed error encoding processing the data segments of FIG. 7. In this example, data segment 1 includes 3 rows with each row being treated as one word for encoding. As such, data segment 1 includes three words for encoding: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

In operation, an error encoding module 146 and a slicing module 148 convert each data segment into a set of encoded data slices in accordance with error correction encoding parameters as control information 160. More specifically, when the error correction encoding parameters indicate a unity matrix Reed-Solomon based encoding algorithm, 5 pillars, and decode threshold of 3, the first three encoded data slices of the set of encoded data slices for a data segment are substantially similar to the corresponding word of the data segment. For instance, when the unity matrix Reed-Solomon based encoding algorithm is applied to data segment 1, the content of the first encoded data slice (DS1_d1&2) of the first set of encoded data slices (e.g., corresponding to data segment 1) is substantially similar to content of the first word (e.g., d1 & d2); the content of the second encoded data slice (DS1_d16&17) of the first set of encoded data slices is substantially similar to content of the second word (e.g., d16 & d17); and the content of the third encoded data slice (DS1_d31&32) of the first set of encoded data slices is substantially similar to content of the third word (e.g., d31 & d32).

The content of the fourth and fifth encoded data slices (e.g., ES1_1 and ES1_2) of the first set of encoded data slices include error correction data based on the first-third words of the first data segment. With such an encoding and slicing scheme, retrieving any three of the five encoded data slices allows the data segment to be accurately reconstructed.

The encoding and slicing of data segments 2-7 yield sets of encoded data slices similar to the set of encoded data slices of data segment 1. For instance, the content of the first encoded data slice (DS2_d3&4) of the second set of encoded data slices (e.g., corresponding to data segment 2) is substantially similar to content of the first word (e.g., d3 & d4); the content of the second encoded data slice (DS2_d18&19) of the second set of encoded data slices is substantially similar to content of the second word (e.g., d18 & d19); and the content of the third encoded data slice (DS2_d33&34) of the second set of encoded data slices is substantially similar to content of the third word (e.g., d33 & d34). The content of the fourth and fifth encoded data slices (e.g., ES1_1 and ES1_2) of the second set of encoded data slices includes error correction data based on the first-third words of the second data segment.

Figure 9:
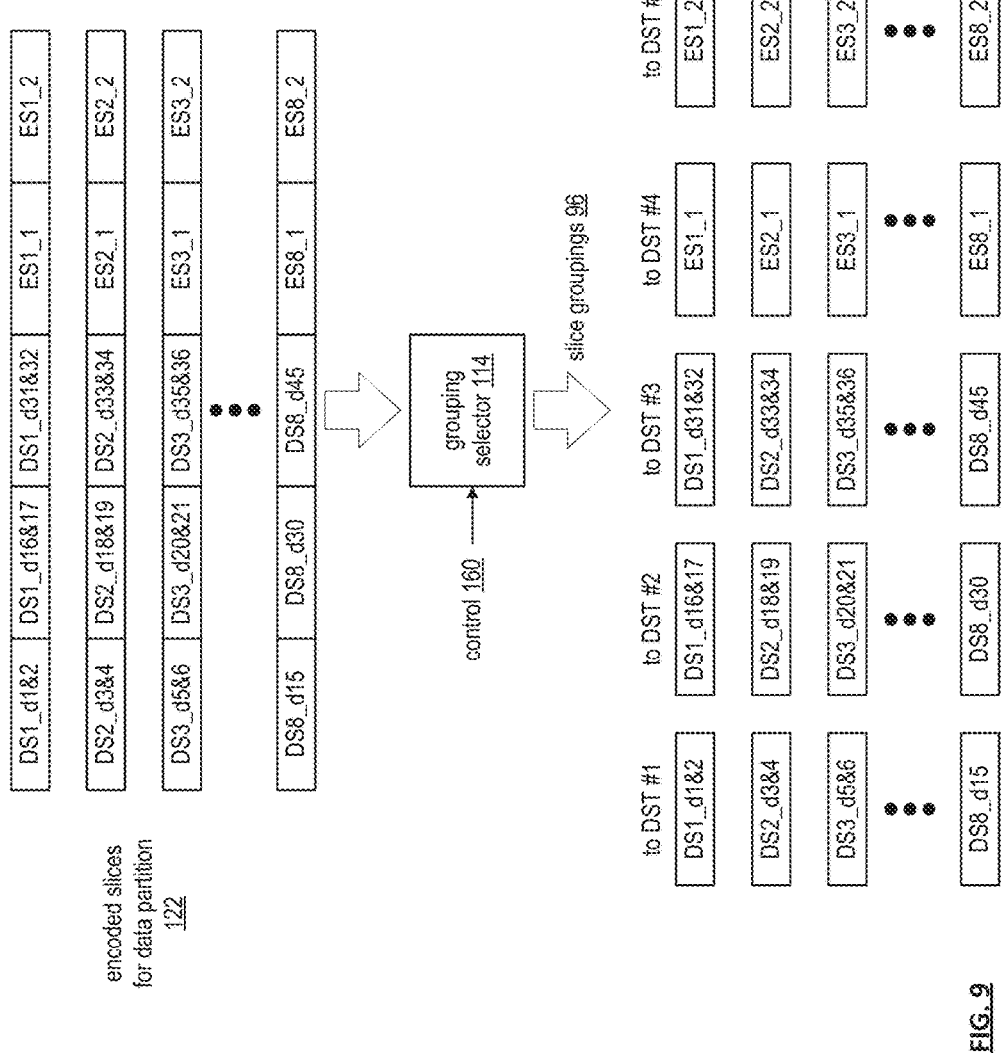
FIG. 9 is a diagram of an example of grouping selection processing of the outbound DST processing in accordance with the present invention.

FIG. 9 is a diagram of an example of grouping selection processing of an outbound distributed storage and task (DST) processing in accordance with group selection information as control information 160 from a control module. Encoded slices for data partition 122 are grouped in accordance with the control information 160 to produce slice groupings 96. In this example, a grouping selector module 114 organizes the encoded data slices into five slice groupings (e.g., one for each DST execution unit of a distributed storage and task network (DSTN) module). As a specific example, the grouping selector module 114 creates a first slice grouping for a DST execution unit #1, which includes first encoded slices of each of the sets of encoded slices. As such, the first DST execution unit receives encoded data slices corresponding to data blocks 1-15 (e.g., encoded data slices of contiguous data).

The grouping selector module 114 also creates a second slice grouping for a DST execution unit #2, which includes second encoded slices of each of the sets of encoded slices. As such, the second DST execution unit receives encoded data slices corresponding to data blocks 16-30. The grouping selector module 114 further creates a third slice grouping for DST execution unit #3, which includes third encoded slices of each of the sets of encoded slices. As such, the third DST execution unit receives encoded data slices corresponding to data blocks 31-45.

The grouping selector module 114 creates a fourth slice grouping for DST execution unit #4, which includes fourth encoded slices of each of the sets of encoded slices. As such, the fourth DST execution unit receives encoded data slices corresponding to first error encoding information (e.g., encoded data slices of error coding (EC) data). The grouping selector module 114 further creates a fifth slice grouping for DST execution unit #5, which includes fifth encoded slices of each of the sets of encoded slices. As such, the fifth DST execution unit receives encoded data slices corresponding to second error encoding information.

Figure 10:
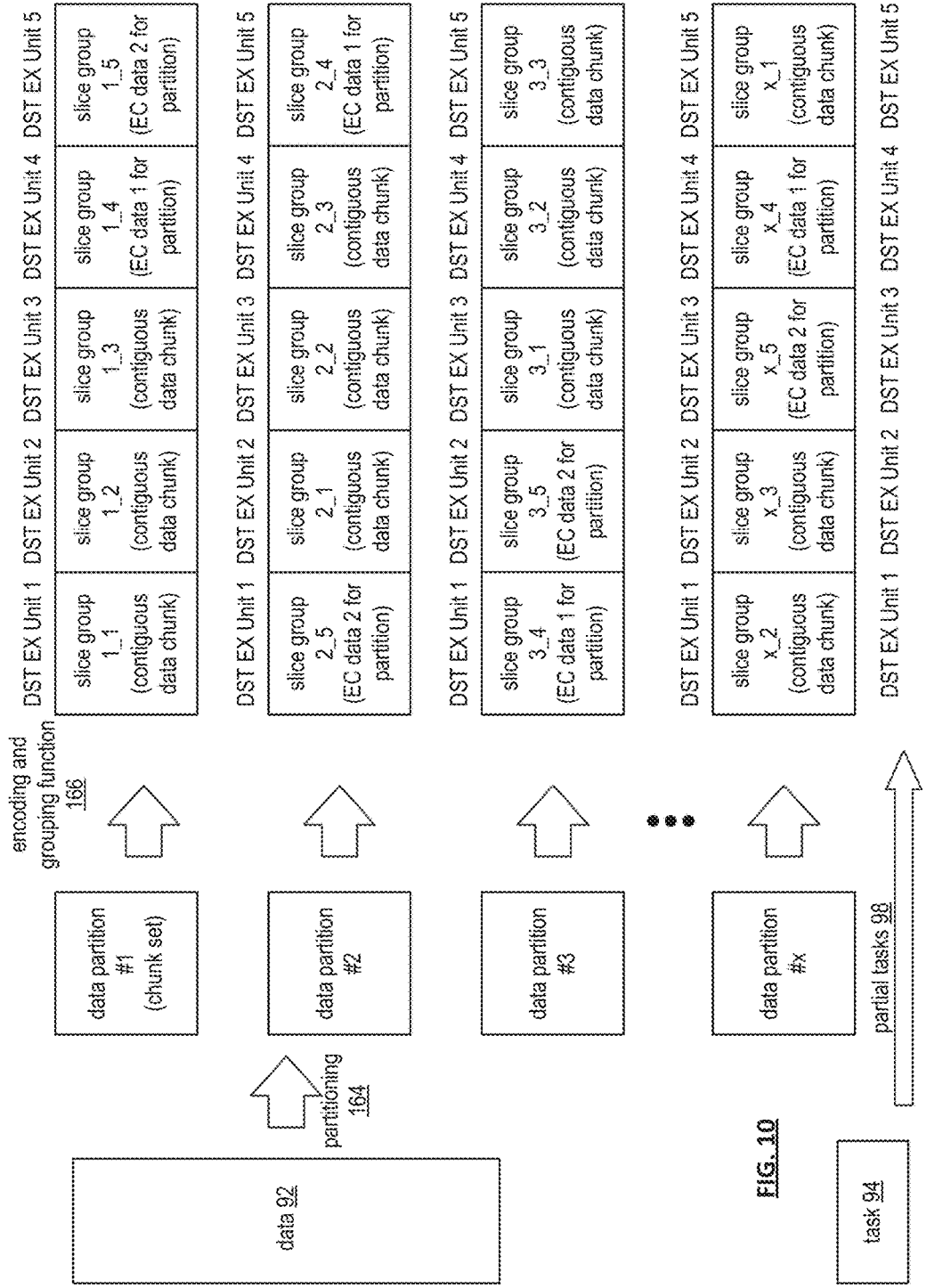
FIG. 10 is a diagram of an example of converting data into slice groups in accordance with the present invention.

FIG. 10 is a diagram of an example of converting data 92 into slice groups that expands on the preceding figures. As shown, the data 92 is partitioned in accordance with a partitioning function 164 into a plurality of data partitions (1-x, where x is an integer greater than 4). Each data partition (or chunkset of data) is encoded and grouped into slice groupings as previously discussed by an encoding and grouping function 166. For a given data partition, the slice groupings are sent to distributed storage and task (DST) execution units. From data partition to data partition, the ordering of the slice groupings to the DST execution units may vary.

For example, the slice groupings of data partition #1 is sent to the DST execution units such that the first DST execution receives first encoded data slices of each of the sets of encoded data slices, which corresponds to a first continuous data chunk of the first data partition (e.g., refer to FIG. 9), a second DST execution receives second encoded data slices of each of the sets of encoded data slices, which corresponds to a second continuous data chunk of the first data partition, etc.

For the second data partition, the slice groupings may be sent to the DST execution units in a different order than it was done for the first data partition. For instance, the first slice grouping of the second data partition (e.g., slice group 2_1) is sent to the second DST execution unit; the second slice grouping of the second data partition (e.g., slice group 2_2) is sent to the third DST execution unit; the third slice grouping of the second data partition (e.g., slice group 2_3) is sent to the fourth DST execution unit; the fourth slice grouping of the second data partition (e.g., slice group 2_4, which includes first error coding information) is sent to the fifth DST execution unit; and the fifth slice grouping of the second data partition (e.g., slice group 2_5, which includes second error coding information) is sent to the first DST execution unit.

The pattern of sending the slice groupings to the set of DST execution units may vary in a predicted pattern, a random pattern, and/or a combination thereof from data partition to data partition. In addition, from data partition to data partition, the set of DST execution units may change. For example, for the first data partition, DST execution units 1-5 may be used; for the second data partition, DST execution units 6-10 may be used; for the third data partition, DST execution units 3-7 may be used; etc. As is also shown, the task is divided into partial tasks that are sent to the DST execution units in conjunction with the slice groupings of the data partitions.

Figure 11:
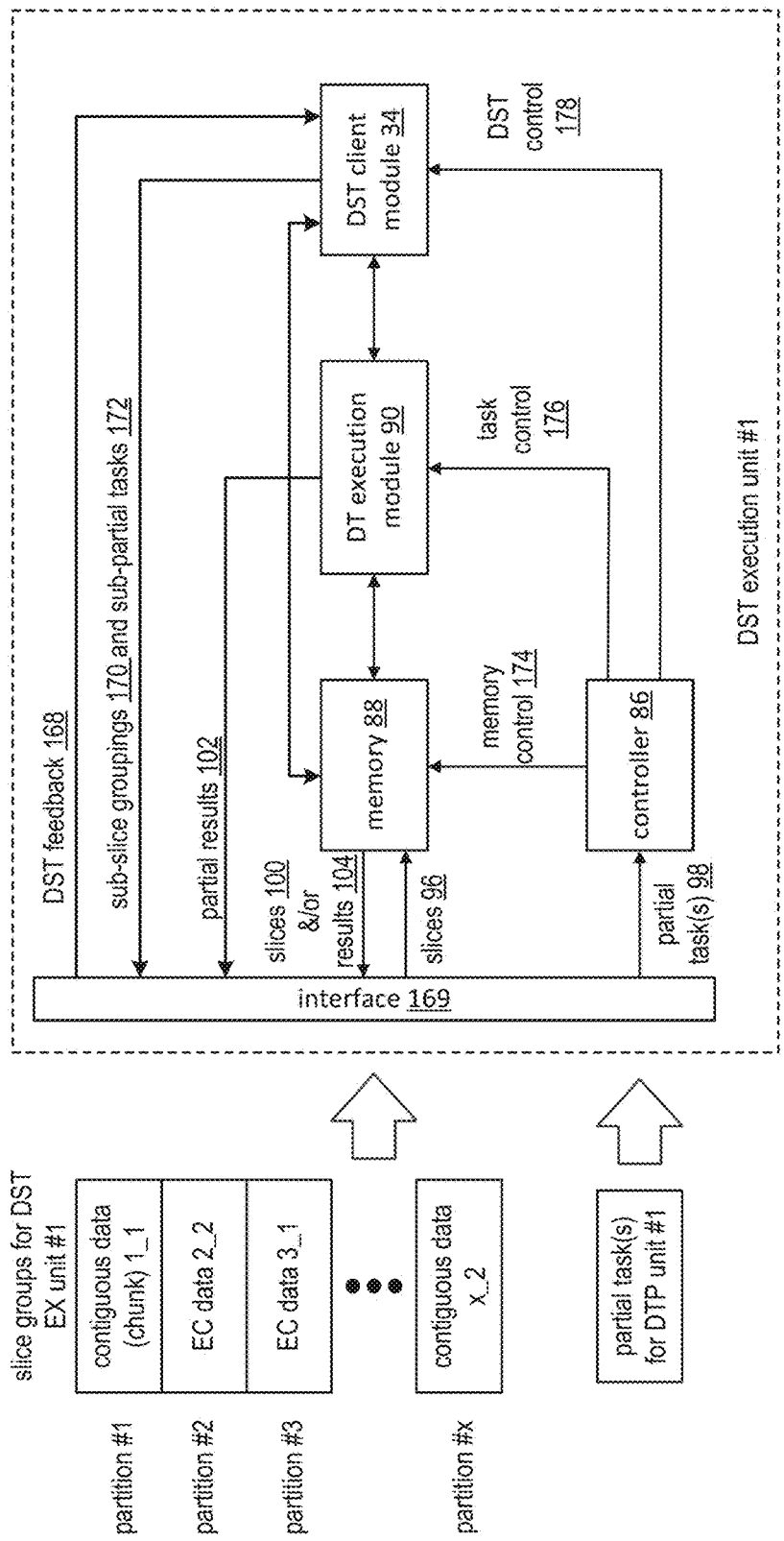
FIG. 11 is a schematic block diagram of an embodiment of a DST execution unit in accordance with the present invention.

FIG. 11 is a schematic block diagram of an embodiment of a DST (distributed storage and/or task) execution unit that includes an interface 169, a controller 86, memory 88, one or more DT (distributed task) execution modules 90, and a DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a slice group, the DST execution module receives a slice grouping 96 (e.g., slice group #1) via interface 169. The slice grouping 96 includes, per partition, encoded data slices of contiguous data or encoded data slices of error coding (EC) data. For slice group #1, the DST execution module receives encoded data slices of contiguous data for partitions #1 and #x (and potentially others between 3 and x) and receives encoded data slices of EC data for partitions #2 and #3 (and potentially others between 3 and x). Examples of encoded data slices of contiguous data and encoded data slices of error coding (EC) data are discussed with reference to FIG. 9. The memory 88 stores the encoded data slices of slice groupings 96 in accordance with memory control information 174 it receives from the controller 86.

The controller 86 (e.g., a processing module, a CPU, etc.) generates the memory control information 174 based on a partial task(s) 98 and distributed computing information (e.g., user information (e.g., user ID, distributed computing permissions, data access permission, etc.), vault information (e.g., virtual memory assigned to user, user group, temporary storage for task processing, etc.), task validation information, etc.). For example, the controller 86 interprets the partial task(s) 98 in light of the distributed computing information to determine whether a requestor is authorized to perform the task 98, is authorized to access the data, and/or is authorized to perform the task on this particular data. When the requestor is authorized, the controller 86 determines, based on the task 98 and/or another input, whether the encoded data slices of the slice grouping 96 are to be temporarily stored or permanently stored. Based on the foregoing, the controller 86 generates the memory control information 174 to write the encoded data slices of the slice grouping 96 into the memory 88 and to indicate whether the slice grouping 96 is permanently stored or temporarily stored.

With the slice grouping 96 stored in the memory 88, the controller 86 facilitates execution of the partial task(s) 98. In an example, the controller 86 interprets the partial task 98 in light of the capabilities of the DT execution module(s) 90. The capabilities include one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, etc. If the controller 86 determines that the DT execution module(s) 90 have sufficient capabilities, it generates task control information 176.

The task control information 176 may be a generic instruction (e.g., perform the task on the stored slice grouping) or a series of operational codes. In the former instance, the DT execution module 90 includes a co-processor function specifically configured (fixed or programmed) to perform the desired task 98. In the latter instance, the DT execution module 90 includes a general processor topology where the controller stores an algorithm corresponding to the particular task 98. In this instance, the controller 86 provides the operational codes (e.g., assembly language, source code of a programming language, object code, etc.) of the algorithm to the DT execution module 90 for execution.

Depending on the nature of the task 98, the DT execution module 90 may generate intermediate partial results 102 that are stored in the memory 88 or in a cache memory (not shown) within the DT execution module 90. In either case, when the DT execution module 90 completes execution of the partial task 98, it outputs one or more partial results 102. The partial results 102 may also be stored in memory 88.

If, when the controller 86 is interpreting whether capabilities of the DT execution module(s) 90 can support the partial task 98, the controller 86 determines that the DT execution module(s) 90 cannot adequately support the task 98 (e.g., does not have the right resources, does not have sufficient available resources, available resources would be too slow, etc.), it then determines whether the partial task 98 should be fully offloaded or partially offloaded.

If the controller 86 determines that the partial task 98 should be fully offloaded, it generates DST control information 178 and provides it to the DST client module 34. The DST control information 178 includes the partial task 98, memory storage information regarding the slice grouping 96, and distribution instructions. The distribution instructions instruct the DST client module 34 to divide the partial task 98 into sub-partial tasks 172, to divide the slice grouping 96 into sub-slice groupings 170, and identify other DST execution units. The DST client module 34 functions in a similar manner as the DST client module 34 of FIGS. 3-10 to produce the sub-partial tasks 172 and the sub-slice groupings 170 in accordance with the distribution instructions.

The DST client module 34 receives DST feedback 168 (e.g., sub-partial results), via the interface 169, from the DST execution units to which the task was offloaded. The DST client module 34 provides the sub-partial results to the DST execution unit, which processes the sub-partial results to produce the partial result(s) 102.

If the controller 86 determines that the partial task 98 should be partially offloaded, it determines what portion of the task 98 and/or slice grouping 96 should be processed locally and what should be offloaded. For the portion that is being locally processed, the controller 86 generates task control information 176 as previously discussed. For the portion that is being offloaded, the controller 86 generates DST control information 178 as previously discussed.

When the DST client module 34 receives DST feedback 168 (e.g., sub-partial results) from the DST executions units to which a portion of the task was offloaded, it provides the sub-partial results to the DT execution module 90. The DT execution module 90 processes the sub-partial results with the sub-partial results it created to produce the partial result(s) 102.

The memory 88 may be further utilized to retrieve one or more of stored slices 100, stored results 104, partial results 102 when the DT execution module 90 stores partial results 102 and/or results 104 in the memory 88. For example, when the partial task 98 includes a retrieval request, the controller 86 outputs the memory control 174 to the memory 88 to facilitate retrieval of slices 100 and/or results 104.

Figure 12:
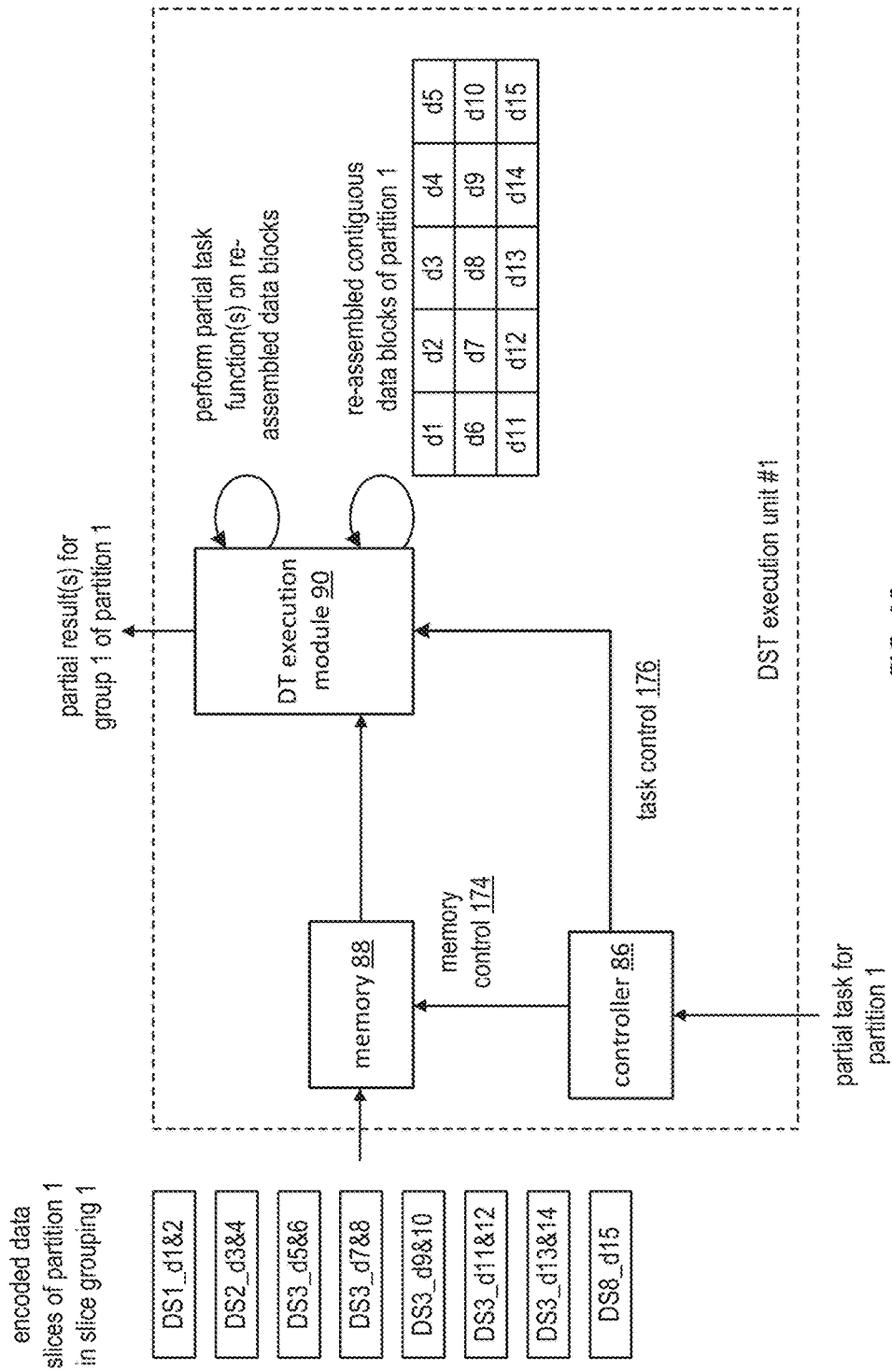
FIG. 12 is a schematic block diagram of an example of operation of a DST execution unit in accordance with the present invention.

FIG. 12 is a schematic block diagram of an example of operation of a distributed storage and task (DST) execution unit storing encoded data slices and executing a task thereon. To store the encoded data slices of a partition 1 of slice grouping 1, a controller 86 generates write commands as memory control information 174 such that the encoded slices are stored in desired locations (e.g., permanent or temporary) within memory 88.

Once the encoded slices are stored, the controller 86 provides task control information 176 to a distributed task (DT) execution module 90. As a first step of executing the task in accordance with the task control information 176, the DT execution module 90 retrieves the encoded slices from memory 88. The DT execution module 90 then reconstructs contiguous data blocks of a data partition. As shown for this example, reconstructed contiguous data blocks of data partition 1 include data blocks 1-15 (e.g., d1-d15).

With the contiguous data blocks reconstructed, the DT execution module 90 performs the task on the reconstructed contiguous data blocks. For example, the task may be to search the reconstructed contiguous data blocks for a particular word or phrase, identify where in the reconstructed contiguous data blocks the particular word or phrase occurred, and/or count the occurrences of the particular word or phrase on the reconstructed contiguous data blocks. The DST execution unit continues in a similar manner for the encoded data slices of other partitions in slice grouping 1. Note that with using the unity matrix error encoding scheme previously discussed, if the encoded data slices of contiguous data are uncorrupted, the decoding of them is a relatively straightforward process of extracting the data.

If, however, an encoded data slice of contiguous data is corrupted (or missing), it can be rebuilt by accessing other DST execution units that are storing the other encoded data slices of the set of encoded data slices of the corrupted encoded data slice. In this instance, the DST execution unit having the corrupted encoded data slices retrieves at least three encoded data slices (of contiguous data and of error coding data) in the set from the other DST execution units (recall for this example, the pillar width is 5 and the decode threshold is 3). The DST execution unit decodes the retrieved data slices using the DS error encoding parameters to recapture the corresponding data segment. The DST execution unit then re-encodes the data segment using the DS error encoding parameters to rebuild the corrupted encoded data slice. Once the encoded data slice is rebuilt, the DST execution unit functions as previously described.

Figure 13:
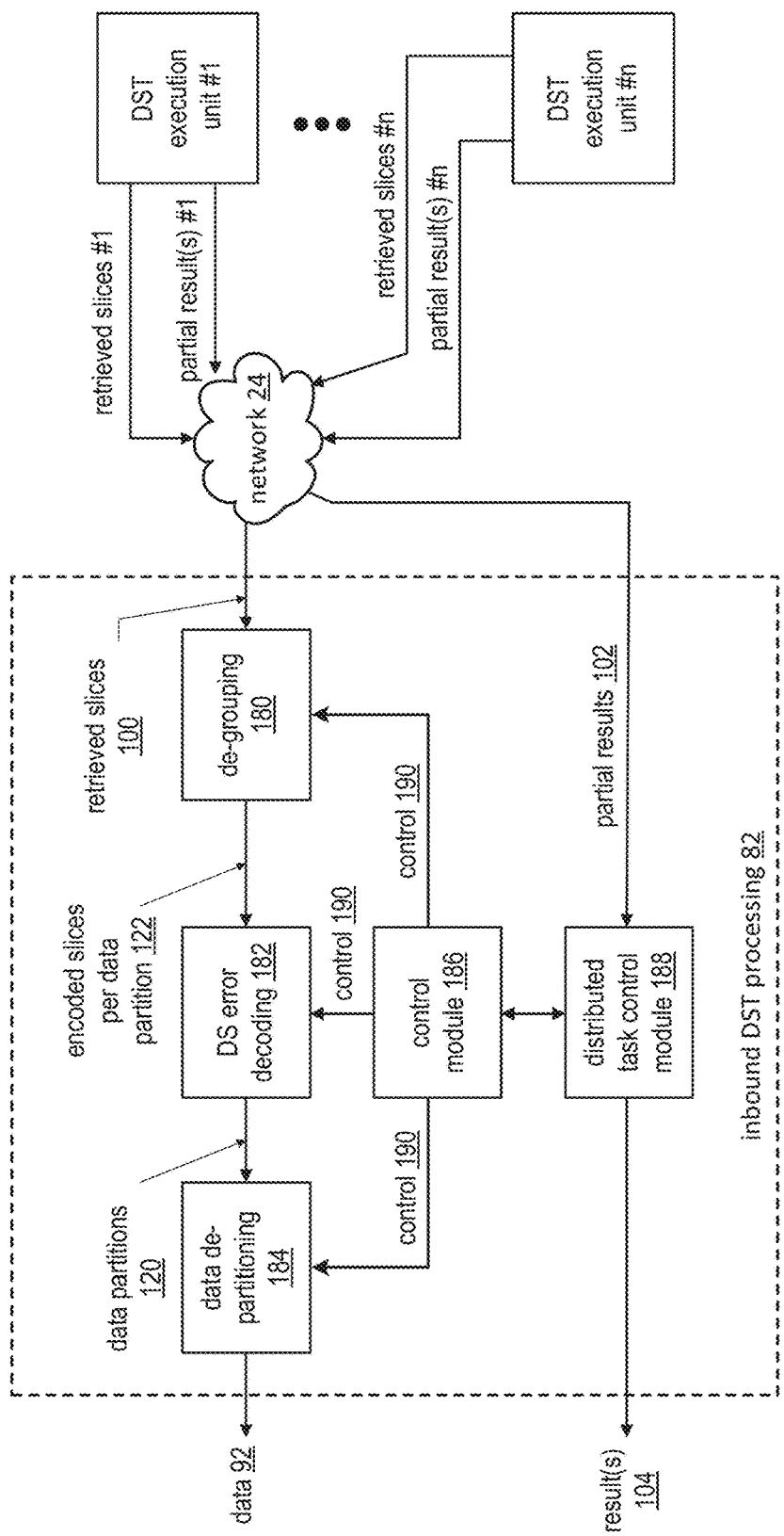
FIG. 13 is a schematic block diagram of an embodiment of an inbound distributed storage and/or task (DST) processing in accordance with the present invention.

FIG. 13 is a schematic block diagram of an embodiment of an inbound distributed storage and/or task (DST) processing section 82 of a DST client module coupled to DST execution units of a distributed storage and task network (DSTN) module via a network 24. The inbound DST processing section 82 includes a de-grouping module 180, a DS (dispersed storage) error decoding module 182, a data de-partitioning module 184, a control module 186, and a distributed task control module 188. Note that the control module 186 and/or the distributed task control module 188 may be separate modules from corresponding ones of outbound DST processing section or may be the same modules.

In an example of operation, the DST execution units have completed execution of corresponding partial tasks on the corresponding slice groupings to produce partial results 102. The inbound DST processing section 82 receives the partial results 102 via the distributed task control module 188. The inbound DST processing section 82 then processes the partial results 102 to produce a final result, or results 104. For example, if the task was to find a specific word or phrase within data, the partial results 102 indicate where in each of the prescribed portions of the data the corresponding DST execution units found the specific word or phrase. The distributed task control module 188 combines the individual partial results 102 for the corresponding portions of the data into a final result 104 for the data as a whole.

In another example of operation, the inbound DST processing section 82 is retrieving stored data from the DST execution units (i.e., the DSTN module). In this example, the DST execution units output encoded data slices 100 corresponding to the data retrieval requests. The de-grouping module 180 receives retrieved slices 100 and de-groups them to produce encoded data slices per data partition 122. The DS error decoding module 182 decodes, in accordance with DS error encoding parameters, the encoded data slices per data partition 122 to produce data partitions 120.

The data de-partitioning module 184 combines the data partitions 120 into the data 92. The control module 186 controls the conversion of retrieved slices 100 into the data 92 using control signals 190 to each of the modules. For instance, the control module 186 provides de-grouping information to the de-grouping module 180, provides the DS error encoding parameters to the DS error decoding module 182, and provides de-partitioning information to the data de-partitioning module 184.

Figure 14:
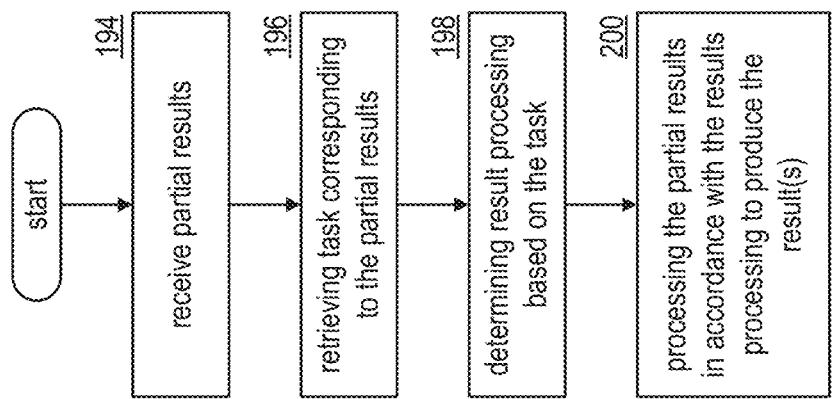
FIG. 14 is a logic diagram of an example of a method for inbound DST processing in accordance with the present invention.

FIG. 14 is a logic diagram of an example of a method that is executable by distributed storage and task (DST) client module regarding inbound DST processing. The method begins at step 194 where the DST client module receives partial results. The method continues at step 196 where the DST client module retrieves the task corresponding to the partial results. For example, the partial results include header information that identifies the requesting entity, which correlates to the requested task.

The method continues at step 198 where the DST client module determines result processing information based on the task. For example, if the task were to identify a particular word or phrase within the data, the result processing information would indicate to aggregate the partial results for the corresponding portions of the data to produce the final result. As another example, if the task were to count the occurrences of a particular word or phrase within the data, results of processing the information would indicate to add the partial results to produce the final results. The method continues at step 200 where the DST client module processes the partial results in accordance with the result processing information to produce the final result or results.

Figure 15:
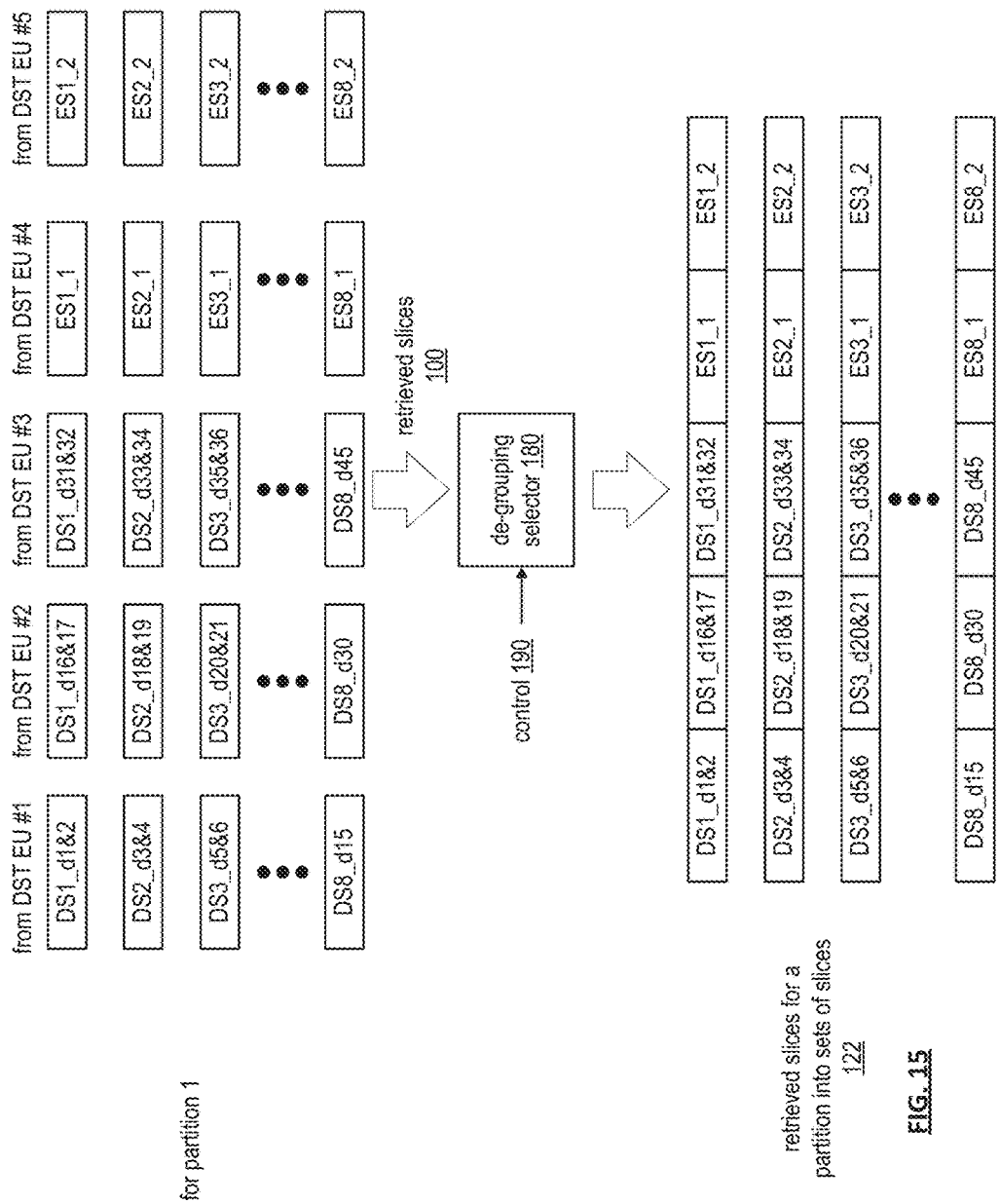
FIG. 15 is a diagram of an example of de-grouping selection processing of the inbound DST processing in accordance with the present invention.

FIG. 15 is a diagram of an example of de-grouping selection processing of an inbound distributed storage and task (DST) processing section of a DST client module. In general, this is an inverse process of the grouping module of the outbound DST processing section of FIG. 9. Accordingly, for each data partition (e.g., partition #1), the de-grouping module retrieves the corresponding slice grouping from the DST execution units (EU) (e.g., DST 1-5).

As shown, DST execution unit #1 provides a first slice grouping, which includes the first encoded slices of each of the sets of encoded slices (e.g., encoded data slices of contiguous data of data blocks 1-15); DST execution unit #2 provides a second slice grouping, which includes the second encoded slices of each of the sets of encoded slices (e.g., encoded data slices of contiguous data of data blocks 16-30); DST execution unit #3 provides a third slice grouping, which includes the third encoded slices of each of the sets of encoded slices (e.g., encoded data slices of contiguous data of data blocks 31-45); DST execution unit #4 provides a fourth slice grouping, which includes the fourth encoded slices of each of the sets of encoded slices (e.g., first encoded data slices of error coding (EC) data); and DST execution unit #5 provides a fifth slice grouping, which includes the fifth encoded slices of each of the sets of encoded slices (e.g., first encoded data slices of error coding (EC) data).

The de-grouping module de-groups the slice groupings (e.g., received slices 100) using a de-grouping selector 180 controlled by a control signal 190 as shown in the example to produce a plurality of sets of encoded data slices (e.g., retrieved slices for a partition into sets of slices 122). Each set corresponding to a data segment of the data partition.

Figure 16:
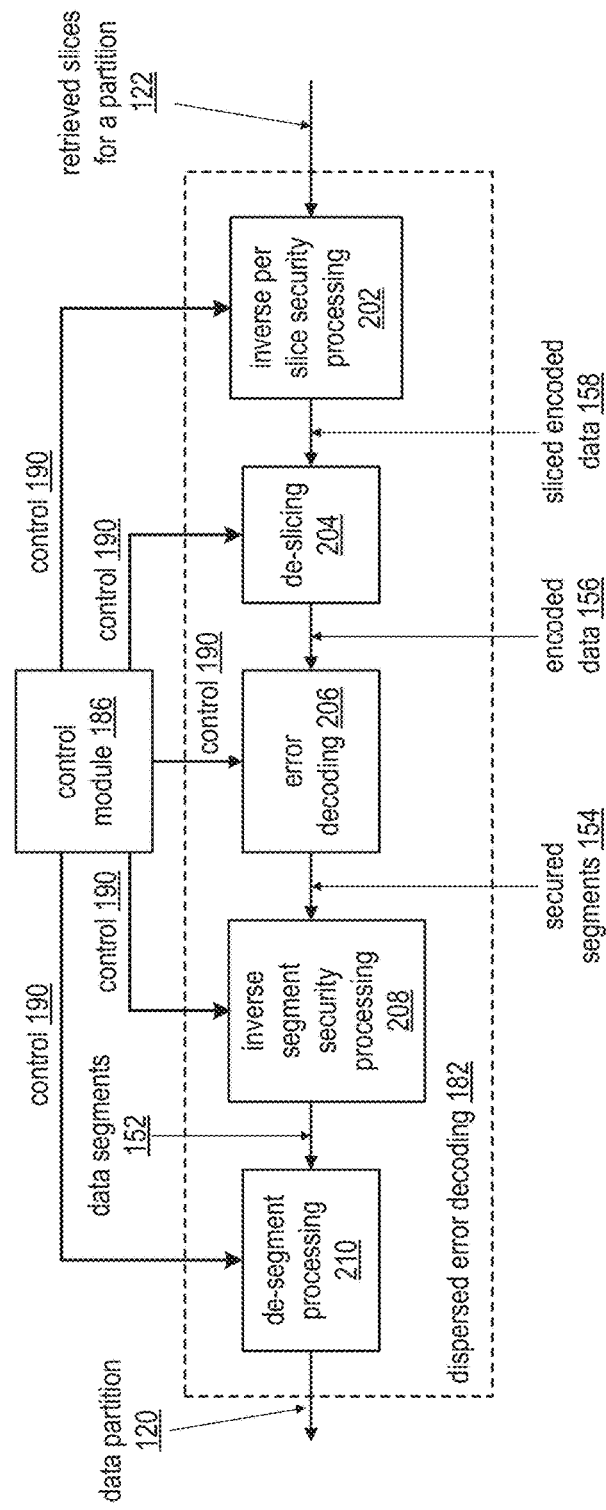
FIG. 16 is a schematic block diagram of an embodiment of a dispersed error decoding in accordance with the present invention.

FIG. 16 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, a de-segmenting processing module 210, and a control module 186.

In an example of operation, the inverse per slice security processing module 202, when enabled by the control module 186, unsecures each encoded data slice 122 based on slice de-security information received as control information 190 (e.g., the compliment of the slice security information discussed with reference to FIG. 6) received from the control module 186. The slice security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 122, it decrypts each verified encoded data slice, and decompresses each decrypted encoded data slice to produce slice encoded data 158. When the inverse per slice security processing module 202 is not enabled, it passes the encoded data slices 122 as the sliced encoded data 158 or is bypassed such that the retrieved encoded data slices 122 are provided as the sliced encoded data 158.

The de-slicing module 204 de-slices the sliced encoded data 158 into encoded data segments 156 in accordance with a pillar width of the error correction encoding parameters received as control information 190 from the control module 186. For example, if the pillar width is five, the de-slicing module 204 de-slices a set of five encoded data slices into an encoded data segment 156. The error decoding module 206 decodes the encoded data segments 156 in accordance with error correction decoding parameters received as control information 190 from the control module 186 to produce secure data segments 154. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments 154 based on segment security information received as control information 190 from the control module 186. The segment security information includes data decompression, decryption, de-watermarking, integrity check (e.g., CRC, etc.) verification, and/or any other type of digital security. For example, when the inverse segment security processing module 208 is enabled, it verifies integrity information (e.g., a CRC value) of each secure data segment 154, it decrypts each verified secured data segment, and decompresses each decrypted secure data segment to produce a data segment 152. When the inverse segment security processing module 208 is not enabled, it passes the decoded data segment 154 as the data segment 152 or is bypassed.

The de-segment processing module 210 receives the data segments 152 and receives de-segmenting information as control information 190 from the control module 186. The de-segmenting information indicates how the de-segment processing module 210 is to de-segment the data segments 152 into a data partition 120. For example, the de-segmenting information indicates how the rows and columns of data segments are to be rearranged to yield the data partition 120.

Figure 17:
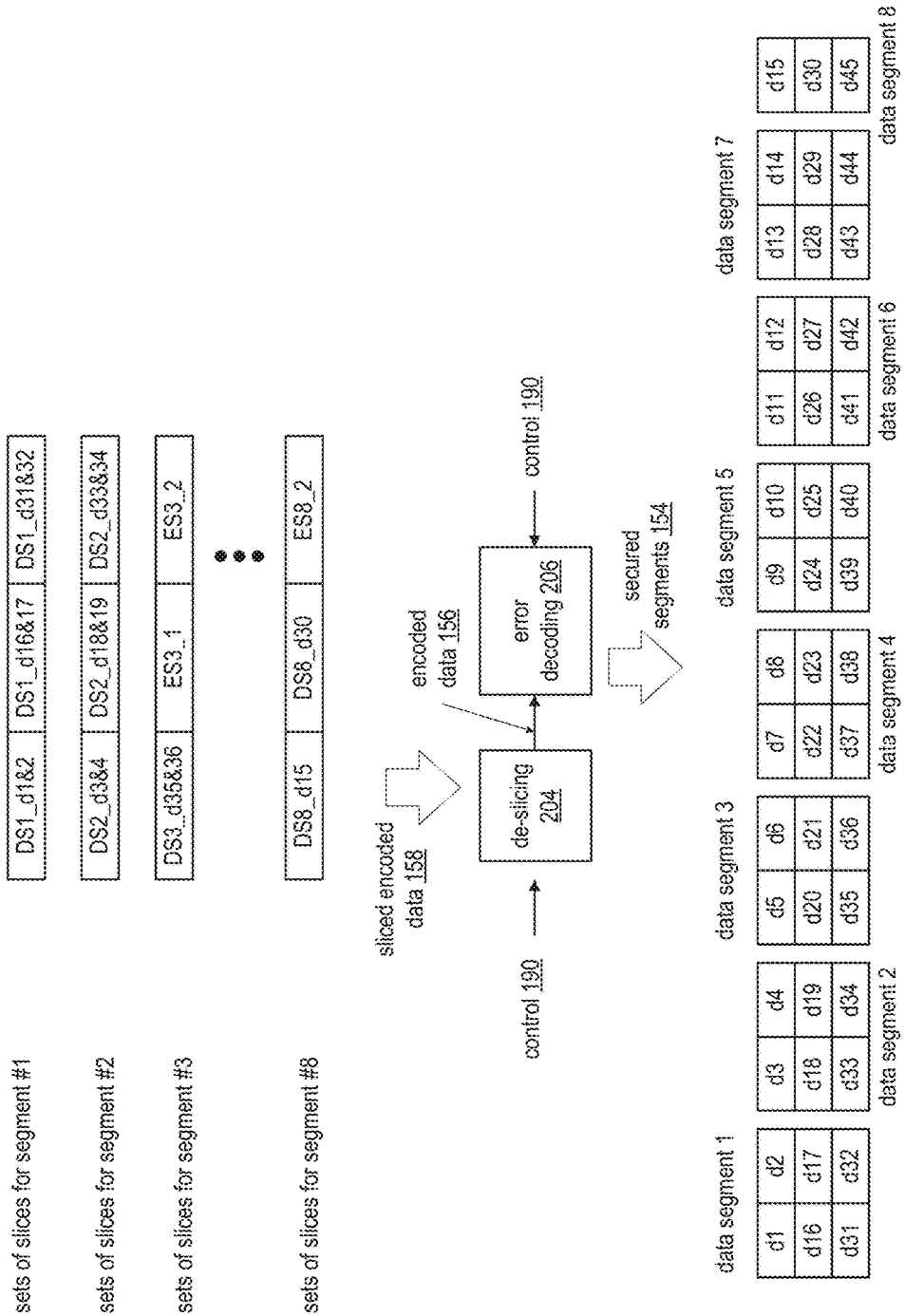
FIG. 17 is a diagram of an example of de-slicing and error decoding processing of the dispersed error decoding in accordance with the present invention.

FIG. 17 is a diagram of an example of de-slicing and error decoding processing of a dispersed error decoding module. A de-slicing module 204 receives at least a decode threshold number of encoded data slices 158 for each data segment in accordance with control information 190 and provides encoded data 156. In this example, a decode threshold is three. As such, each set of encoded data slices 158 is shown to have three encoded data slices per data segment. The de-slicing module 204 may receive three encoded data slices per data segment because an associated distributed storage and task (DST) client module requested retrieving only three encoded data slices per segment or selected three of the retrieved encoded data slices per data segment. As shown, which is based on the unity matrix encoding previously discussed with reference to FIG. 8, an encoded data slice may be a data-based encoded data slice (e.g., DS1_d1&d2) or an error code based encoded data slice (e.g., ES3_1).

An error decoding module 206 decodes the encoded data 156 of each data segment in accordance with the error correction decoding parameters of control information 190 to produce secured segments 154. In this example, data segment 1 includes 3 rows with each row being treated as one word for encoding. As such, data segment 1 includes three words: word 1 including data blocks d1 and d2, word 2 including data blocks d16 and d17, and word 3 including data blocks d31 and d32. Each of data segments 2-7 includes three words where each word includes two data blocks. Data segment 8 includes three words where each word includes a single data block (e.g., d15, d30, and d45).

Figure 18:
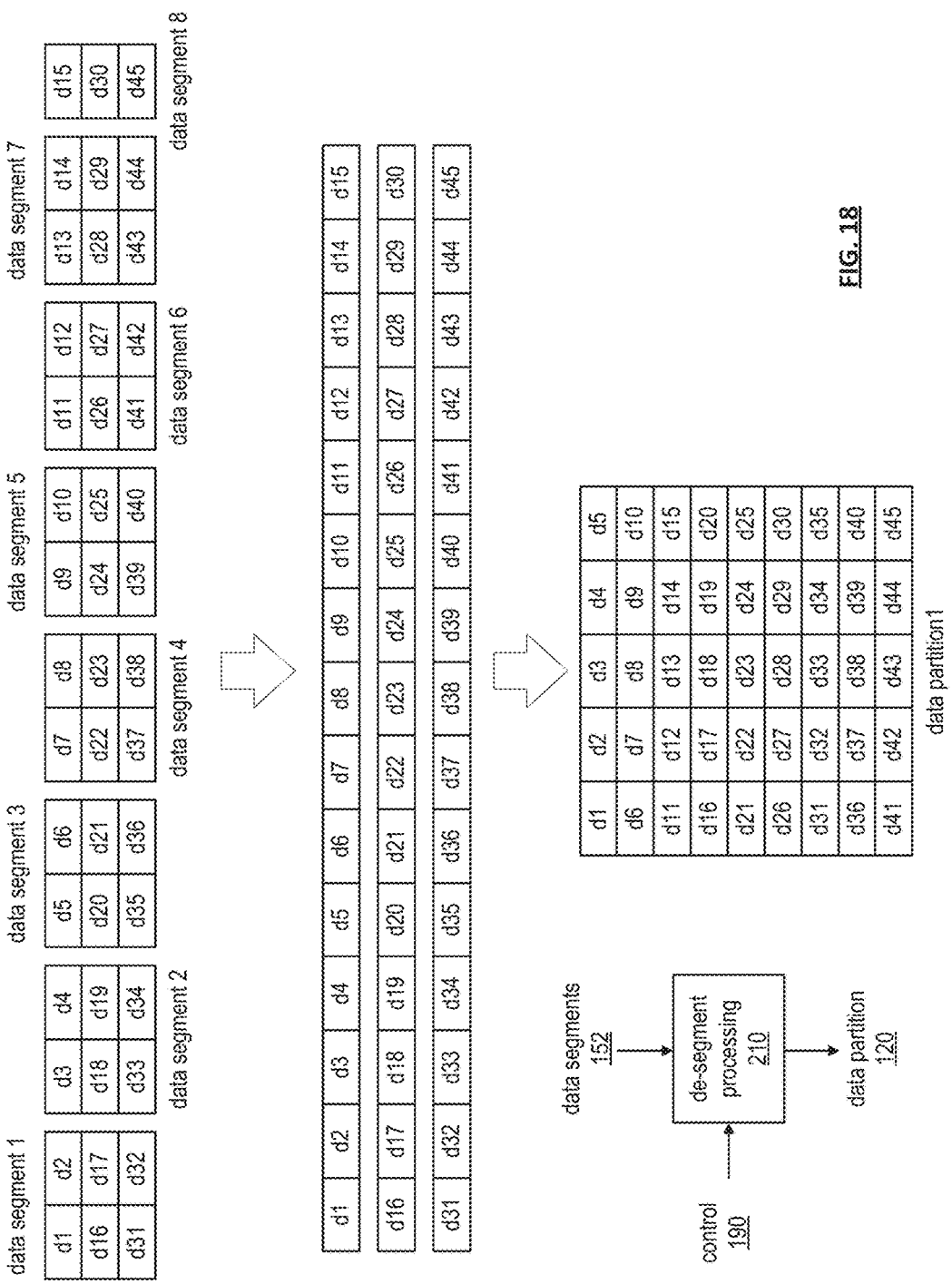
FIG. 18 is a diagram of an example of a de-segment processing of the dispersed error decoding in accordance with the present invention.

FIG. 18 is a diagram of an example of de-segment processing of an inbound distributed storage and task (DST) processing. In this example, a de-segment processing module 210 receives data segments 152 (e.g., 1-8) and rearranges the data blocks of the data segments into rows and columns in accordance with de-segmenting information of control information 190 to produce a data partition 120. Note that the number of rows is based on the decode threshold (e.g., 3 in this specific example) and the number of columns is based on the number and size of the data blocks.

The de-segmenting module 210 converts the rows and columns of data blocks into the data partition 120. Note that each data block may be of the same size as other data blocks or of a different size. In addition, the size of each data block may be a few bytes to megabytes of data.

Figure 19:
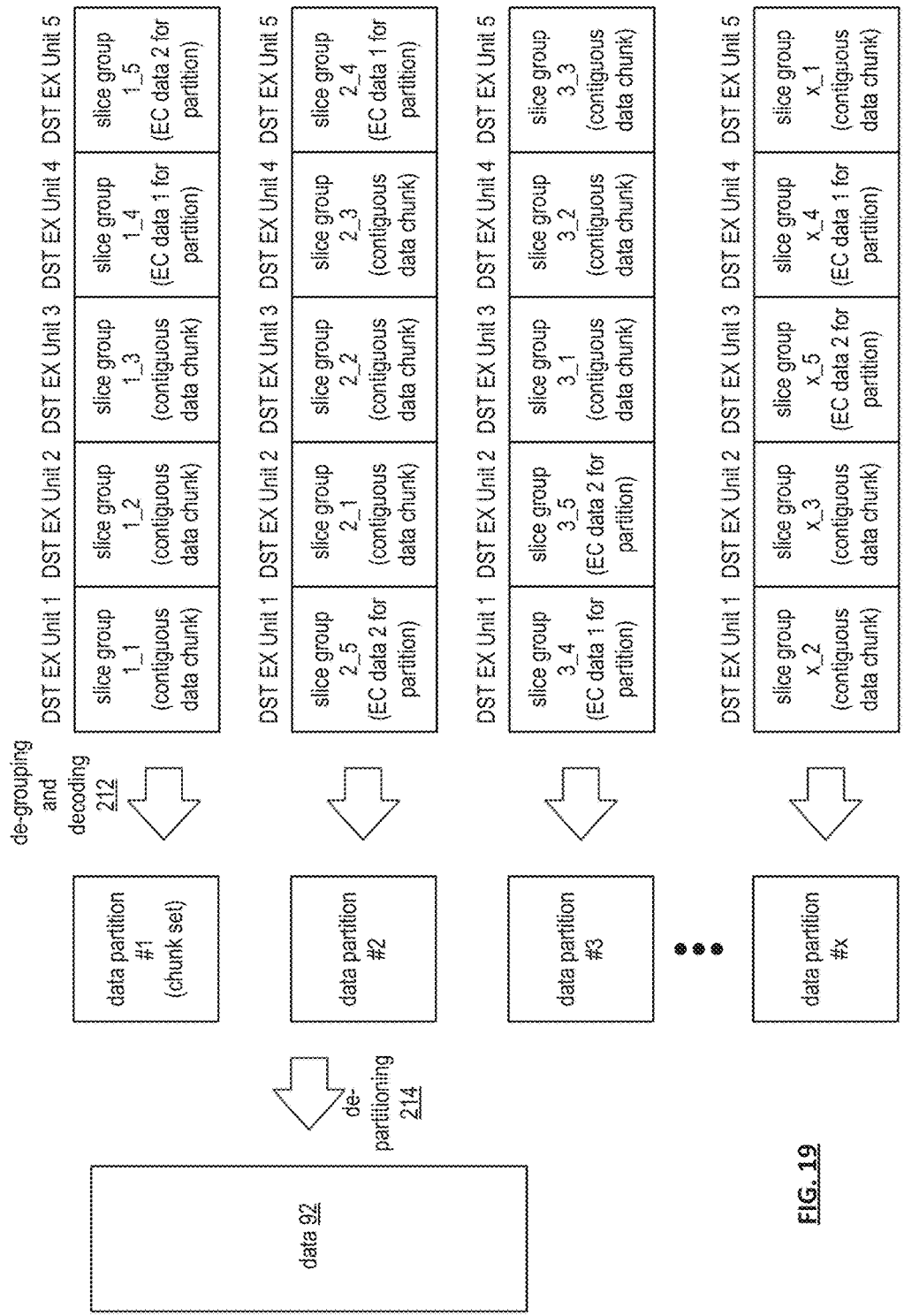
FIG. 19 is a diagram of an example of converting slice groups into data in accordance with the present invention.

FIG. 19 is a diagram of an example of converting slice groups into data 92 within an inbound distributed storage and task (DST) processing section. As shown, the data 92 is reconstructed from a plurality of data partitions (1-x, where x is an integer greater than 4). Each data partition (or chunk set of data) is decoded and re-grouped using a de-grouping and decoding function 212 and a de-partition function 214 from slice groupings as previously discussed. For a given data partition, the slice groupings (e.g., at least a decode threshold per data segment of encoded data slices) are received from DST execution units. From data partition to data partition, the ordering of the slice groupings received from the DST execution units may vary as discussed with reference to FIG. 10.

Figure 20:
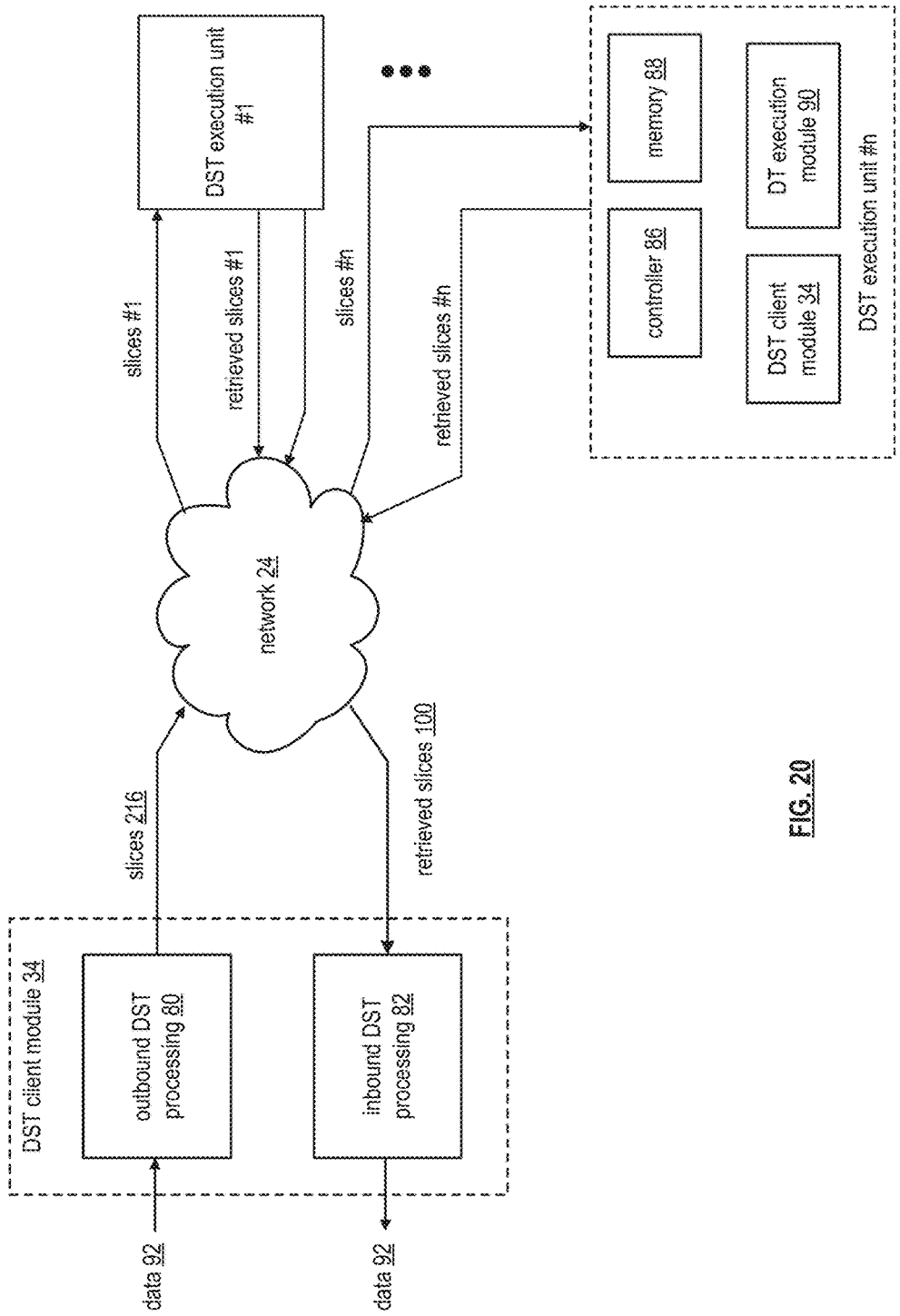
FIG. 20 is a diagram of an example of a distributed storage within the distributed computing system in accordance with the present invention.

FIG. 20 is a diagram of an example of a distributed storage and/or retrieval within the distributed computing system. The distributed computing system includes a plurality of distributed storage and/or task (DST) processing client modules 34 (one shown) coupled to a distributed storage and/or task processing network (DSTN) module, or multiple DSTN modules, via a network 24. The DST client module 34 includes an outbound DST processing section 80 and an inbound DST processing section 82. The DSTN module includes a plurality of DST execution units. Each DST execution unit includes a controller 86, memory 88, one or more distributed task (DT) execution modules 90, and a DST client module 34.

In an example of data storage, the DST client module 34 has data 92 that it desires to store in the DSTN module. The data 92 may be a file (e.g., video, audio, text, graphics, etc.), a data object, a data block, an update to a file, an update to a data block, etc. In this instance, the outbound DST processing module 80 converts the data 92 into encoded data slices 216 as will be further described with reference to FIGS. 21-23. The outbound DST processing module 80 sends, via the network 24, to the DST execution units for storage as further described with reference to FIG. 24.

In an example of data retrieval, the DST client module 34 issues a retrieve request to the DST execution units for the desired data 92. The retrieve request may address each DST executions units storing encoded data slices of the desired data, address a decode threshold number of DST execution units, address a read threshold number of DST execution units, or address some other number of DST execution units. In response to the request, each addressed DST execution unit retrieves its encoded data slices 100 of the desired data and sends them to the inbound DST processing section 82, via the network 24.

When, for each data segment, the inbound DST processing section 82 receives at least a decode threshold number of encoded data slices 100, it converts the encoded data slices 100 into a data segment. The inbound DST processing section 82 aggregates the data segments to produce the retrieved data 92.

Figure 21:
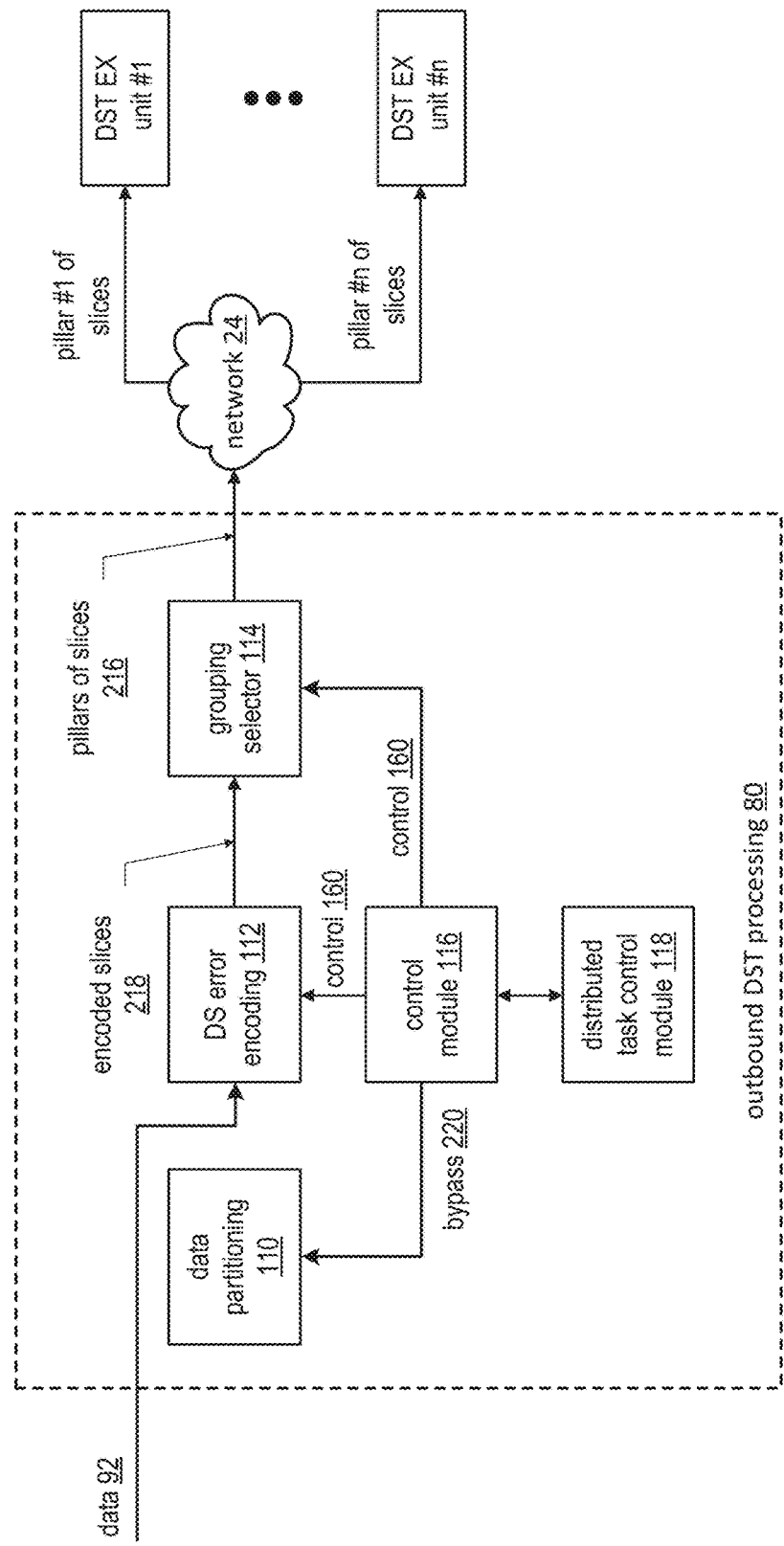
FIG. 21 is a schematic block diagram of an example of operation of outbound distributed storage and/or task (DST) processing for storing data in accordance with the present invention.

FIG. 21 is a schematic block diagram of an embodiment of an outbound distributed storage and/or task (DST) processing section 80 of a DST client module coupled to a distributed storage and task network (DSTN) module (e.g., a plurality of DST execution units) via a network 24. The outbound DST processing section 80 includes a data partitioning module 110, a dispersed storage (DS) error encoding module 112, a grouping selector module 114, a control module 116, and a distributed task control module 118.

In an example of operation, the data partitioning module 110 is by-passed such that data 92 is provided directly to the DS error encoding module 112. The control module 116 coordinates the by-passing of the data partitioning module 110 by outputting a bypass 220 message to the data partitioning module 110.

The DS error encoding module 112 receives the data 92 in a serial manner, a parallel manner, and/or a combination thereof. The DS error encoding module 112 DS error encodes the data in accordance with control information 160 from the control module 116 to produce encoded data slices 218. The DS error encoding includes segmenting the data 92 into data segments, segment security processing (e.g., encryption, compression, watermarking, integrity check (e.g., CRC, etc.)), error encoding, slicing, and/or per slice security processing (e.g., encryption, compression, watermarking, integrity check (e.g., CRC, etc.)). The control information 160 indicates which steps of the DS error encoding are active for the data 92 and, for active steps, indicates the parameters for the step. For example, the control information 160 indicates that the error encoding is active and includes error encoding parameters (e.g., pillar width, decode threshold, write threshold, read threshold, type of error encoding, etc.).

The grouping selector module 114 groups the encoded slices 218 of the data segments into pillars of slices 216. The number of pillars corresponds to the pillar width of the DS error encoding parameters. In this example, the distributed task control module 118 facilitates the storage request.

Figure 22:
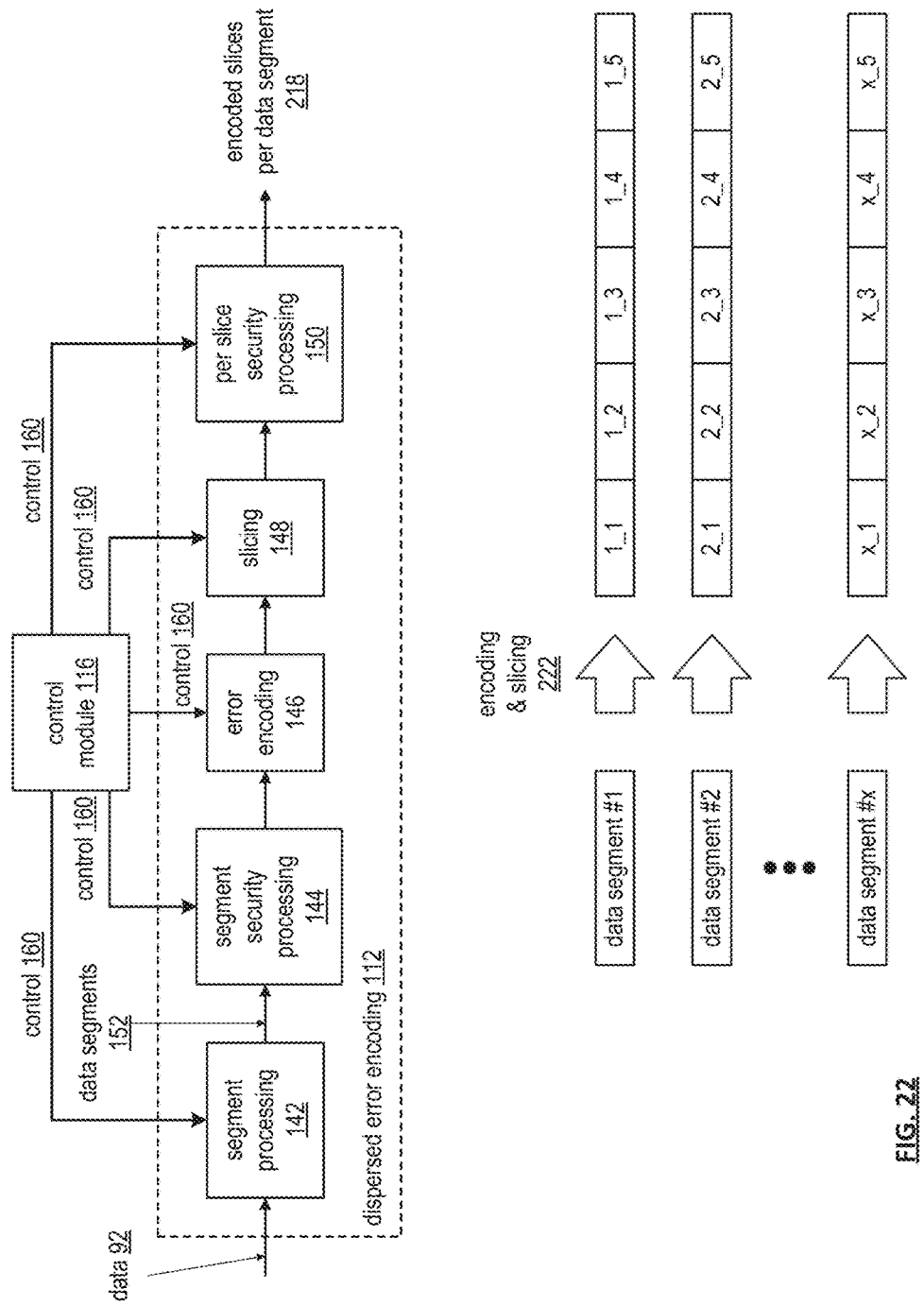
FIG. 22 is a schematic block diagram of an example of a dispersed error encoding for the example of FIG. 21 in accordance with the present invention.

FIG. 22 is a schematic block diagram of an example of a dispersed storage (DS) error encoding module 112 for the example of FIG. 21. The DS error encoding module 112 includes a segment processing module 142, a segment security processing module 144, an error encoding module 146, a slicing module 148, and a per slice security processing module 150. Each of these modules is coupled to a control module 116 to receive control information 160 therefrom.

In an example of operation, the segment processing module 142 receives data 92 and receives segmenting information as control information 160 from the control module 116. The segmenting information indicates how the segment processing module is to segment the data. For example, the segmenting information indicates the size of each data segment. The segment processing module 142 segments the data 92 into data segments 152 in accordance with the segmenting information.

The segment security processing module 144, when enabled by the control module 116, secures the data segments 152 based on segment security information received as control information 160 from the control module 116. The segment security information includes data compression, encryption, watermarking, integrity check (e.g., CRC, etc.), and/or any other type of digital security. For example, when the segment security processing module 144 is enabled, it compresses a data segment 152, encrypts the compressed data segment, and generates a CRC value for the encrypted data segment to produce a secure data segment. When the segment security processing module 144 is not enabled, it passes the data segments 152 to the error encoding module 146 or is bypassed such that the data segments 152 are provided to the error encoding module 146.

The error encoding module 146 encodes the secure data segments in accordance with error correction encoding parameters received as control information 160 from the control module 116. The error correction encoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction encoding parameters identify a specific error correction encoding scheme, specifies a pillar width of five, and specifies a decode threshold of three. From these parameters, the error encoding module 146 encodes a data segment to produce an encoded data segment.

The slicing module 148 slices the encoded data segment in accordance with a pillar width of the error correction encoding parameters. For example, if the pillar width is five, the slicing module slices an encoded data segment into a set of five encoded data slices. As such, for a plurality of data segments, the slicing module 148 outputs a plurality of sets of encoded data slices as shown within encoding and slicing function 222 as described.

The per slice security processing module 150, when enabled by the control module 116, secures each encoded data slice based on slice security information received as control information 160 from the control module 116. The slice security information includes data compression, encryption, watermarking, integrity check (e.g., CRC, etc.), and/or any other type of digital security. For example, when the per slice security processing module 150 is enabled, it may compress an encoded data slice, encrypt the compressed encoded data slice, and generate a CRC value for the encrypted encoded data slice to produce a secure encoded data slice tweaking. When the per slice security processing module 150 is not enabled, it passes the encoded data slices or is bypassed such that the encoded data slices 218 are the output of the DS error encoding module 112.

Figure 23:
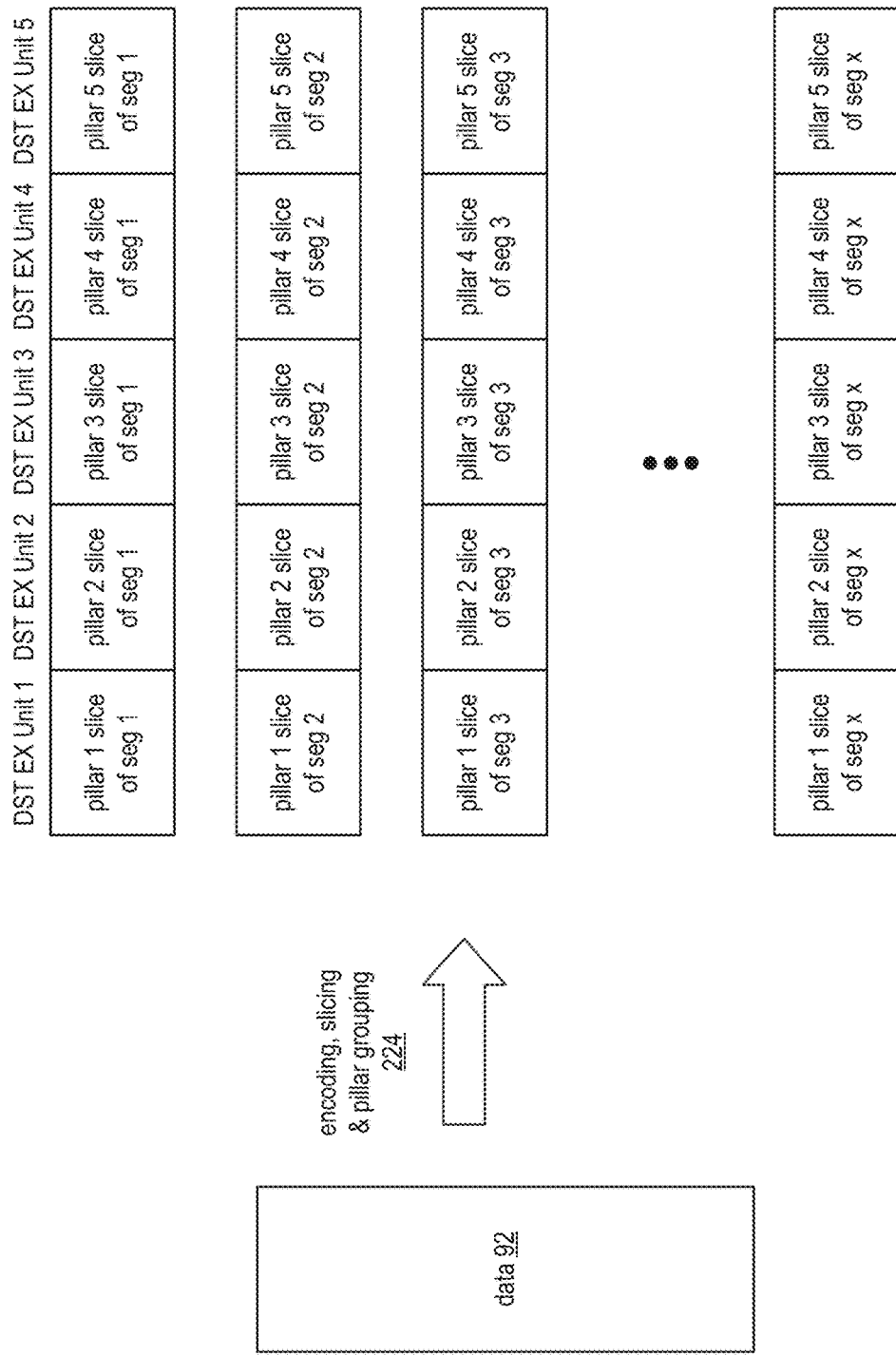
FIG. 23 is a diagram of an example of converting data into pillar slice groups for storage in accordance with the present invention.

FIG. 23 is a diagram of an example of converting data 92 into pillar slice groups utilizing encoding, slicing and pillar grouping function 224 for storage in memory of a distributed storage and task network (DSTN) module. As previously discussed the data 92 is encoded and sliced into a plurality of sets of encoded data slices; one set per data segment. The grouping selector module organizes the sets of encoded data slices into pillars of data slices. In this example, the DS error encoding parameters include a pillar width of 5 and a decode threshold of 3. As such, for each data segment, 5 encoded data slices are created.

The grouping selector module takes the first encoded data slice of each of the sets and forms a first pillar, which may be sent to the first DST execution unit. Similarly, the grouping selector module creates the second pillar from the second slices of the sets; the third pillar from the third slices of the sets; the fourth pillar from the fourth slices of the sets; and the fifth pillar from the fifth slices of the set.

Figure 24:
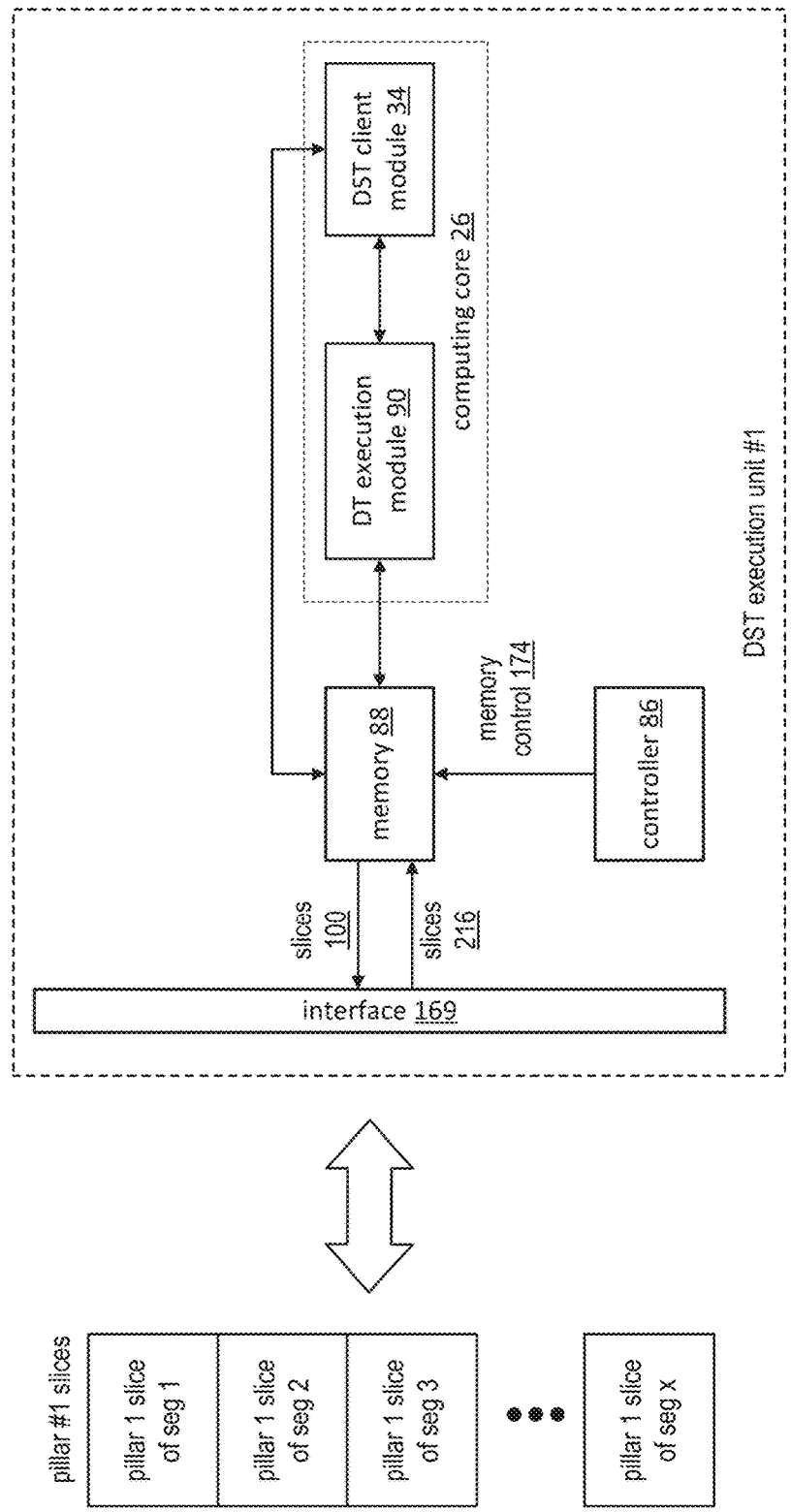
FIG. 24 is a schematic block diagram of an example of a storage operation of a DST execution unit in accordance with the present invention.

FIG. 24 is a schematic block diagram of an embodiment of a distributed storage and/or task (DST) execution unit that includes an interface 169, a controller 86, memory 88, one or more distributed task (DT) execution modules 90, and a DST client module 34. A computing core 26 may be utilized to implement the one or more DT execution modules 90 and the DST client module 34. The memory 88 is of sufficient size to store a significant number of encoded data slices (e.g., thousands of slices to hundreds-of-millions of slices) and may include one or more hard drives and/or one or more solid-state memory devices (e.g., flash memory, DRAM, etc.).

In an example of storing a pillar of slices 216, the DST execution unit receives, via interface 169, a pillar of slices 216 (e.g., pillar #1 slices). The memory 88 stores the encoded data slices 216 of the pillar of slices in accordance with memory control information 174 it receives from the controller 86. The controller 86 (e.g., a processing module, a CPU, etc.) generates the memory control information 174 based on distributed storage information (e.g., user information (e.g., user ID, distributed storage permissions, data access permission, etc.), vault information (e.g., virtual memory assigned to user, user group, etc.), etc.). Similarly, when retrieving slices, the DST execution unit receives, via interface 169, a slice retrieval request. The memory 88 retrieves the slice in accordance with memory control information 174 it receives from the controller 86. The memory 88 outputs the slice 100, via the interface 169, to a requesting entity.

Figure 25:
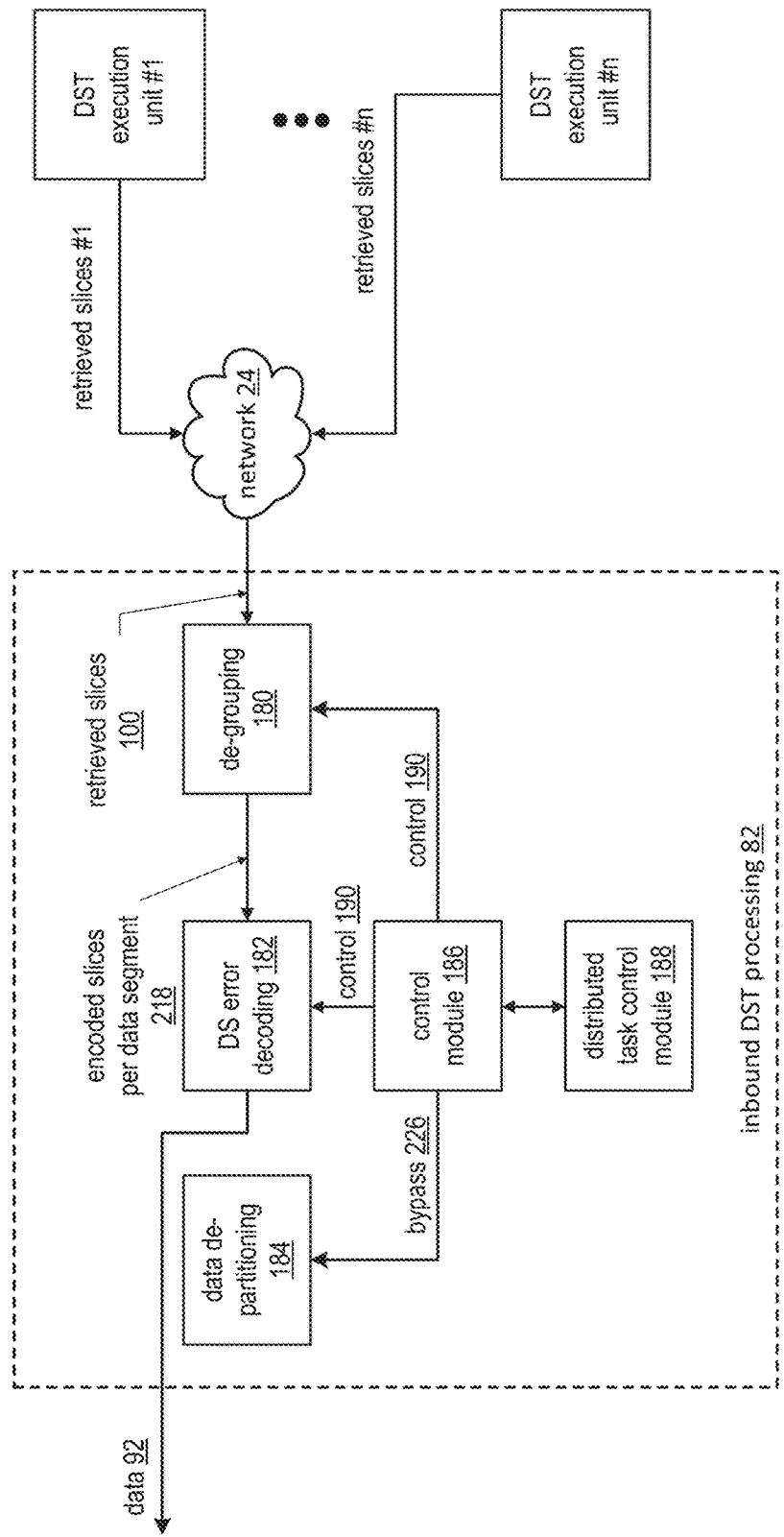
FIG. 25 is a schematic block diagram of an example of operation of inbound distributed storage and/or task (DST) processing for retrieving dispersed error encoded data in accordance with the present invention.

FIG. 25 is a schematic block diagram of an example of operation of an inbound distributed storage and/or task (DST) processing section 82 for retrieving dispersed error encoded data 92. The inbound DST processing section 82 includes a de-grouping module 180, a dispersed storage (DS) error decoding module 182, a data de-partitioning module 184, a control module 186, and a distributed task control module 188. Note that the control module 186 and/or the distributed task control module 188 may be separate modules from corresponding ones of an outbound DST processing section or may be the same modules.

In an example of operation, the inbound DST processing section 82 is retrieving stored data 92 from the DST execution units (i.e., the DSTN module). In this example, the DST execution units output encoded data slices corresponding to data retrieval requests from the distributed task control module 188. The de-grouping module 180 receives pillars of slices 100 and de-groups them in accordance with control information 190 from the control module 186 to produce sets of encoded data slices 218. The DS error decoding module 182 decodes, in accordance with the DS error encoding parameters received as control information 190 from the control module 186, each set of encoded data slices 218 to produce data segments, which are aggregated into retrieved data 92. The data de-partitioning module 184 is by-passed in this operational mode via a bypass signal 226 of control information 190 from the control module 186.

Figure 26:
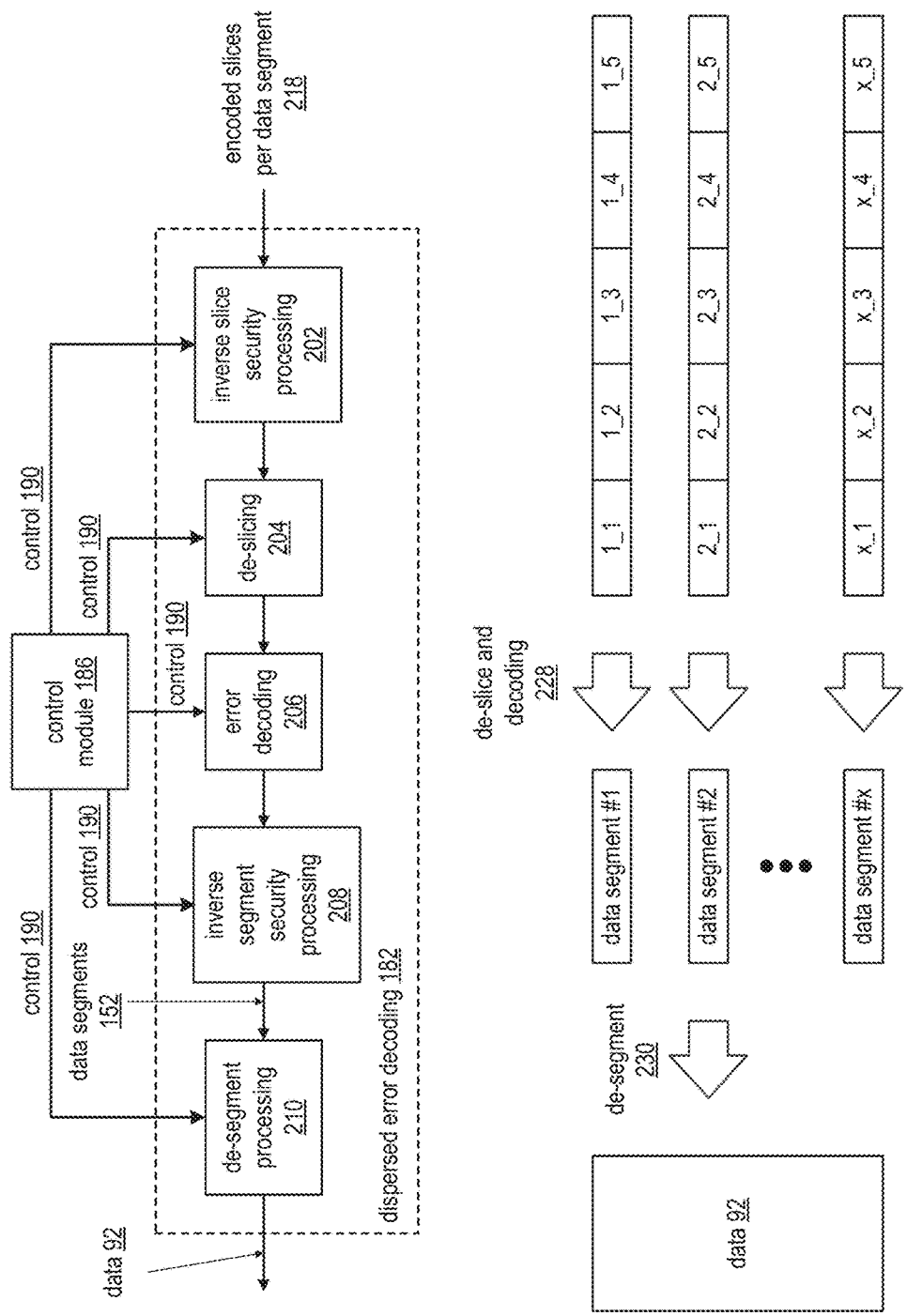
FIG. 26 is a schematic block diagram of an example of a dispersed error decoding for the example of FIG. 25 in accordance with the present invention.

FIG. 26 is a schematic block diagram of an embodiment of a dispersed storage (DS) error decoding module 182 of an inbound distributed storage and task (DST) processing section. The DS error decoding module 182 includes an inverse per slice security processing module 202, a de-slicing module 204, an error decoding module 206, an inverse segment security module 208, and a de-segmenting processing module 210. The dispersed error decoding module 182 is operable to de-slice and decode encoded slices per data segment 218 utilizing a de-slicing and decoding function 228 to produce a plurality of data segments that are de-segmented utilizing a de-segment function 230 to recover data 92.

In an example of operation, the inverse per slice security processing module 202, when enabled by the control module 186 via control information 190, unsecures each encoded data slice 218 based on slice de-security information (e.g., the compliment of the slice security information discussed with reference to FIG. 6) received as control information 190 from the control module 186. The slice de-security information includes data decompression, decryption, de-watermarking, integrity check (e.g., CRC verification, etc.), and/or any other type of digital security. For example, when the inverse per slice security processing module 202 is enabled, it verifies integrity information (e.g., a CRC value) of each encoded data slice 218, it decrypts each verified encoded data slice, and decompresses each decrypted encoded data slice to produce slice encoded data. When the inverse per slice security processing module 202 is not enabled, it passes the encoded data slices 218 as the sliced encoded data or is bypassed such that the retrieved encoded data slices 218 are provided as the sliced encoded data.

The de-slicing module 204 de-slices the sliced encoded data into encoded data segments in accordance with a pillar width of the error correction encoding parameters received as control information 190 from a control module 186. For example, if the pillar width is five, the de-slicing module de-slices a set of five encoded data slices into an encoded data segment. Alternatively, the encoded data segment may include just three encoded data slices (e.g., when the decode threshold is 3).

The error decoding module 206 decodes the encoded data segments in accordance with error correction decoding parameters received as control information 190 from the control module 186 to produce secure data segments. The error correction decoding parameters include identifying an error correction encoding scheme (e.g., forward error correction algorithm, a Reed-Solomon based algorithm, an information dispersal algorithm, etc.), a pillar width, a decode threshold, a read threshold, a write threshold, etc. For example, the error correction decoding parameters identify a specific error correction encoding scheme, specify a pillar width of five, and specify a decode threshold of three.

The inverse segment security processing module 208, when enabled by the control module 186, unsecures the secured data segments based on segment security information received as control information 190 from the control module 186. The segment security information includes data decompression, decryption, de-watermarking, integrity check (e.g., CRC, etc.) verification, and/or any other type of digital security. For example, when the inverse segment security processing module is enabled, it verifies integrity information (e.g., a CRC value) of each secure data segment, it decrypts each verified secured data segment, and decompresses each decrypted secure data segment to produce a data segment 152. When the inverse segment security processing module 208 is not enabled, it passes the decoded data segment 152 as the data segment or is bypassed. The de-segmenting processing module 210 aggregates the data segments 152 into the data 92 in accordance with control information 190 from the control module 186.

Figure 27:
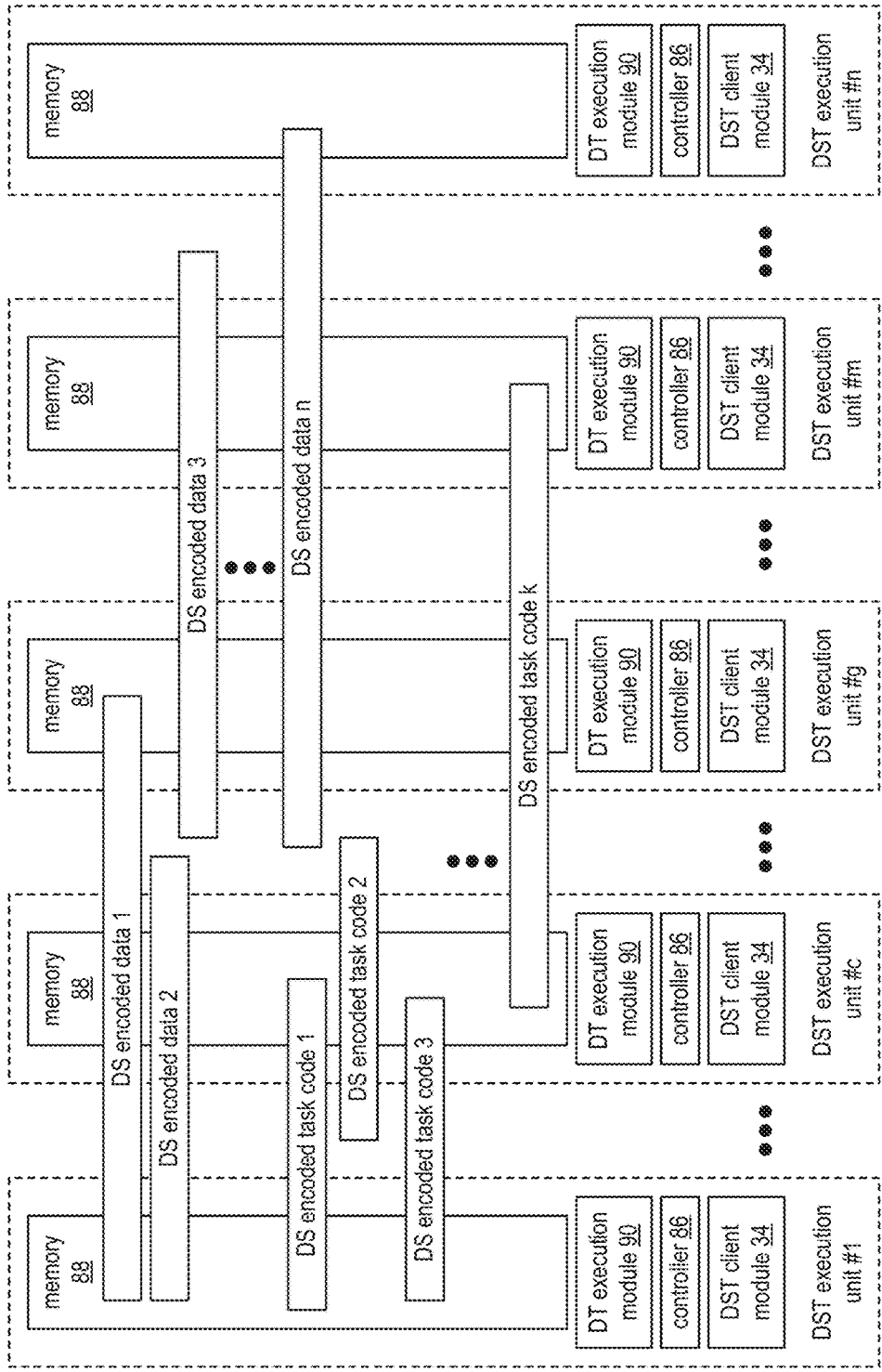
FIG. 27 is a schematic block diagram of an example of a distributed storage and task processing network (DSTN) module storing a plurality of data and a plurality of task codes in accordance with the present invention.

FIG. 27 is a schematic block diagram of an example of a distributed storage and task processing network (DSTN) module that includes a plurality of distributed storage and task (DST) execution units (#1 through #n, where, for example, n is an integer greater than or equal to three). Each of the DST execution units includes a DST client module 34, a controller 86, one or more DT (distributed task) execution modules 90, and memory 88.

In this example, the DSTN module stores, in the memory of the DST execution units, a plurality of DS (dispersed storage) encoded data (e.g., 1 through n, where n is an integer greater than or equal to two) and stores a plurality of DS encoded task codes (e.g., 1 through k, where k is an integer greater than or equal to two). The DS encoded data may be encoded in accordance with one or more examples described with reference to FIGS. 3-19 (e.g., organized in slice groupings) or encoded in accordance with one or more examples described with reference to FIGS. 20-26 (e.g., organized in pillar groups). The data that is encoded into the DS encoded data may be of any size and/or of any content. For example, the data may be one or more digital books, a copy of a company's emails, a large-scale Internet search, a video security file, one or more entertainment video files (e.g., television programs, movies, etc.), data files, and/or any other large amount of data (e.g., greater than a few Terabytes).

The tasks that are encoded into the DS encoded task code may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. The tasks may be encoded into the DS encoded task code in accordance with one or more examples described with reference to FIGS. 3-19 (e.g., organized in slice groupings) or encoded in accordance with one or more examples described with reference to FIGS. 20-26 (e.g., organized in pillar groups).

In an example of operation, a DST client module of a user device or of a DST processing unit issues a DST request to the DSTN module. The DST request may include a request to retrieve stored data, or a portion thereof, may include a request to store data that is included with the DST request, may include a request to perform one or more tasks on stored data, may include a request to perform one or more tasks on data included with the DST request, etc. In the cases where the DST request includes a request to store data or to retrieve data, the client module and/or the DSTN module processes the request as previously discussed with reference to one or more of FIGS. 3-19 (e.g., slice groupings) and/or 20-26 (e.g., pillar groupings). In the case where the DST request includes a request to perform one or more tasks on data included with the DST request, the DST client module and/or the DSTN module process the DST request as previously discussed with reference to one or more of FIGS. 3-19.

In the case where the DST request includes a request to perform one or more tasks on stored data, the DST client module and/or the DSTN module processes the DST request as will be described with reference to one or more of FIGS. 28-39. In general, the DST client module identifies data and one or more tasks for the DSTN module to execute upon the identified data. The DST request may be for a one-time execution of the task or for an on-going execution of the task. As an example of the latter, as a company generates daily emails, the DST request may be to daily search new emails for inappropriate content and, if found, record the content, the email sender(s), the email recipient(s), email routing information, notify human resources of the identified email, etc.

Figure 28:
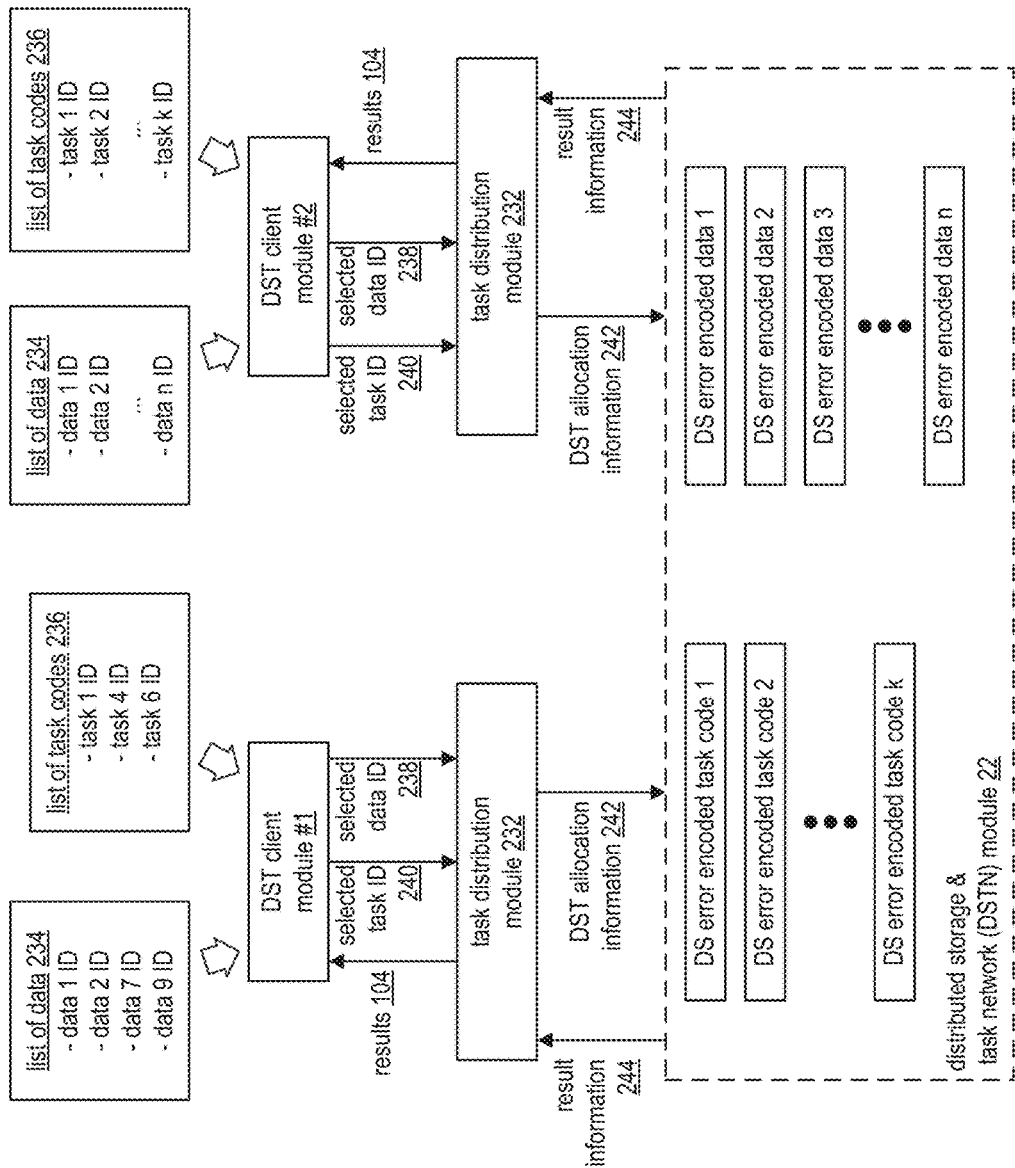
FIG. 28 is a schematic block diagram of an example of the distributed computing system performing tasks on stored data in accordance with the present invention.

FIG. 28 is a schematic block diagram of an example of a distributed computing system performing tasks on stored data. In this example, two distributed storage and task (DST) client modules 1-2 are shown: the first may be associated with a user device and the second may be associated with a DST processing unit or a high priority user device (e.g., high priority clearance user, system administrator, etc.). Each DST client module includes a list of stored data 234 and a list of tasks codes 236. The list of stored data 234 includes one or more entries of data identifying information, where each entry identifies data stored in the DSTN module 22. The data identifying information (e.g., data ID) includes one or more of a data file name, a data file directory listing, DSTN addressing information of the data, a data object identifier, etc. The list of tasks 236 includes one or more entries of task code identifying information, when each entry identifies task codes stored in the DSTN module 22. The task code identifying information (e.g., task ID) includes one or more of a task file name, a task file directory listing, DSTN addressing information of the task, another type of identifier to identify the task, etc.

As shown, the list of data 234 and the list of tasks 236 are each smaller in number of entries for the first DST client module than the corresponding lists of the second DST client module. This may occur because the user device associated with the first DST client module has fewer privileges in the distributed computing system than the device associated with the second DST client module. Alternatively, this may occur because the user device associated with the first DST client module serves fewer users than the device associated with the second DST client module and is restricted by the distributed computing system accordingly. As yet another alternative, this may occur through no restraints by the distributed computing system, it just occurred because the operator of the user device associated with the first DST client module has selected fewer data and/or fewer tasks than the operator of the device associated with the second DST client module.

In an example of operation, the first DST client module selects one or more data entries 238 and one or more tasks 240 from its respective lists (e.g., selected data ID and selected task ID). The first DST client module sends its selections to a task distribution module 232. The task distribution module 232 may be within a stand-alone device of the distributed computing system, may be within the user device that contains the first DST client module, or may be within the DSTN module 22.

Regardless of the task distribution module's location, it generates DST allocation information 242 from the selected task ID 240 and the selected data ID 238. The DST allocation information 242 includes data partitioning information, task execution information, and/or intermediate result information. The task distribution module 232 sends the DST allocation information 242 to the DSTN module 22. Note that one or more examples of the DST allocation information will be discussed with reference to one or more of FIGS. 29-39.

The DSTN module 22 interprets the DST allocation information 242 to identify the stored DS encoded data (e.g., DS error encoded data 2) and to identify the stored DS error encoded task code (e.g., DS error encoded task code 1). In addition, the DSTN module 22 interprets the DST allocation information 242 to determine how the data is to be partitioned and how the task is to be partitioned. The DSTN module 22 also determines whether the selected DS error encoded data 238 needs to be converted from pillar grouping to slice grouping. If so, the DSTN module 22 converts the selected DS error encoded data into slice groupings and stores the slice grouping DS error encoded data by overwriting the pillar grouping DS error encoded data or by storing it in a different location in the memory of the DSTN module 22 (i.e., does not overwrite the pillar grouping DS encoded data).

The DSTN module 22 partitions the data and the task as indicated in the DST allocation information 242 and sends the portions to selected DST execution units of the DSTN module 22. Each of the selected DST execution units performs its partial task(s) on its slice groupings to produce partial results. The DSTN module 22 collects the partial results from the selected DST execution units and provides them, as result information 244, to the task distribution module. The result information 244 may be the collected partial results, one or more final results as produced by the DSTN module 22 from processing the partial results in accordance with the DST allocation information 242, or one or more intermediate results as produced by the DSTN module 22 from processing the partial results in accordance with the DST allocation information 242.

The task distribution module 232 receives the result information 244 and provides one or more final results 104 therefrom to the first DST client module. The final result(s) 104 may be result information 244 or a result(s) of the task distribution module's processing of the result information 244.

In concurrence with processing the selected task of the first DST client module, the distributed computing system may process the selected task(s) of the second DST client module on the selected data(s) of the second DST client module. Alternatively, the distributed computing system may process the second DST client module's request subsequent to, or preceding, that of the first DST client module. Regardless of the ordering and/or parallel processing of the DST client module requests, the second DST client module provides its selected data 238 and selected task 240 to a task distribution module 232. If the task distribution module 232 is a separate device of the distributed computing system or within the DSTN module, the task distribution modules 232 coupled to the first and second DST client modules may be the same module. The task distribution module 232 processes the request of the second DST client module in a similar manner as it processed the request of the first DST client module.

Figure 29:
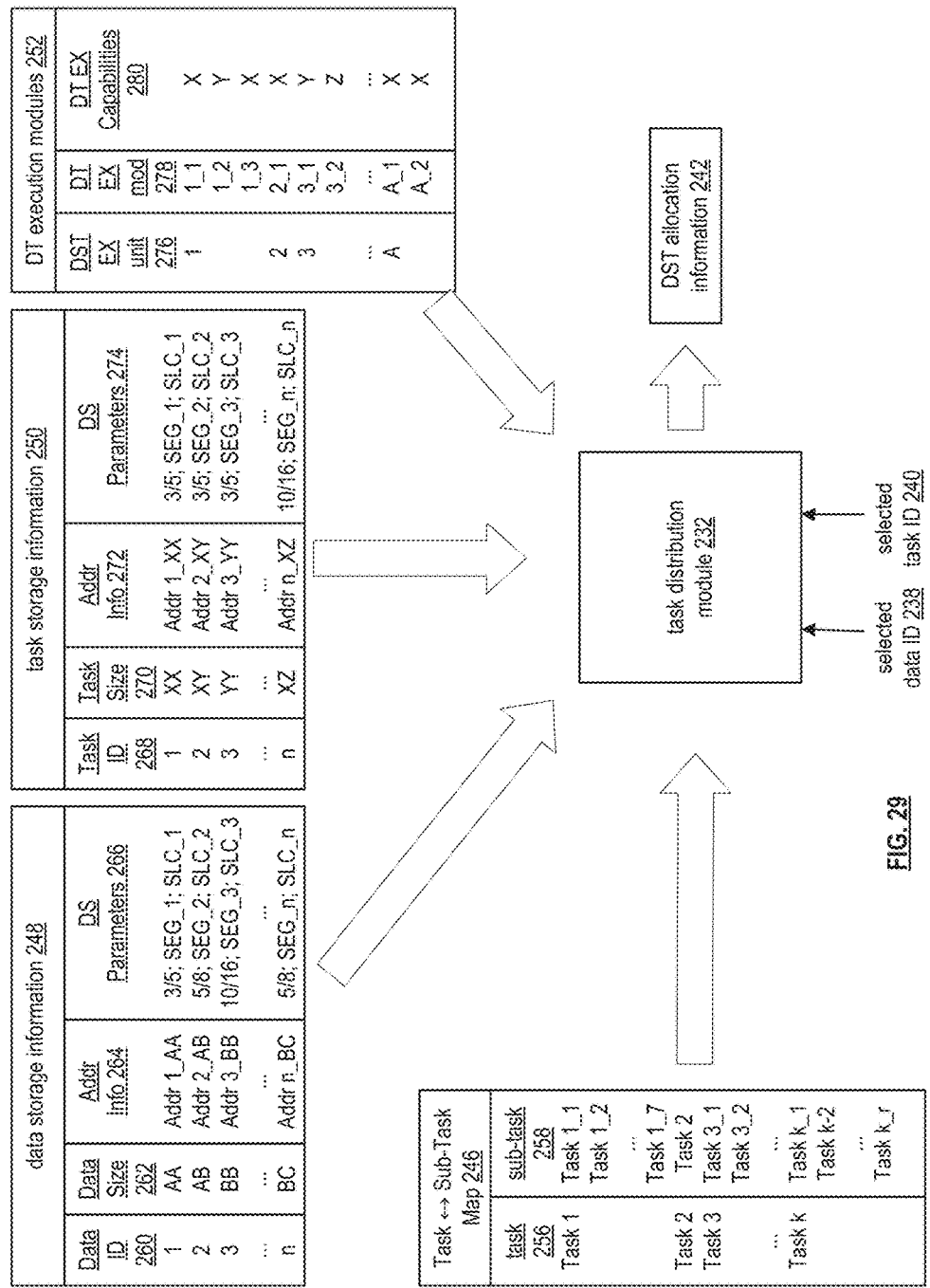
FIG. 29 is a schematic block diagram of an embodiment of a task distribution module facilitating the example of FIG. 28 in accordance with the present invention.

FIG. 29 is a schematic block diagram of an embodiment of a task distribution module 232 facilitating the example of FIG. 28. The task distribution module 232 includes a plurality of tables it uses to generate distributed storage and task (DST) allocation information 242 for selected data and selected tasks received from a DST client module. The tables include data storage information 248, task storage information 250, distributed task (DT) execution module information 252, and task⇔sub-task mapping information 246.

The data storage information table 248 includes a data identification (ID) field 260, a data size field 262, an addressing information field 264, distributed storage (DS) information 266, and may further include other information regarding the data, how it is stored, and/or how it can be processed. For example, DS encoded data #1 has a data ID of 1, a data size of AA (e.g., a byte size of a few Terabytes or more), addressing information of Addr_1_AA, and DS parameters of 3/5; SEG_1; and SLC_1. In this example, the addressing information may be a virtual address corresponding to the virtual address of the first storage word (e.g., one or more bytes) of the data and information on how to calculate the other addresses, may be a range of virtual addresses for the storage words of the data, physical addresses of the first storage word or the storage words of the data, may be a list of slice names of the encoded data slices of the data, etc. The DS parameters may include identity of an error encoding scheme, decode threshold/pillar width (e.g., 3/5 for the first data entry), segment security information (e.g., SEG_1), per slice security information (e.g., SLC_1), and/or any other information regarding how the data was encoded into data slices. The task storage information table 250 includes a task identification (ID) field 268, a task size field 270, an addressing information field 272, distributed storage (DS) information 274, and may further include other information regarding the task, how it is stored, and/or how it can be used to process data. For example, DS encoded task #2 has a task ID of 2, a task size of XY, addressing information of Addr_2_XY, and DS parameters of 3/5; SEG_2; and SLC_2. In this example, the addressing information may be a virtual address corresponding to the virtual address of the first storage word (e.g., one or more bytes) of the task and information on how to calculate the other addresses, may be a range of virtual addresses for the storage words of the task, physical addresses of the first storage word or the storage words of the task, may be a list of slices names of the encoded slices of the task code, etc. The DS parameters may include identity of an error encoding scheme, decode threshold/pillar width (e.g., 3/5 for the first data entry), segment security information (e.g., SEG_2), per slice security information (e.g., SLC_2), and/or any other information regarding how the task was encoded into encoded task slices. Note that the segment and/or the per-slice security information include a type of encryption (if enabled), a type of compression (if enabled), watermarking information (if enabled), and/or an integrity check scheme (if enabled).

The task ⇔ sub-task mapping information table 246 includes a task field 256 and a sub-task field 258. The task field 256 identifies a task stored in the memory of a distributed storage and task network (DSTN) module and the corresponding sub-task fields 258 indicates whether the task includes sub-tasks and if so, how many and if any of the sub-tasks are ordered. In this example, the task ⇔ sub-task mapping information table 246 includes an entry for each task stored in memory of the DSTN module (e.g., task 1 through task k). In particular, this example indicates that task 1 includes 7 sub-tasks; task 2 does not include sub-tasks, and task k includes r number of sub-tasks (where r is an integer greater than or equal to two).

The DT execution module table 252 includes a DST execution unit ID field 276, a DT execution module ID field 278, and a DT execution module capabilities field 280. The DST execution unit ID field 276 includes the identity of DST units in the DSTN module. The DT execution module ID field 278 includes the identity of each DT execution unit in each DST unit. For example, DST unit 1 includes three DT executions modules (e.g., 1_1, 1_2, and 1_3). The DT execution capabilities field 280 includes identity of the capabilities of the corresponding DT execution unit. For example, DT execution module 1_1 includes capabilities X, where X includes one or more of MIPS capabilities, processing resources (e.g., quantity and capability of microprocessors, CPUs, digital signal processors, co-processor, microcontrollers, arithmetic logic circuitry, and/or any other analog and/or digital processing circuitry), availability of the processing resources, memory information (e.g., type, size, availability, etc.), and/or any information germane to executing one or more tasks.

From these tables, the task distribution module 232 generates the DST allocation information 242 to indicate where the data is stored, how to partition the data, where the task is stored, how to partition the task, which DT execution units should perform which partial task on which data partitions, where and how intermediate results are to be stored, etc. If multiple tasks are being performed on the same data or different data, the task distribution module factors such information into its generation of the DST allocation information.

Figure 30:
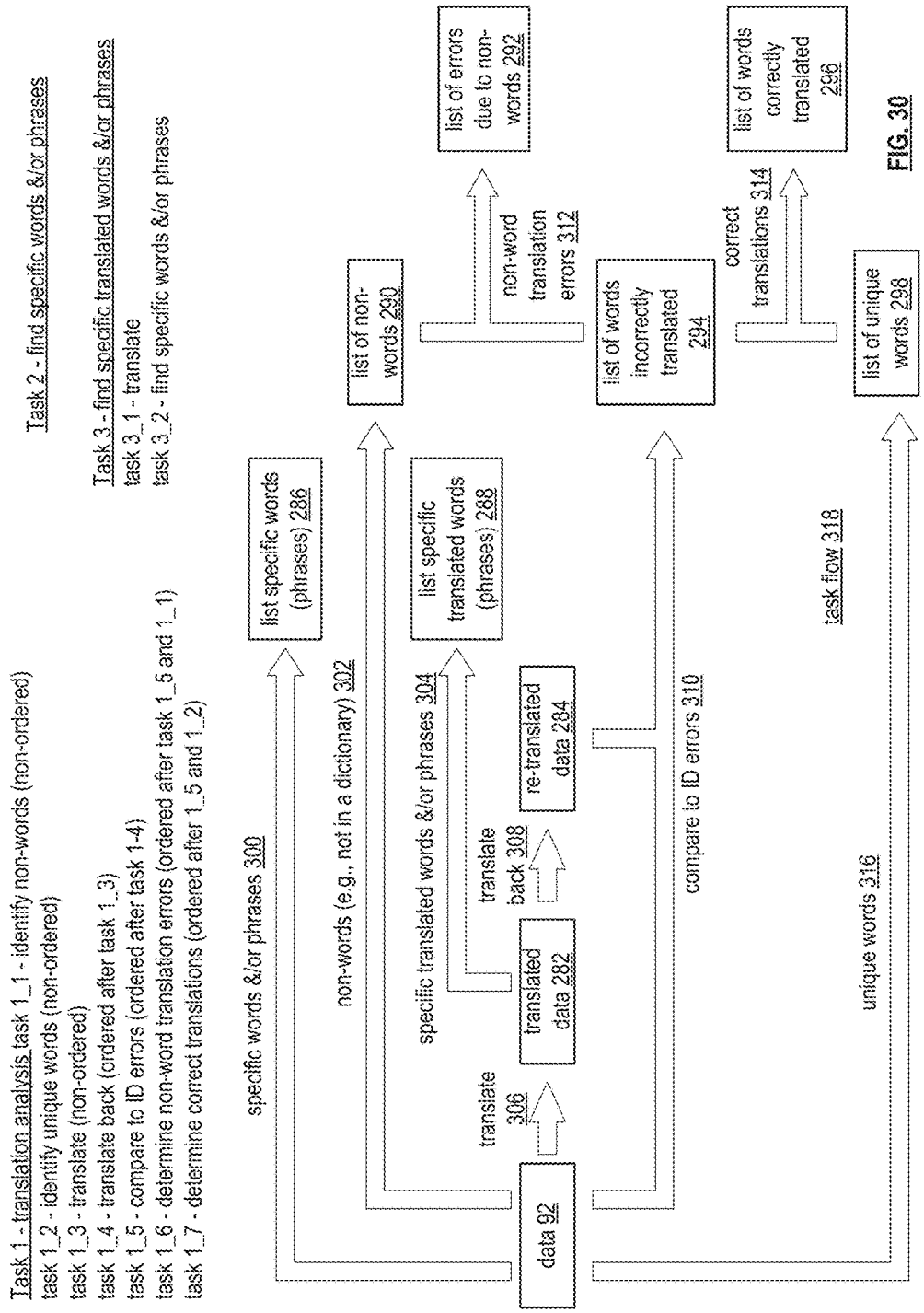
FIG. 30 is a diagram of a specific example of the distributed computing system performing tasks on stored data in accordance with the present invention.

FIG. 30 is a diagram of a specific example of a distributed computing system performing tasks on stored data as a task flow 318. In this example, selected data 92 is data 2 and selected tasks are tasks 1, 2, and 3. Task 1 corresponds to analyzing translation of data from one language to another (e.g., human language or computer language); task 2 corresponds to finding specific words and/or phrases in the data; and task 3 corresponds to finding specific translated words and/or phrases in translated data.

In this example, task 1 includes 7 sub-tasks: task 1_1—identify non-words (non-ordered); task 1_2—identify unique words (non-ordered); task 1_3—translate (non-ordered); task 1_4—translate back (ordered after task 1_3); task 1_5—compare to ID errors (ordered after task 1-4); task 1_6—determine non-word translation errors (ordered after task 1_5 and 1_1); and task 1_7—determine correct translations (ordered after 1_5 and 1_2). The sub-task further indicates whether they are an ordered task (i.e., are dependent on the outcome of another task) or non-order (i.e., are independent of the outcome of another task). Task 2 does not include sub-tasks and task 3 includes two sub-tasks: task 3_1 translate; and task 3_2 find specific word or phrase in translated data.

In general, the three tasks collectively are selected to analyze data for translation accuracies, translation errors, translation anomalies, occurrence of specific words or phrases in the data, and occurrence of specific words or phrases on the translated data. Graphically, the data 92 is translated 306 into translated data 282; is analyzed for specific words and/or phrases 300 to produce a list of specific words and/or phrases 286; is analyzed for non-words 302 (e.g., not in a reference dictionary) to produce a list of non-words 290; and is analyzed for unique words 316 included in the data 92 (i.e., how many different words are included in the data) to produce a list of unique words 298. Each of these tasks is independent of each other and can therefore be processed in parallel if desired.

The translated data 282 is analyzed (e.g., sub-task 3_2) for specific translated words and/or phrases 304 to produce a list of specific translated words and/or phrases 288. The translated data 282 is translated back 308 (e.g., sub-task 1_4) into the language of the original data to produce re-translated data 284. These two tasks are dependent on the translation task (e.g., task 1_3) and thus must be ordered after the translation task, which may be in a pipelined ordering or a serial ordering. The re-translated data 284 is then compared 310 with the original data 92 to find words and/or phrases that did not translate (one way and/or the other) properly to produce a list of incorrectly translated words 294. As such, the comparing task (e.g., sub-task 1_5) 310 is ordered after the translation 306 and re-translation tasks 308 (e.g., sub-tasks 1_3 and 1_4).

The list of words incorrectly translated 294 is compared 312 to the list of non-words 290 to identify words that were not properly translated because the words are non-words to produce a list of errors due to non-words 292. In addition, the list of words incorrectly translated 294 is compared 314 to the list of unique words 298 to identify unique words that were properly translated to produce a list of correctly translated words 296. The comparison may also identify unique words that were not properly translated to produce a list of unique words that were not properly translated. Note that each list of words (e.g., specific words and/or phrases, non-words, unique words, translated words and/or phrases, etc.,) may include the word and/or phrase, how many times it is used, where in the data it is used, and/or any other information requested regarding a word and/or phrase.

Figure 31:
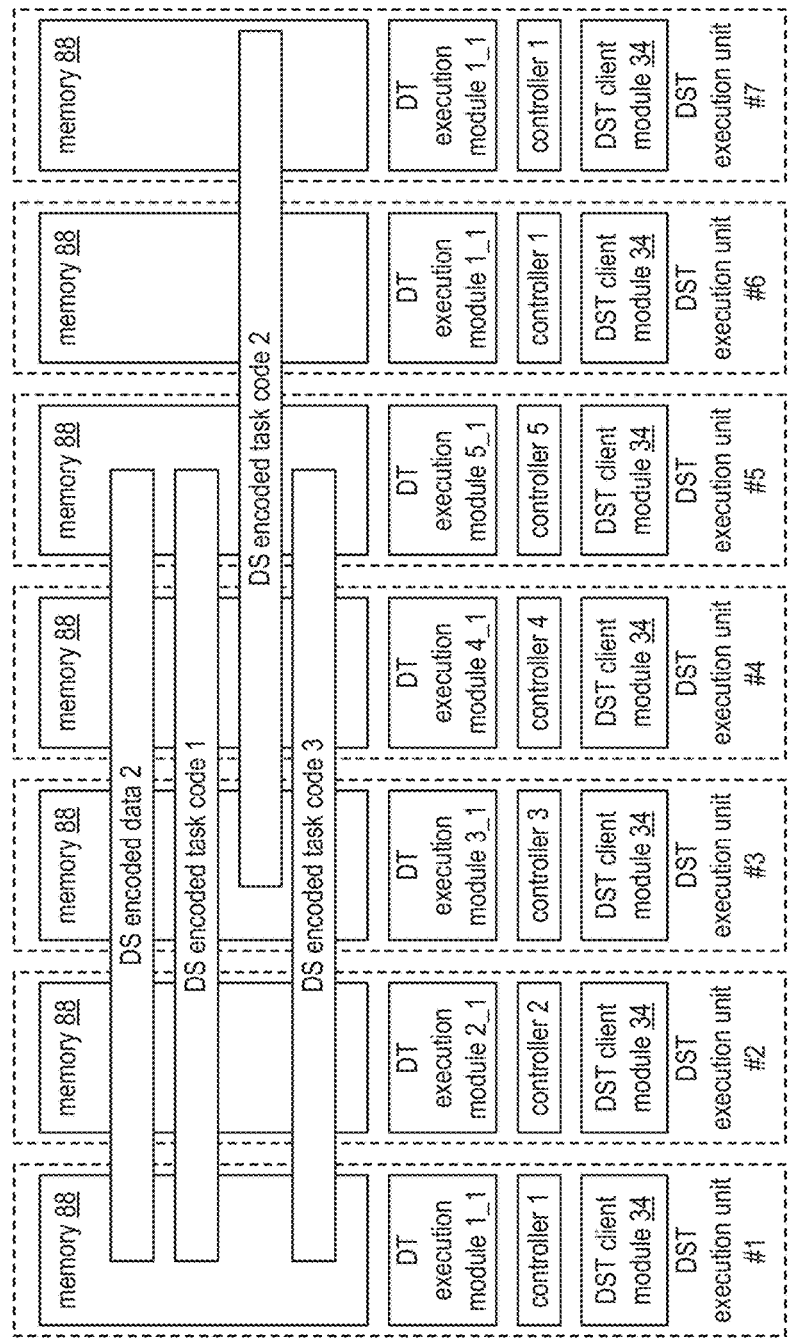
FIG. 31 is a schematic block diagram of an example of a distributed storage and task processing network (DSTN) module storing data and task codes for the example of FIG. 30 in accordance with the present invention.

FIG. 31 is a schematic block diagram of an example of a distributed storage and task processing network (DSTN) module storing data and task codes for the example of FIG. 30. As shown, DS encoded data 2 is stored as encoded data slices across the memory (e.g., stored in memories 88) of DST execution units 1-5; the DS encoded task code 1 (of task 1) and DS encoded task 3 are stored as encoded task slices across the memory of DST execution units 1-5; and DS encoded task code 2 (of task 2) is stored as encoded task slices across the memory of DST execution units 3-7. As indicated in the data storage information table and the task storage information table of FIG. 29, the respective data/task has DS parameters of 3/5 for their decode threshold/pillar width; hence spanning the memory of five DST execution units.

FIG. 32 is a diagram of an example of distributed storage and task (DST) allocation information 242 for the example of FIG. 30. The DST allocation information 242 includes data partitioning information 320, task execution information 322, and intermediate result information 324. The data partitioning information 320 includes the data identifier (ID), the number of partitions to split the data into, address information for each data partition, and whether the DS encoded data has to be transformed from pillar grouping to slice grouping. The task execution information 322 includes tabular information having a task identification field 326, a task ordering field 328, a data partition field ID 330, and a set of DT execution modules 332 to use for the distributed task processing per data partition. The intermediate result information 324 includes tabular information having a name ID field 334, an ID of the DST execution unit assigned to process the corresponding intermediate result 336, a scratch pad storage field 338, and an intermediate result storage field 340.

Continuing with the example of FIG. 30, where tasks 1-3 are to be distributedly performed on data 2, the data partitioning information includes the ID of data 2. In addition, the task distribution module determines whether the DS encoded data 2 is in the proper format for distributed computing (e.g., was stored as slice groupings). If not, the task distribution module indicates that the DS encoded data 2 format needs to be changed from the pillar grouping format to the slice grouping format, which will be done by the DSTN module. In addition, the task distribution module determines the number of partitions to divide the data into (e.g., 2_1 through 2_z) and addressing information for each partition.

The task distribution module generates an entry in the task execution information section for each sub-task to be performed. For example, task 1_1 (e.g., identify non-words on the data) has no task ordering (i.e., is independent of the results of other sub-tasks), is to be performed on data partitions 2_1 through 2_z by DT execution modules 1_1, 2_1, 3_1, 4_1, and 5_1. For instance, DT execution modules 1_1, 2_1, 3_1, 4_1, and 5_1 search for non-words in data partitions 2_1 through 2_z to produce task 1_1 intermediate results (R1-1, which is a list of non-words). Task 12 (e.g., identify unique words) has similar task execution information as task 1_1 to produce task 1_2 intermediate results (R1-2, which is the list of unique words).

Task 1_3 (e.g., translate) includes task execution information as being non-ordered (i.e., is independent), having DT execution modules 1_1, 2_1, 3_1, 4_1, and 5_1 translate data partitions 2_1 through 2_4 and having DT execution modules 1_2, 2_2, 3_2, 4_2, and 5_2 translate data partitions 2_5 through 2_z to produce task 1_3 intermediate results (R1-3, which is the translated data). In this example, the data partitions are grouped, where different sets of DT execution modules perform a distributed sub-task (or task) on each data partition group, which allows for further parallel processing.

Task 1_4 (e.g., translate back) is ordered after task 1_3 and is to be executed on task 1_3's intermediate result (e.g., R1-3_1) (e.g., the translated data). DT execution modules 1_1, 2_1, 3_1, 4_1, and 5_1 are allocated to translate back task 1_3 intermediate result partitions R1-3_1 through R1-3_4 and DT execution modules 1_2, 2_2, 6_1, 7_1, and 7_2 are allocated to translate back task 1_3 intermediate result partitions R1-3_5 through R1-3_z to produce task 1-4 intermediate results (R1-4, which is the translated back data).

Task 1_5 (e.g., compare data and translated data to identify translation errors) is ordered after task 1_4 and is to be executed on task 1_4's intermediate results (R4-1) and on the data. DT execution modules 1_1, 2_1, 3_1, 4_1, and 5_1 are allocated to compare the data partitions (2_1 through 2_z) with partitions of task 1-4 intermediate results partitions R1-4_1 through R1-4_z to produce task 1_5 intermediate results (R1-5, which is the list words translated incorrectly).

Task 1_6 (e.g., determine non-word translation errors) is ordered after tasks 1_1 and 1_5 and is to be executed on tasks 1_1's and 1_5's intermediate results (R1-1 and R1-5). DT execution modules 1_1, 2_1, 3_1, 4_1, and 5_1 are allocated to compare the partitions of task 1_1 intermediate results (R1-1_1 through R1-1_z) with partitions of task 1-5 intermediate results partitions (R1-5_1 through R1-5_z) to produce task 1_6 intermediate results (R1-6, which is the list translation errors due to non-words).

Task 1_7 (e.g., determine words correctly translated) is ordered after tasks 1_2 and 1_5 and is to be executed on tasks 1_2's and 1_5's intermediate results (R1-1 and R1-5). DT execution modules 1_2, 2_2, 3_2, 4_2, and 5_2 are allocated to compare the partitions of task 1_2 intermediate results (R1-2_1 through R1-2_z) with partitions of task 1-5 intermediate results partitions (R1-5_1 through R1-5_z) to produce task 1_7 intermediate results (R1-7, which is the list of correctly translated words).

Task 2 (e.g., find specific words and/or phrases) has no task ordering (i.e., is independent of the results of other sub-tasks), is to be performed on data partitions 2_1 through 2_z by DT execution modules 3_1, 4_1, 5_1, 6_1, and 7_1. For instance, DT execution modules 3_1, 4_1, 5_1, 6_1, and 7_1 search for specific words and/or phrases in data partitions 2_1 through 2_z to produce task 2 intermediate results (R2, which is a list of specific words and/or phrases).

Task 3_2 (e.g., find specific translated words and/or phrases) is ordered after task 1_3 (e.g., translate) is to be performed on partitions R1-3_1 through R1-3_z by DT execution modules 1_2, 2_2, 3_2, 4_2, and 5_2. For instance, DT execution modules 1_2, 2_2, 3_2, 4_2, and 5_2 search for specific translated words and/or phrases in the partitions of the translated data (R1-3_1 through R1-3_z) to produce task 3_2 intermediate results (R3-2, which is a list of specific translated words and/or phrases).

For each task, the intermediate result information indicates which DST unit is responsible for overseeing execution of the task and, if needed, processing the partial results generated by the set of allocated DT execution units. In addition, the intermediate result information indicates a scratch pad memory for the task and where the corresponding intermediate results are to be stored. For example, for intermediate result R1-1 (the intermediate result of task 1_1), DST unit 1 is responsible for overseeing execution of the task 1_1 and coordinates storage of the intermediate result as encoded intermediate result slices stored in memory of DST execution units 1-5. In general, the scratch pad is for storing non-DS encoded intermediate results and the intermediate result storage is for storing DS encoded intermediate results.

Figure 33:
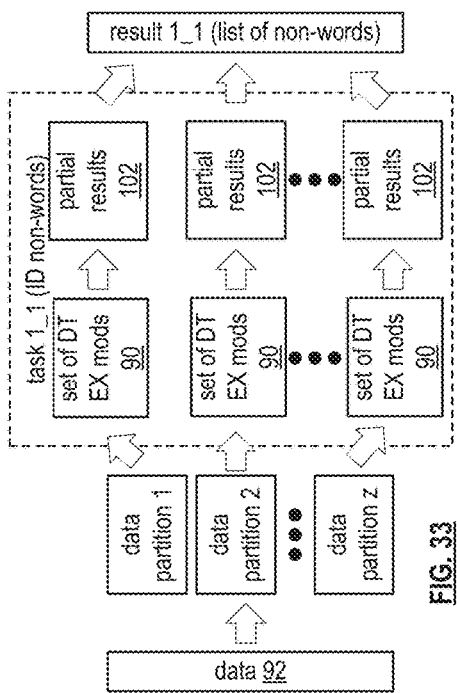

FIGS. 33-38 are schematic block diagrams of the distributed storage and task network (DSTN) module performing the example of FIG. 30. In FIG. 33, the DSTN module accesses the data 92 and partitions it into a plurality of partitions 1-z in accordance with distributed storage and task network (DST) allocation information. For each data partition, the DSTN identifies a set of its DT (distributed task) execution modules 90 to perform the task (e.g., identify non-words (i.e., not in a reference dictionary) within the data partition) in accordance with the DST allocation information. From data partition to data partition, the set of DT execution modules 90 may be the same, different, or a combination thereof (e.g., some data partitions use the same set while other data partitions use different sets).

For the first data partition, the first set of DT execution modules (e.g., 1_1, 2_1, 3_1, 4_1, and 5_1 per the DST allocation information of FIG. 32) executes task 1_1 to produce a first partial result 102 of non-words found in the first data partition. The second set of DT execution modules (e.g., 1_1, 2_1, 3_1, 4_1, and 5_1 per the DST allocation information of FIG. 32) executes task 1_1 to produce a second partial result 102 of non-words found in the second data partition. The sets of DT execution modules (as per the DST allocation information) perform task 1_1 on the data partitions until the "z" set of DT execution modules performs task 1_1 on the "zth" data partition to produce a "zth" partial result 102 of non-words found in the "zth" data partition.

As indicated in the DST allocation information of FIG. 32, DST execution unit 1 is assigned to process the first through "zth" partial results to produce the first intermediate result (R1-1), which is a list of non-words found in the data. For instance, each set of DT execution modules 90 stores its respective partial result in the scratchpad memory of DST execution unit 1 (which is identified in the DST allocation or may be determined by DST execution unit 1). A processing module of DST execution 1 is engaged to aggregate the first through "zth" partial results to produce the first intermediate result (e.g., R1_1). The processing module stores the first intermediate result as non-DS error encoded data in the scratchpad memory or in another section of memory of DST execution unit 1.

DST execution unit 1 engages its DST client module to slice grouping based DS error encode the first intermediate result (e.g., the list of non-words). To begin the encoding, the DST client module determines whether the list of non-words is of a sufficient size to partition (e.g., greater than a Terabyte). If yes, it partitions the first intermediate result (R1-1) into a plurality of partitions (e.g., R1-1_1 through R1-1_m). If the first intermediate result is not of sufficient size to partition, it is not partitioned.

For each partition of the first intermediate result, or for the first intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-5).

Figure 34:
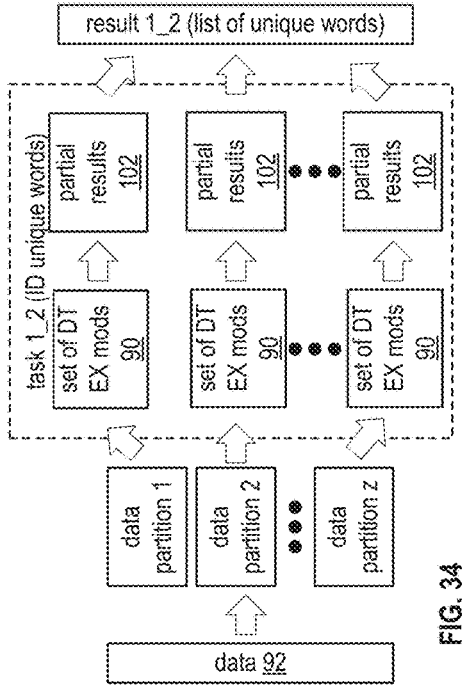

In FIG. 34, the DSTN module is performing task 1_2 (e.g., find unique words) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_2 in accordance with the DST allocation information. From data partition to data partition, the set of DT execution modules may be the same, different, or a combination thereof. For the data partitions, the allocated set of DT execution modules executes task 12 to produce a partial results (e.g., $1^{st}$ through "zth") of unique words found in the data partitions.

As indicated in the DST allocation information of FIG. 32, DST execution unit 1 is assigned to process the first through "zth" partial results 102 of task 1_2 to produce the second intermediate result (R1-2), which is a list of unique words found in the data 92. The processing module of DST execution 1 is engaged to aggregate the first through "zth" partial results of unique words to produce the second intermediate result. The processing module stores the second intermediate result as non-DS error encoded data in the scratchpad memory or in another section of memory of DST execution unit 1.

DST execution unit 1 engages its DST client module to slice grouping based DS error encode the second intermediate result (e.g., the list of non-words). To begin the encoding, the DST client module determines whether the list of unique words is of a sufficient size to partition (e.g., greater than a Terabyte). If yes, it partitions the second intermediate result (R1-2) into a plurality of partitions (e.g., R1-2_1 through R1-2_m). If the second intermediate result is not of sufficient size to partition, it is not partitioned.

For each partition of the second intermediate result, or for the second intermediate results, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-5).

Figure 35:
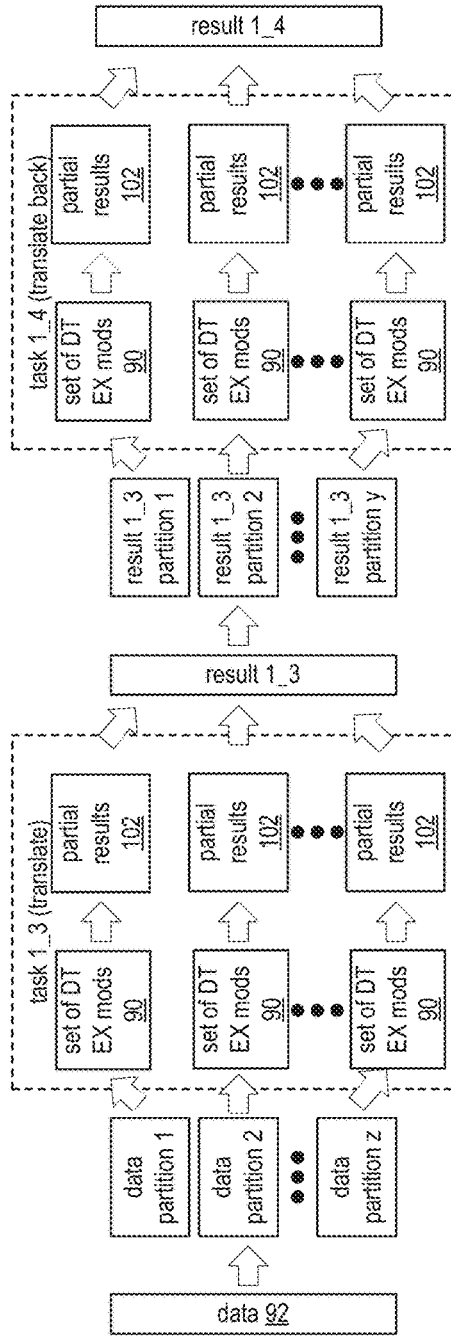

In FIG. 35, the DSTN module is performing task 1_3 (e.g., translate) on the data 92. To begin, the DSTN module accesses the data 92 and partitions it into a plurality of partitions 1-z in accordance with the DST allocation information or it may use the data partitions of task 1_1 if the partitioning is the same. For each data partition, the DSTN identifies a set of its DT execution modules to perform task 1_3 in accordance with the DST allocation information (e.g., DT execution modules 1_1, 2_1, 3_1, 4_1, and 5_1 translate data partitions 2_1 through 2_4 and DT execution modules 1_2, 2_2, 3_2, 4_2, and 5_2 translate data partitions 2_5 through 2_z). For the data partitions, the allocated set of DT execution modules 90 executes task 1_3 to produce partial results 102 (e.g., $1^{st}$ through "zth") of translated data.

As indicated in the DST allocation information of FIG. 32, DST execution unit 2 is assigned to process the first through "zth" partial results of task 1_3 to produce the third intermediate result (R1-3), which is translated data. The processing module of DST execution 2 is engaged to aggregate the first through "zth" partial results of translated data to produce the third intermediate result. The processing module stores the third intermediate result as non-DS error encoded data in the scratchpad memory or in another section of memory of DST execution unit 2.

DST execution unit 2 engages its DST client module to slice grouping based DS error encode the third intermediate result (e.g., translated data). To begin the encoding, the DST client module partitions the third intermediate result (R1-3) into a plurality of partitions (e.g., R1-3_1 through R1-3_y). For each partition of the third intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 2-6 per the DST allocation information).

As is further shown in FIG. 35, the DSTN module is performing task 14 (e.g., retranslate) on the translated data of the third intermediate result. To begin, the DSTN module accesses the translated data (from the scratchpad memory or from the intermediate result memory and decodes it) and partitions it into a plurality of partitions in accordance with the DST allocation information. For each partition of the third intermediate result, the DSTN identifies a set of its DT execution modules 90 to perform task 1_4 in accordance with the DST allocation information (e.g., DT execution modules 1_1, 2_1, 3_1, 4_1, and 5_1 are allocated to translate back partitions R1-3_1 through R1-3_4 and DT execution modules 1_2, 2_2, 6_1, 7_1, and 7_2 are allocated to translate back partitions R1-3_5 through R1-3_z). For the partitions, the allocated set of DT execution modules executes task 14 to produce partial results 102 (e.g., $1^{st}$ through "zth") of re-translated data.

As indicated in the DST allocation information of FIG. 32, DST execution unit 3 is assigned to process the first through "zth" partial results of task 1_4 to produce the fourth intermediate result (R1-4), which is retranslated data. The processing module of DST execution 3 is engaged to aggregate the first through "zth" partial results of retranslated data to produce the fourth intermediate result. The processing module stores the fourth intermediate result as non-DS error encoded data in the scratchpad memory or in another section of memory of DST execution unit 3.

DST execution unit 3 engages its DST client module to slice grouping based DS error encode the fourth intermediate result (e.g., retranslated data). To begin the encoding, the DST client module partitions the fourth intermediate result (R1-4) into a plurality of partitions (e.g., R1-4_1 through R1-4_z). For each partition of the fourth intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

Figure 36:
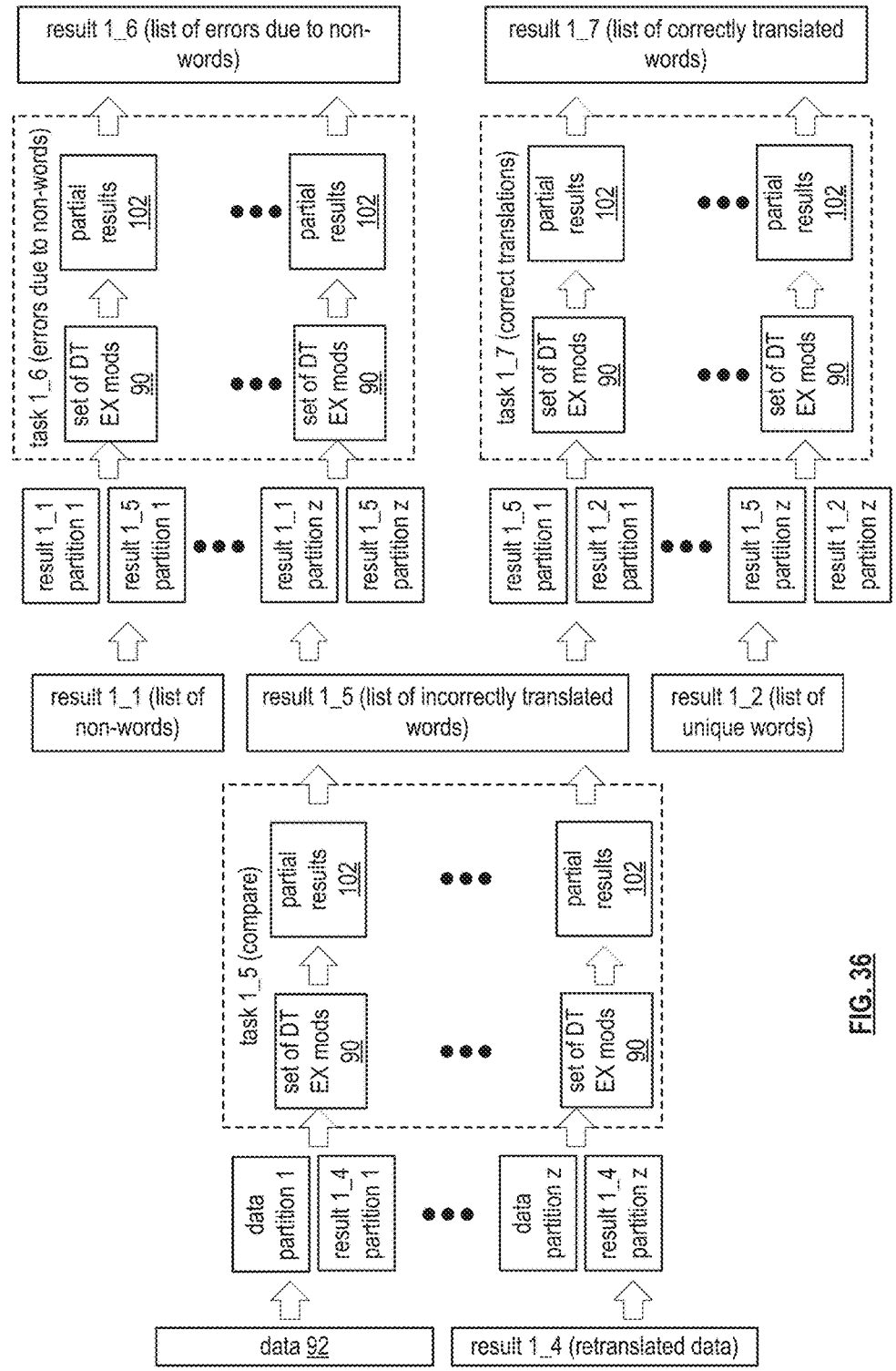

In FIG. 36, a distributed storage and task network (DSTN) module is performing task 1_5 (e.g., compare) on data 92 and retranslated data of FIG. 35. To begin, the DSTN module accesses the data 92 and partitions it into a plurality of partitions in accordance with the DST allocation information or it may use the data partitions of task 1_1 if the partitioning is the same. The DSTN module also accesses the retranslated data from the scratchpad memory, or from the intermediate result memory and decodes it, and partitions it into a plurality of partitions in accordance with the DST allocation information. The number of partitions of the retranslated data corresponds to the number of partitions of the data.

For each pair of partitions (e.g., data partition 1 and retranslated data partition 1), the DSTN identifies a set of its DT execution modules 90 to perform task 1_5 in accordance with the DST allocation information (e.g., DT execution modules 1_1, 2_1, 3_1, 4_1, and 5_1). For each pair of partitions, the allocated set of DT execution modules executes task 1_5 to produce partial results 102 (e.g., $1^{st}$ through "zth") of a list of incorrectly translated words and/or phrases.

As indicated in the DST allocation information of FIG. 32, DST execution unit 1 is assigned to process the first through "zth" partial results of task 1_5 to produce the fifth intermediate result (R1-5), which is the list of incorrectly translated words and/or phrases. In particular, the processing module of DST execution 1 is engaged to aggregate the first through "zth" partial results of the list of incorrectly translated words and/or phrases to produce the fifth intermediate result. The processing module stores the fifth intermediate result as non-DS error encoded data in the scratchpad memory or in another section of memory of DST execution unit 1.

DST execution unit 1 engages its DST client module to slice grouping based DS error encode the fifth intermediate result. To begin the encoding, the DST client module partitions the fifth intermediate result (R1-5) into a plurality of partitions (e.g., R1-5_1 through R1-5_z). For each partition of the fifth intermediate result, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-5 per the DST allocation information).

As is further shown in FIG. 36, the DSTN module is performing task 1_6 (e.g., translation errors due to non-words) on the list of incorrectly translated words and/or phrases (e.g., the fifth intermediate result R1-5) and the list of non-words (e.g., the first intermediate result R1-1). To begin, the DSTN module accesses the lists and partitions them into a corresponding number of partitions.

For each pair of partitions (e.g., partition R1-1_1 and partition R1-5_1), the DSTN identifies a set of its DT execution modules 90 to perform task 1_6 in accordance with the DST allocation information (e.g., DT execution modules 1_1, 2_1, 3_1, 4_1, and 5_1). For each pair of partitions, the allocated set of DT execution modules executes task 1_6 to produce partial results 102 (e.g., $1^{st}$ through "zth") of a list of incorrectly translated words and/or phrases due to non-words.

As indicated in the DST allocation information of FIG. 32, DST execution unit 2 is assigned to process the first through "zth" partial results of task 1_6 to produce the sixth intermediate result (R1-6), which is the list of incorrectly translated words and/or phrases due to non-words. In particular, the processing module of DST execution 2 is engaged to aggregate the first through "zth" partial results of the list of incorrectly translated words and/or phrases due to non-words to produce the sixth intermediate result. The processing module stores the sixth intermediate result as non-DS error encoded data in the scratchpad memory or in another section of memory of DST execution unit 2.

DST execution unit 2 engages its DST client module to slice grouping based DS error encode the sixth intermediate result. To begin the encoding, the DST client module partitions the sixth intermediate result (R1-6) into a plurality of partitions (e.g., R1-6_1 through R1-6_z). For each partition of the sixth intermediate result, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 2-6 per the DST allocation information).

As is still further shown in FIG. 36, the DSTN module is performing task 1_7 (e.g., correctly translated words and/or phrases) on the list of incorrectly translated words and/or phrases (e.g., the fifth intermediate result R1-5) and the list of unique words (e.g., the second intermediate result R1-2). To begin, the DSTN module accesses the lists and partitions them into a corresponding number of partitions.

For each pair of partitions (e.g., partition R1-2_1 and partition R1-5_1), the DSTN identifies a set of its DT execution modules 90 to perform task 1_7 in accordance with the DST allocation information (e.g., DT execution modules 1_2, 2_2, 3_2, 4_2, and 5_2). For each pair of partitions, the allocated set of DT execution modules executes task 1_7 to produce partial results 102 (e.g., $1^{st}$ through "zth") of a list of correctly translated words and/or phrases.

As indicated in the DST allocation information of FIG. 32, DST execution unit 3 is assigned to process the first through "zth" partial results of task 1_7 to produce the seventh intermediate result (R1-7), which is the list of correctly translated words and/or phrases. In particular, the processing module of DST execution 3 is engaged to aggregate the first through "zth" partial results of the list of correctly translated words and/or phrases to produce the seventh intermediate result. The processing module stores the seventh intermediate result as non-DS error encoded data in the scratchpad memory or in another section of memory of DST execution unit 3.

DST execution unit 3 engages its DST client module to slice grouping based DS error encode the seventh intermediate result. To begin the encoding, the DST client module partitions the seventh intermediate result (R1-7) into a plurality of partitions (e.g., R1-7_1 through R1-7_z). For each partition of the seventh intermediate result, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 3-7 per the DST allocation information).

In FIG. 37, the distributed storage and task network (DSTN) module is performing task 2 (e.g., find specific words and/or phrases) on the data 92. To begin, the DSTN module accesses the data and partitions it into a plurality of partitions 1-z in accordance with the DST allocation information or it may use the data partitions of task 1_1 if the partitioning is the same. For each data partition, the DSTN identifies a set of its DT execution modules 90 to perform task 2 in accordance with the DST allocation information. From data partition to data partition, the set of DT execution modules may be the same, different, or a combination thereof. For the data partitions, the allocated set of DT execution modules executes task 2 to produce partial results 102 (e.g., $1^{st}$ through "zth") of specific words and/or phrases found in the data partitions.

As indicated in the DST allocation information of FIG. 32, DST execution unit 7 is assigned to process the first through "zth" partial results of task 2 to produce task 2 intermediate result (R2), which is a list of specific words and/or phrases found in the data. The processing module of DST execution 7 is engaged to aggregate the first through "zth" partial results of specific words and/or phrases to produce the task 2 intermediate result. The processing module stores the task 2 intermediate result as non-DS error encoded data in the scratchpad memory or in another section of memory of DST execution unit 7.

DST execution unit 7 engages its DST client module to slice grouping based DS error encode the task 2 intermediate result. To begin the encoding, the DST client module determines whether the list of specific words and/or phrases is of a sufficient size to partition (e.g., greater than a Terabyte). If yes, it partitions the task 2 intermediate result (R2) into a plurality of partitions (e.g., R2_1 through R2_m). If the task 2 intermediate result is not of sufficient size to partition, it is not partitioned.

For each partition of the task 2 intermediate result, or for the task 2 intermediate results, the DST client module uses the DS error encoding parameters of the data (e.g., DS parameters of data 2, which includes 3/5 decode threshold/ pillar width ratio) to produce slice groupings. The slice groupings are stored in the intermediate result memory (e.g., allocated memory in the memories of DST execution units 1-4, and 7).

In FIG. 38, the distributed storage and task network (DSTN) module is performing task 3 (e.g., find specific translated words and/or phrases) on the translated data (R1-3). To begin, the DSTN module accesses the translated data (from the scratchpad memory or from the intermediate result memory and decodes it) and partitions it into a plurality of partitions in accordance with the DST allocation information. For each partition, the DSTN identifies a set of its DT execution modules to perform task 3 in accordance with the DST allocation information. From partition to partition, the set of DT execution modules may be the same, different, or a combination thereof. For the partitions, the allocated set of DT execution modules 90 executes task 3 to produce partial results 102 (e.g., $1^{st}$ through "zth") of specific translated words and/or phrases found in the data partitions.

As indicated in the DST allocation information of FIG. 32, DST execution unit 5 is assigned to process the first through "zth" partial results of task 3 to produce task 3 intermediate result (R3), which is a list of specific translated words and/or phrases found in the translated data. In particular, the processing module of DST execution 5 is engaged to aggregate the first through "zth" partial results of specific translated words and/or phrases to produce the task 3 intermediate result. The processing module stores the task 3 intermediate result as non-DS error encoded data in the scratchpad memory or in another section of memory of DST execution unit 7.

DST execution unit 5 engages its DST client module to slice grouping based DS error encode the task 3 intermediate result. To begin the encoding, the DST client module determines whether the list of specific translated words and/or phrases is of a sufficient size to partition (e.g., greater than a Terabyte). If yes, it partitions the task 3 intermediate result (R3) into a plurality of partitions (e.g., R3_1 through R3_m). If the task 3 intermediate result is not of sufficient size to partition, it is not partitioned.

For each partition of the task 3 intermediate result, or for the task 3 intermediate results, the DST client module uses the DS error encoding parameters of the data (e.g., DS parameters of data 2, which includes 3/5 decode threshold/pillar width ratio) to produce slice groupings. The slice groupings are stored in the intermediate result memory (e.g., allocated memory in the memories of DST execution units 1-4, 5, and 7).

FIG. 39 is a diagram of an example of combining result information into final results 104 for the example of FIG. 30. In this example, the result information includes the list of specific words and/or phrases found in the data (task 2 intermediate result), the list of specific translated words and/or phrases found in the data (task 3 intermediate result), the list of non-words found in the data (task 1 first intermediate result R1-1), the list of unique words found in the data (task 1 second intermediate result R1-2), the list of translation errors due to non-words (task 1 sixth intermediate result R1-6), and the list of correctly translated words and/or phrases (task 1 seventh intermediate result R1-7). The task distribution module provides the result information to the requesting DST client module as the results 104.

Figure 40A:
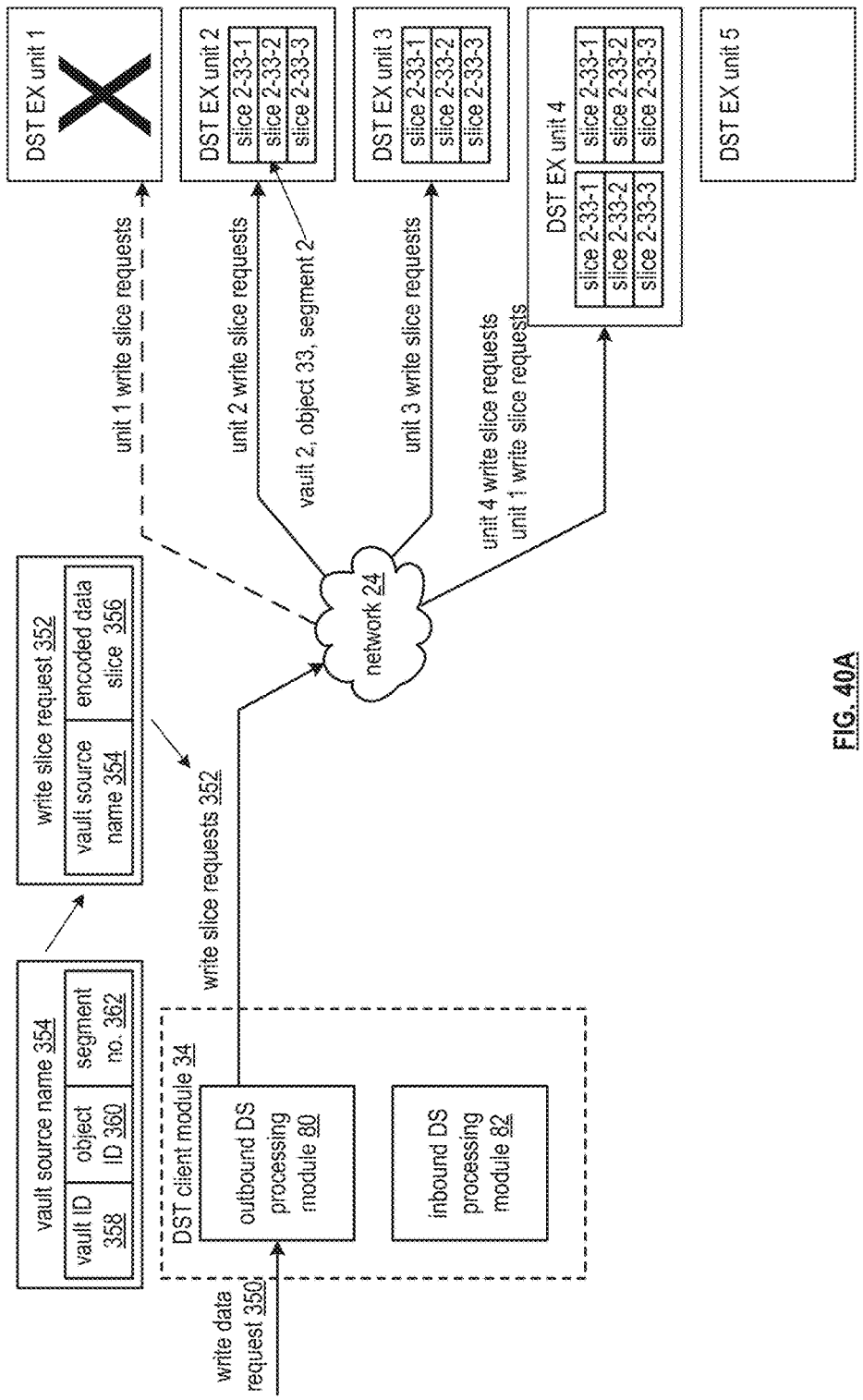
FIGS. 40A and 40B are schematic block diagrams of an embodiment of a dispersed storage network (DSN) in accordance with the present invention.
Figure 40B:
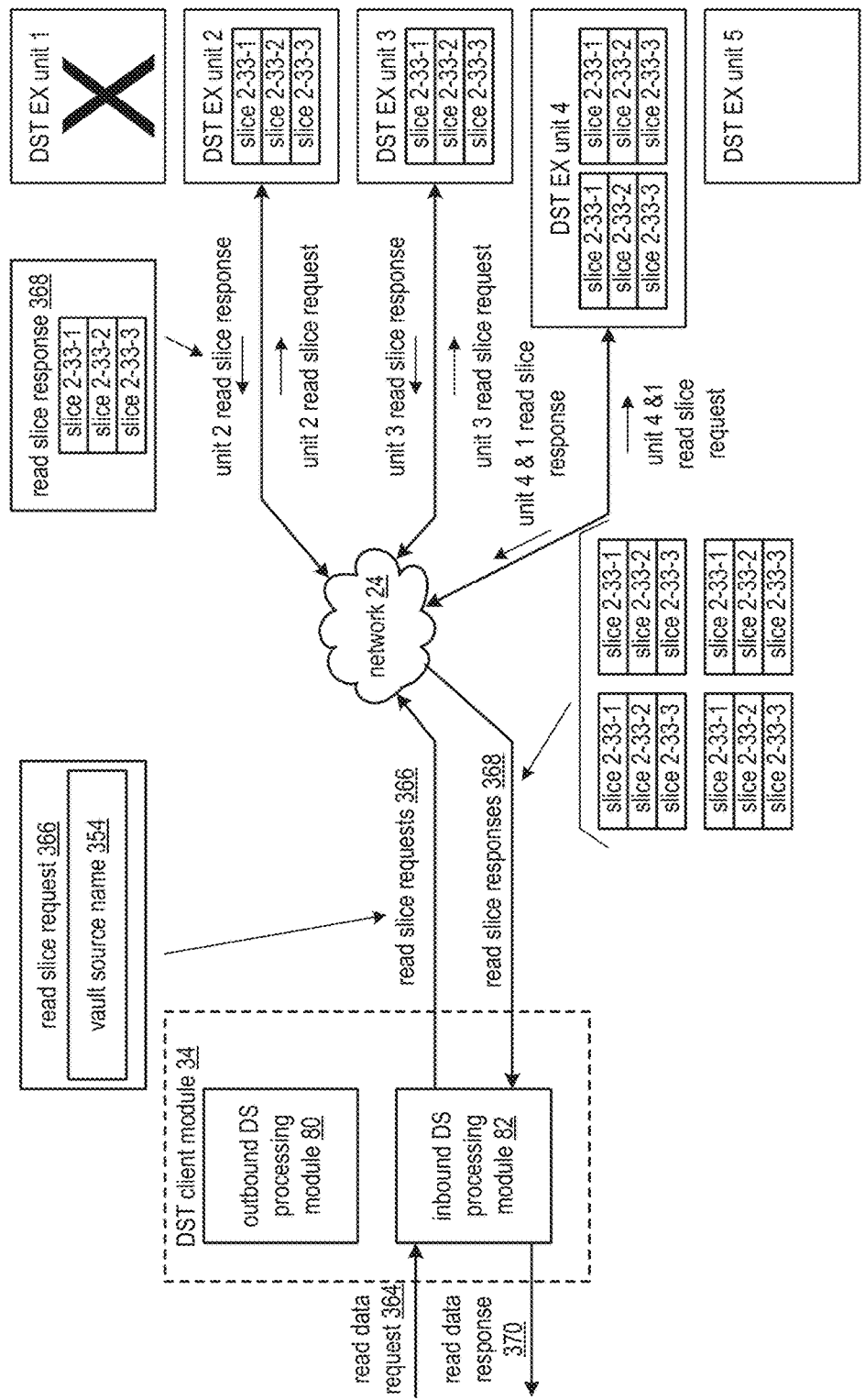

FIGS. 40A and 40B are schematic block diagrams of an embodiment of a dispersed storage network (DSN) that includes the distributed storage and task (DST) client module 34 of FIG. 1, the network 24 of FIG. 1, and a set of DST execution units 1-5. The set of DST execution units includes one or more of the DST execution units 36 of FIG. 1. The DST client module 34 includes the outbound dispersed storage (DS) processing module 80 and the inbound DS processing module 82 of FIG. 3. The DSN functions to store data to the set of DST execution units 1-5 and to retrieve the data from the set of DST execution units 1-5.

In particular, FIG. 40A illustrates an example of the storing of the data to the set of DST execution units 1-5. As a specific example, the DST client module 34 receives a write data request 350 from a requesting entity. The write data request 350 includes one or more of the data for storage and a data identifier (ID) of the data. The outbound DS processing module 80 partitions the data into a plurality of data segments in accordance with a data segmentation scheme (e.g., uniform data segment sizes, data segment sizes that ramp up or down). For each data segment, the outbound DS processing module 80 dispersed storage error encodes the data segment to produce a set of encoded data slices in accordance with dispersal parameters. The dispersal parameters includes one or more of an information dispersal algorithm (IDA) width, a write threshold number, a read threshold number, a decode threshold number, and an encoding matrix. For example, the outbound DS processing module 80 encodes the data segment to produce 5 encoded data slices when the IDA width is 5.

Having produced the plurality of sets of encoded data slices, the outbound DS processing module 80, for each set of encoded data slices, selects a group of DST execution units for storage of at least a threshold number (e.g., the write threshold number, the read threshold number, the decode threshold number, another threshold number) of encoded data slices of the set of encoded data slices. The selecting may be based on one or more of a predetermination, a mapping of slice pillar numbers to DST execution units, a previously received write slice response, a received error message, a unit rotation algorithm, a DST execution unit availability level, a DST execution unit reliability level, a DST execution unit performance level, a DST execution unit foster storage location status (e.g., for storage of foster encoded data slices), and a maximum number of pillars associated with each DST execution unit. Foster encoded data slices are associated with additional encoded data slices to be at least temporarily stored in a DST execution unit available for foster slice storage. For example, the outbound DS processing module 80 determines to select the group of DST execution units for storage of the write threshold number (e.g., 4 encoded data slices) of the set of encoded data slices (e.g., 5 encoded data slices) where DST execution unit 2 is selected for storage of a first encoded data slice, DST execution unit 3 is selected for storage of a second encoded data slice, and DST execution unit 4 is selected for storage of third and fourth encoded data slices when DST execution unit 1 is unavailable, DST execution units 2-4 are available, DST execution unit 4 is available to store foster slices, and DST execution unit 5 is associated with an unfavorable performance level.

Having selected the group of DST execution units for storage of the threshold number of encoded data slices, the outbound DS processing module 80 generates a vault source name 354 for the set of encoded data slices, where the vault source name 354 includes one or more of a vault ID 358, an object ID 360, and a segment number 362. The vault ID 358 includes a predetermined number associated with one or more of the data ID and a requesting entity ID of the requesting entity. The object ID 360 includes a unique number (e.g., randomly generated, deterministically generated based on the data and/or the data ID) to be associated with the data ID. The segment number 362 includes a designator associated with the particular set of encoded data slices of the plurality of sets of encoded data slices. The outbound DS processing module 80 updates one or more of a DSN directory and a dispersed hierarchical index to associate at least a portion (e.g., the vault ID and the object ID) of the vault source name 354 with the data ID to facilitate subsequent retrieval of the data.

Having generated the vault source name 354 for the set of encoded data slices, the outbound DS processing module 80 issues, via the network 24, a threshold number of write slice requests 352 to the selected group of DST execution units, where the threshold number (e.g., the write threshold number) of write slice requests 352 includes the threshold number of encoded data slices 356 associated with the selected group of DST execution units and the vault source name 354. Hereafter, steps including one or more of writing, reading, issuing, receiving, accessing, storing etc., may inherently utilize the network 24 to transfer associated one or more of messages, requests, responses, status, information etc., even when not explicitly stated.

Each DST execution unit of the selected group of DST execution units stores received encoded data slices 356 and the vault source name 354 when the vault source name falls within a range of assigned vault source names for the set of DST execution units. For example, DST execution unit 2 stores encoded data slices for segments 1-3 of object 33 associated with vault 2, DST execution unit 3 stores more encoded data slices for the segments 1-3 of the object 33 associated with the vault 2, and DST execution unit 4 stores still more encoded data slices for two pillars for the segments 1-3 of the object 33 associated with the vault 2. As such, each DST execution unit accepts and stores encoded data slices associated with any pillar of each set of encoded data slices when the vault source names fall within the range of assigned vault source names for the set of DST execution units.

FIG. 40B illustrates an example of the retrieving of the data to the set of DST execution units 1-5. As a specific example, the DST client module 34 receives a read data request 364 that includes the data ID. The inbound DS processing module 82 obtains a source name corresponding to the data ID. For example, the inbound DS processing module 82 accesses at least one of the DSN directory and the dispersed hierarchical network utilizing the data ID to retrieve the source name that includes the vault ID and the object ID. As another example, the inbound DS processing 82 extracts the source name from the read data request 364 when the source name is included in the read data request 364.

Having obtained the source name, the inbound DST processing module 82 identifies the plurality of data segments associated with the data. The identifying includes at least one of accessing a first data segment (e.g., retrieving at least a decode threshold number of encoded data slices of the first data segment and decoding the decode threshold number of encoded data slices to reproduce the first data segment) and accessing a segment allocation table. For each data segment, the inbound DS processing module 82 generates a vault source name 354 based on the source name and identity of the data segment. For example, the inbound DS processing module 82 appends a data segment number of a particular data segment to the source name to produce the vault source name 354 associated with the particular data segment.

Having generated the vault source name 354 for the data segment, the inbound DS processing module 82 selects another group of DST execution units of the DST execution unit set includes at least another threshold number (e.g., the read threshold number) of storage locations. The other group of DST execution units may be substantially the same as the group of DST execution units. The selecting may be based on one or more of received error messages, a DST execution unit performance level, a DST execution unit availability level, a DST execution unit reliability level, a DST execution unit assignment table lookup, a predetermination, initiating a query to the set of DST execution units, receiving a query response, and accessing a foster DST execution unit list.

Having selected the other group of DST execution units, the inbound DS processing module 82 issues (e.g., generates and sends), via the network 24, at least a threshold number (e.g., the read threshold number) of read slice requests 366 to the other group of DST execution units, where each read slice request 366 includes the vault source name 354 of the data segment. In an instance, each single read slice request 366 may include vault source names associated with two or more data segments of the plurality of data segments. The other group of DST execution units receives the at least a threshold number of read slice requests 366 and issues, via the network 24, corresponding read slice responses 368, where a read slice response 368 includes one or more encoded data slices associated with slice names that fall within the range of slice names associated with the vault source name of an associated read slice request.

The inbound DS processing module 82 receives read slice responses 368 from the other group of DST execution units. The inbound DS processing module 82, for each data segment, decodes a decode threshold number of received encoded data slices of the read slice responses 368 to reproduce a corresponding data segment. The inbound DS processing module 82 aggregates a plurality of reproduced data segments to reproduce the data. The inbound DS processing module 82 issues a read data response 370 to a requesting entity, where the read data response 370 includes the reproduced data.

FIG. 40C is a flowchart illustrating an example of storing data. The method begins at step 372 where a processing module (e.g., of a distributed storage and task (DST) client module) partitions data into a plurality of data segments in accordance with a segmentation scheme. The method continues at step 374 where, for each data segment, the processing module encodes the data using a dispersed storage error coding function and in accordance with dispersal parameters to produce a set of encoded data slices. The method continues at step 376 where the processing module selects storage units from the set of storage units. For example, the processing module selects a write threshold number of available storage units based on one or more of an availability indicator, a write slice response, a query, a query response, and a predetermination. As another example, the processing module selects a write threshold minus one number of available storage units when the write threshold number of available storage units is not available.

The method continues at step 378 where the processing module generates a vault source name for the data segment based on one or more of a vault identifier (ID), a data ID of the data, and an object ID associated with the data ID. The method continues at step 380 where the processing module associates the vault source name of each data segment of the plurality of data segments with the data ID. For example, the processing module updates a dispersed storage network (DSN) directory to associate a source name portion of a vault source name with the data ID.

The method continues at step 382 where the processing module issues at least a threshold number of write slice requests to the selected storage units, where each write slice request includes the vault source name and a corresponding encoded data slice of the set of encoded data slices. For example, the processing module generates a write threshold number of write slice requests that includes a write threshold number of encoded data slices of the set of encoded data slices and where each write slice request includes the (same) vault source name. Alternatively, or in addition to, the processing module generates a write slice requests to include a slice name associated with an encoded data slice, where the slice name includes the vault source name and a pillar index number associated with a corresponding pillar index number of an information dispersal algorithm (IDA) width number of encoded data slices of the set of encoded data slices.

FIG. 40D is a flowchart illustrating an example of retrieving data. The method begins at step 384 where a processing module (e.g., of a distributed storage and task (DST) client module) obtains a source name corresponding to a data identifier (ID) of data to be retrieved from a dispersed storage network (DSN). For example, the processing module accesses a DSN directory utilizing the data ID to recover the source name. The method continues at step 386 where the processing module identifies a plurality of data segments of the data. The identifying includes at least one of accessing a segment allocation table and accessing a first data segment of the plurality of data segments.

The method continues at step 388 where, for each data segment, the processing module generates a vault source name based on the source name. For example, the processing module of appends a segment number corresponding to the data segment to the source name to produce the vault source name. The method continues at step 390 where the processing module selects at least a threshold number of storage units of a set of storage units. The selecting may be based on one or more of a storage unit availability level, a storage unit reliability level, a storage unit performance level, a storage unit preference table, initiating a query, receiving a query response, and a predetermination. For example, the processing module selects a read threshold number of storage units where each of the storage units is associated with a performance level greater than a performance threshold level.

The method continues at step 392 where the processing module issues, for the data segment, at least a threshold number of read slice requests to the selected storage units, where each read slice request includes the vault source name associated with the data segment. The method continues at step 394 where the processing module receives read slice responses from at least some of the at least a threshold number of storage units. The method continues at step 396 where the processing module decodes, for each data segment, at least a decode threshold number of received encoded data slices of the read slice responses to reproduce the data segment. Alternatively, or in addition to, the processing module aggregates a plurality of reproduced data segments to reproduce the data.

Figure 41A:
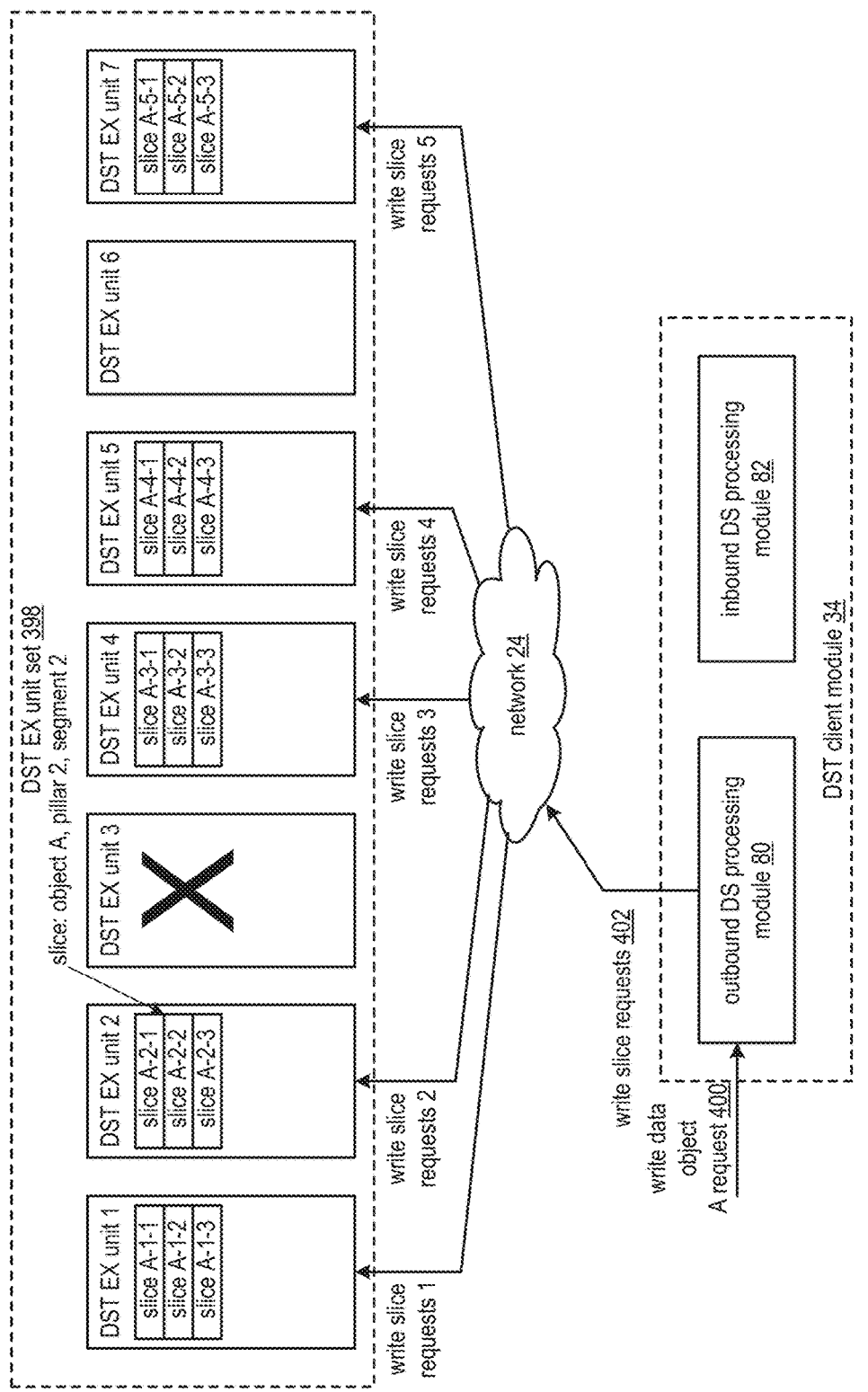
FIG. 41A is a schematic block diagram of an embodiment of another dispersed storage network (DSN) in accordance with the present invention.

FIG. 41A is a schematic block diagram of an embodiment of another dispersed storage network (DSN) that includes the distributed storage and task (DST) client module 34 of FIG. 1, the network 24 of FIG. 1, and a DST execution (EX) unit set 398. The DST execution unit set 398 includes a set of DST execution units 36 of FIG. 1. Each DST execution unit provides at least one storage slot of N storage slots. A storage slot includes at least one of a virtual storage location associated with physical memory of the DST execution unit. For example, the DST execution unit set includes DST execution units 1-7 when 7 storage slots are provided and one storage slot is associated with each DST execution unit. The DST client module 34 includes the outbound dispersed storage (DS) processing module 80 and the inbound DS processing module 82 of FIG. 3. The DSN functions to store data to the set of DST execution units 1-7 and to retrieve the data from the set of DST execution units 1-7.

As a specific example of the storing the data, the DST client module 34 receives a write data object request 400 for data object A, where the write data request 400 includes a data identifier (ID) for data object A and the data object A. The outbound DS processing module 80 obtains dispersal parameters that includes an information dispersal algorithm (IDA) width and a decode threshold number. The outbound DS processing module 80 selects an IDA width number of storage slots of N storage slots associated with the DST execution unit set. The selecting includes choosing one permutation out of a number of permutations expressed by the formula: number of permutations of selecting the IDA width number of storage slots=N choose IDA width. For instance, the number of permutations of selecting the IDA width number of storage slots=7 choose 5=21 permutations.

Storage of data within the DST execution unit set can tolerate a number of storage slot failures without affecting availability and reliability in accordance with a formula: number of storage slot failures tolerated=N−IDA width=7−5=2. As such, the storage of data within the DST execution unit set can tolerate 2 DST execution unit failures when each DST execution unit is associated with one storage slot, the DST execution unit set includes 7 DST execution units and the IDA width is 5.

The DST execution unit set 398 is associated with storage of encoded data slices with slice names that correspond to a common source name range. As such, the selecting of the IDA width number of storage slots includes freedom to select any storage slot of any DST execution unit since a strict DST execution unit to pillar index number relationship is not required. The selecting of the IDA width number of storage slots may be based on one or more of a DST execution unit availability indicator, a DST execution unit reliability indicator, a DST execution unit performance indicator, a DST execution unit to site association, a performance goal, a storage availability goal, a retrieval reliability goal, a predetermination, a rotation of permutations of selecting the IDA width number of DST execution units, and a look up. For example, the outbound DS processing module 80 selects the one storage slot of each of DST execution units 1, 2, 4, 5, and 7 when those units are associated with favorable availability and reliability levels and DST execution units 3 and 6 are associated with at least one of non-availability and performance below a desired performance threshold level.

Having selected the IDA width number of storage slots, the outbound DS processing module 80 encodes the data using a dispersed storage error coding function and in accordance with the dispersal parameters to produce a plurality of sets of encoded data slices. For each encoded data slice, the outbound DS processing module 80 generates a corresponding slice name producing a plurality of sets of slice names. Having an encoded the data, the outbound DS processing module 80 issues, via the network 24, write slice requests 402 to DST execution units associated with the selected IDA width number of storage slots. For example, the outbound DS processing module 80 generates one or more sets of write slice requests 402 that includes the plurality of sets of encoded data slices and the plurality of sets of slice names. The outbound DS processing module 80 sends, via the network 24 the one or more sets of write slice requests 402 to the DST execution units associated with the selected IDA width number of storage slots.

As a specific example of the retrieving the data, the DST client module 34 receives a read data object request for data object A, where the read data request includes the data ID for data object A. The inbound DS processing module 82 selects a read threshold number of storage slots of the selected IDA width number of storage slots and issues read slice requests to DST execution units associated with the selected read threshold number of storage slots. The issuing includes generating addressing information, for each set of encoded data slices of the plurality of sets of encoded data slices, where the addressing information includes at least one of a source name corresponding to data object A, a vault source name corresponding to a data segment of the set of encoded data slices, and a read threshold number of slice names. The inbound DS processing module 82 generates the one or more sets of read slice requests to include the addressing information. The inbound DS processing module 82 sends the one or more sets of read slice requests to at least one of the DST execution units associated with the selected read threshold number of storage slots (e.g., based on a directory lookup), the DST execution unit set, and the DST execution units associated with the IDA width number of storage slots.

The inbound DS processing module 82 receives read slice responses that includes retrieved encoded data slices. When receiving at least a decode threshold number of encoded data slices for each set of encoded data slices, the inbound DS processing module 82 decodes (e.g., dispersed storage error decodes) the decode threshold number of encoded data slices to reproduce a data segment of a plurality of data segments of the data object A. When not receiving the at least a decode threshold number of encoded data slices for a set of encoded data slices, the inbound DS processing module 82 issues further read slice requests to other storage slots. The issuing includes selecting the other storage slots based on one or more of a DST execution unit ranking, a primary affiliation, a secondary affiliation, a query, a query response, a lookup, DST execution units not tried so far, and a predetermination.

Figure 41B:
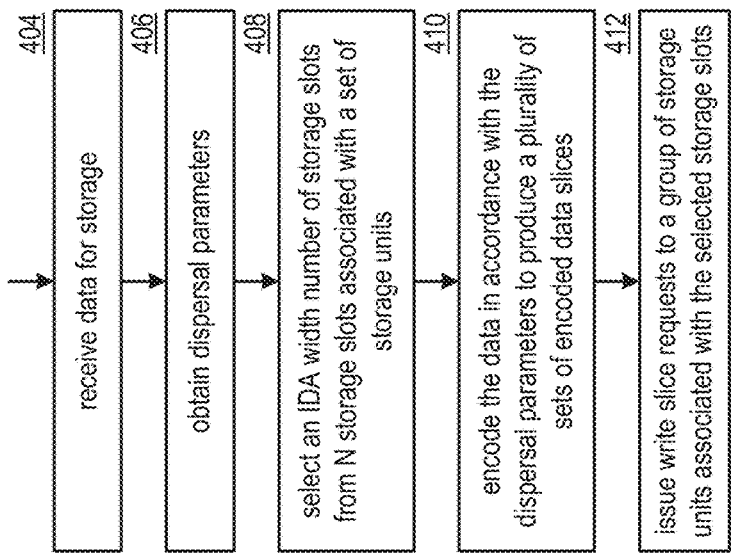
FIG. 41B is a flowchart illustrating another example of storing data in accordance with the present invention.

FIG. 41B is a flowchart illustrating another example of storing data. The method begins at step 404 where a processing module (e.g., of a distributed storage and task (DST) client module) receives data for storage. The receiving may include receiving a data identifier (ID) associated with the data. The method continues at step 406 where the processing module obtains dispersal parameters associated with a dispersed storage error coding function. The obtaining includes at least one of performing a lookup based on the data ID, performing a lookup based on a requesting entity ID, and accessing a system registry.

The method continues at step 408 where the processing module selects an IDA width number of storage slots from N storage slots associated with a set of storage units. The selecting includes at least one of identifying a predetermined mapping of storage slots storage units, selecting based on one or more of goals for availability reliability, configuration information, and a permutation rotation algorithm. For example, the processing module selects a different permutation (e.g., compared to a previous storage sequence) for a new data object storage.

The method continues at step 410 where the processing module encodes the data using the dispersed storage error coding function and in accordance with the dispersal parameters to produce a plurality of sets of encoded data slices. The method continues at step 412 where the processing module issues write slice requests to a group of storage units associated with the selected storage slots. For example, the processing module utilizes the mapping of storage slots to storage units to identify the group of storage units, generates one or more sets of write slice requests, where each request includes an encoded data slice of a set of encoded data slices and a slice name corresponding to the encoded data slice, and sends the one or more sets of write slice requests to the identified group storage units.

FIGS. 42A-D are a schematic block diagram of an embodiment of another dispersed storage network (DSN) that includes the distributed storage and task (DST) client module 34 of FIG. 1, the network 24 of FIG. 1, and a DST execution (EX) unit set 420. The DST execution unit set 420 includes a set of DST execution units 36 of FIG. 1, where one or more DST execution units are deployed at two or more sites. Hereafter, DST execution units may be referred to interchangeably as storage units and the DST execution unit set 420 may be referred to interchangeably as a set of storage units. Each DST execution unit provides at least one storage slot of N storage slots amongst the set of DST execution units. The DST client module 34 includes the outbound dispersed storage (DS) processing module 80 and the inbound DS processing module 82 of FIG. 3. The DSN functions to configure the DST execution unit set 420 to enable storing of data to the DST execution unit set 420.

FIG. 42A illustrates initial steps of the configuring of the DST execution unit set 420 where the outbound DS processing module 80 ascertains a decode threshold value for dispersed storage error encoding the data for storage in the storage units of the DSN, where the decode threshold value corresponds to a minimum number of encoded data slices of a set of encoded data slices needed to recover a data segment of the data. The outbound DS processing module 80 segments the data to produce a plurality of data segments and dispersed storage error encodes each data segment producing a plurality of sets of encoded data slices that includes the set of encoded data slices.

The outbound DS processing module 80 ascertains the decode threshold value by at least one of ascertaining the decode threshold value on a segment-by segment basis for the data (e.g., a potentially different decode threshold value for each data segment of the plurality of data segments) and by ascertaining the decode threshold value for the data (e.g., one decode threshold value for all data segments). Ascertaining includes at least one of retrieving, receiving, performing a lookup, initiating a query, and interpreting a query response. For example, the outbound DS processing module 80 retrieves the decode threshold by performing a DSN system registry lookup based on a vault identifier (ID) associated with the DST execution unit set 420. For instance, the outbound DS processing module 80 retrieves a decode threshold value of 20 from the DSN system registry.

Having determined the decode threshold value, the outbound DS processing module 80 determines available sites within the DSN. The determining may be based on one or more of performing a lookup of the DSN system registry, initiating a query, interpreting a received query response, interpreting an error message, interpreting a slice access response, interpreting configuration information, receiving a network management input, utilizing a predetermination, and interpreting configuration information 422. For example, the outbound DS processing module 80 receives configuration information 422 that includes configuration information 1-3 associated with sites 1-3, where the configuration information 422 indicates one or more of identifiers of available sites, identifiers of available storage units, available storage capacity of a storage unit, a performance level associated with a storage unit, and a site affiliation identifier of each storage unit. For example, the outbound DS processing module 80 receives the configuration information 422 that identifies DST execution units 1 and 2 at site 1, DST execution unit 3 at site 2, and DST execution units 4, 5, and 6 at site 3.

Having determined the available sites within the DSN, the outbound DS processing module 80 selects sites from the available sites to produce selected sites. The selecting of the sites may be based on one or more of site availability, performance of the network 24, DST execution unit availability, the DST execution unit performance level, an availability goal, and a reliability goal. For example, the outbound DS processing module 80 selects sites 1-3 to provide the desired availability and reliability.

Having produced the selected sites, the outbound DS processing module 80 identifies available storage units within the selected sites. The identifying may be based on the configuration information associated with storage unit availability. Having identified the available storage units within the selected sites, the outbound DS processing module 80 selects storage units from the available storage units to produce selected storage units. The selecting may be based on one or more of available storage unit available capacity and available storage unit performance. For example, the outbound DST processing module 80 selects DST execution units 1-6 when available storage and performance of each of the DST execution units compares favorably to desired storage availability and desired performance.

Having selected the sites and storage units, the outbound DS processing module 80 ascertains a site failure number, where the site failure number includes a maximum number of sites that can fail without affecting storage availability and retrieval reliability. The ascertaining may be based on one or more of performing a registry lookup, initiating a query, receiving a query response, interpreting an error message, interpreting configuration information, receiving a network management input, and utilizing a predetermination. For example, the outbound DS processing module 80 ascertains the failure number to be one site when the network management input indicates to tolerate at maximum unavailability of one of the three sites.

Having ascertained the site failure number, the outbound DS processing module 80 generates an expansion factor based on a number of selected sites and the site failure number. For example, the outbound DS processing module 80 calculates the expansion factor in accordance with a formula: expansion factor=no. of sites/(no. of sites−site failure number)=3/(3−1)=1.5.

Having determined the expansion factor, the outbound DS processing module 80 determines a total width value for the dispersed storage error encoding based on the decode threshold value, the number of selected sites within the DSN, and a number of selected storage units of the selected sites. The total width value is greater than the decode threshold value and corresponds to a number of encoded data slices in the set of encoded data slices. The determining includes performing a mathematical function on the decode threshold value and the expansion factor to generate the total width value. For example, the outbound DS processing module 80 multiplies the decode threshold value by the expansion factor to produce the total width value when the mathematical function includes multiplying. For instance, the outbound DS processing module 80 multiplies 20 by 1.5 to produce 30 as the total width value for the dispersed storage error encoding.

FIG. 42B illustrates further steps of the configuring of the DST execution unit set 420 where the outbound DS processing module 80 determines logical storage slots within the selected storage units of the selected sites based on the total width value, the number of selected sites within the DSN, and the number of selected storage units of the selected sites. The determining includes determining a slot number to indicate a number of slots to include in the logical storage slots, where the slot number is greater than the total width value. As a specific example, having generated the expansion factor based on the number of selected sites in the site failure number, the outbound DS processing module 80 performs a mathematical function on the total width value and the expansion factor to generate the slot number. For example, the outbound DS processing module 80 multiplies the total width value of 30 by the expansion factor of 1.5 to equal 45 as the slot number when the mathematical function includes multiplication.

Having determined the slot number, the outbound DS processing module 80 determines a slice-to-slot mapping based on the site failure number and a load balancing scheme among the at least some of the selected storage units. The load balancing scheme includes at least one of substantially equal distribution by site, substantially equal distribution within a site by storage unit, weighted distribution based on available storage unit capacity, weighted distribution based on storage unit performance, utilizing a predetermined site pattern. For example, the outbound DS processing module 80 calculates the number of storage slots per site in accordance with a formula: number of storage slots per site=number of storage slots/number of sites=45/3=15 when the load balancing scheme includes even distribution by site.

Having determined the number of storage slots per site, the outbound DS processing module 80 maps, for each site, the number of storage slots per site to DST execution units implemented at the site. For example, the outbound DS processing module 80 maps the storage slots per site to the DST execution units per site in accordance with a formula: number of storage slots per the DST execution unit=number of storage slots for the site/number of DST execution units at the site when the load balancing scheme includes even distribution. For instance, for site 1, the outbound DS processing module 80 maps 8 of the 15 storage slots to DST execution unit 1 and a remaining 7 of the 15 storage slots to DST execution unit 2; for site 2, maps a next 15 storage slots to DST execution unit 3; and for site 3, maps a remaining 15 storage slots evenly across DST execution units 4-6 when an equal number of storage slots per DST execution unit load balancing scheme per site is selected.

Having determined the slice-to-slot mapping, the outbound DS processing module 80 sends updated configuration information 422 to the DST execution units, where the configuration information 422 includes one or more of the slice-to-slot mapping, assigned source name ranges for the DST execution unit set, and write slice requests that includes an indication of the mapping (e.g., each DST execution unit interprets a corresponding write request to identify mapping of a storage slot to the DST execution unit).

The outbound DS processing module 80 may send the configuration information 422 directly to the DST execution units. Alternatively, the outbound DS processing module 80 may issue write slice requests to the DST execution units, where the write slice requests includes the configuration information 422. For example, the outbound DS processing module 80 issues write slice requests to the DST execution unit set to facilitate sending the configuration information to the DST execution units. For instance, write slice requests 1-15 corresponding to the storage slots 1-15 are sent to the DST execution units 1 and 2 at site 1, write slice requests 16-30 corresponding to the storage slots 16-30 are sent to DST execution unit 3 at site 2, and write slice requests 31-45 corresponding to storage slots 31-45 are sent to DST execution units 4-6 at site 3.

FIG. 42C illustrates further steps of the configuring of the DST execution unit set 420 where the outbound DS processing module 80 writes the set of encoded data slices to a total width value of the logical storage slots within at least some of the selected storage units of the selected sites based on a slice-to-slot mapping. The slice-to-slot mapping allows for the site failure number of the selected sites to fail and still be able to retrieve the decoded threshold value of encoded data slices from one or more of the selected storage units of remaining selected sites of the selected sites.

The writing includes the outbound DS processing module 80 determining which of the selected sites are available, and when a number of available selected sites is equal to or greater than the site failure number, selecting the at least some of the selected sites from the available selected sites in accordance with the slice-to-slot mapping. For example, the outbound DS processing module 80 determines that all DST execution units at all sites are available and selects all of the selected sites.

Having selected the sites, the outbound DS processing module 80 divides the total width number of encoded data slices by the number of available selected sites to produce a number of encoded data slices per site. For example, the outbound DS processing module 80 divides the total width number of 30 by the number of available selected sites of 3 to produce 10 encoded data slices per site.

Having produced the number of encoded data slices per site, the outbound DS processing module 80 maps encoded data slices of the total width number of encoded data slices of the set of encoded data slices to each storage slot of the set of DST execution units in accordance with the number of available selected sites and the number of encoded data slices per site. For example, the outbound DS processing module 80 maps encoded data slices 1-8 to virtual storage slots 1-8 of the DST execution unit 1 at site 1, and remaining two encoded data slices of 10 encoded data slices for site 1 to virtual storage slots 9 and 10 DST execution unit 2; maps encoded data slices 11-20 to virtual storage slots 16-25 of the DST execution unit 3 at site 2; and maps encoded data slices 21-25 to virtual storage slots 31-35 of the DST execution unit 4 at site 3, and encoded data slices 26-30 to virtual storage slots 36-40 of the DST execution unit 5 at site 3.

Having mapped to encoded data slices to the virtual storage slots, the outbound DS processing module 80 issues, via the network 24, to the DST execution unit set 420 write slice requests 426 in accordance with the selected sites, number of encoded data slices per site, and the mapping of encoded data slices to the virtual storage slots. For example, the outbound DS processing module 80 issues one or more write slice requests that includes encoded data slices 1-10 to the DST execution units 1-2 at site 1, issues one or more write slice requests that includes encoded data slices 11-20 to the DST execution unit 3 at site 2, and issues one or more write slice requests that includes encoded data slices 21-30 to the DST execution units 4-5 at site 3.

FIG. 42D illustrates further steps of the configuring of the DST execution unit set 420 as another example where the outbound DS processing module 80 writes the set of encoded data slices to the total width value of the logical storage slots within at least some of the selected storage units of the selected sites based on a slice-to-slot mapping when a site failure is detected. For example, the outbound DS processing module 80 interprets an error message indicating that the DST execution units at site three are unavailable.

The writing includes the outbound DS processing module 80 determining which of the selected sites are available, and when a number of available selected sites is equal to or greater than the site failure number, selecting the at least some of the selected sites from the available selected sites in accordance with the slice-to-slot mapping. For example, the outbound DS processing module 80 selects sites one and two when determining that the DST execution units at sites 1 and 2 are available and the DST execution units at site 3 are unavailable when the site failure number is 1.

Having selected the sites, the outbound DS processing module 80 divides the total width number of encoded data slices by the number of available selected sites to produce the number of encoded data slices per site. For example, the outbound DS processing module 80 divides the total width number of 30 by the number of available selected sites of 2 to produce 15 encoded data slices per site.

Having produced the number of encoded data slices per site, the outbound DS processing module 80 maps encoded data slices of the total width number of encoded data slices of the set of encoded data slices to each storage slot of the set of DST execution units in accordance with the number of available selected sites and the number of encoded data slices per site. For example, the outbound DS processing module 80 maps encoded data slices 1-8 to virtual storage slots 1-8 of the DST execution unit 1 at site 1, and remaining 7 encoded data slices of 15 encoded data slices for site 1 to virtual storage slots 9-15 DST execution unit 2; and maps encoded data slices 16-30 to virtual storage slots 16-30 of the DST execution unit 3 at site 2.

Having mapped to encoded data slices to the virtual storage slots, the outbound DS processing module 80 issues, via the network 24, to the DST execution unit set 420 write slice requests 426 in accordance with the selected sites, number of encoded data slices per site, and the mapping of encoded data slices to the virtual storage slots. For example, the outbound DS processing module 80 issues one or more write slice requests that includes encoded data slices 1-15 to the DST execution units 1-2 at site 1 and issues one or more write slice requests that includes encoded data slices 16-30 to the DST execution unit 3 at site 2. Note that the data is recoverable by subsequently retrieving at least 20 encoded data slices from sites 1 and 2.

FIG. 42E is a flowchart illustrating an example of configuring a set of storage units. In particular, a method is presented for use in conjunction with one or more functions and features described in conjunction with FIGS. 1-39, 42A-D, and also FIG. 42E. The method begins at step 430 where a processing module of a computing device of one or more computing devices of a dispersed storage network (DSN) ascertains a decode threshold value for dispersed storage error encoding data for storage in storage units of the DSN, where the decode threshold value corresponds to a minimum number of encoded data slices of a set of encoded data slices needed to recover a data segment of the data. The data segment was dispersed storage error encoded into the set of encoded data slices. The ascertaining includes ascertaining the decode threshold value on a segment-by-segment basis for the data or ascertaining the decode threshold value for the data.

The method continues at step 432 where the processing module determines available sites within the DSN (e.g., interpreting a query response, performing a system registry lookup). The method continues at step 434 where the processing module selects sites from the available sites to produce selected sites (e.g., based on storage capacity, based on availability, based on reliability, etc.). The method continues at step 436 where the processing module identifies available storage units within the selected sites (e.g., interprets a query response, performs a lookup, etc.). The method continues at step 438 where the processing module selects storage units from the available storage units to produce selected storage units (e.g., based on available storage capacity, based on performance, etc.).

The method continues at step 440 where the processing module determines a total width value for the dispersed storage error encoding based on the decode threshold value, a number of the selected sites within the DSN, and a number of the selected storage units of the selected sites, where the total width value is greater than the decode threshold value and corresponds to a number of encoded data slices in the set of encoded data slices. As a specific example, the processing module generates an expansion factor based on the number of selected sites and a site failure number (e.g., sites divided by a difference of sites and the site failure number) and performs a mathematical function on the decode threshold value and the expansion factor to generate the total width value (e.g., multiplies the decode threshold value by the expansion factor).

The method continues at step 442 where the processing module determines logical storage slots within the selected storage units of the selected sites based on the total width value, the number of selected sites within the DSN, and the number of selected storage units of the selected sites. As a specific example, the processing module determines a slot number to indicate a number of slots to include in the logical storage slots, where the slot number is greater than the total width value. For instance, the processing module performs a mathematical function on the total width value and the expansion factor to generate the slot number (e.g., multiplies the total with value by the expansion factor to generate the slot number).

The method continues at step 444 where the processing module determines a slice-to-slot mapping based on the site failure number and a load balancing scheme among the at least some of the selected storage units (e.g., even distribution, weighted). The method continues at step 446 where the processing module writes the set of encoded data slices to a total width value of the logical storage slots within at least some of the selected storage units of the selected sites based on the slice-to-slot mapping. The slice-to-slot mapping allows for the site failure number of the selected sites to fail and still be able to retrieve the decoded threshold value of encoded data slices from one or more of the selected storage units of remaining selected sites of the selected sites. As a specific example, the processing module determines which of the selected sites are available and when a number of available selected sites is equal to or greater than the site failure number, the processing module selects the at least some of the selected sites from the available selected sites in accordance with the slice-to-slot mapping.

The method described above in conjunction with the processing module can alternatively be performed by other modules of the dispersed storage network or by other devices. In addition, at least one memory section that stores operational instructions can, when executed by one or more processing modules of one or more computing devices of the dispersed storage network (DSN), cause the one or more computing devices to perform any or all of the method steps described above.

FIGS. 43A and 43B are schematic block diagrams of another embodiment of a dispersed storage network (DSN) that includes the distributed storage and task (DST) client module 34 of FIG. 1, the network 24 of FIG. 1, and a DST execution (EX) unit 450. The DST execution unit set includes a set of DST execution units 36 of FIG. 1. Each DST execution unit provides at least one storage slot of N storage slots. For example, the DST execution unit set includes DST execution units 1-7 when 8 storage slots are provided with DST execution unit 5 providing two storage slots and the other DST execution units providing one storage slot each. The DST client module 34 includes the outbound dispersed storage (DS) processing module 80 and the inbound DS processing module 82 of FIG. 3. The DSN functions to store data as a plurality of data segments, where each data segment is encoded to produce a set of encoded data slices that are sent to the set of DST execution units 1-7, to retrieve the data from the set of DST execution units 1-7, and to rebuild errant encoded data slices of the plurality of sets of encoded data slices.

As a specific example of the rebuilding of the errant encoded data slices, the example begins with FIG. 43A where the DST client module 34 detects slice errors to identify the errant encoded data slices. For example, the DST client module 34 issues list slice requests to each DST execution unit for at least a portion of a source name range assigned to the DST execution unit set, receives list slice responses indicating slice names of stored encoded data slices and/or the errant encoded data slices, and compares the list slice responses to identify missing and/or corrupted encoded data slices as the errant encoded data slices. For example, the DST client module 34 identifies missing slices associated with DST execution unit 2 (e.g., data object A, pillar 2, segments 1-3) and corrupted slices associated with DST execution unit 7 (e.g., data object A, pillar 5, segments 1-3).

Having identified the errant slices, for each data segment, when the DST client module 34 identifies an error threshold number (e.g., such that a number of remaining non-errant encoded data slices is substantially the same as a decode threshold number) of errant encoded data slices, the inbound DS processing module 82 obtains a decode threshold number of encoded data slices of the data segment. For example, the inbound DS processing module 82 issues read slice requests 452 to DST execution units associated with at least a decode threshold number of storage slots (e.g., to DST execution units 1, 4, and 5 when DST execution unit 3 is unavailable, DST execution units 2 and 7 have errant encoded data slices, and DST execution units 1, 4-5 are associated with storage slots utilized to store at least a decode threshold number of encoded data slices), receives the at least a decode threshold number of encoded data slices (e.g., from received read slice responses 454), and decodes the at least a decode threshold number of received encoded data slices to reproduce the data segment as part of reproduced data segments 456.

The rebuilding example continues with FIG. 43B where the inbound DS processing module 82 sends the reproduced data segments 456 to the outbound DS processing module 80. For each reproduced data segment, the outbound DS processing module 80 encodes the reproduced data segment to produce rebuilt encoded data slices corresponding to the errant encoded data slices. For example, the outbound DS processing module 80 dispersed storage error encodes the reproduce data segment to produce a set of encoded data slices that includes the rebuilt encoded data slices.

Having produced the rebuilt encoded data slices, the outbound DS processing module 80 identifies, for each rebuilt encoded data slice, a storage slot for storage of the rebuilt encoded data slice in accordance with a rebuilding mapping approach. The rebuilding mapping approach includes one or more of selecting storage slots associated with available DST execution units and selecting storage slots original utilized for storage of the corresponding errant encoded data slice when the storage slot original utilized for storage is associated with a DST execution unit that is now available. For example, the outbound DS processing module 80 identifies utilization of a second storage slot associated with DST execution unit 5 and a storage slot associated with DST execution unit 6 for storage of rebuilt encoded data slices associated with pillar 2 when DST execution units 5 and 6 are available and DST execution unit 2 is still unavailable; and identifies utilization of a storage slot associated with DST execution unit 7 for storage of rebuilt encoded data slices associated with pillar 5 when DST execution unit 7 is available.

Having identified storage slots, for each identified storage slot, the outbound DS processing module issues a write slice request 458 to a DST execution unit associated with the storage slot, where the write slice request 458 includes one or more rebuilt encoded data slices associated with the identified storage slot. For example, the outbound DS processing module 80 issues a write request 2 to DST execution unit 5 where the write request 2 includes a rebuilt encoded data slice for data object A, pillar 2, and segment 1 etc.

Alternatively, or in addition to, the outbound DS processing module 80 updates an association of slice names and identified storage slots. For example, the outbound DS processing module 80 updates a dispersed storage network directory to associate slice names of the rebuilt encoded data slices, the identified storage slots, and identifiers of the associated DST execution units. Alternatively, or in addition to, the DST client module 34 facilitates migration of the stored rebuilt encoded data slices from the identified storage slots to original storage slots associated with the errant encoded data slices. For example, the DST client module 34 issues a migration request to DST execution unit 6 to write rebuilt encoded data slices A-2-2 and A-2-3 to DST execution unit 2 when DST execution unit 2 is available.

FIG. 43C is a flowchart illustrating an example of rebuilding an encoded data slices. The method begins at step 460 where a processing module (e.g., of a distributed storage and task (DST) client module) identifies slice errors associated with one or more sets of stored encoded data slices (e.g., receive an error message, obtain slice lists and compare). The method continues at step 462 where the processing module, when detecting that an error threshold number of errors for a set of encoded data slices has occurred, obtains a decode threshold number of encoded data slices of the set of encoded data slices from at least a decode threshold number of storage slots of one or more storage units associated with storing the set of encoded data slices. For example, the processing module detects that to slice errors have occurred for a set of encoded data slices, identifies available storage slots and associated storage units, issues read slice requests to the identified available storage units, and receives the at least a decode threshold number of encoded data slices.

The method continues at step 464 where the processing module decodes (e.g., dispersed storage error decodes) the at least the decode threshold number of encoded data slices to produce a reproduced data segment. The method continues at step 466 where the processing module encodes (e.g., dispersed storage error encodes) the reproduced data segment to produce a set of rebuilt encoded data slices. At least some of the rebuilt encoded data slices corresponds to errant encoded data slices associated with the identified slice errors. For example, the processing module identifies rebuilt encoded data slices for pillars 2 and 5 as required rebuilt encoded data slices when the identified rebuilt encoded data slices for pillars 2 and 5 correspond to errant encoded data slices of slice errors detected for pillars 2 and 5 of a set of five encoded data slices.

The method continues at step 468, where for each required rebuilt encoded data slice, the processing module identifies a storage slot in accordance with a rebuilding mapping scheme. For example, the processing module identifies available storage slots associated with available associated storage units and assigns each required rebuilt encoded data slice to the identified available storage slots. For each identified storage slot, the method continues at step 470 where the processing module issues one or more write slice requests to a storage unit associated with the identified storage slot. The write slice request includes one or more associated required rebuilt encoded data slices (e.g., required rebuilt encoded data slices associated with a common storage unit).

The method continues at step 472 where the processing module associates the required rebuilt encoded data slices with corresponding identified storage slots. For example, the processing module updates a dispersed storage network directory to associate slice names of the required rebuilt encoded data slices with the corresponding identified storage slots and associated storage units to enable subsequent retrieval when retrieving particular stored encoded data slices.

When an unavailable storage slot becomes available, the method continues at step 474 where the processing module determines whether to migrate one or more encoded data slices from the identified storage slot to the available storage slot. For example, the processing module compares and original mapping scheme to identify slices that are now stored at different storage units in accordance with the rebuilding mapping scheme.

When determining to migrate the one or more encoded data slices from the identified storage slot to the available storage slot, the method continues at step 476 where the processing module facilitates migration of the one or more encoded data slices from the identified storage slot to the available storage slot in accordance with an original mapping scheme. The facilitating includes one or more of retrieving an encoded data slices, re-storing encoded data slices, and issuing a migration request to at least one of two storage units associated with the migration.

FIG. 44A is schematic block diagrams of another embodiment of a dispersed storage network (DSN) that includes the distributed storage and task (DST) client module 34 of FIG. 1, the network 24 of FIG. 1, and the DST execution (EX) unit set 450 of FIG. 43A. The DST execution unit set 450 includes a set of DST execution units 36 of FIG. 1. Each DST execution unit provides at least one storage slot of N storage slots. For example, the DST execution unit set 450 includes DST execution units 1-7 when 8 storage slots are provided with DST execution unit 5 providing two storage slots and the other DST execution units providing one storage slot each. The DST client module 34 includes the outbound dispersed storage (DS) processing module 80 and the inbound DS processing module 82 of FIG. 3. The DSN functions to store data and to retrieve data. The DSN stores data as a plurality of data segments, where each data segment is encoded to produce a set of encoded data slices that are sent to the set of DST execution units 1-7 for storage. At least some of the encoded data slices are retrieved from the set of DST execution units 1-7 and decoded to reproduce the data.

As a specific example of the retrieving the data, the example begins with FIG. 44A where the inbound DS processing module 82 selects a group of storage slots of the N storage slots associated with the DST execution unit set in accordance with a selection scheme such that a read threshold number of encoded data slices of the set of encoded data slices may be recovered. The selection scheme includes at least one of minimizing a number of DST execution units associated with selected group of storage slots, prioritizing selection of storage slots associated with DST execution units that support two or more storage slots, selecting storage slots associated with available DST execution units, selecting storage slots associated with DST execution units exhibiting performance levels greater than a low performance threshold level, selecting from a predetermined list, prioritizing selection of storage slots associated with primary DST execution units, selecting another storage slots such that a read threshold or more number of encoded data slices of each set of encoded data slices may be retrieved, and the prioritizing selection of storage slots associated with secondary DST execution units. For example, the inbound DS processing module 82 selects a group of five storage slots associated with DST execution units 4-7 when the group of five storage slots are associated with storage of a read threshold number of encoded data slices for each set of encoded data slices even when a read threshold dispersed parameter is four.

Having selected the group of storage slots, the inbound DS processing module generates a source name 480 corresponding to the data to be recovered. The source name includes one or more of a vault identifier (ID) 482 and an object ID 484. For example, the inbound DS processing module 82 utilizes a data identifier of the data to be recovered to access a DSN directory to look up the source name 480. Having generated the source name 480, the inbound DS processing module 82 generates a read source request 478 that includes the source name 480. Next, the inbound DS processing module 82 issues the read source request 478 to DST execution units associated with the selected group of storage slots. Each of the DST execution units associated with the selected group of storage slots issues one or more read source responses 486 to the inbound DS processing module 82, where each read source response 486 includes all slices stored at the DST execution unit associated with slice names that include the source name 480 of the read source request 478. For instance, DST execution unit 5 issues a read source response 486 that includes encoded data slices A-4-1 through A-4-3 (e.g., data object A, pillar 4, segments 1-3) and encoded data slice A-2-1 (e.g., data object A, pillar 2, segment 1).

The inbound DS processing module 82 receives the read slice responses 486 and extracts encoded data slices from the received read slice responses. When not receiving at least a decode threshold number of encoded data slices of a set of encoded data slices, the inbound DS processing module issues another read source request to another DST execution unit (e.g., to available DST execution unit 1). When receiving the at least a decode threshold number of encoded data slices for each set of encoded data slices, the inbound DS processing module dispersed storage error decodes each decode threshold number of encoded data slices to reproduce a plurality of data segments of the data.

FIG. 44B is a flowchart illustrating another example of retrieving data. The method begins at step 488 where a processing module (e.g., of a distributed storage and task (DST) client module) obtains a source name corresponding to data for retrieval. The obtaining includes at least one of retrieving from a directory based on a data identifier of the data, generating by obtaining a vault identifier from a system registry based on the data identifier, retrieving an object number from the directory based on the data identifier, and generating to include the vault identifier and the object number; and extracting the source name from a request for the data.

The method continues at 490 where the processing module selects a group of storage slots of N storage slots associated with storage units of a set of storage units such that a read threshold number of encoded data slices of a set of encoded data slices may be retrieved. The selecting may be further based on a selection scheme that includes at least one of minimizing a number of the storage units to minimize network traffic, maximizing the number of associated storage units to improve retrieval reliability and latency, obtaining a retrieval reliability goal, specifying a specific storage location, selecting in accordance with a security pattern initiating a query, receiving a query response, and a predetermination.

For each associated storage unit, the method continues at step 492 where the processing module issues a read source request to the storage unit, where the read source request includes the obtained source name. Alternatively, the processing module may generate a read segment request that specifies a segment number in addition to the source name for each desired data segment. The method continues at step 494 where the processing module receives encoded data slices. For example, each storage unit issues a read source response that includes all encoded data slices associated with slice names that include the source name.

For each data segment of a plurality of data segments associated with the data, the method continues at step 496 where the processing module issues at least one further read slice request to another storage unit of the set of storage units when not receiving the at least a decode threshold number of encoded data slices of the set of encoded data slices of a data segment within a receiving time frame. The issuing includes identifying a number of further required encoded data slices and issuing corresponding read source requests to the other storage (s) in accordance with the number of further required encoded data slices.

For each data segment, the method continues at step 498 where the processing module decodes the at least a decode threshold number of received encoded data slices to reproduce the data segment. The processing module aggregates a plurality of recovered data segments to reproduce the data. Alternatively, the processing module selects each decode threshold number of encoded data slices for decoding where the selected encoded data slices include a common revision number (e.g., a most recent revision number). Alternatively, the processing module selects each decode threshold number of encoded data slices for decoding where the selected encoded data slices are associated with slice names with different pillar index numbers.

FIGS. 44C and 44D are schematic block diagrams of another embodiment of a dispersed storage network (DSN) that includes two distributed storage and task (DST) client modules 1-2, the network 24 of FIG. 1, and the DST execution unit set 450 of FIG. 44A. The DST client modules 1-2 may be implemented using the DST client module 34 of FIG. 1. The DST execution unit set 450 includes a set of DST execution units 36 of FIG. 1. Each DST execution unit provides at least one storage slot of N storage slots. For example, the DST execution unit set includes DST execution units 1-7 when 8 storage slots are provided with DST execution unit 5 providing two storage slots and the other DST execution units providing one storage slot each. Each DST client module 34 includes the outbound dispersed storage (DS) processing module 80 of FIG. 3. The DSN functions to store data and to retrieve data. The DSN stores data as a plurality of data segments, where each data segment is encoded to produce a set of encoded data slices that are sent to the set of DST execution units 1-7 for storage. At least some of the encoded data slices are retrieved from the set of DST execution units 1-7 and decoded to reproduce the data.

As a specific example of the storing the data, the example begins with FIG. 44C where the DST client module 1 receives one or more data segments of the data object for storage in storage slots of the DST execution unit set. For example, the outbound DS processing module 80 of the DST client module 1 receives a write data segment 2 data object A request 500 that includes an updated data segment 2. For a data segment to be written (e.g., data segment 2), the outbound DS processing module 80 of a DST client module 1 dispersed storage error encodes the data segment to produce a set of encoded data slices in accordance with dispersal parameters. For example, the DS processing module 80 encodes the data segment 2 to produce five encoded data slices A-1-2, A-2-2, A-3-2, A-4-2, and A-5-2 when the dispersal parameters includes an information dispersal algorithm (IDA) width of 5.

Having encoded the data segment, the outbound DS processing module 80 of the DST client module 1 selects an IDA width number of storage slots of N storage slots associated with the DST execution unit set. The selecting may be based on one or more of storage slot availability (e.g., selecting storage slots associated with available DST execution units) and a storage scheme (e.g., selecting storage slots associated with a storing of a previous revision of data segment 2, selecting storage slots associated with DST execution units exhibiting performance levels greater than a low performance threshold level). Having selected the storage slots, the outbound DS processing module 80 of the DST client module 1 issues, via the network 24, write slice requests 502 to DST execution units corresponding to the selected storage slots. For each write slice request 502, the issuing includes generating the write slice request 502 to include one or more of an associated encoded data slice of the set of encoded data slices, a slice name corresponding to the encoded data slice (e.g., including one or more of a pillar index, a vault identifier, an object number, and a data segment number), and a revision number corresponding to a revision number of the updating of the data segment and sending the write slice request to a DST execution unit corresponding to an associated storage slot. For instance, the outbound DS processing module 80 of DST client module 1 sends write slice request A-3-2 that includes encoded data slice A-3-2 to DST execution unit 4 associated with storage of a previous revision of encoded data slice A-3-2.

For a received write slice request 502, a DST execution unit identifies a source name of the write slice request 502. The DST execution unit indicates that DST client module 1 has a lock on slice names associated with the identified source name (e.g., each slice name includes the identified source name) where each of the slice names were not previously locked. For instance, DST execution unit 5 indicates that the DST client module 1 has a lock on slice names A-4-1, A-4-2, A-4-3, and A-2-1. The DST execution unit issues a write slice response 504 to the DST client module 1, where the write slice response 504 includes an indication that no write conflict exists since the identified source name is not associated with any previously locked encoded data slices. For instance, DST execution unit 5 issues a write slice request A-5-2 that includes a no conflict status.

Having received write slice responses 504 from the DST execution units, the outbound DS processing module 80 of the DST client module 1 indicates that DST client module 1 owns the lock on the source name with receiving at least a write threshold number (e.g., 4 when the IDA width is 5 and a decode threshold number is 3) of favorable write slice responses (e.g., indicating no conflict). Such an indication enables a normal proceeding of an overall write process, including issuing commit transaction requests and finalize requests to enable concurrency of data.

The specific example of the storing the data as encoded data slices continues with FIG. 44D where the DST client module 2 receives one or more data segments of the updated data object for storage in storage slots of the set of DST execution units. For example, the outbound DS processing module 80 of the DST client module 2 receives a write data segment 3 data object A request 506 that includes an updated data segment 3. For a data segment (e.g., data segment 3), the outbound DS processing module 80 of the DST client module 2 dispersed storage error encodes the data segment to produce another set of encoded data slices. For instance, the outbound DS processing module 80 encodes data segment 3 to produce updated encoded data slices A-1-3, A-2-3, A-3-3, A-4-3, and A-5-3.

Having encoded the data segment, the DS processing module 80 of the DST client module 2 selects a second IDA width number of storage slots. The second IDA width number of storage slots may be identical to the selected IDA width number of storage slots when the selection scheme includes selecting last known storage locations for encoded data slices. Having selected the second IDA width number of storage slots, the DS processing module 80 of the DST client module 2 issues, via the network 24, other write slice requests 502 to DST execution units corresponding to the second IDA width number of storage slots. For example, the outbound DS processing module 80 of the DST client module 2 sends write slice request A-1-3 to DST execution unit 1, write slice request A-3-3 to DST execution unit 4, etc.

The DST execution units receives the other write slice requests 504. A DST execution unit identifies a source name from one of the other write slice requests. The DST execution unit indicates that the lock on the slice names associated with the identified source name is active when at least one of the slice names is locked by another requestor (e.g., DST client module 1). For instance, the lock is still active since subsequent to receiving the write slice request from the DST client module 1, a commit request has not been received nor has a time frame expired from receiving the write slice request.

The DST execution unit issues, via the network 24, another write slice response 504 to the DST client module 2 indicating a conflict status. For instance, DST execution unit 5 issues a write slice request A-5-3 that includes a conflict status. The outbound DS processing module 80 of the DST client module 2 indicates that the other write slice requests have failed when receiving less than a write threshold number of other write slice responses indicating no conflict. Alternatively, the outbound DS processing module 80 of the DST client module 2 indicates that the other write slice requests have failed when receiving greater than the IDA width–the write threshold number of conflict responses. For instance, the outbound DS processing module 80 of the DST client module 2 indicates that the other write slice requests have failed when receiving 2 conflict responses (e.g., 2>5–4). The outbound DS processing module 80 of the DST client module 2 disables further processing of writing of data segment three when indicating that the other write slice requests have failed. Alternatively, or in addition to, the outbound DS processing module 80 of the DST client module 2 may try the other write slice requests at a later time (e.g., after DST client module 1 finishes writing and the lock is released).

FIG. 44E is a flowchart illustrating an example of storing encoded data slices. The method begins at step 508 where a first module (e.g., of a first distributed storage and task (DST) client module) a dispersed storage error encodes a data segment of a data object to produce a set of encoded data slices. The method continues at step 510 where the first module selects an information dispersal algorithm (IDA)

width number of storage slots of a set of storage units in accordance with one or more of DST execution unit availability and a selection scheme. The method continues at step 512 where the first module issues write slice requests to storage units corresponding to the selected storage slots. The processing module may combine write slice requests for two or more pillars into a common write slice request. Each read slice request includes one or more of an encoded data slice, a slice name corresponding to the encoded data slice, a revision number corresponding to the encoded data slice, and a transaction number.

The method continues at step 514 where a storage unit of the storage units corresponding to the selected storage slots identifies a source name of a received write slice request. For the example, the storage unit extracts the source name from a slice name of the received write slice request. When each slice name associated with the identified source name is not locked, the method continues at step 516 where the storage unit indicates that the first module has a lock on the slice names associated with the identified source name. The indicating includes accessing a lock table, determining whether the slice names associated with the identified source name are locked based on one or more entries of the lock table, and indicating that the first module has the lock on the slice names associated with the identified source name when each of the slice names associated with the identified source name are not previously locked. The indicating includes updating the lock table to indicate that the slice names associated with the identified source name are locked by the first module (e.g., associate each slice name with a locked status and the transaction number).

The method continues at step 518 where the storage unit issues a write slice response to the first module indicating no conflict. The write slice response includes one or more of a no conflict status indicator, the identified source name, one or more slice names, an identifier of the storage unit, and the transaction number. The method continues at step 520 where the first module receives write slice responses and when receiving at least a write threshold number of favorable write slice responses indicating no conflict, the first module indicates that the first module owns a lock on the source name. Subsequent to indicating that ownership of the lock, the first module may issue a commit transaction requests to the storage units, where the commit transaction request includes the transaction number. When receiving a write threshold number of favorable commit transaction responses, the first module sends a finalize transaction requests to the storage units where the finalize transaction request includes the transaction number.

Prior to issuing of the commit transaction request and/or the finalize transaction request, the method continues at step 522 where a second module dispersed storage error encodes a second data segment to produce a second set of encoded data slices. The second data segment may include the data segment or another data segment of the data object. The method continues at step 524 where the second module selects a second IDA width number of storage slots associated with the set of storage units. The number of selected storage slots may be substantially the same as the number of selected storage slots when the first module selected the IDA width number of storage slots. The second selected storage slots may be substantially the same the selected storage slots by the first module.

The method continues at step 526 where the second module issues second write slice requests to second storage units corresponding to the second selected storage slots. The second storage units may include same or different storage units as selected by the first module. Each request includes one or more of an encoded data slice of the second set of encoded data slices, a slice name corresponding to the encoded data slice, a revision number corresponding to the encoded data slice, and a second transaction number that is different than the transaction number.

The method continues at step 528 where a second storage unit of the set of storage units identifies the source name of a received second write slice request. The method continues at step 530 where the second storage unit indicates that the lock is active on the slice names associated with the identified source name when at least one slice name associated with the identified source name is locked. The method continues at step 532 where the second storage unit issues a second write slice response to the second module indicating conflict. The method continues at step 534 where the second module indicates that the second write slice requests have failed when receiving a threshold number (e.g., >IDA width−write threshold number) of unfavorable second write slice responses. The second module issues a rollback transaction requests to the second storage units, where the rollback transaction request includes the second transaction number. The second module may subsequently retry the second write slice requests at a later time.

FIGS. 45A and 45B are schematic block diagrams illustrating another example of a dispersed storage network (DSN) that includes the distributed storage and task (DST) client module 34 of FIG. 1, the network 24 of FIG. 1, and the DST execution (EX) unit set 420 of FIG. 42A. The DST execution unit set 420 includes a set of DST execution units 36 of FIG. 1, where one or more DST execution units are deployed at one or more sites. Each DST execution unit provides at least one storage slot of N storage slots. The DST client module 34 includes the outbound dispersed storage (DS) processing module 80 and the inbound DS processing module 82 of FIG. 3. The DSN functions to store data to the set of DST execution unit set and to retrieve the data from the DST execution unit set.

As a specific example of the storing of the data to the DST execution unit set, the example begins with FIG. 45A where the outbound DS processing module 80 receives a write data object A request 424 that includes a data object A and a data identifier (ID) of data object A. The outbound DS processing module 80 obtains dispersal parameters that includes an information dispersal algorithm (IDA) width and a decode threshold number. The obtaining includes at least one of accessing a system registry, accessing a copy of the system registry, initiating a query, receiving a query response, and performing a local look up.

Having obtained the dispersal parameters, the outbound DS processing module 80 selects an IDA width number of storage slots of N storage slots associated with the DST execution unit set, where N>IDA width number. The selecting may be based on one or more of DST execution unit availability, a selection scheme, DST execution unit to cite affiliations, a data retrieval reliability goal, a data writing availability goal, a predetermination, a source name range to selection permutation association, and a lookup. For example, the outbound DS processing module 80 selects storage slots 2-13 at site 1; storage slots 17, 19-25, and 28 at site 2; and storage slots 31-33, 36-38, and 41-43 at site 3 when the source name range to selection permutation association indicates to select the selected storage slots as a next imitation to achieve the data retrieval reliability goal.

Having selected the storage slots, the outbound DS processing module 80 encodes the data object A to produce a plurality of sets of encoded data slices in accordance with the dispersal parameters. For example, the outbound DS processing module 80 partitions the data object A into a plurality of data segments and disperse storage error encodes a data segment using the dispersal parameters to produce 30 encoded data slices when the IDA width is 30.

The DS processing module 80 issues, in accordance with a sending scheme and via the network 24, write slice requests 426 to DST execution units associated with the selected IDA width number of storage slots, where each write slice requests includes one or more of an encoded data slice of the set of encoded data slices, a slice name corresponding to the encoded data slice, and a revision number corresponding to the encoded data slice. The sending scheme includes at least one of sending one encoded data slice in each write slice request, sending one write slice requests that includes all encoded data slices associated with a common DST execution unit, and sending one write slice request that includes all encoded data slices associated with a common site.

As a specific example, the outbound DS processing module 80 issues a write slice request 2 to DST execution unit 1 and a write slice request 3 to DST execution unit 1 etc., when each write slice request includes the one encoded data slice. As another specific example, the outbound DS processing module 80 issues one write slice request that includes encoded data slices associated with storage slots 2-8 to DST execution unit 1 when each write slice request includes all the encoded data slices associated with a common DST execution unit. As yet another specific example, the outbound DS processing module 80 issues one write slice request to one or more DST execution units at the common site (e.g., DST execution units 1 and 2 at site 1) where the one write slice request includes encoded data slices associated with the common site (e.g., encoded data slices associated with storage slots 2-13).

Each DST execution unit receiving at least one write slice request, processes the write slice request and issues, via the network 24, a corresponding write slice response 536 to the outbound DS processing module 80, where the write slice response 536 includes status with regards to the processing of the write slice request 426 (e.g., no errors, error). The outbound DS processing module 80 receives write slice responses 536 from the DST execution units. When not receiving at least a threshold number (e.g., IDA width number, a write threshold number) of favorable write slice responses 536 within a write response timeframe, the outbound DS processing module 80 determines a number of additional storage slots based on received write slice responses 536. For example, the outbound DS processing module 80 receives no write slice responses 536 within the write response timeframe for storage slots 41-43 when DST execution unit 6 is unavailable or very slow compared to the other DST execution units. As a specific example, the outbound DS processing module 80 determines the number of additional storage slots as three when not receiving write slice responses 536 for the three storage slots 41-43.

The specific example of the storing the data to the DST execution unit set continues with FIG. 45B where the outbound DS processing module 80 selects additional storage slots in accordance with the determined number of additional storage slots based on the received read slice responses. The selecting may be based on one or more of DST execution unit availability, DST execution unit performance levels, the selection scheme, a predetermination, and received favorable read slice responses. For example, the outbound DS processing module 80 selects the additional storage slots where the additional storage slots correspond to DST execution units associated with favorable read slice responses. For instance, the outbound DS processing module 80 selects storage slot 30 of DST execution unit 3, storage slot 35 of DST execution unit 4, and storage slot 40 of DST execution unit 5 for storage of encoded data slices associated with unavailable storage slots 41-43.

Having selected the additional storage slots, the outbound DS processing module 80 issues additional write slice requests 538 to the selected additional storage slots, where the additional write slice requests 538 includes encoded data slices to be stored associated with the unavailable storage slots and may further include redundant encoded data slices associated with the unavailable storage slots. For example, the outbound DS processing module 80 issues an additional write slice request 30 to the DST execution unit 3 that includes an encoded data slice originally associated with unavailable storage slot 41.

Having issued the additional write slice request 538, the outbound DS processing module 80 receives additional read slice responses 540 from DST execution units associated with the selected additional storage slots. For example, the outbound DS processing module 80 receives an additional write slice response 30 from DST execution unit 3. When confirming that the IDA width number of encoded data slices of each set of encoded data slices has been successfully stored in storage slots of the DST execution unit set, the outbound DS processing module 80 may execute one or more additional storage steps. As a specific example of an additional storage step, the outbound DS processing module 80 identifies redundant favorable write slice responses (e.g., those associated with replicated encoded data slices beyond the confirmed IDA width number of favorable write slice responses) and issues rollback transaction requests to DST execution units associated with the redundant favorable write slice responses. Each rollback transaction request includes a transaction number associated with the write slice requests. As another specific example of another specific additional storage step, the outbound DS processing module 80 issues a commit transaction request to DST execution units associated with storage slots of the confirmed IDA width number of encoded data slices.

FIG. 45C is a flowchart illustrating another example of storing encoded data slices, where the method includes similar steps to FIG. 41B. The method begins with steps 404-412 of FIG. 41B where a processing module (e.g., of a distributed storage and task (DST) client module) receives data for storage, obtains dispersal parameters, selects an IDA width number of storage slots from N storage slots associated with a set of storage units, dispersed storage error encodes the data using the dispersal parameters to produce a plurality of sets of encoded data slices, and issues write slice requests to the identified storage units of the set of storage units, where the identified storage units are associated with the selected IDA width number of storage slots. The method continues at step 542 where the processing module receives write slice responses from at least some of the identified storage units. The receiving may include counting a number of favorable write slice responses and comparing the number to a threshold (e.g., an arbitrary number, a decode threshold number, a write threshold number, and an IDA width number).

When receiving less than the threshold number of favorable write slice responses, the method continues at step 544 where the processing module determines a number of additional storage slots. The determining may be based on identifying a number of unwritten encoded data slices of the IDA width number of encoded data slices to be written and ascertaining whether redundant encoded data slices are to be utilized (e.g., based on a lookup, a predetermination, a reliability goal, a performance level). For example, the processing module determines the number of additional storage slots to be five when the identified number of unwritten encoded data slices is three and a predetermination indicates to store two additional redundant encoded data slices when the identified number of unwritten encoded data slices is three.

The method continues at step 546 where the processing module selects additional storage slots based on the received write slice responses and the number of additional storage slots. For example, the processing module selects the additional storage slots where the additional storage slots are associated with favorably performing storage units. The method continues at step 548 where the processing module issues one or more additional write slice requests to one or more storage units associated with the selected additional storage slots. For example, the processing module generates an additional write slice requests to include an encoded data slice that has not been stored, a slice name of the encoded data slice, and a revision number associated with the encoded data slice.

The method continues at step 550 where the processing module receives one or more additional write slice responses from at least some of the one or more storage units. The processing module determines whether the encoded data slices of the one or more additional write slice requests have been stored. When confirming that the IDA width number of write slice requests have been successfully stored, the method continues at step 552 where the processing module issues a rollback transaction request to a storage unit associated with an undesired redundant encoded data slice when receiving more than an IDA width number of favorable write slice responses. The issuing may include determining whether to issue the rollback transaction. As a specific example, the processing module determines to allow additional redundant encoded data slices beyond the IDA width number of encoded data slices. As another specific example, the processing module determines to delete at least some of the additional redundant encoded data slices beyond the IDA width number of encoded data slices.

FIG. 46A is a schematic block diagram of another embodiment of a dispersed storage network (DSN) that includes the distributed storage and task (DST) client module 34 of FIG. 1, the network 24 of FIG. 1, and the DST execution (EX) unit set 424 of FIG. 42A. The DST execution unit set 420 includes a set of DST execution units 36 of FIG. 1, where one or more DST execution units are deployed at one or more sites. Each DST execution unit provides at least one storage slot of N storage slots associated with the DST execution unit set 420. The DST client module 34 includes the outbound dispersed storage (DS) processing module 80 and the inbound DS processing module 82 of FIG. 3. The DSN functions to select storage slots to store data to the set of DST execution unit set and to retrieve the data from the DST execution unit set.

As a specific example of the selecting of the storage slots, the outbound DS processing module 80 ascertains a storage slot association with DST execution units of the DST execution unit set 420. The ascertaining includes at least one of retrieving from a system registry, receiving a management system input, initiating a query, receiving a query response, and determining based on capabilities and capacities of the DST execution units. The outbound DS processing module 80 may determine a number of the storage slots based on an expansion factor.

Having ascertained the storage slot association, the outbound DS processing module 80 obtains status information 556 for each of the storage slots. The status information 556 includes one or more of a throughput capacity, latency information, retrieval reliability, storage availability, available storage capacity information and loading level information. The obtaining includes at least one of issuing a status query 554, initiating a query, receiving a query response, autonomously receiving the status information, performing a test, and performing a lookup. For example, the outbound DS processing module 80 issues a status query 1-8 for storage slots 1-8 to DST execution unit 1, a status query 9-15 for storage slots 9-15 to DST execution unit 2 etc. Alternatively, a DST execution unit may, from time to time, autonomously issue the status information 556 without a need to receive a status query 554.

Next, the outbound DS processing module 80 receives the status information 556. For example, the outbound DS processing module 80 receives status information 1-8 with regards to storage slots 1-8 from DST execution unit 1, receives status information 9-15 with regards to storage slots 9-15 from DST execution unit 2 etc. The outbound DS processing module 80 does not receive status information from DST execution unit 6 when the DST execution unit 6 is unavailable. For example, the outbound DS processing module 80 does not receive status information 41-45 with regards to storage slots 41-45 when DST execution unit 6 is unavailable.

Having obtained the status information 556, the outbound DS processing module 80 obtains performance goal information. The performance goal information includes one or more of a target storage availability, target storage latency time, target storage retrieval time, target storage throughput level, and a target retrieval reliability level. The obtaining includes at least one of receiving, retrieving, and determining. For example, the outbound DS processing module 80 receives the performance goal information from a system registry where the performance goal information is associated with the DST execution unit set.

Having obtained the performance goal information, the outbound DS processing module 80 ranks the storage slots against each other to produce rank information, where, for each storage slot, the outbound DS processing module 80 determines a rating value based on a comparison of corresponding status information and the performance goal information. For example, the outbound DS processing module 80 compares attributes of status information ankle information. The comparing may further include weighting factors attached to one or more of the attributes of the status information and the goal information in accordance with a weighting scheme. For instance, the outbound DS processing module 80 may weight attributes of retrieval reliability twice as much as attributes of throughput in accordance with the weighting scheme.

Having ranked the storage slots, the outbound DS processing module 80 obtains an information dispersal algorithm (IDA) width number associated with the DST execution unit set (e.g., retrieving from a system registry, receiving, and determining based on one or more of the status information and the performance goal information). Having obtained the IDA width number, the outbound DS processing module 80 selects an IDA width number of storage slots of the N storage slots based on the ranking information in accordance with a ranked selection scheme. For example, the outbound DS processing module 80 selects 30 storage slots associated with highest rating numbers of the ranking information when the IDA width number is 30 and the ranked selection scheme indicates to select the highest rated storage slots.

Alternatively, or in addition to, the outbound DS processing module 80 may identify each of the N storage slots is either a primary storage slot or a secondary (non-primary) storage slot based on the ranking information. For example, the outbound DS processing module 80 identifies the 30 storage slots associated with a highest rating numbers as the primary storage slots and identifies remaining storage slots as secondary storage slots when a number of desired primary storage slots is substantially the same as the IDA width number.

FIG. 46B is a flowchart illustrating an example of selecting storage slots. The method begins at step 558 where a processing module (e.g., of a distributed storage and task (DST) client module) ascertains a storage slot association of a set of N storage slots to a set of U storage units. The ascertaining includes at least one of determining the association and retrieving the association. The method continues at step 560 where the processing module obtains status information for each of the N storage slots. The obtaining includes at least one of receiving, retrieving, initiating a test, receiving a response, and accessing a historical information that includes the status information.

The method continues at step 562 where the processing module obtains performance goal information. The obtaining includes at least one of receiving, retrieving, and determining based on previous goals and actual performance. The method continues at step 564 where the processing module rates each storage slot based on corresponding status information and the performance goal information to produce ranking information. The ranking may be in accordance with a weighting scheme. For example, the processing module weights attributes of the status information and the performance goal information, compares weighted attributes, scores the storage slot based on the comparison to produce ratings, and ranks the storage slots in order of the scored ratings.

The method continues at step 566 where the processing module obtains an information dispersal algorithm (IDA) width number associated with the set of N storage slots, where N>IDA width number. The obtaining includes at least one of retrieving and determining for one or more faults associated with one or more of the set of storage slots and the set of U storage units. For example, the processing module accesses a system registry information to recover the IDA width number. The method continues at step 568 where the processing module selects an IDA width number of storage slots of the set of storage slots based on the ranking information in accordance with a ranked selection scheme. As a specific example, the processing module selects highest ranked storage slots. As another specific example, the processing module selects any available storage slot associated with a rating number above a ranking threshold level. As yet another specific example, the processing module selects a different permutation of storage slots for each vault associated with the set of U storage units. As a still further specific example, the processing module selects another different permutation of storage slots for each requesting entity accessing the set of U storage units.

FIG. 47A is a schematic block diagram of another embodiment of a distributed storage and task (DST) execution unit 36 that includes the processing module 84 and the memory 88 of FIG. 3. The DST execution unit 36 may be operably coupled, via the network 24 of FIG. 1, to the DST client module 34 of FIG. 1. The DST client module 34 includes the outbound DS processing module 80 and the inbound DS processing module 82 of FIG. 3. The memory 88 may be associated with one or more storage slots to facilitate storage and retrieval of one or more encoded data slices.

Each storage slot of the one or more storage slots may be associated with a particular type of storage. The types of storage includes one or more of a home pillar assignment (e.g., storage slot 1 associated with encoded data slices associated with slice names that includes pillar index 4), another pillar assignment encoded data slices (e.g., storage slot 2 associated with encoded data slices associated with slice names that includes pillar index 5 and), and any other pillar assignments (e.g., for temporary storage of foster encoded data slices such as encoded data slices associated with slice names that includes pillar indexes 2 and 1).

In an example of operation, the DST execution unit 36 receives, via the network 24, a write slice request 570 from the outbound DS processing module 80, where the write slice request 570 includes an encoded data slice and a slice name of the encoded data slice. The processing module 84 extracts a source name from the received slice name. The processing module 84 compares the extracted source name to one or more assigned source name ranges (e.g., assigned to a set of DST execution units including the DST execution unit 36). When the extracted source name does not compare favorably to the one or more assigned source name ranges (e.g., the one or more assigned source name ranges does not include the extracted source name), the processing module 84 issues an unfavorable write slice response 572, via the network 24, to the outbound DS processing module 80, where the write slice response 572 includes an indication that an addressing error has occurred with regards to the write slice request.

When the extracted source name compares favorably to the one or more assigned source name ranges, the processing module 84 determines whether a pillar index of the slice name is associated with a particular storage slot of the one or more storage slots associated with the DST execution unit 36. For example, the processing module 84 extracts the pillar index from the slice name and compares the extracted pillar index to a list of storage slot assignments to pillar indexes. For instance, the processing module 84 indicates that the pillar index of the slice name is associated with storage slot 1 when the pillar index is 4 and the pillar index of 4 has been assigned to storage slot 1. As another instance, the processing module 84 indicates that the pillar index of the slice name is associated with storage slot 2 when the pillar index is 5 and the pillar index of 5 has been assigned to storage slot 2. As yet another instance, the processing module 84 indicates that the pillar index of the slice name is not associated with a particular storage slot when the pillar index is 2 and the pillar index of 2 is not assigned to a particular storage slot.

When the pillar index of the slice name is associated with a particular storage slot, the processing module 84 stores the received encoded data slice in the particular storage slot. For instance, the processing module 84 stores encoded data slice A-4-1 in storage slot 1 of the memory 88 when the pillar index 4 has been assigned to storage slot 1 and the write slice request includes encoded data slice A-4-1.

When the pillar index of the slice name is not associated with a particular storage slot, the processing module 84 stores the received encoded data slice in a storage slot associated with storage of foster slices. For instance, the processing module 84 stores encoded data slice A-2-5 in storage slot 3 of the memory 88 when the pillar index 2 has been not assigned to a particular storage slot, storage slot 3 has been assigned to storage a foster encoded data slices, and the write slice request includes encoded data slice A-2-5. When the received encoded data slice has been stored in the storage slot associated with storage of foster encoded data slices in the memory 88, the processing module 84 updates a slice storage information table (e.g., within the memory 88) to associate the received slice name with one or more of a foster slice indicator and a storage slot identifier (e.g., storage slot 3) utilized to store the received encoded data slice.

FIG. 47B is a flowchart illustrating another example of storing encoded data slices. The method begins at step 574 where a processing module (e.g., of a distributed storage and task (DST) execution unit) receives a write slice request that includes an encoded data slice and a slice name (e.g., including a pillar index, a source name, and a segment number) of the encoded data slice. The method continues at step 576 where the processing module extracts a source name from the received slice name.

The method continues at step 578 where the processing module determines whether the extracted source name compares favorably to one or more assigned source name ranges associated with a storage unit of a set of storage units. The determining may be based on one or more of initiating a query, accessing a storage location table, accessing a dispersed storage network address range assignment table, and identifying an association of a pillar index and a storage slot. As a specific example, the processing module indicates a favorable comparison when the extracted source name range falls within at least one assigned source name range. As another specific example, the processing module indicates an unfavorable comparison when the extracted source name range does not fall within any of the assigned source name ranges. As yet another specific example, the processing module indicates a favorable comparison for all extracted source name ranges (e.g., the storage unit is to store any received encoded data slices). The method branches to step 582 when the processing module determines that the extracted source name compares favorably to the one or more assigned source name ranges. The method continues to step 580 when the processing module determines that the extracted source name compares unfavorably to the one or more assigned source name ranges. The method continues at step 580 where the processing module issues an unfavorable write slice response (e.g., indicating a addressing error) to a requesting entity when the extracted source name compares unfavorably to the one or more assigned source name ranges.

The method continues at step 582 where the processing module determines whether a pillar index of the received slice name is associated with a specific storage slot when the extracted source name compares favorably to the one or more assigned source name ranges. The determining may be based on one or more of receiving registry information, obtaining local registry information, accessing a storage location table, initiating a query, receiving a query response, and indicating that the pillar index is associated with the specific storage slot when identifying the specific storage slot assigned to the pillar index.

The method branches to step 584 when the pillar index of the received slice name is associated with the specific storage slot. The method continues to step 586 when the processing module determines that the pillar index of the received slice name is not associated with the specific storage slot. The method continues at step 586 where the processing module stores the received encoded data slice in a storage slot associated with storage of foster slices when the pillar index of the received slice name is not associated with the specific storage slot. For example, the processing module accesses the storage location table to identify the storage slot associated with storage of foster slices and stores the received encoded data slice in the identified storage slot. The method branches to step 588.

The method continues at step 584 where the processing module stores the received encoded data slice in a storage slot associated with the pillar index when the pillar index of the received slice name is associated with the specific storage slot. For example, the processing module accesses the storage location table to identify the storage slot associated with the pillar index and stores the received encoded data slice in the identified storage slot. The method branches to step 588.

The method continues at step 588 where the processing module issues a favorable write slice response to the requesting entity. The issuing includes generating the favorable write slice response to include one or more of an indicator to indicate whether a foster encoded data slice was stored, an indicator that the received encoded data slice was successfully stored, and the received slice name; and sending of the favorable write slice response to the requesting entity.

FIGS. 48A and 48C are schematic block diagrams of another embodiment of a dispersed storage network (DSN) that includes the network 24 of FIG. 1 and the DST execution unit set 450 of FIG. 44A. The DST execution (EX) unit set 450 includes a set of DST execution units 36 of FIG. 1. Each DST execution unit provides at least one storage slot of N storage slots. For example, the DST execution unit set includes DST execution units 1-7 when 8 storage slots are provided with DST execution unit 5 providing two storage slots and the other DST execution units providing one storage slot each.

The DSN functions to store data and to retrieve stored data. The DSN stores data as a plurality of data segments, where each data segment is encoded to produce a set of encoded data slices that are sent to the set of DST execution units 1-7 for storage. The set of encoded data slices is associated with a set of slice names where each slice name includes one or more of a pillar index, a source name corresponding to a data object, and a segment number corresponding to the data segment. Each storage slot may be associated with a pillar index in accordance with a storage mapping. For example, encoded data slices associated with pillar index 1 are to be stored in a storage slot associated with DST execution unit 1, encoded data slices associated with pillar index 2 are to be stored in a storage slot associated with DST execution unit 2, encoded data slices associated with pillar index 3 are to be stored in a storage slot associated with DST execution unit 4, encoded data slices associated with pillar index 4 are to be stored in a first storage slot associated with DST execution unit 5, and encoded data slices associated with pillar index 5 are to be stored in a storage slot associated with DST execution unit 7.

From time to time, as a result of unavailability of one or more of a particular DST execution unit and at least a portion of the network 24, encoded data slices may be temporarily stored as foster encoded data slices in storage slots associated with foster DST execution units in accordance with an alternate storage mapping. For example, encoded data slices associated with pillar index 2 are temporarily stored in a second storage slot of foster DST execution unit 5 and a storage slot associated with foster DST execution unit 6.

The DST execution unit set functions to migrate temporarily stored foster encoded data slices from the storage slots associated with the foster DST execution units to storage slots and DST execution units in accordance with the storage mapping. As a specific example of the migrating the temporarily stored foster encoded data slices, the example begins with FIG. 48A where a DST execution unit determines whether to accommodate ingestion of temporarily stored foster encoded data slices stored on one or more other DST execution units of the DST execution unit set. The determining may be based on one or more of the storage mapping, the alternate storage mapping, a DST execution unit performance level, a network traffic level, a slice error indicator, an error message, a migrating request, and a rebuilding request. For example, DST execution unit 2 determines to accommodate ingestion of the temporarily stored foster encoded data slices when determining that a performance level of the DST execution unit 2 is greater than a performance threshold level and a recovered error message indicates that slice errors have occurred.

Having determined to accommodate ingestion of the temporarily stored foster encoded data slices, the DST execution unit identifies one or more other DST execution units of the DST execution unit set that may be associated with storage of the temporarily stored foster encoded data slices. The identifying may include one or more of initiating a query, receiving a query response, accessing a slice location table, identifying all of the DST execution units of the DST execution unit set, identifying foster DST execution units from a foster unit table lookup, and receiving a request. For example, DST execution unit 2 identifies DST execution units 5 and 6 as the foster DST execution units based on the foster unit table look up.

For storage slot of the DST execution unit, the DST execution unit issues, via the network 24, a list slice request 592 to at least some of the identified one or more other DST execution units, where the list slice request 592 includes a slice name range corresponding to a pillar index associated with the storage slot and assigned to the DST execution unit in accordance with the storage mapping. For example, DST execution unit 2 generates list slice requests 2 to include a slice name range associated with DST execution unit 2 that includes a pillar index 2 and sends the list slice requests 2 to each of the other DST execution units.

At least some of the identified one or more other DST execution units issues, via the network 24, a list slice response 594 to the DST execution unit. The DST execution unit identifies the foster DST execution unit storing the temporarily stored foster encoded data slices based on received list slice responses 594. For example, the DST execution unit identifies DST execution units 5 and 6 based on received list slice responses 2 from the DST execution units 5 and 6 when the list slice responses 2 indicates that the temporally stored foster encoded data slices associated with pillar index 2 are stored within one or more storage slots of the DST execution units 5 and 6.

Having identified the foster DST execution units actually storing the temporarily stored foster encoded data slices, the DST execution unit issues read slice request for at least some of the identified temporally stored foster encoded data slices to the identified foster DST execution units. For example, DST execution unit 2 issues read slice requests for the temporarily stored foster encoded data slices to DST execution units 5 and 6. Each foster DST execution unit sends a read slice response to the DST execution unit when determining to send the read slice response (e.g., when performance and capacity of the foster DST execution unit is greater than a threshold). The read slice response includes one or more of the temporarily stored foster encoded data slices.

The DST execution unit receives the read slice responses and stores the received foster encoded data slices as encoded data slices in the DST execution unit in accordance with the storage mapping. The DST execution unit updates and association of identities of the stored encoded data slices and the storage locations. For example, the DST execution unit 2 updates a DSN directory to indicate that the foster encoded data slices are disassociated with the DST execution units 5 and 6 and that the stored encoded data slices are associated with the DST execution unit 2.

FIG. 48B is a flowchart illustrating an example of migrating encoded data slices. The method begins at step 596 where a processing module (e.g., of a distributed storage and task (DST) execution unit) determines whether to ingest foster encoded data slices into a storage unit. As a specific example, the processing module determines to ingest the foster encoded data slices when detecting that associated storage unit performance is greater than a performance threshold level and receiving an indicator that encoded data slices may be missing. As another specific example the processing module determines to ingest the foster encoded data slices when detecting that available storage capacity of the storage unit is greater than a capacity threshold level and receiving the indicator that the encoded data slices may be missing.

The method continues at step 598 where the processing module identifies one or more storage units of a set of storage units that may be associated with storage of the foster encoded data slices. For example, the processing module accesses a list of identifiers of the set of storage units. As another example, the processing module accesses a list of foster storage units. As yet another example, the processing module initiates a query to at least some of the set of storage units.

For a storage slot of the storage unit, the method continues at step 600 where the processing module issues a corresponding list slice request to at least some of the one or more storage units. For example, the processing module identifies storage slots associated with the set of storage units, selects the storage slot, identifies a pillar index associated with the storage slot, generates the list slice request to include a slice name range associated with the storage slot and pillar index, selects the storage units, and sends the list slice requests to the selected storage units.

The method continues at step 602 where the processing module receives list slice responses from at least some of the one or more storage units. The method continues at step 604 where the processing module identifies the foster encoded data slices based on the received list slice responses. For example, the processing module extracts slice names from the list slice responses that match slice names associated with the storage slot (e.g., by the pillar index). The method continues at step 606 where the processing module retrieves the identified foster encoded data slices. For example, the processing module generates a read slice request, sends the read slice requests to storage units associated with storage of the foster slices, receives read slice responses, and stores encoded data slices extracted from the read slice responses.

The method continues at step 608 where the processing module updates an association of the identified foster encoded data slices in storage locations. For example, the processing module updates one or more directories and/or one or more dispersed hierarchical indexes to associate an identifier of the storage unit with the stored foster encoded data slices and disassociates identifiers of each of the other storage units with the stored foster encoded data slices.

As another specific example of the migrating the temporary stored foster encoded data slices, the other example begins with FIG. 48C where a foster DST execution unit determines whether to accommodate migration of locally stored foster encoded data slices to storage slots of one or more home DST execution units. The determining may be based on one or more of performance of the DST execution unit set, a network traffic level, a migration check timeframe has expired, and a request. For example, the DST execution unit 5 determines to accommodate the migration of the locally stored foster encoded data slices when the migration check timeframe has expired and the performance of the DST execution unit set is unfavorable due to too many foster encoded data slices.

When accommodating the migration, the foster DST execution unit, for one or more of the locally stored foster encoded data slices, identifies a corresponding home DST execution unit. For example, DST execution unit 5 identifies DST execution unit 2 as the corresponding home DST execution unit for foster slice A-2-1 based on the storage mapping. Having identified the corresponding home DST execution unit, the foster DST execution unit determines whether the identified home DST execution unit is available and requires storage of the one or more locally stored foster encoded data slices.

The determining may be based on interpreting a list slice response in response to sending a list slice request. For example, DST execution unit 5 generates a list slice request 2 and sends the list slice request 2 to DST execution unit 2. The list slice request 2 includes a slice name range that includes slice names of foster encoded data slices stored at DST execution unit 5. The DST execution unit 5 indicates that storage of the one or more locally stored foster encoded data slices is stored in the identified home DST execution unit is available when receiving a list slice response 2 from the DST execution unit 2 that indicates that encoded data slices of the slice names of the foster encoded data slices are not present on DST execution unit 2. The DST execution unit 5 indicates that the DST execution unit 2 is not available when not receiving the list slice response 2 within a response timeframe.

When the identified home DST execution unit is available and requires storage of the one or more locally stored foster encoded data slices, the foster DST execution unit facilitates transfer of the one or more locally stored foster encoded data slices to the identified home DST execution unit for storage therein. The facilitating includes one or more of issuing write slice requests to the home DST execution unit and issuing a request to the identified home DST execution unit two issues read slice requests to the foster DST execution unit.

Alternatively, or in addition to, the foster DST execution unit updates an association of identities of the stored foster encoded data slices in storage locations. For example, the DST execution unit 5 updates a DSN directory to indicate that the foster encoded data slices are associated with (e.g., stored in) the DST execution unit 2 and that the foster encoded data slices are disassociated with the DST execution unit 5.

FIG. 48D is a flowchart illustrating another example of migrating encoded data slices, where the method includes similar steps to FIG. 48B. The method begins at step 610 where a processing module (e.g., of a distributed storage and task (DST) execution unit) determines whether to migrate locally stored foster encoded data slices from a foster storage unit to storage slots of one or more home storage units. The determining may be based on one or more of detecting that performance is less than a performance threshold, and detecting that available storage capacity is less than a capacity threshold level, receiving an error message, and receiving a request. For example, the processing module determines that the foster storage unit as available storage capacity that is less than the capacity threshold level.

For one or more of the locally stored foster encoded data slices, the method continues at step 612 where the processing module identifies a corresponding home storage unit. The identifying may be based on one or more of accessing a local storage table, identifying a storage unit associated with a storage slot affiliated with a pillar index of the one or more locally stored foster encoded data slices, and receiving a request. The method continues at step 614 where the processing module determines whether the identified home storage unit is available and requires storage of the one or more locally stored foster encoded data slices. The determining may be based on one or more of issuing a query, receiving a query response, issuing a list slice request, and receiving a list slice response. For example, the processing module determines that the identified home storage unit is available and requires storage of the one or more locally stored foster encoded data slices when the list slice response indicates that the one or more locally stored foster encoded data slices should be stored in the identified home storage unit but are not.

When the identified home storage unit is available and requires the storage of the one or more locally stored foster encoded data slices, the method continues at step 616 where the processing module facilitates transfer of the one or more locally stored foster encoded data slices to the identified home storage unit. The facilitating includes at least one of issuing write slice requests that includes the one or more locally stored foster encoded data slices and issuing a message to the identified home storage unit to issue a read slice request to the foster storage unit. The method continues with step 608 of FIG. 48B where the processing module updates an association of the identified foster encoded data slices in storage locations.

FIG. 49A is a schematic block diagram of another embodiment of a dispersed storage network (DSN) that includes the distributed storage and task (DST) client module 34 of FIG. 1, the network 24 of FIG. 1, and DST execution (EX) unit set 420 of FIG. 42A. The DST execution unit set 420 includes a set of DST execution units 36 of FIG. 1, where one or more DST execution units are deployed at one or more sites. Each DST execution unit provides at least one storage slot of N storage slots associated with the DST execution unit set. The DST client module 34 includes the outbound dispersed storage (DS) processing module 80 and the inbound DS processing module 82 of FIG. 3. The DSN functions to select storage slots to store data to the set of DST execution unit set and to retrieve stored data from the DST execution unit set.

In an example of operation of the selecting of the storage slots, the outbound DS processing module 80 performs a series of configurations steps, where the steps may be performed one or more times. For example, the series of configurations steps are performed once at time of installation of the DSN. As another example, the series of configuration steps are performed once for a first data access. As yet another example, the series of configurations steps are performed each time data is accessed within the DSN. The series of configurations step may be performed by any one or more processing modules of the DSN. As a specific example, the DS processing module 80 identifies the DST execution units of the DST execution unit set. The identifying includes at least one of accessing system registry information, initiating a query, receiving a query response, issuing a data access request, receiving a data access response, and receiving a network management input.

Having identified the DST execution units, the outbound DS processing module 80 identifies site affiliation of each DST execution unit. The identifying includes at least one of accessing the system registry information, initiating a query, receiving a query response, and receiving a network management input. For example, the outbound DS processing module 80 accesses the system registry information to identify DST execution units 1 and 2 implemented at site 1, DST execution unit 3 implemented at site 2, and DST execution units 4, 5, and 6 implemented at site 3.

Having identified the site affiliation, the outbound DS processing module 80 determines an information dispersal algorithm (IDA) width. The determining may be based on one or more of a site failure toleration goal, expansion factor, a decode threshold number, a number of sites, accessing the system registry information, initiating a query, receiving a query response, and receiving a network management input. For example, the outbound DS processing module 80 accesses the system registry information to determine that the IDA width is 15.

Having identified the IDA width, the outbound DS processing module 80 determines a number of storage slots. The determining may be based on one or more of performing a lookup, accessing a system registry information, utilizing a predetermination, and the expansion factor. For example, the outbound DS processing module 80 calculates the number of storage slots in accordance with a formula: number of storage slots=expansion factor×IDA width=2×15=30, when the expansion factor is 2 and the IDA width is 15.

Having determined the number of storage slots, the outbound DS processing module 80 determines a number of primary storage slots of the number of storage slots. Primary storage slots include storage slots associated with a utilization prioritization greater than remaining storage slots (e.g., secondary storage slots). For instance, primary storage slots are to be utilized for storage and retrieval of an IDA width number of encoded data slices and secondary storage slots are to be utilized when a primary storage slot is not available. The determining of the number of primary storage slots may be based on one or more accessing the system registry, the IDA width, a target threshold number, a write threshold number, a read threshold number, and a decode threshold number. For example, the outbound DS processing module 80 determines the number of primary storage slots to be the same as the IDA width when an entry of the system registry indicates to utilize the IDA width to provide a favorable storage availability.

Having determined the number of primary storage slots, the outbound DS processing module 80 determines a number of primary storage slots for each site in accordance with a system primary slot distribution scheme. The system primary slot distribution scheme includes at least one of distributing the primary storage slots evenly amongst the sites, scaling the number of primary storage slots per site based on a number of DST execution units per site, distribution in accordance with a predetermined list of the system registry, and utilizing system distribution information from a system manager input. For example, the outbound DS processing module 80 determines the number of primary storage slots for each site to be the number of primary storage slots divided by the number of sites when the system primary slot distribution scheme includes distributing the primary storage slots evenly amongst the sites. For instance, the number of primary storage slots for each site=15/3=5, when the number of primary storage slots is 15 and the number of sites is 3.

Having determined the number of primary storage slots for each site, the outbound DS processing module 80 determines, for each site, a mapping of primary storage slots to DST execution units of the site in accordance with a site primary slot distribution scheme. The site primary slot distribution scheme includes at least one of distributing the primary storage slots evenly amongst the DST execution units of the site, scaling the number of primary storage slots for DST execution unit based on the number of DST execution units at the site, distribution in accordance with the predetermined list of the system registry, and utilization of site distribution information from another manager input. For example, the outbound DS processing module 80 determines the number of primary storage slots for each DST execution unit to be the number of primary storage slots for the site divided by the number of DST execution units at the site and select available storage slots. For instance, the outbound DS processing module 80 distributes 3 of the 5 storage slots of site 1 to DST execution unit 1 (e.g., storage slots 1, 3, and 5) and a remaining 2 of the 5 storage slots to DST execution unit 2 (e.g., storage slots 7 and 9). As another instance, the outbound DS processing module 80 distributes 5 of the 5 storage slots of site 2 to DST execution unit 3 (e.g., storage slots 11, 13, 15, 17, and 19). As yet another example, the outbound DS processing module 80 distributes 2 of the 5 storage slots of site 3 to DST execution unit 4 (e.g., storage slots 21, 23), distributes another 2 of the 5 storage slots of site 3 to DST execution unit 5 (e.g., storage slots 25, 27), and the distributes a remaining 1 of the 5 storage slots to DST execution unit 6 (e.g., storage slot 29).

Having determined the mapping, the outbound DS processing module 80 sends configuration information to the DST execution unit set, where the configuration information includes one or more of the mapping and assigned source name ranges. The outbound DS processing module 80 accesses the primary storage slots in accordance with the mapping when storing sets of encoded data slices. As a specific example, the outbound DS processing module 80 receives a write data object A request 424 to store data object A in the DSN. The outbound DS processing module 80 encodes the data object A to produce sets of encoded data slices, where each set includes 15 encoded data slices when the IDA width is 15. The outbound DS processing module 80 generates one or more sets of write slice requests 426 that includes the sets of encoded data slices. The outbound DS processing module 80 sends write slice requests 426 to the DST execution unit set in accordance with the mapping to store the sets of encoded data slices in the primary storage slots. For example, the outbound DS processing module 80 sends write slice requests 1, 3, 5 to DST execution unit 1 to store encoded data slices 1, 2, and 3 of the 15 encoded data slices per set of encoded data slices and sends write slice requests 7, 9 to DST execution unit 2 to store encoded data slices 4, 5 of the 15 encoded data slices per set of encoded data slices etc. The outbound DS processing module 80 may select one or more secondary storage slots for storage of one or more encoded data slices of each set of encoded data slices when one or more primary storage slots are not available.

FIG. 49B is a flowchart illustrating another example of configuring a set of storage units. The method begins at step 618 where a processing module (e.g., of a distributed storage and task (DST) client module) identifies a set of storage units deployed at one or more sites. The identifying may be based on one or more of accessing a system registry, initiating a query, receiving a query response, receiving site affiliation information, identifying a number of sites, and identifying a site affiliation for each storage unit. The method continues at step 620 where the processing module ascertains an information dispersal algorithm (IDA) width. The ascertaining may be based on one or more of receiving and determining. The receiving may be based on one or more of receiving a query response in response to issuing a query, accessing the system registry, and utilizing a predetermination. The determining may be based on one or more of dispersed storage network performance information, dispersed storage network performance goal information, and receiving a system manager input.

The method continues at step 622 where the processing module determines a number of storage slots for storage of sets of encoded data slices in the set of storage units. The determining may be based on one or more of a lookup and determining. For example, the processing module determines the number of storage slots in accordance with a formula: number of storage slots=an expansion factor×IDA width. The method continues at step 624 where the processing module determines a number of primary storage slots of the number of storage slots. The determining may be based on one or more of performing a lookup, utilizing a predetermination, utilizing the number in accordance with the system registry, and calculating in accordance with a formula: number of primary storage slots=number of storage slots/expansion factor. For instance, the processing module determines the number of primary storage slots to be substantially the same as the IDA width based on a system registry lookup.

The method continues at step 626 where the processing module determines a number of primary storage slots for each site. The determining may be based on one or more of a lookup and calculating. For example, the processing module calculates the number of primary storage slots for each site in accordance with a formula: number of primary storage slots for each site=number of primary storage slots/number of sites.

The method continues at step 628 where the processing module determines a mapping of primary storage slots to storage units at each site. For example, the processing module assigns a number of available storage slots from each storage unit at each site substantially in an even fashion such that each storage unit on a per site basis has approximately the same number of primary storage slots, where every other storage slot is assigned as a primary storage slot.

The method continues at step 630 where the processing module sends configuration information to the set of storage units. The configuration information includes one or more of a mapping and dispersed storage network addressing information (e.g., assigned source name ranges). For example, the processing module issues a configuration information message to each storage unit of the set of storage units, where the configuration information message includes the configuration information. As another example, the processing module sends slice access requests to at least some storage units of the set of storage units, where the slice access requests includes the configuration information.

The method continues at step 632 where the processing module accesses primary storage slots when storing sets of encoded data slices. For example, the processing module encodes data using the IDA width and a decode threshold number to create sets of encoded data slices and issues one or more sets of write slice requests to storage units associated with the primary storage slots in accordance with the mapping where the write slice requests includes the sets of encoded data slices. Upon failure of access, the method continues at step 634 where the processing module selects an alternative storage slot. For example, the processing module detects the failure of access when less than an IDA width number of favorable write slice responses are received within a response timeframe from the set of storage units. Having detected the failure of access, the processing module selects the alternative storage slot from known available storage slots (e.g., interpreting a favorable write slice response associated with the alternative storage slot, accessing a list of available storage slots) and issues another write slice request to a storage unit associated with the alternative storage slot, where the other write slice request includes an encoded data slice associated with the access failure (e.g., an encoded data slice associated with unconfirmed storage).

FIGS. 50A and 50B are schematic block diagrams of another embodiment of a dispersed storage network (DSN) that includes the DST client module 34 of FIG. 1, the network 24 of FIG. 1, and the DST execution unit set 450 of FIG. 43A. The DST client module 34 includes the outbound DST processing module 80 and the inbound DST processing module 82 of FIG. 3. The DST execution (EX) unit set includes a set of DST execution units 36 of FIG. 1. Each DST execution unit provides at least one storage slot of N storage slots. For example, the DST execution unit set includes DST execution units 1-7 when 8 storage slots are provided with DST execution unit 5 providing two storage slots and the other DST execution units providing one storage slot each. An information dispersal algorithm (IDA) width number of the storage slots may be utilized as primary storage slots, which are prioritized for accessing encoded data slices. For example, primary storage slots are associated with DST execution units 1, 2, 4, 5, and 7.

The DSN functions to store data and to retrieve stored data. The DSN stores data as a plurality of data segments, where each data segment is encoded to produce a set of encoded data slices that are sent to primary storage slots of the set of DST execution units 1-7 for storage. The set of encoded data slices is associated with a set of slice names where each slice name includes one or more of a pillar index, a source name corresponding to a data object, and a segment number corresponding to the data segment. Each storage slot may be associated with a pillar index in accordance with a storage mapping. For example, encoded data slices associated with pillar index 1 are to be stored in a primary storage slot associated with DST execution unit 1, encoded data slices associated with pillar index 2 are to be stored in a primary storage slot associated with DST execution unit 2, encoded data slices associated with pillar index 3 are to be stored in a primary storage slot associated with DST execution unit 4, encoded data slices associated with pillar index 4 are to be stored in a first primary storage slot associated with DST execution unit 5, and encoded data slices associated with pillar index 5 are to be stored in a primary storage slot associated with DST execution unit 7.

From time to time, as a result of unavailability of one or more of a particular DST execution unit and at least a portion of the network 24, encoded data slices may be temporarily stored as foster encoded data slices in secondary storage slots associated with foster DST execution units in accordance with an alternate storage mapping. For example, encoded data slices associated with pillar index 2 are temporarily stored in a secondary storage slot of foster DST execution unit 5 and a secondary storage slot associated with foster DST execution unit 6.

In an example of operation of the retrieving of the data, the example starts with FIG. 50A where the inbound DS processing module 82 obtains a source name corresponding to a data object to be retrieved from the DST execution unit set. For example, the inbound DST processing module 82 performs a DSN directory lookup using a data identifier of the data object to be retrieved to recover the source name corresponding to the data object.

Having obtained the source name, the inbound DS processing module 82 identifies at least a read threshold number of storage slots of N storage slots affiliated with the DST execution unit set based on the source name. The identifying may be based on one or more of a lookup, a predetermination, and deterministically determining. For example, the inbound DS processing module 82 deterministically calculates a storage slot selection pattern identifier (ID) in accordance with a formula: storage slot selection pattern identifier (ID)=(source name) mod (number of patterns), where the number of patterns includes a number of permutations of a selection of storage slots. The inbound DS processing module 82 may calculate the number of permutations in accordance with a formula: number of permutations=(number of storage slots) choose (IDA width). For instance, the number of permutations=8 choose 5=56, when the number of storage slots is 8 and the IDA width is 5.

Having calculated the storage slots selection pattern ID, the inbound DS processing module 82 accesses a pattern table using the pattern ID to recover an entry of the pattern table, where the entry indicates which read threshold number of storage slots to utilize. For example, the inbound DST processing module 82 recovers the entry which indicates that the read threshold number of storage slots includes storage slot 1 associated with DST execution unit 1, storage slot 2 associated with DST execution unit 2, storage slot 4 associated with DST execution unit 4, and storage slot 5 associated with slot a of DST execution unit 5 when the read threshold is 4. The entry may further indicate which additional storage slots to utilize, and in which order, upon failure of any of the initial read threshold number of storage slots. For instance, the entry indicates to utilize storage slot 8 associated with DST execution unit 7 and then utilize storage slot 7 associated with DST execution unit 6.

Having identified the read threshold number of storage slots, the inbound DS processing module 82 issues, via the network 24, read source requests 478 to the identified at least a read threshold number of storage slots. For example, the inbound DS processing module 82 generates the read source requests 478 to include the source name corresponding to the data object and sends the read source request 478 to DST execution units associated with the identified read threshold number of storage slots. For instance, the inbound DS processing module 82 sends the read slice requests to DST execution units 1, 2, 4, and 5.

Each DST execution unit receiving the read source request 478 issues, via the network 24, a corresponding read source response 486 to the DST client module 34, where the read source response 486 includes any encoded data slices associated with the source name that are recoverable from memory of the DST execution unit. For example, DST execution unit 5 issues the read source response 486 to the DST client module 34, where the resource response includes encoded data slices A-4-1, A-4-2, A-4-3, and A-2-1.

From time to time, DST execution units may be unavailable and as such, the inbound DS processing module 82 may not receive enough read source responses to produce at least a decode threshold number of received encoded data slices for each data segment of the plurality of data segments. For example, the inbound DS processing module 82 receives read source responses 486 from DST execution units 1 and 5 and not from DST execution units 2 and 4. Having received some resource responses 486, the inbound DS processing module 82 determines whether the decode threshold number of encoded data slices have been received for each data segment of the data object. For example, the inbound DS processing module 82 indicates that the decode threshold number of encoded data slices have not been received for data segments 1-3.

In the example of operation of the retrieving of the data, the example continues with FIG. 50B, when the inbound DS processing module 82 does not receive the decode threshold number of encoded data slices for each data segment of the data object, where the inbound DS processing module 82 identifies at least one other storage slot based on the source name. For example, the inbound DS processing module 82 identifies the additional storage slots to utilize based on the entry of the pattern table. For instance, the inbound DS processing module 82 determines to identify one additional storage slot when to encoded data slices have been recovered (e.g., from DST execution units 1 and 4) for each data segment and the decode threshold is three. Next, the inbound DS processing module 82 identifies storage slot 8 associated with DST execution unit 7 as the one additional storage slot in accordance with the entry of the pattern table.

Having identified the at least one other storage slot, the inbound DS processing module 82 issues, via the network 24, one or more additional read source requests 478 to the identified at least one other storage slot (e.g., by sending the read source request to a DST execution unit associated with the other storage slot). For instance, the inbound DS processing module 82 sends the read source request 478 to DST execution unit 7 associated with storage slot 8. The inbound DS processing module 82 receives one or more additional read source responses 486. The described process continues (e.g., sending even more read source requests and receiving even more read source responses) such that when the inbound DS processing module 82 receives the decode threshold number of encoded data slices for each data segment, the inbound DS processing module 82 disperse storage error decodes each decode threshold number of received encoded data slices to reproduce the plurality of data segments of the data object.

FIG. 50C is a flowchart illustrating another example of selecting storage slots. The method begins at step 636 where a processing module (e.g., of a distributed storage and task (DST) client module) obtains (e.g., receives, determines) a source name corresponding to a data object to be retrieved from a set of storage units. The method continues at step 638 where the processing module identifies at least a read threshold number of storage slots of N storage slots affiliated with the set of storage units based on the source name. The identifying includes performing a deterministic function on the source name to produce a deterministic index, accessing a table of storage slot ranking utilizing the deterministic index, extracting an entry of the table to produce one or more of identifiers of the identified at least a read threshold number of storage slots and identifiers of additional storage slots in accordance with the storage slot ranking.

For each individual storage slot, the method continues at step 640 where the processing module issues a read source request to storage units associated with the identified at least a read threshold number of storage slots, where the read source request includes the source name. For example, the processing module sends the read source request to a storage unit associated with one of the identified storage slots. As another example, the processing module sends a common read source request to a storage unit associated with two or more storage slots of the identified storage slots.

The method continues at step 642 where the processing module receives one or more read source responses. The receiving includes the processing module extracting slice names and encoded data slices from the read source responses, where a resource response includes one or more encoded data slices and associated slice names indicating that the one or more encoded data slices are affiliated with source names that includes one or more of pillar index numbers.

The method continues at step 644 where the processing module determines whether at least a decode threshold number of encoded data slices have been received for each data segment of a plurality data segments of the data object. The method branches to step 648 when the decode threshold number of encoded data slices have been received for each data segment. The method continues to step six and 46 when the decode threshold number of encoded data slices have not been received for each data segment.

The method continues at step 646 where the processing module identifies at least one other storage slot based on the source name when the processing module determines that the at least a decode threshold number of encoded data slices have not been received for each data segment of the plurality of data segments of the data object. For instance, the processing module identifies at least one of the additional storage slots in accordance with the storage slot ranking. Having identified the at least one other storage slot, the method branches back to step 640, where the processing module issues the read source request to a storage unit associated with the at least one other storage slot.

The method continues at step 648 where the processing module dispersed storage error decodes the received encoded data slices to reproduce each data segment of the data object when the decode threshold number of encoded data slices have been received for each data segment. For example, the processing module, for each data segment, identifies a decode threshold number of encoded data slices associated with slice names of different pillar index numbers to produce the decode threshold number of encoded data slices for decoding and decodes the identified decode threshold number of encoded data slices to reproduce the data segment.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc., described with reference to one or more of the embodiments discussed herein. Further, from figure to figure, the embodiments may incorporate the same or similarly named functions, steps, modules, etc., that may use the same or different reference numbers and, as such, the functions, steps, modules, etc., may be the same or similar functions, steps, modules, etc., or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/ or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A method for execution by a computing device of a dispersed storage network (DSN), the method comprises:
   determining, by the computing device prior to storing a set of encoded data slices, an acceptable site failure number for storing the set of encoded data slices within the DSN based on available sites within the DSN and storage units within the available sites, wherein the DSN includes a plurality of sites coupled via a wide area network (WAN), wherein a site of the plurality of sites includes one or more storage units, and wherein the one or more storage units are coupled within the site via a local area network (LAN);
   determining, by the computing device, dispersed storage error encoding parameters based on the acceptable site failure number, wherein the dispersed storage error encoding parameters includes a decode threshold number and a total width number;
   encoding, by the computing device and in accordance with the dispersed storage error encoding parameters, a data segment of data to produce the set of encoded data slices, wherein the set of encoded data slices includes the total width number of encoded data slices and wherein a decode threshold number of encoded data slices of the set of encoded data slices is required to recover the data segment;
   generating, by the computing device, a slice mapping based on the acceptable site failure number, the available sites, and the storage units within the available storage units within the available sites, wherein the slice mapping maps less than the decode threshold number of encoded data slices to any one site of the available sites; and
   sending, by the computing device and based on the slice mapping, a first sub-decode threshold number of encoded data slices of the set of encoded data slices to at least some of the storage units within a first site of the available sites for storage therein; and
   sending, by the computing device and based on the slice mapping, a second sub-decode threshold number of encoded data slices of the set of encoded data slices to at least some of the storage units within a second site of the available sites for storage therein.

2. The method of claim 1 further comprises one of:
   determining the decode threshold number on a segment-by-segment basis for the data; and
   ascertaining the decode threshold number for the data.

3. The method of claim 1, wherein the determining the acceptable site failure number comprises:
   identifying the available sites;
   identifying available storage units within the available sites;
   selecting at least some of the available sites and at least some of the available storage units to produce selected sites and selected storage units within the selected sites; and
   determining the acceptable site failure number based on the selected sites, the selected storage units within the sites and a DSN performance factor.

4. The method of claim 3 further comprises:
   determining the total width number by:
      generating an expansion factor based on the number of selected sites and the acceptable site failure number; and performing a mathematical function on the decode threshold value and the expansion factor to generate the total width value.

5. The method of claim 1, wherein the generating the slice mapping comprises:
dividing the set of encoded data slices into sub-groups of encoded data slices based on a number of the at least some of the available sites and the acceptable site failure number such that, when the acceptable site failure number of sites within the at least some of the available sites, storage units in remaining sites of the at least some of the available sites stored at least the decode threshold number of encoded data slices; and
establishing the slice mapping based on the sub-groups of encoded data slices and the at least some of the available sites.

6. A computing device of a dispersed storage network (DSN), the computing device comprises:
an interface;
a local memory; and
a processing module operably coupled to the interface and the local memory, wherein the processing module functions to:
determine, prior to storing a set of encoded data slices, an acceptable site failure number for storing the set of encoded data slices within the DSN based on available sites within the DSN and storage units within the available sites, wherein the DSN includes a plurality of sites coupled via a wide area network (WAN), wherein a site of the plurality of sites includes one or more storage units, wherein the one or more storage units are coupled within the site via a local area network (LAN);
determine dispersed storage error encoding parameters based on the acceptable site failure number, wherein the dispersed storage error encoding parameters includes a decode threshold number and a total width number;
encode, in accordance with the dispersed storage error encoding parameters, a data segment of data to produce the set of encoded data slices, wherein the set of encoded data slices includes the total width number of encoded data slices and wherein the decode threshold number of encoded data slices of the set of encoded data slices is required to recover the data segment;
generate a slice mapping based on the acceptable site failure number, the available sites, and the storage units within the available storage units within the available sites, wherein the slice mapping maps less than the decode threshold number of encoded data slices to any one site of the available sites; and
send, via the interface and based on the slice mapping, a first sub-decode threshold number of encoded data slices of the set of encoded data slices to at least some of the storage units within a first site of the available sites for storage therein; and
sending, via the interface and based on the slice mapping, a second sub-decode threshold number of encoded data slices of the set of encoded data slices to at least some of the storage units within a second site of the available sites for storage therein.

7. The computing device of claim 6, wherein the processing is further operable to perform one of:
determining the decode threshold number on a segment-by-segment basis for the data; and
ascertaining the decode threshold number for the data.

8. The computing device of claim 6, wherein the processing is further operable to determine the acceptable site failure number by:
identifying the available sites;
identifying available storage units within the available sites;
selecting at least some of the available sites and at least some of the available storage units to produce selected sites and selected storage units within the selected sites; and
determining the acceptable site failure number based on the selected sites, the selected storage units within the sites and a DSN performance factor.

9. The computing device of claim 8, wherein the processing is further operable to:
determining the total width number by:
generating an expansion factor based on the number of selected sites and the acceptable site failure number; and
performing a mathematical function on the decode threshold value and the expansion factor to generate the total width value.

10. The computing device of claim 6, wherein the processing is further operable to generate the slice mapping by:
dividing the set of encoded data slices into sub-groups of encoded data slices based on a number of the at least some of the available sites and the acceptable site failure number such that, when the acceptable site failure number of sites within the at least some of the available sites, storage units in remaining sites of the at least some of the available sites stored at least the decode threshold number of encoded data slices; and
establishing the slice mapping based on the sub-groups of encoded data slices and the at least some of the available sites.

11. A computer readable memory comprises:
a first memory section that stores operational instructions that, when executed by a computing device of a dispersed storage network (DSN), causes the computing device to:
determine, prior to storing a set of encoded data slices, an acceptable site failure number for storing the set of encoded data slices within the DSN based on available sites within the DSN and storage units within the available sites, wherein the DSN includes a plurality of sites coupled via a wide area network (WAN), wherein a site of the plurality of sites includes one or more storage units, and wherein the one or more storage units are coupled within the site via a local area network (LAN);
determine dispersed storage error encoding parameters based on the acceptable site failure number, wherein the dispersed storage error encoding parameters includes a decode threshold number and a total width number;
encode, in accordance with the dispersed storage error encoding parameters, a data segment of data to produce the set of encoded data slices, wherein the set of encoded data slices includes the total width number of encoded data slices and wherein a decode threshold number of encoded data slices of the set of encoded data slices is required to recover the data segment; and
a second memory section that stores operational instructions that, when executed by the computing device, causes the computing device to:

generate a slice mapping based on the acceptable site failure number, the available sites, and the storage units within the available storage units within the available sites, wherein the slice mapping maps less than the decode threshold number of encoded data slices to any one site of the available sites; and send, based on the slice mapping, a first sub-decode threshold number of encoded data slices of the set of encoded data slices to at least some of the storage units within a first site of the available sites for storage therein; and send, based on the slice mapping, a second sub-decode threshold number of encoded data slices of the set of encoded data slices to at least some of the storage units within a second site of the available sites for storage therein.

12. The computer readable memory of claim 11, wherein the first memory section further stores operational instructions that, when executed by the computing device, causes the computing device to perform one of:

determining the decode threshold number on a segment-by-segment basis for the data; and ascertaining the decode threshold number for the data.

13. The computer readable memory of claim 11, wherein the first memory section further stores operational instructions that, when executed by the computing device, causes the computing device to determine the acceptable site failure number by:

identifying the available sites;

identifying available storage units within the available sites;

selecting at least some of the available sites and at least some of the available storage units to produce selected sites and selected storage units within the selected sites; and determining the acceptable site failure number based on the selected sites, the selected storage units within the sites and a DSN performance factor.

14. The computer readable memory of claim 13, wherein the first memory section further stores operational instructions that, when executed by the computing device, causes the computing device to:

determine the total width number by:

generating an expansion factor based on the number of selected sites and the acceptable site failure number; and performing a mathematical function on the decode threshold value and the expansion factor to generate the total width value.

15. The computer readable memory of claim 13, wherein the first memory section further stores operational instructions that, when executed by the computing device, causes the computing device to generate the slice mapping by:

dividing the set of encoded data slices into sub-groups of encoded data slices based on a number of the at least some of the available sites and the acceptable site failure number such that, when the acceptable site failure number of sites within the at least some of the available sites, storage units in remaining sites of the at least some of the available sites stored at least the decode threshold number of encoded data slices; and establishing the slice mapping based on the sub-groups of encoded data slices and the at least some of the available sites.

* * * * *